(12) United States Patent
Behringer et al.

(10) Patent No.: US 12,477,883 B2
(45) Date of Patent: Nov. 18, 2025

(54) µ-LED, µ-LED DEVICE, DISPLAY FOR AUGMENTED REALITY OR LIGHTING APPLICATIONS

(71) Applicant: OSRAM Opto Semiconductors GmbH, Regensburg (DE)

(72) Inventors: Martin Behringer, Regensburg (DE); Andreas Biebersdorf, Regensburg (DE); Ruth Boss, Neutraubling (DE); Erwin Lang, Regensburg (DE); Tobias Meyer, Kelheim (DE); Alexander Pfeuffer, Regensburg (DE); Marc Philippens, Regensburg (DE); Julia Stolz, Regensburg (DE); Tansen Varghese, Regensburg (DE); Sebastian Wittmann, Regenstauf (DE); Siegfried Herrmann, Neukirchen (DE); Berthold Hahn, Hemau-Hohenschambach (DE); Bruno Jentzsch, Regensburg (DE); Korbinian Perzlmaier, Regensburg (DE); Peter Stauss, Regensburg (DE);
(Continued)

(73) Assignee: OSRAM Opto Semiconductors GmbH, Regensburg (DE)

( * ) Notice: Subject to any disclaimer, the term of this patent is extended or adjusted under 35 U.S.C. 154(b) by 581 days.

(21) Appl. No.: 17/733,892

(22) Filed: Apr. 29, 2022

(65) Prior Publication Data

US 2022/0285430 A1 Sep. 8, 2022

Related U.S. Application Data

(63) Continuation of application No. 17/039,283, filed on Sep. 30, 2020, now Pat. No. 11,538,852, which is a
(Continued)

(30) Foreign Application Priority Data

Apr. 23, 2019 (DE) ............. 10 2019 110 500.5
May 13, 2019 (DE) ............. 10 2019 112 490.5
(Continued)

(51) Int. Cl.
*H10H 20/814* (2025.01)
*H10H 20/819* (2025.01)
(Continued)

(52) U.S. Cl.
CPC ........ *H10H 29/142* (2025.01); *H10H 20/814* (2025.01); *H10H 20/819* (2025.01); *H10H 20/855* (2025.01)

(58) Field of Classification Search
CPC .. H01L 25/167; H10H 20/814; H10H 20/819; H10H 20/855
(Continued)

(56) References Cited

U.S. PATENT DOCUMENTS 4,897,614 A 1/1990 Nishio
4,979,002 A 12/1990 Pankove
(Continued)

FOREIGN PATENT DOCUMENTS

CN 109473047 A 3/2019
DE 19744793 A1 4/1998
(Continued)

OTHER PUBLICATIONS

Ron Mertens, "More details emerge on Samsung's QD-OLED TV Plans", available online at <https://www.oled-info.com/more-details-emerge-samsungs-qd-oled-tv-plans>, Dec. 8, 2018, 4 pages.
(Continued)

*Primary Examiner* — Hoai V Pham
(74) *Attorney, Agent, or Firm* — ArentFox Schiff LLP

(57) ABSTRACT

The invention relates to various aspects of a µ-LED or a µ-LED array for augmented reality or lighting applications,
(Continued)

in particular in the automotive field. The μ-LED is characterized by particularly small dimensions in the range of a few μm.

6 Claims, 77 Drawing Sheets

(72) Inventors: Petrus Sundgren, Lappersdorf (DE);
Jens Mueller, Regensburg (DE);
Kerstin Neveling, Pentling (DE);
Frank Singer, Regenstauf (DE);
Christian Mueller, Deuerling (DE)

Related U.S. Application Data continuation of application No. PCT/EP2020/052191, filed on Jan. 29, 2020.

(30) Foreign Application Priority Data

| May 14, 2019 | (DE) | ................... | 10 2019 112 604.5 |
| May 23, 2019 | (DE) | ................... | 10 2019 113 768.3 |
| May 23, 2019 | (DE) | ................... | 10 2019 113 791.8 |
| May 29, 2019 | (DE) | ................... | 10 2019 114 442.6 |
| Aug. 12, 2019 | (DE) | ................... | 10 2019 121 672.9 |
| Sep. 25, 2019 | (DE) | ................... | 10 2019 125 875.8 |
| Oct. 29, 2019 | (DE) | ................... | 10 2019 129 209.3 |
| Nov. 15, 2019 | (DE) | ................... | 10 2019 130 866.6 |

(51) Int. Cl.
*H10H 20/855* (2025.01)
*H10H 29/14* (2025.01)

(58) Field of Classification Search
USPC .................................................. 257/79, 88
See application file for complete search history.

(56) References Cited

U.S. PATENT DOCUMENTS

| 5,103,271 | A | 4/1992 | Izumiya et al. |
| 5,526,063 | A | 6/1996 | Joubert et al. |
| 5,537,171 | A | 7/1996 | Ogino et al. |
| 5,858,814 | A | 1/1999 | Goossen et al. |
| 6,048,751 | A | 4/2000 | D'Asaro et al. |
| 6,316,286 | B1 | 11/2001 | Trezza |
| 6,527,456 | B1 | 3/2003 | Trezza |
| 6,531,328 | B1 | 3/2003 | Chen |
| 6,881,982 | B2 | 4/2005 | Okuyama et al. |
| 7,067,339 | B2 | 6/2006 | Biwa et al. |
| 7,101,050 | B2 | 9/2006 | Magarill et al. |
| 7,390,097 | B2 | 6/2008 | Magarill |
| 7,808,005 | B1 | 10/2010 | Fattal et al. |
| 8,049,233 | B2 | 11/2011 | Fukshima et al. |
| 8,349,116 | B1 | 1/2013 | Bibl et al. |
| 8,536,026 | B2 | 9/2013 | Park et al. |
| 8,586,965 | B2 | 11/2013 | Toyoda et al. |
| 8,816,324 | B2 | 8/2014 | Fukui et al. |
| 9,202,988 | B2 | 12/2015 | Yoshida et al. |
| 9,318,645 | B2 | 4/2016 | Tani et al. |
| 9,368,683 | B1 | 6/2016 | Meitl et al. |
| 9,437,782 | B2 | 9/2016 | Bower et al. |
| 9,444,015 | B2 | 9/2016 | Bower et al. |
| 9,472,734 | B1 | 10/2016 | Chen et al. |
| 9,520,537 | B2 | 12/2016 | Bower et al. |
| 9,698,308 | B2 | 7/2017 | Bower et al. |
| 9,705,042 | B2 | 7/2017 | Bower et al. |
| 9,923,013 | B1 | 3/2018 | Yamashita et al. |
| 9,991,423 | B2 | 6/2018 | Bower et al. |
| 9,997,102 | B2 | 6/2018 | Rotzoll et al. |
| 10,069,036 | B2 | 9/2018 | Atanackovic |
| 10,096,585 | B2 | 10/2018 | Tanaka et al. |
| 10,147,849 | B2 | 12/2018 | Xu et al. |
| 10,162,182 | B2 | 12/2018 | Jepsen |
| 10,177,195 | B2 | 1/2019 | Ahmed et al. |
| 10,224,460 | B2 | 3/2019 | Bower et al. |
| 10,395,589 | B1 | 8/2019 | Vahid Far et al. |
| 10,396,241 | B1 | 8/2019 | Perkins |
| 10,405,406 | B2 | 9/2019 | Liszt |
| 10,418,517 | B2 | 9/2019 | Atanackovic |
| 10,446,719 | B2 | 10/2019 | Bower et al. |
| 10,466,487 | B2 | 11/2019 | Blum et al. |
| 10,490,695 | B2 | 11/2019 | Gomez-Iglesias et al. |
| 10,522,787 | B1 | 12/2019 | Montgomery et al. |
| 10,622,514 | B1 | 4/2020 | Atanackovic |
| 10,802,334 | B2 | 10/2020 | Kim et al. |
| 10,833,225 | B2 | 11/2020 | Bower et al. |
| 10,903,193 | B2 | 1/2021 | Yamada |
| 10,963,103 | B1 | 3/2021 | Shahmohammadi |
| 10,985,143 | B2 | 4/2021 | Bower et al. |
| 11,156,759 | B2 | 10/2021 | Brick et al. |
| 11,300,827 | B2 | 4/2022 | Hwang et al. |
| 11,302,248 | B2 | 4/2022 | Halbritter |
| 11,367,807 | B2 | 6/2022 | Wada et al. |
| 11,513,275 | B2 | 11/2022 | Brick et al. |
| 11,538,852 | B2 | 12/2022 | Varghese et al. |
| 11,552,057 | B2 | 1/2023 | Chae et al. |
| 2002/0072138 | A1 | 6/2002 | Trezza et al. |
| 2002/0074553 | A1 | 6/2002 | Starikov et al. |
| 2003/0013230 | A1 | 1/2003 | Dudoff et al. |
| 2003/0141507 | A1 | 7/2003 | Krames et al. |
| 2003/0168666 | A1 | 9/2003 | Okuyama et al. |
| 2003/0189125 | A1 | 10/2003 | Trierenberg |
| 2004/0146219 | A1 | 7/2004 | Sathyanarayana |
| 2004/0189627 | A1 | 9/2004 | Shirasaki et al. |
| 2005/0174768 | A1 | 8/2005 | Conner |
| 2005/0194598 | A1 | 9/2005 | Kim et al. |
| 2005/0237488 | A1 | 10/2005 | Yamasaki et al. |
| 2005/0264472 | A1 | 12/2005 | Rast |
| 2006/0002247 | A1 | 1/2006 | Kim et al. |
| 2006/0043402 | A1 | 3/2006 | Suehiro et al. |
| 2006/0163435 | A1 | 7/2006 | Russom et al. |
| 2006/0164345 | A1 | 7/2006 | Sarma et al. |
| 2006/0192225 | A1 | 8/2006 | Chua et al. |
| 2007/0057249 | A1 | 3/2007 | Kim et al. |
| 2007/0096127 | A1 | 5/2007 | Pattison et al. |
| 2007/0252132 | A1 | 11/2007 | Kamins et al. |
| 2008/0061304 | A1 | 3/2008 | Huang et al. |
| 2008/0160725 | A1 | 7/2008 | Byun et al. |
| 2009/0045416 | A1 | 2/2009 | Bierhuizen et al. |
| 2009/0101897 | A1 | 4/2009 | Murphy et al. |
| 2009/0229097 | A1 | 9/2009 | Crandlemire |
| 2009/0291237 | A1 | 11/2009 | Park et al. |
| 2009/0315054 | A1 | 12/2009 | Kim et al. |
| 2010/0019693 | A1 | 1/2010 | Hoogzaad et al. |
| 2010/0019697 | A1 | 1/2010 | Korsunsky et al. |
| 2010/0163894 | A1 | 7/2010 | Uemura et al. |
| 2010/0252103 | A1 | 10/2010 | Yao et al. |
| 2010/0317132 | A1 | 12/2010 | Rogers et al. |
| 2011/0012142 | A1 | 1/2011 | Hahn |
| 2011/0037094 | A1 | 2/2011 | Lin et al. |
| 2011/0151602 | A1 | 6/2011 | Speier |
| 2011/0156070 | A1 | 6/2011 | Yoon et al. |
| 2011/0156616 | A1 | 6/2011 | Anderson et al. |
| 2011/0198653 | A1 | 8/2011 | Cho |
| 2011/0204327 | A1 | 8/2011 | Hiruma et al. |
| 2011/0254043 | A1 | 10/2011 | Negishi et al. |
| 2011/0263054 | A1 | 10/2011 | Yu et al. |
| 2011/0291115 | A1 | 12/2011 | Kim et al. |
| 2012/0012622 | A1 | 1/2012 | Sundbaum |
| 2012/0126229 | A1 | 5/2012 | Bower |
| 2012/0223289 | A1 | 9/2012 | Gwo et al. |
| 2012/0223873 | A1 | 9/2012 | Ohta |
| 2012/0261642 | A1 | 10/2012 | Bergenek et al. |
| 2013/0063413 | A1 | 3/2013 | Miyake |
| 2013/0063815 | A1 | 3/2013 | Kubota |
| 2013/0082624 | A1 | 4/2013 | Brassfield et al. |
| 2013/0119424 | A1 | 5/2013 | Kang et al. |
| 2013/0154498 | A1 | 6/2013 | Missbach |
| 2013/0208273 | A1 | 8/2013 | Dominguez-Caballero et al. |

(56) References Cited

U.S. PATENT DOCUMENTS

| | | |
|---|---|---|
| 2013/0249972 A1 | 9/2013 | Nishino et al. |
| 2013/0256708 A1 | 10/2013 | Jin et al. |
| 2013/0328066 A1 | 12/2013 | Sabathil et al. |
| 2014/0008677 A1 | 1/2014 | Zhu et al. |
| 2014/0054619 A1 | 2/2014 | Tseng et al. |
| 2014/0111559 A1 | 4/2014 | Yang et al. |
| 2014/0131753 A1 | 5/2014 | Ishida et al. |
| 2014/0159064 A1 | 6/2014 | Sakariya et al. |
| 2014/0231841 A1* | 8/2014 | Wang ............... H10H 20/856 257/98 |
| 2014/0319560 A1 | 10/2014 | Tischler |
| 2014/0340900 A1 | 11/2014 | Bathurst et al. |
| 2015/0018609 A1 | 1/2015 | Forsell |
| 2015/0103070 A1 | 4/2015 | In et al. |
| 2015/0103404 A1 | 4/2015 | Rudy et al. |
| 2015/0162560 A1 | 6/2015 | Chen et al. |
| 2015/0186099 A1 | 7/2015 | Hall |
| 2015/0187991 A1 | 7/2015 | McGroddy et al. |
| 2015/0207399 A1 | 7/2015 | Li et al. |
| 2015/0213756 A1 | 7/2015 | Wacyk |
| 2015/0221835 A1 | 8/2015 | Tischler et al. |
| 2015/0280086 A1 | 10/2015 | Jang et al. |
| 2015/0293302 A1 | 10/2015 | Czornomaz et al. |
| 2015/0325598 A1 | 11/2015 | Pfeuffer et al. |
| 2016/0013167 A1 | 1/2016 | Sakariya et al. |
| 2016/0155892 A1 | 6/2016 | Li et al. |
| 2016/0172253 A1 | 6/2016 | Wu et al. |
| 2016/0185277 A1 | 6/2016 | Cho et al. |
| 2016/0240159 A1 | 8/2016 | Ohkawa et al. |
| 2016/0315218 A1 | 10/2016 | Bour et al. |
| 2016/0341942 A1 | 11/2016 | Cheon et al. |
| 2016/0351539 A1 | 12/2016 | Bower et al. |
| 2017/0005151 A1 | 1/2017 | Kim et al. |
| 2017/0061878 A1 | 3/2017 | Park et al. |
| 2017/0082263 A1 | 3/2017 | Byrnes et al. |
| 2017/0084775 A1 | 3/2017 | Li et al. |
| 2017/0133357 A1 | 5/2017 | Kuo et al. |
| 2017/0170360 A1 | 6/2017 | Bour et al. |
| 2017/0179097 A1 | 6/2017 | Zhang et al. |
| 2017/0179192 A1 | 6/2017 | Zhang et al. |
| 2017/0186740 A1 | 6/2017 | Cok et al. |
| 2017/0186908 A1 | 6/2017 | Robin et al. |
| 2017/0236885 A1 | 8/2017 | Koshihara et al. |
| 2017/0250323 A1 | 8/2017 | Otto |
| 2017/0254518 A1 | 9/2017 | Vasylyev |
| 2017/0270852 A1 | 9/2017 | Meitl et al. |
| 2017/0278733 A1 | 9/2017 | Chang et al. |
| 2017/0287402 A1 | 10/2017 | Toyomura et al. |
| 2017/0338372 A1 | 11/2017 | Teraguchi et al. |
| 2017/0345867 A1 | 11/2017 | Chaji et al. |
| 2017/0352309 A1 | 12/2017 | Chang et al. |
| 2017/0352313 A1 | 12/2017 | Miyake |
| 2017/0371087 A1 | 12/2017 | You et al. |
| 2018/0005562 A1 | 1/2018 | Lin et al. |
| 2018/0012540 A1 | 1/2018 | Hosoyachi et al. |
| 2018/0024412 A1 | 1/2018 | Kim et al. |
| 2018/0033767 A1 | 2/2018 | Yu et al. |
| 2018/0033768 A1 | 2/2018 | Kumar et al. |
| 2018/0075798 A1 | 3/2018 | Nho et al. |
| 2018/0084614 A1 | 3/2018 | Bower et al. |
| 2018/0090058 A1 | 3/2018 | Chen et al. |
| 2018/0097033 A1 | 4/2018 | Ahmed et al. |
| 2018/0114878 A1 | 4/2018 | Danesh et al. |
| 2018/0138071 A1 | 5/2018 | Bower et al. |
| 2018/0180249 A1 | 6/2018 | Yamada et al. |
| 2018/0182298 A1 | 6/2018 | Jang et al. |
| 2018/0190712 A1 | 7/2018 | Xu et al. |
| 2018/0211595 A1 | 7/2018 | Takahashi et al. |
| 2018/0211945 A1 | 7/2018 | Cok et al. |
| 2018/0219144 A1 | 8/2018 | Perkins et al. |
| 2018/0226386 A1 | 8/2018 | Cok |
| 2018/0233536 A1 | 8/2018 | Chang |
| 2018/0247586 A1 | 8/2018 | Vahid Far et al. |
| 2018/0269234 A1 | 9/2018 | Hughes |
| 2018/0275410 A1 | 9/2018 | Yeoh et al. |
| 2018/0301433 A1 | 10/2018 | Robin et al. |
| 2018/0308832 A1 | 10/2018 | Shin et al. |
| 2018/0323116 A1 | 11/2018 | Wu et al. |
| 2018/0323178 A1 | 11/2018 | Meitl et al. |
| 2018/0331258 A1 | 11/2018 | Halbritter et al. |
| 2018/0342492 A1 | 11/2018 | Lu |
| 2018/0358339 A1 | 12/2018 | Iguchi |
| 2018/0358340 A1 | 12/2018 | Wong et al. |
| 2018/0367769 A1 | 12/2018 | Greenberg |
| 2019/0012957 A1 | 1/2019 | Liu et al. |
| 2019/0012965 A1 | 1/2019 | Fu et al. |
| 2019/0013439 A1 | 1/2019 | Sung et al. |
| 2019/0044023 A1 | 2/2019 | Cheng et al. |
| 2019/0058081 A1 | 2/2019 | Ahmed et al. |
| 2019/0066571 A1 | 2/2019 | Goward |
| 2019/0066587 A1 | 2/2019 | Han |
| 2019/0096973 A1 | 3/2019 | Zhou |
| 2019/0113199 A1 | 4/2019 | Pellarin et al. |
| 2019/0113727 A1 | 4/2019 | Tamma |
| 2019/0115508 A1 | 4/2019 | Lin et al. |
| 2019/0137757 A1 | 5/2019 | Rousseau |
| 2019/0148606 A1 | 5/2019 | Racz et al. |
| 2019/0165209 A1 | 5/2019 | Bonar et al. |
| 2019/0174079 A1 | 6/2019 | Anthony et al. |
| 2019/0195466 A1 | 6/2019 | Shimizu et al. |
| 2019/0198716 A1 | 6/2019 | Gordon et al. |
| 2019/0229097 A1 | 7/2019 | Takeya et al. |
| 2019/0235234 A1 | 8/2019 | Hu et al. |
| 2019/0235677 A1 | 8/2019 | Liu et al. |
| 2019/0258346 A1 | 8/2019 | Cheng et al. |
| 2019/0293939 A1 | 9/2019 | Sluka |
| 2019/0302917 A1 | 10/2019 | Pan |
| 2019/0305035 A1 | 10/2019 | Cho et al. |
| 2019/0305036 A1 | 10/2019 | Ahn et al. |
| 2019/0305185 A1 | 10/2019 | Lauermann et al. |
| 2019/0335553 A1 | 10/2019 | Ahmed et al. |
| 2019/0347979 A1 | 11/2019 | Ahmed |
| 2019/0371777 A1 | 12/2019 | Iguchi |
| 2019/0378674 A1 | 12/2019 | Chou et al. |
| 2019/0383474 A1 | 12/2019 | Vasylyev |
| 2019/0386173 A1 | 12/2019 | Chen et al. |
| 2019/0393198 A1 | 12/2019 | Takeya |
| 2020/0052033 A1 | 2/2020 | Iguchi |
| 2020/0105184 A1 | 4/2020 | Shao et al. |
| 2020/0119233 A1 | 4/2020 | Dupont |
| 2020/0134624 A1 | 4/2020 | Zhang et al. |
| 2020/0203580 A1 | 6/2020 | Marutani |
| 2020/0219855 A1 | 7/2020 | Chen et al. |
| 2020/0227594 A1 | 7/2020 | Kuo |
| 2020/0251638 A1 | 8/2020 | Morris et al. |
| 2020/0342194 A1 | 10/2020 | Bhat et al. |
| 2020/0343230 A1 | 10/2020 | Sizov et al. |
| 2020/0356016 A1 | 11/2020 | Sampayan et al. |
| 2020/0357103 A1 | 11/2020 | Wippermann et al. |
| 2020/0366067 A1 | 11/2020 | David et al. |
| 2021/0005775 A1 | 1/2021 | Chen et al. |
| 2021/0043617 A1 | 2/2021 | Onuma et al. |
| 2021/0104574 A1 | 4/2021 | Behringer et al. |
| 2021/0124247 A1 | 4/2021 | Mezouari et al. |
| 2021/0134624 A1 | 5/2021 | Zhang |
| 2021/0136966 A1 | 5/2021 | Jang et al. |
| 2021/0242370 A1 | 8/2021 | Lee et al. |
| 2021/0272938 A1 | 9/2021 | Chang et al. |
| 2021/0313497 A1 | 10/2021 | Pourquier |
| 2021/0325594 A1 | 10/2021 | Meng et al. |
| 2021/0375833 A1 | 12/2021 | Lee et al. |
| 2021/0391514 A1 | 12/2021 | Koyama et al. |
| 2021/0405276 A1 | 12/2021 | Brick et al. |
| 2022/0052235 A1 | 2/2022 | Biebersdorf et al. |
| 2022/0093833 A1 | 3/2022 | Takiguchi et al. |
| 2022/0102583 A1 | 3/2022 | Baumheinrich et al. |
| 2022/0123046 A1 | 4/2022 | Behringer et al. |
| 2022/0231193 A1 | 7/2022 | Boss et al. |
| 2022/0262850 A1 | 8/2022 | Behringer et al. |
| 2022/0262851 A1 | 8/2022 | Behringer et al. |
| 2022/0262852 A1 | 8/2022 | Behringer et al. |
| 2022/0271084 A1 | 8/2022 | Behringer et al. |
| 2022/0271085 A1 | 8/2022 | Behringer et al. |
| 2022/0285430 A1 | 9/2022 | Behringer et al. |

(56) References Cited

U.S. PATENT DOCUMENTS

| | | |
|---|---|---|
| 2022/0285591 A1 | 9/2022 | Biebersdorf et al. |
| 2022/0285592 A1 | 9/2022 | Biebersdorf et al. |
| 2022/0293829 A1 | 9/2022 | Biebersdorf et al. |
| 2022/0293830 A1 | 9/2022 | Biebersdorf et al. |
| 2022/0310888 A1 | 9/2022 | Biebersdorf et al. |
| 2022/0352436 A1 | 11/2022 | Biebersdorf et al. |
| 2022/0375991 A1 | 11/2022 | Behringer et al. |

FOREIGN PATENT DOCUMENTS

| | | |
|---|---|---|
| DE | 19751649 A1 | 5/1999 |
| DE | 19911717 A1 | 9/2000 |
| DE | 10009782 A1 | 9/2001 |
| DE | 102006045702 A1 | 4/2008 |
| DE | 102007043877 A1 | 1/2009 |
| DE | 102007046339 A1 | 4/2009 |
| DE | 102005063159 B4 | 5/2009 |
| DE | 102012008833 A1 | 11/2012 |
| DE | 102013104273 A1 | 10/2014 |
| DE | 102017106755 A1 | 10/2018 |
| DE | 102017109083 A1 | 10/2018 |
| DE | 102018108022 A1 | 10/2018 |
| DE | 102017114369 A1 | 1/2019 |
| DE | 102018113363 A1 | 12/2019 |
| DE | 102018119312 A1 | 2/2020 |
| DE | 102018119376 A1 | 2/2020 |
| EP | 0488772 A1 | 6/1992 |
| EP | 1544660 A1 | 6/2005 |
| EP | 1553640 A1 | 7/2005 |
| EP | 1887634 A2 | 2/2008 |
| EP | 2323185 A2 | 5/2011 |
| EP | 2396818 A2 | 12/2011 |
| EP | 2430652 | 3/2012 |
| EP | 2609624 A0 | 3/2012 |
| EP | 2477240 A2 | 7/2012 |
| EP | 2506321 A1 | 10/2012 |
| EP | 2642537 A2 | 9/2013 |
| EP | 2685155 A2 | 1/2014 |
| EP | 2750208 A2 | 7/2014 |
| EP | 2838130 A1 | 2/2015 |
| EP | 2924490 A2 | 9/2015 |
| EP | 2980866 A1 | 2/2016 |
| EP | 2986082 A1 | 2/2016 |
| EP | 3010048 A1 | 4/2016 |
| EP | 3031086 A1 | 6/2016 |
| EP | 2676528 B1 | 8/2017 |
| EP | 3226042 A1 | 10/2017 |
| EP | 2704215 B1 | 4/2018 |
| EP | 3367374 A1 | 8/2018 |
| EP | 33673774 A1 | 8/2018 |
| JP | S642386 A | 6/1987 |
| JP | S62269385 A | 11/1987 |
| JP | H06244457 A | 9/1994 |
| JP | H11145519 A | 5/1999 |
| JP | 2002246647 A | 8/2002 |
| JP | 2004-228297 A | 8/2004 |
| JP | 2005244220 A | 9/2005 |
| JP | 2005346066 A | 12/2005 |
| JP | 2006263932 A | 10/2006 |
| JP | 2007264610 A | 10/2007 |
| JP | 2007324416 A | 12/2007 |
| JP | 2009141254 A | 6/2009 |
| JP | 2009186794 A | 8/2009 |
| JP | 2009260357 A | 11/2009 |
| JP | 2010272245 A | 12/2010 |
| JP | 2012510716 A | 5/2012 |
| JP | 2013048282 A | 3/2013 |
| JP | 2013110154 A | 6/2013 |
| JP | 2014019436 A | 2/2014 |
| JP | 2014110333 A | 6/2014 |
| JP | 2015099238 A | 5/2015 |
| JP | 2016174179 A | 9/2016 |
| JP | 2016208012 A | 12/2016 |
| JP | 2017152655 A | 8/2017 |
| JP | 2017-533453 A | 11/2017 |
| JP | 2017535966 A | 11/2017 |
| JP | 2018050082 A | 3/2018 |
| JP | 2018063975 A | 4/2018 |
| JP | 2018-191006 A | 11/2018 |
| JP | 2019009438 A | 1/2019 |
| JP | 2019029473 A | 2/2019 |
| KR | 10-0713226 B1 | 5/2007 |
| KR | 20130052944 A | 5/2013 |
| WO | 2004084318 A1 | 9/2004 |
| WO | 2006035212 A1 | 4/2006 |
| WO | 2007001099 A1 | 1/2007 |
| WO | 2009082121 A2 | 7/2009 |
| WO | 2010019594 A2 | 2/2010 |
| WO | 2010132552 A1 | 11/2010 |
| WO | 2010149027 A1 | 12/2010 |
| WO | 2011069747 A1 | 6/2011 |
| WO | 2011117056 A1 | 9/2011 |
| WO | 2011160051 A2 | 12/2011 |
| WO | 2012014857 A1 | 2/2012 |
| WO | 2013026440 A2 | 2/2013 |
| WO | 2014047113 A1 | 3/2014 |
| WO | 2014093063 A1 | 6/2014 |
| WO | 2015138102 A1 | 9/2015 |
| WO | 2016025325 A1 | 2/2016 |
| WO | 2016054092 A1 | 4/2016 |
| WO | 2016060677 A1 | 4/2016 |
| WO | 2016/151112 A1 | 9/2016 |
| WO | 2017087312 A1 | 5/2017 |
| WO | 2017111827 A1 | 6/2017 |
| WO | 2017120320 A1 | 7/2017 |
| WO | 2017120341 A1 | 7/2017 |
| WO | 2017197576 A1 | 11/2017 |
| WO | 2018117382 A1 | 6/2018 |
| WO | 2018123280 A1 | 7/2018 |
| WO | 2018179540 A1 | 10/2018 |
| WO | 2019079383 A1 | 4/2019 |

OTHER PUBLICATIONS

Volz et al., "Influence of annealing on the optical and structural properties of dilute N-containing III/V semiconductor heterostructures," Journal of Crystal Growth, Jan. 2007, vol. 298, pp. 126-130.

Buljan et al., "Ultra-Compact Multichannel Freeform Optics for 4xWUXGA OLED Microdisplays," Proc. SPIE 10676, Digital Optics for Immersive Displays, 9 pages (2018).

Fortuna, "Integrated Nanoscale Antenna-LED for On-Chip Optical Communication," UC Berkeley, 146 pages (2017).

Li et al., "Waveguiding in Vertical Cavity Quantum-Well Structure Defined by Ion Implantation," J. Lightwave Technol. 16, pp. 1498-1508 (1998).

Ogihara et al., "1200 Dots-Per-Inch Light Emitting Diode Array Fabricated by Solid-Phase Zinc Diffusion," IEICE Transactions on Electronics, 80;3, pp. 489-497 (1997).

Stevens et al., "Varifocal Technologies Providing Prescription and VAC Mitigation in HMDs Using Alvarez Lenses," Proc. SPIE 10676, Digital Optics for Immersive Displays, 18 pages (2018).

Tomioka et al., "Selective-Area Growth of III-V Nanowires and Their Applications," Journal of Materials Research, 26 (17), pp. 2127-2141 (2011).

Waldern et al., "DigiLens Switchable Bragg Grating Waveguide Optics for Augmented Reality Applications," Proc. SPIE 10676, Digital Optics for Immersive Displays, 17 pages (2018).

Wheelwright et al., "Field of View: Not Just a Number," Proc. SPIE 10676, Digital Optics for Immersive Displays, 8 pages (2018).

Yu et al., "Hybrid LED Driver for Multi-Channel Output with High Consistency," 2015 IEEE 11th International Conference on ASIC (ASICON), Chengdu, 4 pages (2015).

Huang et al., "Metasurface Holography: From Fundamentals to Applications," Nanophotonics. 7(6), pp. 1169-1190 (2018).

Peng et al., "Magnetic-Mechanical-Electrical-Optical Coupling Effects in GaN-Based LED/Rare-Earth Terfenol-D Structures", Advanced Materials, vol. 26, 2014, pp. 6767-6772.

International Search Report for International Patent Application No. PCT/EP2020/058997 dated Mar. 5, 2021.

(56) References Cited

OTHER PUBLICATIONS

International Search Report for International Patent Application No. PCT/EP2020/058547 dated Mar. 26, 2021.

* cited by examiner

| | App. Field | Usecase | Viewing Distance [cm] | Min. Size X*Y [cm] | Max. Size X*Y [cm] | PPI | PP [μm] | Res. Type |
|---|---|---|---|---|---|---|---|---|
| | Auto | Low res HuD | tbd | tbd | tbd | tbd | tbd | tbd |
| | Auto | Multi Media Display Rear | 30 - 40 | 15*10 | 25*15 | ≥ 250 | ≤ 102 | |
| | Auto | Rear View Mirror / Replacement | 25 - 70 | 16*6 | 30*15 | ≥ 250 | ≤ 102 | |
| | Auto | Display in the Window Pillars | 25 - 150 | 20*5 | 100*30 | ≥ 250 | ≤ 102 | |
| | Auto | Cluster | 40 - 70 | 20*10 | 90*30 | ≥ 200 | ≤ 127 | mid res |
| | Auto | Center Stack | 40 - 70 | 12*9 | 40*25 | ≥ 200 | ≤ 127 | |
| Direct Emitter Display | Auto | Small Distributed info Displays (e.g. AC Control) | 40 - 70 | 1*0,5 | 6*6 | ≥ 200 | ≤ 127 | |
| | Auto | Extended Cluster Across Dash Board | 40 - 70 | 150*10 | 180*30 | ≥ 200 | ≤ 127 | |
| | Auto | Exterior Advertisement good resolution | 50 - 150 | 30*30 | 50*150 | ≥ 100 | ≤ 254 | |
| | Auto | Roof / Sky | 20 - 40 | 70*40 | 200*180 | ≥ 50 | ≤ 508 | low res |
| | Auto | RCL | 200 - .... | 20*10 | 50*30 | ≥ 50 | ≤ 508 | |
| | Auto | Decoration Style Displays | 20 - 200 | 20*10 | 180*30 | ≥ 50 | ≤ 508 | |
| | MM | Command & Control | 300-1500 | 200*200 | 5000*300 | ≤ 30 | ≥ 847 | very low res |
| | MM | Conference/Board Rooms | 1000-10000 | 70*180 | 300*600 | ≤ 30 | ≥ 847 | |
| | Auto | Pedestrian Communication | 200-...... | tbd | tbd | ≥ 25 | ≤ 1016 | |
| | Auto | Exterior Advertisement | 50-2000 | 30*30 | 50*150 | ≥ 25 | ≤ 1016 | |
| | MM | Electronic Posters | 50-2000 | 100*200 | 200*400 | ≥ 25 | ≤ 1016 | |
| | MM | Cinema | 3000-50000 | 500*300 | 800*2000 | ≤ 10 | ≥ 2540 | |

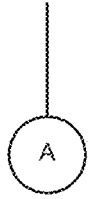

FIG. 3B-1

| | | | | | | | |
|---|---|---|---|---|---|---|---|
| Transparent Direct Emitter Display | Auto | Rear View Mirror | 25 – 70 | 15*10 | 30*15 | ≥ 250 | ≤ 102 | mid res |
| | Auto | Vanity Mirror | 25 – 70 | 7*4 | 90*90 | ≥ 250 | ≤ 102 | |
| | Auto | Side View Mirror | 40 – 70 | 12*8 | 20*15 | ≥ 200 | ≤ 127 | |
| | Auto | Side Window status indicators | 40 – 70 | 2*2 | 15*3 | ≥ 200 | ≤ 127 | |
| | Auto | Stacked Display (3D Cluster) | 40 – 70 | 20*10 | 180*30 | ≥ 200 | ≤ 127 | |
| | Auto | Panorama Roof Display | 20 – 40 | 70*40 | 200*180 | ≥ 50 | ≤ 508 | low res |
| | MM | Advertisement | 50-2000 | 100*200 | 200*400 | ≥ 25 | ≤ 1016 | very low res |
| | Auto | Rear/Side Window Display (Outside Communication, Rear Light, Turn Indicator) | 200 – 1000 | 20*20 | 180*150 | ≥ 10 | ≤ 2540 | |
| | Auto | CHMSL (Center High Mounted Stop Light) | 200 – ...... | 20*10 | 180*15 | ≥ 10 | ≤ 2540 | |
| | Auto | Peripheral Display (e.g. Wind Shield, Side Windows, etc...) | 40 – 70 | 5*5 | 180*15 | ≥ 10 | ≤ 2540 | |
| | Auto | Wind Shield Display for Autonomous Communication (Full Size) | 200 – 1000 | 3*50 | 180*150 | ≥ 10 | ≤ 2540 | |

FIG. 3B-2

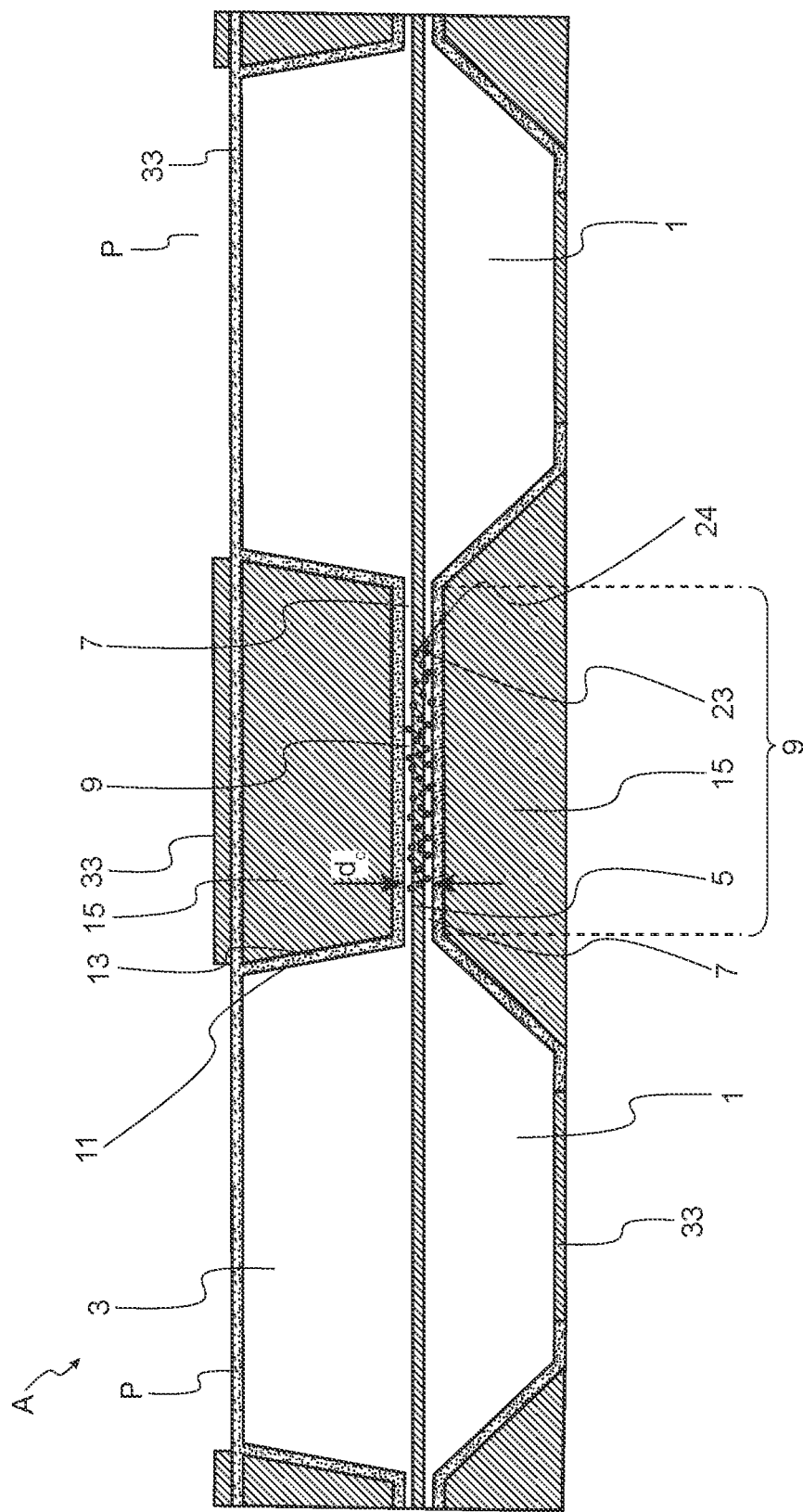

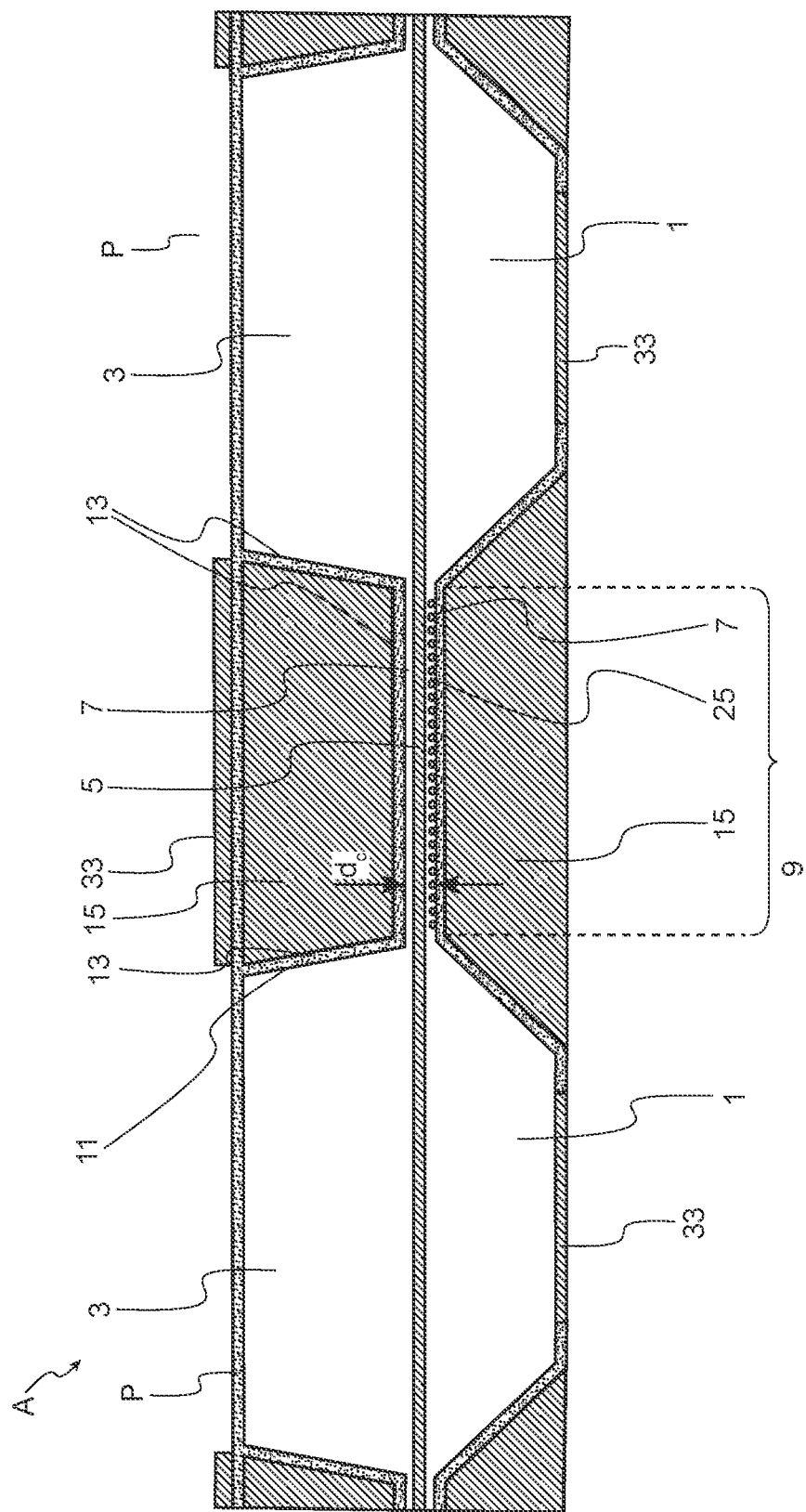

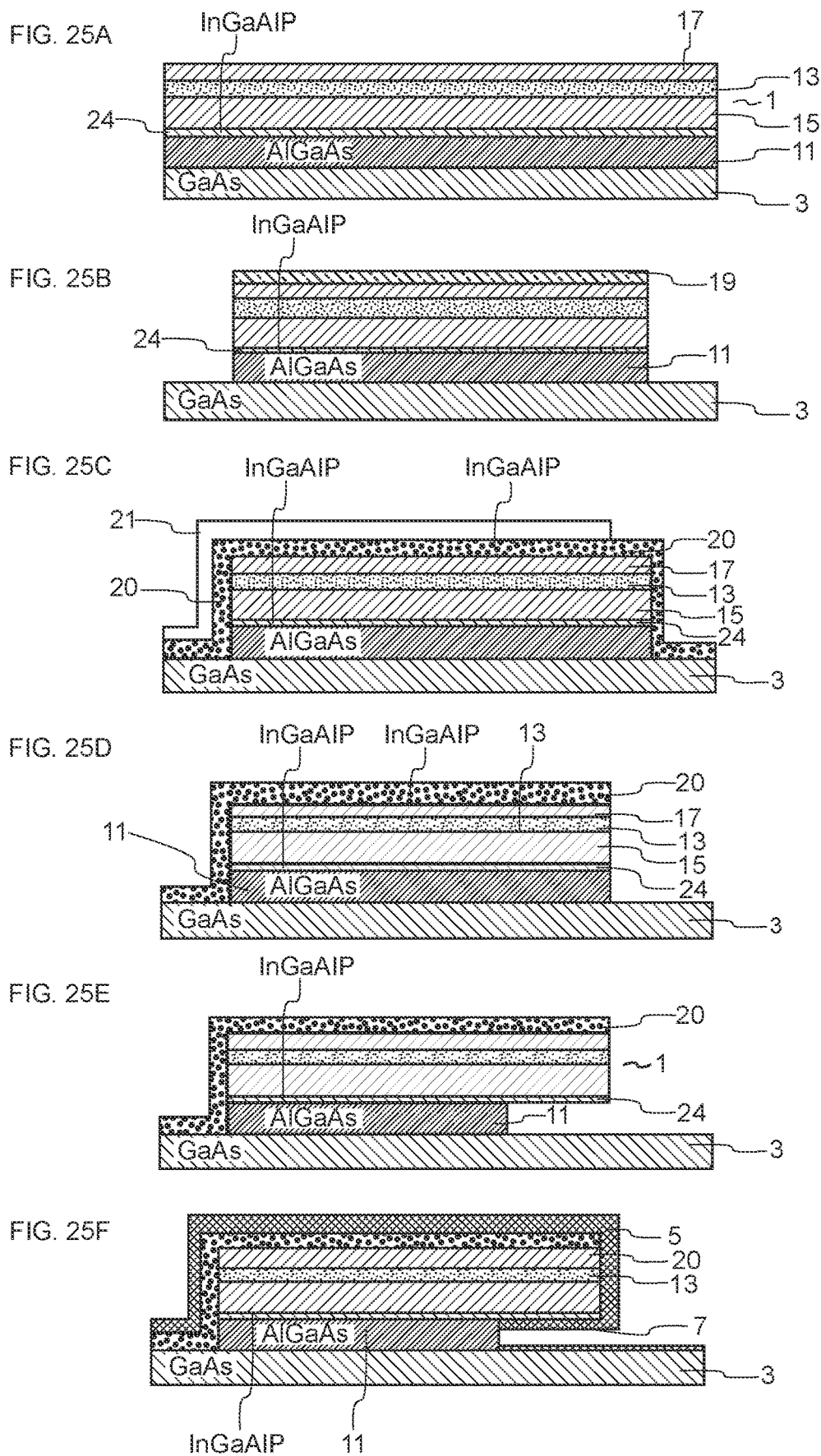

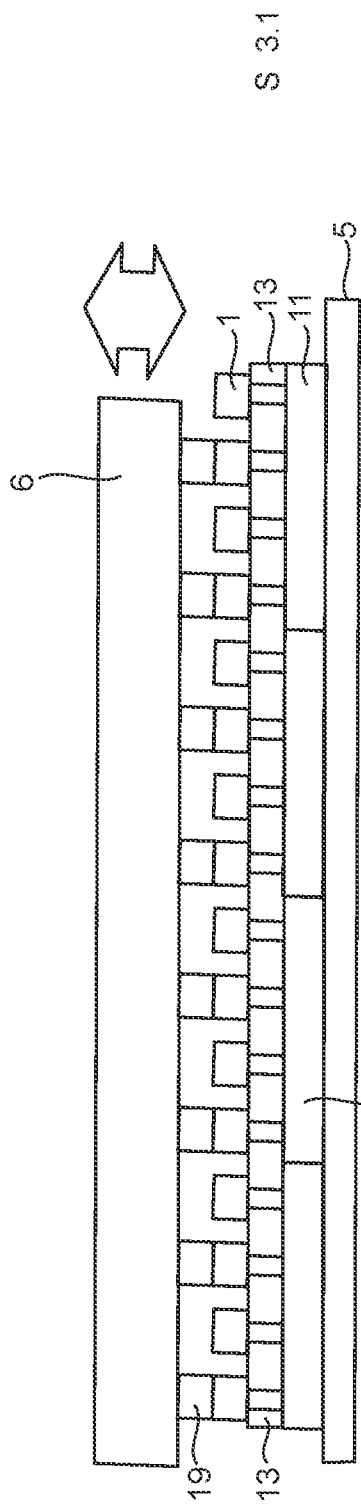
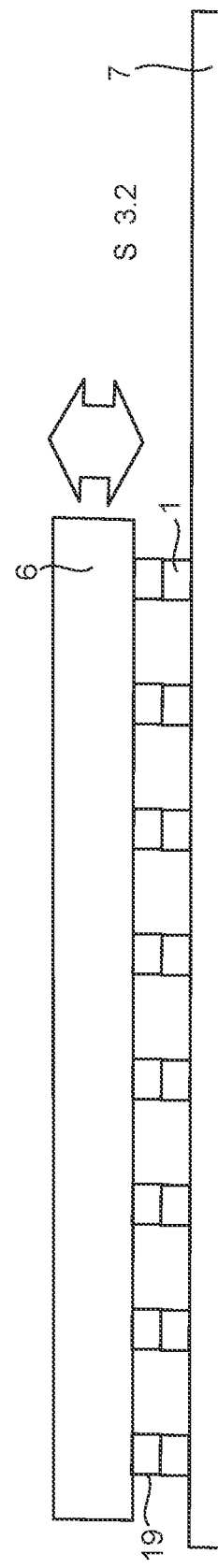
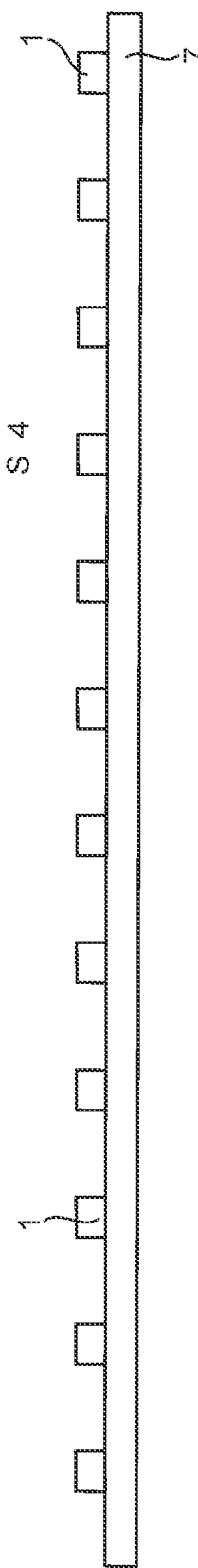
FIG. 47C
FIG. 47D
FIG. 47E

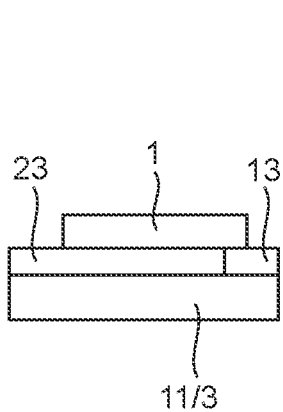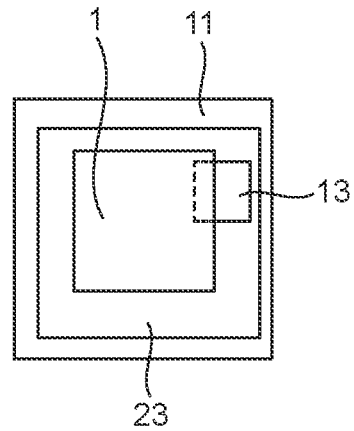
FIG. 53A
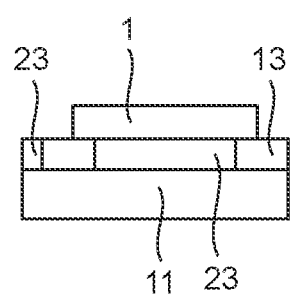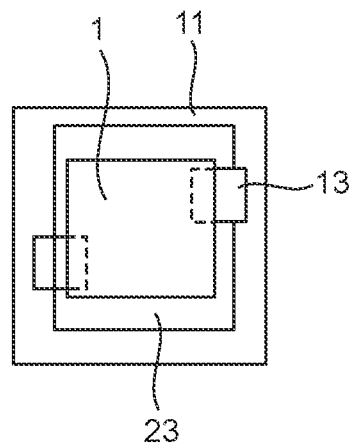
FIG. 53B
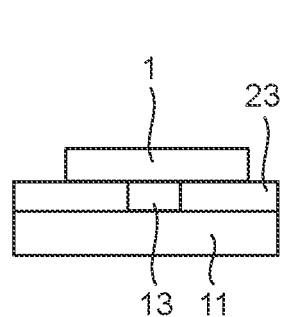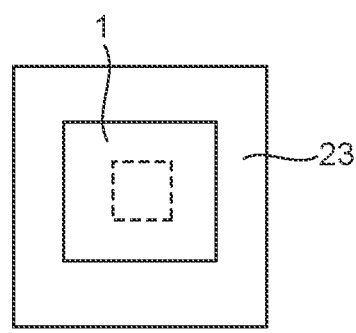
FIG. 53C

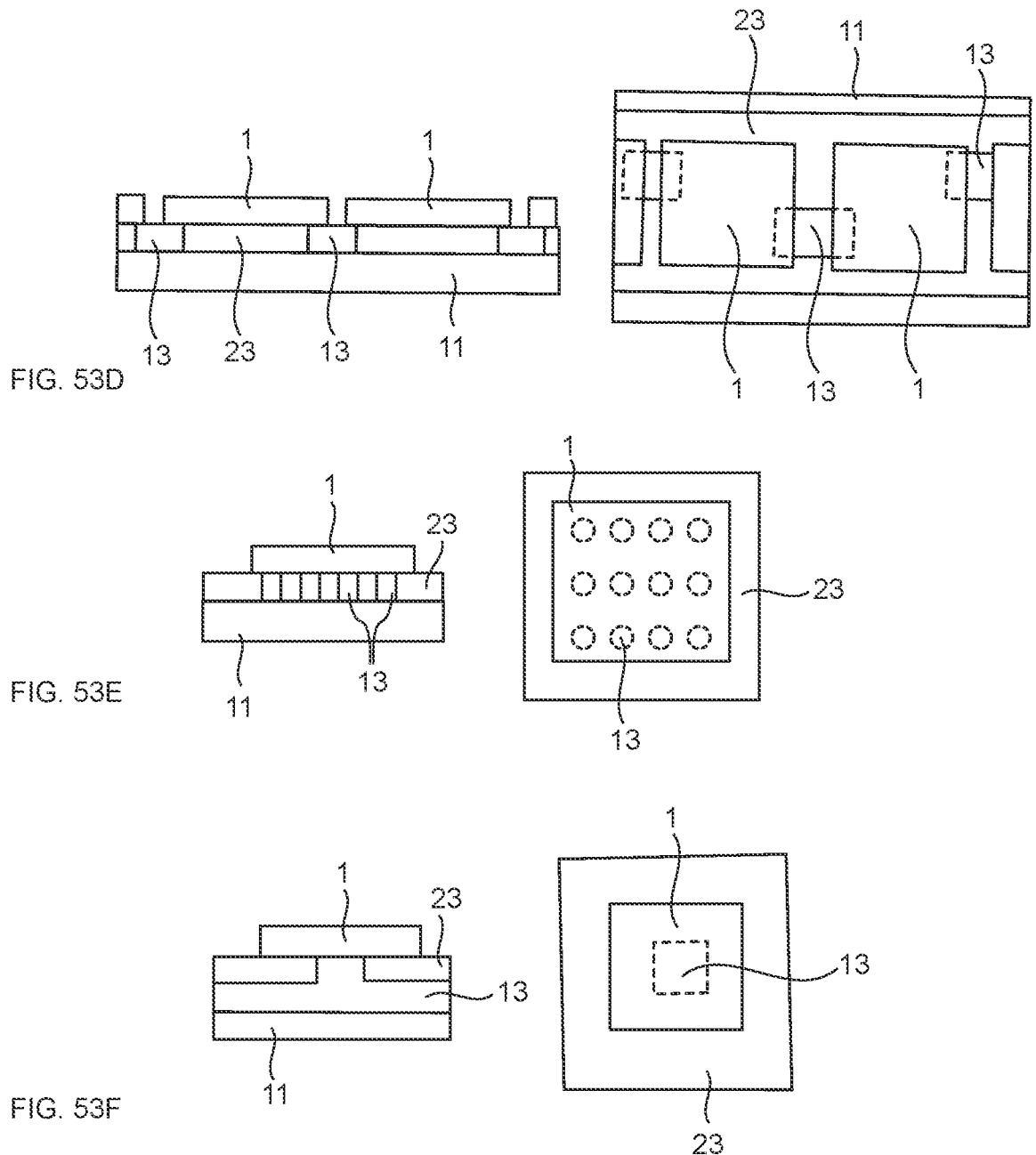

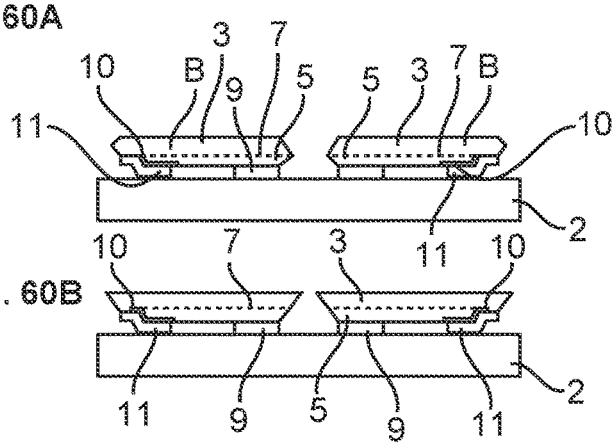
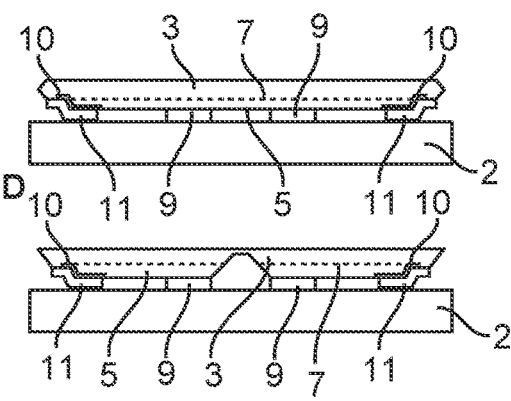
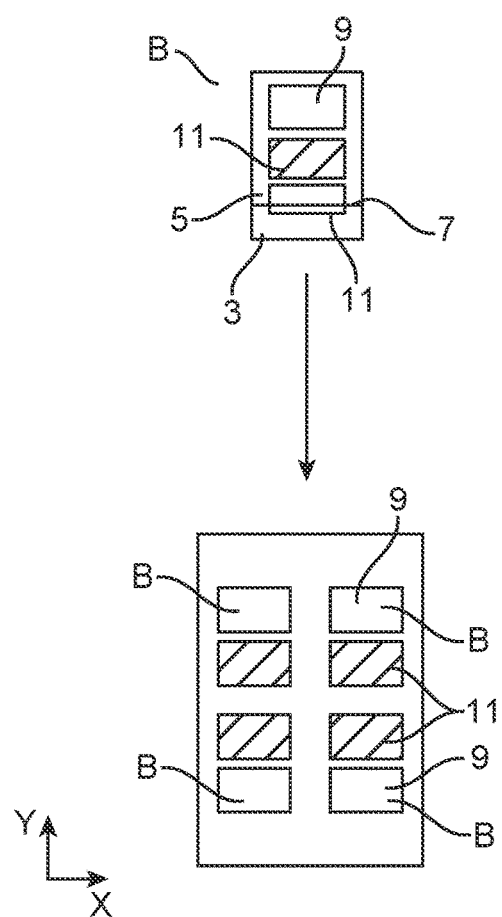
FIG. 59

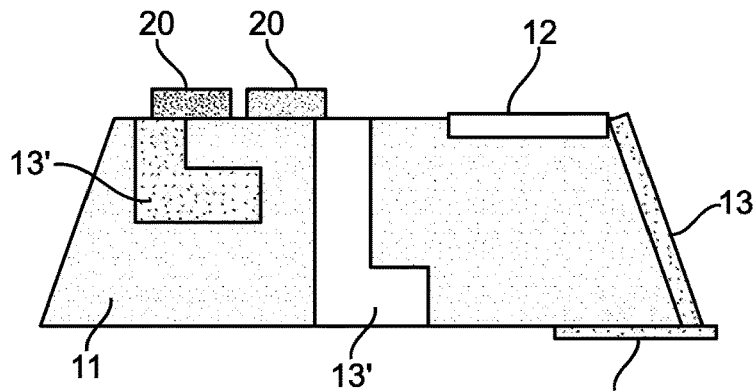
FIG. 76
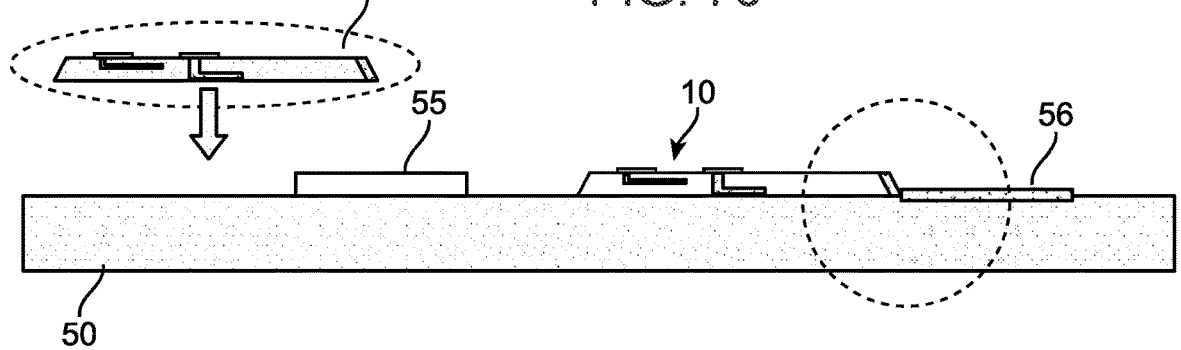
FIG. 77A
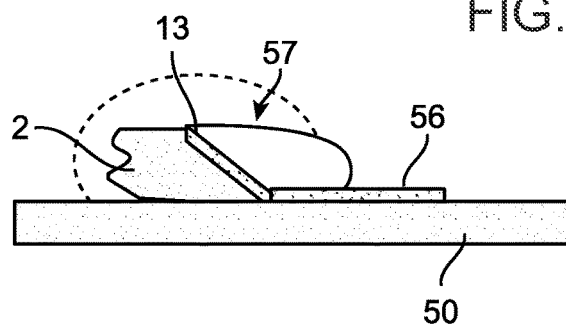
FIG. 77B
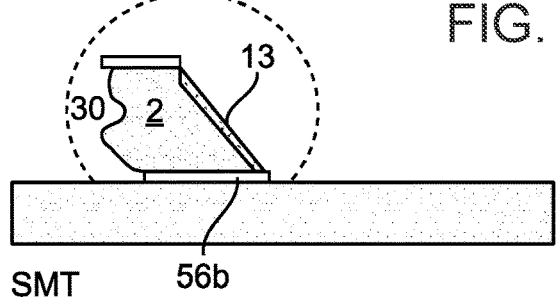
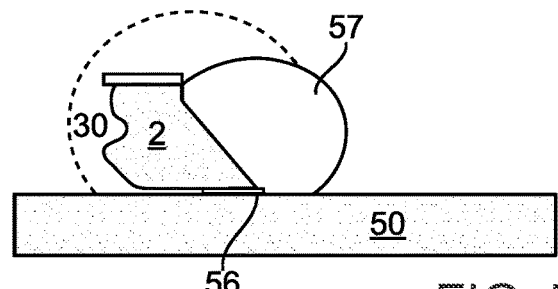
FIG. 77C

μ-LED, μ-LED DEVICE, DISPLAY FOR AUGMENTED REALITY OR LIGHTING APPLICATIONS

This patent application is a continuation of U.S. patent application Ser. No. 17/039,283 of Sep. 30, 2020, which claims the priorities of the German applications DE 10 2019 110 500.5 of 23 Apr. 2019, DE 10 2019 112 490.5 of 13 May 2019, DE 10 2019 112 604.5 of 14 May 2019, DE 10 2019 113 791.8 of 23 May 2019, DE 10 2019 125 875.8 of 25 Sep. 2019, DE 10 2019 121 672.9 of 12 Aug. 2019, DE 10 2019 113 768.3 of 23 May 2019, DE 10 2019 114 442.6 of 29 May 2019, DE 10 2019 129 209.3 of 29 Oct. 2019, and DE 10 2019 130 866.6 of 15 Nov. 2019, the disclosure of which are incorporated herein by way of reference. Finally, this application also claims priority from the PCT application PCT/EP2020/052191 of 29 Jan. 2020. The disclosure of PCT/EP2020/052191 is incorporated herein by reference in its entirety. Additionally, this patent application is related to the following co-pending patent applications: U.S. application Ser. No. 17/038,283, entitled "μ-LED, μ-LED Device, Display and Method for the Same," filed Sep. 30, 2020; U.S. application Ser. No. 17/039,097, entitled "μ-LED, μ-LED Device, Display and Method for the Same," filed Sep. 30, 2020; U.S. application Ser. No. 17/039,422, entitled "μ-LED, μ-LED Device, Display and Method for the Same," filed Sep. 30, 2020; and U.S. application Ser. No. 17/039,482, entitled "μ-LED, μ-LED Device, Display and Method for the Same," filed Sep. 30, 2020.

BACKGROUND

The ongoing current developments within the Internet of Things and the field of communication have opened the door for various new applications and concepts. For development, service and manufacturing purposes, these concepts and applications offer increased effectiveness and efficiency.

One aspect of new concepts is based on augmented or virtual reality. A general definition of "augmented reality" is given by an "interactive experience of the real environment, whereby the objects from it, which are in the real world, are augmented by computer generated perceptible information".

The information is mostly transported by visualization, but is not limited to visual perception. Sometimes haptic or other sensory perceptions can be used to expand reality. In the case of visualization, the superimposed sensory-visual information can be constructive, i.e. additional to the natural environment, or it can be destructive, for example by obscuring parts of the natural environment. In some applications, it is also possible to interact with the superimposed sensory information in one way or another. In this way, augmented reality reinforces the ongoing perception of the user of the real environment.

In contrast, "virtual reality" completely replaces the real environment of the user with an environment that is completely simulated. In other words, while in an augmented reality environment the user is able to perceive the real world at least partially, in a virtual reality the environment is completely simulated and may differ significantly from reality.

Augmented Reality can be used to improve natural environmental situations, enriching the user's experience or supporting the user in performing certain tasks. For example, a user may use a display with augmented reality features to assist him in performing certain tasks. Because information about a real object is superimposed to provide clues to the user, the user is supported with additional information, allowing the user to act more quickly, safely and effectively during manufacturing, repair or other services. In the medical field, augmented reality can be used to guide and support the doctor in diagnosing and treating the patient. In development, an engineer may experience the results of his experiments directly and can therefore evaluate the results more easily. In the tourism or event industry, augmented reality can provide a user with additional information about sights, history, and the like. Augmented Reality can support the learning of activities or tasks.

SUMMARY

In the following summary different aspects for μ-displays in the automotive and augmented reality applications are explained. This includes devices, displays, controls, process engineering methods and other aspects suitable for augmented reality and automotive applications. This includes aspects which are directed to light generation by means of displays, indicators or similar. In addition, control circuits, power supplies and aspects of light extraction, light guidance and focusing as well as applications of such devices are listed and explained by means of various examples.

Because of the various limitations and challenges posed by the small size of the light-generating components, a combination of the various aspects is not only advantageous, but often necessary. For ease of reference, this disclosure is divided into several sections with similar topics. However, this should explicitly not be understood to mean that features from one topic can not be combined with others. Rather, aspects from different topics should be combined to create a display for augmented reality or other applications or even in the automotive sector.

For considerations of the following solutions, some terms and expressions should be explained in order to define a common and equal understanding. The terms listed are generally used with this understanding in this document. In individual cases, however, there may be deviations from the interpretation, whereby such deviation will be specifically referred to.

"Active Matrix Display"

The term "active matrix display" was originally used for liquid crystal displays containing a matrix of thin film transistors that drive LCD pixels. Each individual pixel has a circuit with active components (usually transistors) and power supply connections. At present, however, this technology should not be limited to liquid crystals, but should also be used in particular for driving μ-LEDs or μ-displays.

"Active Matrix Carrier Substrate"

"Active matrix carrier substrate" or "active matrix backplane" means a drive for light emitting diodes of a display with thin-film transistor circuits. The circuits may be integrated into the backplane or mounted on it. The "active matrix carrier substrate" has one or more interface contacts, which form an electrical connection to a μ-LED display structure. An "active-matrix carrier substrate" can thus be part of an active-matrix display or support it.

"Active Layer"

The active layer is referred to as the layer in an optoelectronic component or light emitting diode in which charge carriers recombine. In its simplest form, the active layer can be characterized by a region of two adjacent semiconductor layers of different conductivity type. More complex active layers comprise quantum wells (see there), multi-quantum wells or other structures that have additional properties. Similarly, the structure and material systems can be used to adjust the band gap (see there) in the active layer, which determines the wavelength and thus the color of the light.

"Alvarez Lens Array"

With the use of Alvarez lens pairs, a beam path can be adapted to video eyewear. An adjustment optic comprises an Alvarez lens arrangement, in particular a rotatable version with a Moire lens arrangement. Here, the beam deflection is determined by the first derivative of the respective phase plate relief, which is approximated, for example, by $z=ax2+by2+cx+dy+e$ for the transmission direction z and the transverse directions x and y, and by the offset of the two phase plates arranged in pairs in the transverse directions x and y. For further design alternatives, swivelling prisms are provided in the adjustment optics.

"Augmented Reality (AR)"

This is an interactive experience of the real environment, where the subject of the picking up is located in the real world and is enhanced by computer-generated perceptible information. Extended reality is the computer-aided extension of the perception of reality by means of this computer-generated perceptible information. The information can address all human sensory modalities. Often, however, augmented reality is only understood to be the visual representation of information, i.e. the supplementation of images or videos with computer-generated additional information or virtual objects by means of fade-in/overlay. Applications and explanations of the mode of operation of Augmented Reality can be found in the introduction and in the following in execution examples.

"Automotive."

Automotive generally refers to the motor vehicle or automobile industry. This term should therefore cover this branch, but also all other branches of industry which include µ-displays or generally light displays—with very high resolution and µ-LEDs.

"Bandgap"

Bandgap, also known as band gap or forbidden zone, is the energetic distance between the valence band and conduction band of a solid-state body. Its electrical and optical properties are largely determined by the size of the band gap. The size of the band gap is usually specified in electron volts (eV). The band gap is thus also used to differentiate between metals, semiconductors and insulators. The band gap can be adapted, i.e. changed, by various measures such as spatial doping, deforming of the crystal lattice structure or by changing the material systems. Material systems with so-called direct band gap, i.e. where the maximum of the valence band and a minimum of the conduction band in the pulse space are superimposed, allow a recombination of electron-hole pairs under emission of light.

"Bragg Grid"

Fibre Bragg gratings are special optical interference filters inscribed in optical fibres. Wavelengths that lie within the filter bandwidth around λB are reflected. In the fiber core of an optical waveguide, a periodic modulation of the refractive index is generated by means of various methods. This creates areas with high and low refractive indexes that reflect light of a certain wavelength (bandstop). The center wavelength of the filter bandwidth in single-mode fibers results from the Bragg condition.

"Directionality"

Directionality is the term used to describe the radiation pattern of a µ-LED or other light-emitting device. A high directionality corresponds to a high directional radiation, or a small radiation cone. In general, the aim should be to obtain a high directional radiation so that crosstalk of light into adjacent pixels is avoided as far as possible. Accordingly, the light-emitting component has a different brightness depending on the viewing angle and thus differs from a Lambert emitter.

The directionality can be changed by mechanical measures or other measures, for example on the side intended for the emission. In addition to lenses and the like, this includes photonic crystals or pillar structures (columnar structures) arranged on the emitting surface of a pixelated array or on an arrangement of, in particular, µ-LEDs. These generate a virtual band gap that reduces or prevents the propagation of a light vector along the emitting surface.

"Far Field"

The terms near field and far field describe spatial areas around a component emitting an electromagnetic wave, which differ in their characterization. Usually the space regions are divided into three areas: reactive near field, transition field and far field. In the far field, the electromagnetic wave propagates as a plane wave independent of the radiating element.

"Fly Screen Effect"

The Screen Door Effect (SDE) is a permanently visible image artefact in digital video projectors. The term fly screen effect describes the unwanted black space between the individual pixels or their projected information, which is caused by technical reasons, and takes the form of a fly screen. This distance is due to the construction, because between the individual LCD segments run the conductor paths for control, where light is swallowed and therefore cannot hit the screen. If small optoelectronic lighting devices and especially µ-LEDs are used or if the distance between individual light emitting diodes is too great, the resulting low packing density leads to possibly visible differences between pointy illuminated and dark areas when viewing a single pixel area. This so-called fly screen effect (screen door effect) is particularly noticeable at a short viewing distance and thus especially in applications such as VR glasses. Sub-pixel structures are usually perceived and perceived as disturbing when the illumination difference within a pixel continues periodically across the matrix arrangement. Accordingly, the fly screen effect in automotive and augmented reality applications should be avoided as far as possible.

"Flip Chip"

Flip-chip assembly is a process of assembly and connection technology for contacting unpackaged semiconductor chips by means of contact bumps, or short "bumps". In flip-chip mounting, the chip is mounted directly, without any further connecting wires, with the active contacting side down—towards the substrate/circuit carrier—via the bumps. This results in particularly small package dimensions and short conductor lengths. A flip-chip is thus in particular an electronic semiconductor component contacted on its rear side. The mounting may also require special transfer techniques, for example using an auxiliary carrier. The radiation direction of a flip chip is then usually the side opposite the contact surfaces.

"Flip-Flop"

A flip-flop, often called a bi-stable flip-flop or bi-stable flip-flop element, is an electronic circuit that has two stable states of the output signal. The current state depends not only on the input signals present at the moment, but also on the state that existed prior to the time under consideration. A dependence on time does not exist, but only on events. Due to the bi-stability, the flip-flop can store a data quantity of a single bit for an unlimited time. In contrast to other types of storage, however, power supply must be permanently guaranteed. The flip-flop, as the basic component of sequential circuits, is an indispensable component of digital technology and thus a fundamental component of many electronic circuits, from quartz watches to microprocessors. In particular, as an elementary one-bit memory, it is the basic element of static memory components for computers. Some designs can use different types of flip-flops or other buffer circuits to store state information. Their respective input and output signals are digital, i.e. they alternate between logical "false" and logical "true". These values are also known as "low" 0 and "high" 1.

"Head-Up Display"

The head-up display is a display system or projection device that allows users to maintain their head position or viewing direction by projecting information into their field of vision. The Head-up Display is an augmented reality system. In some cases, a Head-Up Display has a sensor to determine the direction of vision or orientation in space.

"Horizontal Light Emitting Diode"

With horizontal LEDs, the electrical connections are on a common side of the LED. This is often the back of the LED facing away from the light emission surface. Horizontal LEDs therefore have contacts that are only formed on one surface side.

"Interference Filter"

Interference filters are optical components that use the effect of interference to filter light according to frequency, i.e. color for visible light.

"Collimation"

In optics, collimation refers to the parallel direction of divergent light beams. The corresponding lens is called collimator or convergent lens. A collimated light beam contains a large proportion of parallel rays and is therefore minimally spread when it spreads. A use in this sense refers to the spreading of light emitted by a source. A collimated beam emitted from a surface has a strong dependence on the angle of radiation. In other words, the radiance (power per unit of a fixed angle per unit of projected source area) of a collimated light source changes with increasing angle. Light can be collimated by a number of methods, for example by using a special lens placed in front of the light source. Consequently, collimated light can also be considered as light with a very high directional dependence.

"Converter Material"

Converter material is a material, which is suitable for converting light of a first wavelength into a second wavelength. The first wavelength is shorter than the second wavelength. This includes various stable inorganic as well as organic dyes and quantum dots. The converter material can be applied and structured in various processes.

"Lambert Lamps"

For many applications, a so-called Lambertian radiation pattern is required. This means that a light-emitting surface ideally has a uniform radiation density over its area, resulting in a vertically circular distribution of radiant intensity. Since the human eye only evaluates the luminance (luminance is the photometric equivalent of radiance), such a Lambertian material appears to be equally bright regardless of the direction of observation. Especially for curved and flexible display surfaces, this uniform, angle-independent brightness can be an important quality factor that is sometimes difficult to achieve with currently available displays due to their design and LED technology.

LEDs and µ-LEDs resemble a Lambert spotlight and emit light in a large spatial angle. Depending on the application, further measures are taken to improve the radiation characteristics or to achieve greater directionality (see there).

"Conductivity Type"

The term "conductivity type" refers to the majority of (n- or p-) charge carriers in a given semiconductor material. In other words, a semiconductor material that is n-doped is considered to be of n-type conductivity. Accordingly, if a semiconductor material is n-type, then it is n-doped. The term "active" region in a semiconductor refers to a border region in a semiconductor between an n-doped layer and a p-doped layer. In this region, a radiative recombination of p- and n-type charge carriers takes place. In some designs, the active region is still structured and includes, for example, quantum well or quantum dot structures.

"Light Field Display"

Virtual retinal display (VNA) or light field display is referred to a display technology that draws a raster image directly onto the retina of the eye. The user gets the impression of a screen floating in front of him. A light field display can be provided in the form of glasses, whereby a raster image is projected directly onto the retina of a user's eye. In the virtual retina display, a direct retinal projection creates an image within the user's eye. The light field display is an augmented reality system.

"Lithography" or "Photolithography"

Photolithography is one of the central methods of semiconductor and microsystem technology for the production of integrated circuits and other products. The image of a photomask is transferred onto a photosensitive photoresist by means of exposure. Afterwards, the exposed areas of the photoresist are dissolved (alternatively, the unexposed areas can be dissolved if the photoresist is cured under light). This creates a lithographic mask that allows further processing by chemical and physical processes, such as applying material to the open areas or etching depressions in the open areas. Later, the remaining photoresist can also be removed.

"µ-LED"

A µ-LED is an optoelectronic component whose edge lengths are less than 70 µm, especially down to less than 20 µm, especially in the range of 1 µm to 10 µm. Another range is between 10 to 30 µm. This results in an area of a few hundred µm² down to several tens of µm². For example, a µ-LED can comprise an area of about 60 µm² with an edge length of about 8 µm. In some cases, a µ-LED has an edge length of 5 µm or less, resulting in a size of less than 30 µm². Typical heights of such µ-LEDs are, for example, in the range of 1.5 µm to 10 µm.

In addition to classic lighting applications, displays are the main applications for µ-LEDs. The µ-LEDs form pixels or subpixels and emit light of a defined color. Due to their small pixel size and high density with a small pitch, µ-LEDs are suitable for small monolithic displays for AR applications, among other things.

Due to the above-mentioned very small size of a µ-LED, the production and processing is significantly more difficult compared to previous larger LEDs. The same applies to additional elements such as contacts, package, lenses etc. Some aspects that can be realized with larger optoelectronic components cannot be produced with µ-LEDs or only in a different way. In this respect, a µ-LED is therefore significantly different from a conventional LED, i.e. a light emitting device with an edge length of 200 µm or more.

"µ-LED Array"

See at µ-Display

"µ-Display"

A µ-display or µ-LED array is a matrix with a plurality of pixels arranged in defined rows and columns. With regard to its functionality, a µ-LED array often forms a matrix of µ-LEDs of the same type and color. Therefore, it rather provides a lighting surface. The purpose of a µ-display, on the other hand, is to transmit information, which often results in the demand for different colors or an addressable control for each individual pixel or subpixel. A μ-display can be made up of several μ-LED arrays, which are arranged together on a backplane or other carrier. Likewise, a μ-LED array can also form a μ-Display.

The size of each pixel is in the order of a few μm, similar to μ-LEDs. Consequently, the overall dimension of a μ display with 1920*1080 pixels with a μ-LED size of 5 μm per pixel and directly adjacent pixels is in the order of a few 10 mm$^2$. In other words, a μ-display or μ-LED array is a small-sized arrangement, which is realized by means of μ-LEDs.

μ-displays or μ-LED arrays can be formed from the same, i.e. from one work piece. The μ-LEDs of the μ-LED array can be monolithic. Such μ-displays or μ-LED arrays are called monolithic μ-LED arrays or μ-displays.

Alternatively, both assemblies can be formed by growing μ-LEDs individually on a substrate and then arranging them individually or in groups on a carrier at a desired distance from each other using a so-called Pick & Place process. Such μ-displays or μ-LED arrays are called non-monolithic. For non-monolithic μ-displays or μ-LED arrays, other distances between individual μ-LEDs are also possible. These distances can be chosen flexibly depending on the application and design. Thus, such μ-displays or μ-LED arrays can also be called pitch-expanded. In the case of pitch-expanded μ-displays or μ-LED arrays, this means that the μ-LEDs are arranged at a greater distance than on the growth substrate when transferred to a carrier. In a non-monolithic μ-display or μ-LED array, each individual pixel can comprise a blue light-emitting μ-LED and a green light-emitting μ-LED as well as a red light-emitting μ-LED.

To take advantage of different advantages of monolithic μ-LED arrays and non-monolithic μ-LED arrays in a single module, monolithic μ-LED arrays can be combined with non-monolithic μ-LED arrays in a μ-display. Thus, μ-displays can be used to realize different functions or applications. Such a display is called a hybrid display.

"μ-LED Nano Column"

A μ-LED nano column is generally a stack of semiconductor layers with an active layer, thus forming a μ-LED. The μ-LED nano column has an edge length smaller than the height of the column. For example, the edge length of a μ-LED nanopillar is approximately 10 nm to 300 nm, while the height of the device can be in the range of 200 nm to 1 μm or more.

"μ-Rod"

μ-rod or Rod designates in particular a geometric structure, in particular a rod or bar or generally a longitudinally extending, for example cylindrical, structure. μ-rods are produced with spatial dimensions in the μm to nanometer range. Thus, nanorods are also included here.

"Nanorods"

In nanotechnology, nanorods are a design of nanoscale objects. Each of their dimensions is in the range of about 10 nm to 500 nm. They may be synthesized from metal or semiconducting materials. Aspect ratios (length divided by width) are 3 to 5. Nanorods are produced by direct chemical synthesis. A combination of ligands acts as a shape control agent and attaches to different facets of the nanorod with different strengths. This allows different shapes of the nanorod with different growth rates to produce an elongated object. μLED nanopillars are such nanorods.

"Miniature LED"

Their dimensions range from 100 μm to 750 μm, especially in the range larger than 150 μm.

"Moiré Effect" and "Moiré Lens Arrangement"

The moiré effect refers to an apparent coarse raster that is created by overlaying regular, finer rasters. The resulting pattern, whose appearance is similar to patterns resulting from interference, is a special case of the aliasing effect by subsampling. In the field of signal analysis, aliasing effects are errors that occur when the signal to be sampled contains frequency components that are higher than half the sampling frequency. In image processing and computer graphics, aliasing effects occur when images are scanned and result in patterns that are not included in the original image. A moire lens array is a special case of an Alvarez lens array.

"Monolithic Construction Element"

A monolithic construction element is a construction element made of one piece. A typical such device is for example a monolithic pixel array, where the array is made of one piece and the μ-LEDs of the array are manufactured together on one carrier.

"Optical Mode"

A mode is the description of certain temporally stationary properties of a wave. The wave is described as the sum of different modes. The modes differ in the spatial distribution of the intensity. The shape of the modes is determined by the boundary conditions under which the wave propagates. The analysis according to vibration modes can be applied to both standing and continuous waves. For electromagnetic waves, such as light, laser and radio waves, the following types of modes are distinguished: TEM or transverse electromagnetic mode, TE or H modes, TM or E modes. TEM or transverse electromagnetic mode: Both the electric and the magnetic field components are always perpendicular to the direction of propagation. This mode is only propagation-capable if either two conductors (equipotential surfaces) insulated from each other are available, for example in a coaxial cable, or no electrical conductor is available, for example in gas lasers or optical fibers. TE or H modes: Only the electric field component is perpendicular to the direction of propagation, while the magnetic field component is in the direction of propagation. TM or E modes: Only the magnetic field component is perpendicular to the propagation direction, while the electric field component points in the propagation direction.

"Optoelectronic Device"

An optoelectronic component is a semiconductor body that generates light by recombination of charge carriers during operation and emits it. The light generated can range from the infrared to the ultraviolet range, with the wavelength depending on various parameters, including the material system used and doping. An optoelectronic component is also called a light emitting diode.

For the purpose of this disclosure, the term optoelectronic device or also light-emitting device is used synonymously. A μ-LED (see there) is thus a special optoelectronic device with regard to its geometry. In displays, optoelectronic components are usually monolithic or as individual components placed on a matrix.

"Passive matrix backplane" or "passive matrix carrier substrate" A passive matrix display is a matrix display, in which the individual pixels are driven passively (without additional electronic components in the individual pixels). A light emitting diode of a display can be controlled by means of IC circuits. In contrast, displays with active pixels driven by transistors are referred to as active matrix displays. A passive matrix carrier substrate is part of a passive matrix display and carries it.

"Photonic Crystal" or "Photonic Structure"

A photonic structure can be a photonic crystal, a quasi-periodic or deterministically aperiodic photonic structure. The photonic structure generates a band structure for photons by a periodic variation of the optical refractive index. This band structure can comprise a band gap in a certain frequency range. As a result, photons cannot propagate through the photonic structure in all spatial directions. In particular, propagation parallel to a surface is often blocked, but perpendicular to it is possible. In this way, the photonic structure or the photonic crystal determines a propagation in a certain direction. It blocks or reduces this in one direction and thus generates a beam or a bundle of rays of radiation directed as required into the room or radiation area provided for this purpose.

Photonic crystals are photonic structures occurring or created in transparent solids. Photonic crystals are not necessarily crystalline—their name derives from analogous diffraction and reflection effects of X-rays in crystals due to their lattice constants. The structure dimensions are equal to or greater than a quarter of the corresponding wavelength of the photons, i.e. they are in the range of fractions of a μm to several μm. They are produced by classical lithography or also by self-organizing processes.

Similar or the same property of a photonic crystal can alternatively be produced with non-periodic but nevertheless ordered structures. Such structures are especially quasiperiodic structures or deterministically aperiodic structures. These can be for example spiral photonic arrangements.

In particular, so-called two-dimensional photonic crystals are mentioned here as examples, which exhibit a periodic variation of the optical refractive index in two mutually perpendicular spatial directions, especially in two spatial directions parallel to the light-emitting surface and perpendicular to each other.

However, there are also one-dimensional photonic structures, especially one-dimensional photonic crystals. A one-dimensional photonic crystal exhibits a periodic variation of the refractive index along one direction. This direction can be parallel to the light exit plane. Due to the one-dimensional structure, a beam can be formed in a first spatial direction. Thereby a photonic effect can be achieved already with a few periods in the photonic structure. For example, the photonic structure can be designed in such a way that the electromagnetic radiation is at least approximately collimated with respect to the first spatial direction. Thus, a collimated beam can be generated at least with respect to the first direction in space.

"Pixel"

Pixel, pixel, image cell or picture element refers to the individual color values of a digital raster graphic as well as the area elements required to capture or display a color value in an image sensor or screen with raster control. A pixel is thus an addressable element in a display device and comprises at least one light-emitting device. A pixel has a certain size and adjacent pixels are separated by a defined distance or pixel space. In displays, especially μ-displays, often three (or in case of additional redundancy several) subpixels of different color are combined to one pixel.

"Planar Array"

A planar array is an essentially flat surface. It is often smooth and without protruding structures. Roughness of the surface is usually not desired and does not have the desired functionality. A planar array is for example a monolithic, planar array with several optoelectronic components.

"Pulse Width Modulation"

Pulse width modulation or PWM is a type of modulation for driving a component, in particular a μ-LED. Here the PWM signal controls a switch that is configured to switch a current through the respective μ-LED on and off so that the μ-LED either emits light or does not emit light. With the PWM, the output provides a square wave signal with a fixed frequency f. The relative quantity of the switch-on time compared to the switch-off time during each period T (=1/f) determines the brightness of the light emitted by the μ-LED. The longer the switch-on time, the brighter the light.

"Quantum Well"

A quantum well or quantum well refers to a potential in a band structure in one or more semiconductor materials that restricts the freedom of movement of a particle in a spatial dimension (usually in the z-direction). As a result, only one planar region (x, y plane) can be occupied by charge carriers. The width of the quantum well significantly determines the quantum mechanical states that the particles can assume and leads to the formation of energy levels (sub-bands), i.e. the particle can only assume discrete (potential) energy values.

"Recombination"

In general, a distinction is made between radiative and non-radiative recombination. In the latter case, a photon is generated which can leave a component. A non-radiative recombination leads to the generation of phonons, which heat a component. The ratio of radiative to non-radiative recombination is a relevant parameter and depends, among other things, on the size of the component. In general, the smaller the component, the smaller the ratio and non-radiative recombination increases in relation to radiative recombination.

"Refresh Time"

Refresh time is the time after which a cell of a display or similar must be rewritten so that it either does not lose the information or the refresh is predetermined by external circumstances.

"Die" or "Light-Emitting Body"

A light-emitting body or also a die is a semiconductor structure which is separated from a wafer after production on a wafer and which is suitable for generating light after an electrical contact during operation. In this context, a die is a semiconductor structure, which contains an active layer for light generation. The die is usually separated after contacting, but can also be processed further in the form of arrays.

"Slot Antenna"

A slot antenna is a special type of antenna in which instead of surrounding a metallic structure in space with air (as a nonconductor), an interruption of a metallic structure (e.g. a metal plate, a waveguide, etc.) is provided. This interruption causes an emission of an electromagnetic wave whose wavelength depends on the geometry of the interruption. The interruption often follows the principle of the dipole, but can theoretically have any other geometry. A slot antenna thus comprises a metallic structure with a cavity resonator having a length of the order of magnitude of wavelengths of visible light. The metallic structure can be located in or surrounded by an insulating material. Usually, the metallic structure is earthed to set a certain potential.

"Field of Vision"

Field of view (FOV) refers to the area in the field of view of an optical device, a sun sensor, the image area of a camera (film or picking up sensor) or a transparent display within which events or changes can be perceived and recorded. In particular, a field of view is an area that can be seen by a human being without movement of the eyes. With reference to augmented reality and an apparent object placed in front of the eye, the field of view comprises the area indicated as a number of degrees of the angle of vision during stable fixation of the eye.

"Subpixels"

A subpixel (approximately "subpixel") describes the inner structure of a pixel. In general, the term subpixel is associated with a higher resolution than can be expected from a single pixel. A pixel can also consist of several smaller subpixels, each of which radiates a single color. The overall color impression of a pixel is created by mixing the individual subpixels. A subpixel is thus the smallest addressable unit in a display device. A subpixel also comprises a certain size that is smaller than the size of the pixel to which the subpixel is assigned.

"Vertical Light Emitting Diode"

In contrast to the horizontal LED, a vertical LED comprises one electrical connection on the front and one on the back of the LED. One of the two sides also forms the light emission surface. Vertical LEDs thus comprise contacts that are formed towards two opposite main surface sides. Accordingly, it is necessary to deposit an electrically conductive but transparent material so that on the one hand, electrical contact is ensured and on the other hand, light can pass through.

"Virtual Reality"

Virtual reality, or VR for short, is the representation and simultaneous perception of reality and its physical properties in a real-time computer-generated, interactive virtual environment. A virtual reality can completely replace the real environment of an operator with a fully simulated environment.

In the following aspects of the Processing and methods for the production of a µ-LED or a µ-display or module are examined in more detail. However, aspects of processing also include aspects relating to semiconductor structures or materials and vice versa. In this respect, the following aspects can be combined with the many ideas and aspect of µ-LED manufacturing or µ-LED devices themselves examples of such µ-LED devices can be found in WO application PCT/EP2020/052191, the disclosure of which is incorporated herein by reference in its entirety.

Due to the manufacturing process and the extremely small dimensions of individual optical elements, it can sometimes happen that individual pixel elements from the plurality of pixels in a display can be defective. This problem has an increased impact on monolithic µ-display modules, since defects or variations in production lead very quickly to the failure of a pixel due to its small size. If the defect density becomes too high, the entire module has to be replaced. Especially with monolithic displays, individual defective pixels cannot be replaced.

Known solutions try to compensate for a failed pixel, for example, by adjusting surrounding or adjacent pixels to a higher luminosity and thereby at least partially compensating for the missing light of the defective pixel. Since in many cases the replacement or repair of these defective pixels does not appear to be economically and procedurally sensible, it is desirable to be able to use a manufactured display with sufficiently good quality despite isolated defective pixels.

The aspects described below concerning Pixel elements with electrically separated and optically coupled subpixels can compensate for such small defects so that an improved yield is achieved while maintaining the quality of the µ-displays or µ-display modules. These aspects are based on the consideration to use measures suitable for the prevention of optical crosstalk. Therefore, the measures proposed in the following are not only suitable for the above mentioned task, but a reduction of optical crosstalk has further advantages, if µ-LEDs are very close to each other especially in monolithic components and a good optical separation should be achieved. In very densely packed monolithic arrays or µ-displays or µ-display modules, a clean optical separation between pixels is necessary to prevent the emitted light of a µ-LED from radiating into an area of an adjacent pixel. To prevent optical crosstalk, trenches, or more generally, optically separating structures are often provided between two µ-LEDs. While on the one hand optical crosstalk should be suppressed to achieve a sufficiently good high-contrast image quality, the failure of a pixel may be more noticeable.

Therefore, an optical pixel element is proposed to generate a pixel of a display, which is formed by at least two subpixels. According to an example, 2, 4, 6, 9, 12 or 16 subpixels are provided per pixel element. In other words, a redundancy is created here, whereby the two subpixels receive the same driving information and are designed for the same wavelength, for example. So if one subpixel of these at least two subpixels fails, the pixel element can still emit light at this wavelength. According to an example, the luminosity of a subpixel can be adjusted to compensate for the missing light of a failed subpixel. According to an example, the subpixels are configured as so-called fields. For example, if a pixel element is designed as a rectangular structure, the subpixels within the structure of the pixel element are formed by a further subdivision into fields. Each of these subpixels in a field can be accessed independently of the subpixels in other fields.

The subpixels each have an optical emitter area. This is intended to ensure that each subpixel can be individually controlled and function independently. The emitter region comprises a p-n junction, one or more quantum well structures or other active layers intended for light generation. The emitter region is configured with a contact on its underside, which is intended for connection to a control unit or control electronics.

The control electronics is configured to control electrically the individual pixel elements as well as the individual subpixels. For example, the drive electronics or the control unit may be configured to detect a defect in a subpixel and no longer use the defective subpixel. Furthermore, according to an example, the drive electronics can be configured to drive an adjacent subpixel in such a way that a luminosity is increased in such a way that a luminosity of an adjacent failed subpixel is compensated. For this purpose, the control electronics can be provided with a memory unit, for example, which stores an operating state of a subpixel. In other words, a central acquisition of subpixels that are detected as defective can take place in the memory, in order to carry out defect compensation by luminosity adjustment or switching on or off of adjacent subpixels or pixel elements, if necessary. In another embodiment, for example, the time in which a subpixel is active can be increased to compensate for a failed subpixel. If, on the other hand, all subpixels are functional, the control circuit can also control them all with reduced luminosity, reduced duration or even multiplexed. Using functional subpixels with lower current and/or time duration may increase the lifetime of the subpixels.

To separate two adjacent subpixels within a pixel element from each other, a subpixel separation element is provided. The subpixel separating element has an electrically separating effect with regard to the control of the respective emitter chips or the control of the subpixels. In other words, this subpixel separating element can be configured in such a way that electrical interaction between the emitter chips of the adjacent subpixels is prevented.

Especially due to the use of semiconductors and the small distances between the emitter areas of the individual subpixels in the [μm] range, the control of an emitter chip can have secondary electrical or electromagnetic effects on spatially adjacent or surrounding areas. Under certain circumstances, this can lead to an adjacent emitter chip also being activated when driving a primary emitter chip. The subpixel separation element is therefore configured to prevent electrical crosstalk or electrical crosstalk to the adjacent subpixel and possible activation of the adjacent subpixel.

On the other hand, the subpixel separation element should be designed to couple optically the emitter chips of the neighbouring subpixels with respect to the emitted light, so that the visual impression that individual subpixels are switched off is counteracted. By optical coupling is meant here that light generated by a primary emitter chip or a primary subpixel can cross over to the adjacent subpixel by optical crosstalk. This is an advantageous way to prevent a dark dot or dark spot from being created by the defect of a subpixel. Instead, light from the adjacent subpixel can pass over and be emitted in the direction of emission from the defective subpixel. This is an advantageous way to compensate for the visible effect of a defective subpixel. The subpixel separating element therefore has no optical separating effect and should not be achieved.

This is an advantage if a subpixel fails. Due to the lack of optical separation, the pixel is still perceived as a whole and there is no different visual impression than when both subpixels are active. In one aspect, the subpixel separation element can be designed in such a way that it separates electrically but does not promote optical separation or even crosstalk. In one variant, the subpixel separating element is only drawn up to just before the active layer of the two subpixels or into the active layer. In other words, the subpixel separation element electrically separates two subpixel elements otherwise connected via common layers.

In one aspect, the subpixels have a common epitaxial layer. In many cases, pixel elements or entire displays are constructed in such a way that a common layer or several superimposed layers are grown, connecting a large number of subpixels and/or pixel elements. This can also be used to provide a common electrical contact or connection. According to an example, the epitaxial layer has Group III elements gallium, indium or aluminum, and Group V elements nitrogen, arsenic or phosphorus, or combinations thereof, or material systems with the mentioned elements. Among other things, this can influence the color and wavelength of the emitted light of a light emitting diode. The epitaxial layer can also have active semiconductor layers, e.g. a p-doped region and an n-doped region including the active interface regions.

For example, an emitter chip is arranged on a first side of the epitaxial layer transverse to a longitudinal extension of an epitaxial layer plane. Its light is then emitted across the epitaxial layer in the direction of a second opposite side of the epitaxial layer and radiated from there. The subpixel separation element extends trench-like into the epitaxial layer across the epitaxial layer plane, starting from the first side of the epitaxial layer where the emitter chip or the μ-LED is arranged.

In other words, the subpixel separation element is implemented here as a recess, gap, slit or similar structure, which can also be filled with an electrically insulating material. The insulating material should also be optically transparent to facilitate optical crosstalk. According to an example, the length of the trench is selected in such a way that drive signals to a subpixel do not electrically cross over to a secondary adjacent subpixel of the same pixel. Such a trench-like structure increases, among other things, the electrical resistance due to the significantly longer path of the current flow, thus creating electrical decoupling.

The optical effects that affect the emitted light, in turn, affect an area of the epitaxial layer that is further in the middle or further towards the second far side of the epitaxial layer. Thus, the depth of the trench is chosen to ensure electrical decoupling, but on the other hand, the trench ends before an area of the epitaxial layer where light can be transmitted between two adjacent subpixels. For example, the emitter chip's direction of emission runs across the epitaxial layer to allow light to exit at the opposite second side.

According to an example, the trench runs at a right angle relative to the epitaxial layer plane. Assuming this course of the trench, another example shows that a length d1 of the trench is smaller than an overall thickness of the epitaxial layer. It is assumed that the epitaxial layer has at least approximately the same total thickness over a large number of pixel elements and subpixels. According to another example, the length d1 of the trench between the pixel elements is equal to the thickness of the epitaxial layer. In other words, the trench is continuous from the first side of the epitaxial layer to the second side of the epitaxial layer. According to another example, the trench runs continuously diagonally through the epitaxial layer at an angle between 0 and 90° relative to the epitaxial layer plane.

In one aspect, each pixel element or its subpixel elements comprises several semiconductor layers in the form of a layer sequence, with an active layer for generating light. The active layer may comprise quantum wells or any other structure prepared to generate light. In an aspect, one or more layers extend over several pixels or subpixels. For example, the active layer may be intended to extend over several subpixels of a color.

According to an aspect, the subpixels or pixel elements are electrically contactable and/or controllable independently of each other. For this purpose, for example, contacts can be provided on the side of the subpixels that is remote from an epitaxial layer. These can be mechanical contacts, solder connections, clamp connections or similar. The decisive factor here is that the subpixels of the individual subpixels can be contacted and electrically operated without significant interaction with the adjacent subpixels of the adjacent subpixels. This can be especially advantageous for detecting the functional or operating state of a subpixel, since diagnostic information can be generated individually for each subpixel. It is also useful to switch individual subpixels on or off without including the adjacent subpixels. This reduces thermal or other stress on the subpixels at higher intensities, since several subpixels can be operated simultaneously at lower intensities.

According to another aspect, the contacting of the individual subpixels takes place via a carrier substrate. On the one hand, the carrier substrate should provide mechanical stability and, on the other hand, integrate the fine conductor structures for the individual contacting of the individual sub-pixels. Other elements such as control electronics or driver circuits can also be integrated in the carrier substrate and especially in silicon wafers. This can have the same material system, but also a different material system via matching layers. In this way, silicon can also be used as a carrier material. This means that circuits for control in particular can be easily implemented in this carrier.

According to an example, a brightness of the pixel element can be adjusted by switching individual subpixels off or on. The advantage here is that switching off or switching on alone can already provide effective brightness control. This can, for example, significantly simplify a control electronics or a control unit. According to another example, the brightness of one or more subpixels of the pixel element can also be adjusted. Hereby a brightness can be adjusted or calibrated in even finer gradations, or a color spectrum can be adjusted or calibrated more precisely in interaction with different wavelengths of the subpixels of the same pixel element. The brightness can be adjusted by PWM control. If a subpixel has failed, an equivalent brightness can still be achieved by extending the PWM control accordingly. Conversely, if the subpixels are intact, the PWM drive can be adjusted, allowing the subpixels to operate at their maximum efficiency and possibly also resulting in lower thermal stress and thus a longer lifetime.

If, for example, eight subpixels are structured in a pixel element, a brightness dynamic of $2^3$ levels can be achieved without varying other control variables such as current or on-time. In other words, a dynamic range can be increased by a factor of $2^3$ in this design variant. This can also limit the complexity of the control electronics and thus the corresponding costs.

In another aspect, a µ-display is proposed, which has a plurality of pixel elements as described above and below. According to an aspect, such a µ-display can be an optical semiconductor display, e.g. for applications in the augmented reality area or in the automotive sector, where small displays with very high resolutions are used. Such a display can also be used in portable devices such as smart watches or wearables.

A pixel element separation layer is provided between two adjacent pixel elements. This is configured in such a way that the adjacent pixel elements are electrically separated with respect to the control of the respective pixel elements. Furthermore, the pixel element separation layer is configured in such a way that the light emitted by the pixel elements is optically separated. A pixel element separation layer can initially be understood abstractly as any structure or material that separates two pixel elements from each other. Usually, a large number of such pixel elements are arranged next to each other in one plane, for example on a carrier surface, and are connected to control electronics via contacts. In this way, a display can be formed in its entirety.

The electrical and electromagnetic separation is intended to ensure that a pixel element can be driven independently of the adjacent adjacent pixel elements and that there is minimal or no electrical or electromagnetic interaction, in particular no optical interaction. This is important for the sole purpose of being able to generate each pixel independently of the others for displaying a specific image content on the display. The optical separation in turn is necessary in order to achieve sufficient sharpness and contrast, or the ability to separate the individual pixels from one another on the display.

In an aspect, several pixel elements have a common epitaxial layer. The pixel element separation layer is trench-like and extends transversely to the epitaxial layer plane in the emission direction of the emitter chips. In other words, the pixel element separation layer is adapted as a trench, slit, slot or similar recess, which either does not contain any solid material or, for example, comprises a reflecting or absorbing material. In one example, the pixel separation element is filled with an insulating material in which a mirror layer is incorporated. The insulating material electrically separates two adjacent pixels and the mirror element prevents optical crosstalk. In some embodiments, the mirror element is also designed to collimate or support the light.

The pixel element separation layer is configured to prevent electrical or electromagnetic signals from being transmitted from one pixel element to another pixel element. At the same time, the pixel element separation layer should achieve that as little or no light as possible is emitted from one pixel element to an adjacent pixel element. In an example, the pixel element separation layer can be formed simply by placing two separated pixel elements next to each other when they are arranged, resulting in a corresponding insulating or reflective boundary layer. According to an example, the trench is perpendicular to the epitaxial layer plane, and a length of the pixel element separation layer is less than or equal to the thickness of the epitaxial layer.

According to another aspect, the trench depth of the pixel element separation layer is greater than a trench depth of the subpixel separation layer. This is supposed to offer the advantage that the pixel element separation layer causes an electrical as well as an optical separation by its greater length. On the other hand, only an electrical separation is achieved due to the smaller trench depth between the subpixels, whereby optical crosstalk is definitely desired. In some aspects, the depth of the pixel element separation layer reaches through the active layer of second adjacent pixels and separates them. In addition, the pixel element separation layer can reach to the emitting surface or just below.

In a further aspect, a procedure for calibrating a pixel element is proposed. This procedure is based on the idea that when a display is put into operation an optimal control should be possible. This can mean, for example, that defective subpixels are to be detected as such and then no further control is carried out. In this way, error messages or malfunctions can be avoided. By building up the pixel elements with the subpixels, it can be achieved that each subpixel can be individually controlled and checked.

Therefore, in a first step a subpixel of a pixel element is controlled, for example by an electronic control unit or a control unit. The next step is the acquisition of defect information of a subpixel. In other words, the control electronics can be configured and adapted in such a way that a malfunction or defect is detected. For this purpose, for example, a current intensity can be measured or other electrical quantities can be evaluated.

In a further step, the defect information is stored in a memory unit of the control unit. This information can be used, for example, to optimise the control by the control electronics. If, for example, a certain luminous intensity is to be achieved and it is known that a certain subpixel is defective, the control electronics can control the neighbouring subpixels in a correspondingly differentiated manner, for example to compensate for a luminous intensity. As a result, a quantity of light emitted by the pixel element would be exactly or nearly unchanged despite a defective subpixel and would not be noticed by a user.

In a further aspect of the method, the control, acquisition and storage is carried out sequentially for all individual subpixels of a pixel element. In other words, an electronic control unit can be configured in such a way that it checks all available subpixels one after the other via the individual separately addressable emitter chips and thus detects a functional state of the entire pixel element. According to an example, this can be done once when a display is switched on or after a certain period of time.

An extension of pixelated or other emitters, where optical and electrical crosstalk is reduced, is presented in the following concepts.

In conventional monolithic pixel arrays, it is common in some aspects to etch through the active zone in order to separate and address the individual pixels individually. However, the etching process through the active layer causes defects, which on the one hand can lead to, increased leakage currents at the edges and on the other hand produce additional non-radiative recombination. As the pixels become smaller and smaller, the relative damage area effectively increases. Conventionally, the edge of the etched active zone is passivated by various methods to solve the problem. Such methods are regrowth, in-situ passivation, diffusion of species to shift the pn-junction and increase the band gap around the active zone, and wet etch washing to remove the damage as far as possible.

Under the proposed principle, a pixel structure with a material bridge, which at least still includes the active layer. This reduces an increased defect density in the area of the active layer.

Thus an array of optoelectronic pixels or subpixels, in particular a micropixel emitter array, a micropixel detector array, or a combined micropixel detector-emitter array, comprises a respective pixel or subpixel forming an active zone between an n-doped layer and a p-doped layer. According to the proposed principle, between two adjacent formed pixels, material of the layer sequence from the n-doped side and from the p-doped side up to or in cladding layers or up to or at least partially into the active zone is interrupted or removed. In this way material transitions with a maximum thickness dC are formed, whereby electrical and/or optical conductivities in the material transition are reduced.

According to a second aspect, a method for the production of an array of optoelectronic pixels or subpixels is proposed, in which in a first step along the array a whole-surface layer sequence with an n-doped layer and a p-doped layer is provided, between which an active zone suitable for light emission is formed. Subsequently, between adjacent pixels to be formed, material of the layer sequence is removed from the n-doped side and from the p-doped side up to or into undoped cladding layers or up to shortly before or to the active zone. The removal can be done by an etching process. After removal, however, a material transition remains between the adjacent pixels, which comprises the active region and optionally a small area above, below or from both sides. This comprises a maximum thickness dC at which electrical and/or optical conductivity is effectively reduced by the material transition.

With the proposed concept, an array of pixels can be created over a large area. Material is removed by the etching process, but a material transition remains between adjacent pixels or sub-pixels, which encompasses the active layer. Thus, the etching process does not increase the defect density in the area of the active layer, especially in the pixel areas. Nevertheless, the individual pixels or sub-pixels are optically and electrically separated from each other. It is therefore proposed to manufacture micropixel emitter arrays and micropixel detector arrays formed by micropixels without etching through the active zone in such a way that optical and electrical crosstalk as well as performance and reliability losses of etched active zones are avoided. In this way, etching defects are avoided or their number is effectively reduced.

In this context, pixel or subpixel each denotes a µ-LED that emits light during operation. As a rule, several subpixels of different colors are combined into one pixel, also known as an image element.

According to one embodiment, the removed material can be at least partially replaced by a filler material. In other words, after the partial removal of the material and especially the n- or p-doped layers, the space created is filled up again, resulting in a planar surface. This allows the functions of mechanical support, bonding and/or electrical insulation to be provided.

According to a further embodiment, the removed material can be at least partially replaced by a material that has a relatively small band gap and thus absorbs light from the active zone. This effectively reduces optical crosstalk. Alternatively, the removed material can be at least partially replaced with a material having a high refractive index, in particular higher than the refractive index of one of the cladding layers or the active zone. This can effectively create highly refractive interfaces that stop the propagation of fundamental modes. Further alternative light absorbing material and/or material with high refractive index can be applied at a respective material transition in one aspect. Thus, the material influences a wave guide in the material transition and prevents crosstalk.

According to a further embodiment, the material with a high refractive index can be formed by diffusing or implanting a material increasing the refractive index into a filling material, in particular into a respective cladding layer. This allows the arrays to be easily and effectively improved with respect to crosstalk without etching.

Another aspect concerns a reduction of electrical crosstalk. According to this, a material for increasing light absorption and/or a material for increasing electrical resistance can be introduced into the active zone of a respective material transition. The corresponding procedures are relatively simple to carry out. Thus, the arrays can be effectively improved with respect to crosstalk in a simple way without etching.

According to a further embodiment, at least one optical structure, in particular a photonic crystal and/or a Bragg mirror, can be generated along the material transitions, at or in these. These are particularly effective elements for reducing optical crosstalk. Such a photonic crystal or structure can also be used to improve collimation of light.

In another aspect, an electrical bias can be applied to the two main surfaces of the material transitions by means of two opposite electrical contacts and an electrical field can be generated by a respective material transition. This is an effective element in reducing optical crosstalk. In this case, the electric field is generated by applying a bias voltage. This bias voltage can, for example, be derived from or originate from the voltage for operating the pixels. However, in some aspects such a field can also be determined by an inherent material property. In one aspect, for example, it is intended that an electric field is generated by means of an n-doped material and/or p-doped material applied to or grown on at least one of the two main surfaces of the material transitions by a respective material transition. Electric fields are thus built into the corresponding array, whereby it is not necessary to apply a voltage.

According to a further embodiment, the exposed main surfaces of the material transitions and/or exposed surface areas of the pixels can be electrically insulated and passivated by means of a respective passivation layer, in particular one containing silicon dioxide. In this way, current flow through selected areas of an array, in particular through the material transition acting as a waveguide, can be effectively and selectively prevented. The main surfaces of the pixels can be electrically contacted by means of contact layers, so that a vertical optical component is thereby produced. One of the main surfaces can be electrically connected to each other via a shared layer. According to a further embodiment, the material and/or the material transitions between a pixel and its neighbouring pixels can be formed differently to each other, especially depending on the direction.

For the production of a µ-LED display, it seems to be useful to during the processing to provide subunits of µ-LEDs, and separate these to be able to process them further. In this way, the subunits can be tested individually. If µ-LEDs in the subunits fail, it is not necessary to replace the entire µ-display, but only the subunit. On the other hand, by adapting one process step, the production can be made more flexible, so that different sizes can be produced. This approach is particularly suitable as a modular architecture for µ-LEDs.

According to an aspect of the modular architecture, a method for manufacturing µ-LED modules is proposed, with the steps Creating at least one layer stack providing a base module on a carrier;

depositing of a first contact to a surface area of the layer stack facing away from the carrier;

depositing of a second contact to a surface area of a first layer facing away from the carrier.

Alternatively, the following steps can be taken:

Generating at least one layer stack providing a base module, comprising a first layer formed on a carrier, on which an active transition layer and on which a second layer is formed;

opening a surface area of the first layer facing away from the substrate;

Connecting a first contact to a surface area of the second layer facing away from the carrier;

Connecting a second contact to the surface area of the first layer facing away from the carrier.

Accordingly, a µ-LED module then comprises at least one layer stack providing a base module, having a first layer formed on a carrier, on which an active transition layer and on which a second layer is formed, a first contact being connected to a surface region of the second layer facing away from the carrier, a second contact being connected to a surface region of the first layer facing away from the carrier.

In this way, a base module can be created as the basic component of a µ-LED module with, in particular, a contact level for the contacts. The base module is part of a larger system, but in its simplest form, it can in turn comprise a µ-LED. In one aspect, the base module contains several, at least two µ-LEDs. These can be controlled individually or can be adapted as redundant forms. Thus, according to a building block or modular principle, a whole can be divided into parts, which are called modules. With a rectangular or any other arbitrary shape and a common function of light emission, the modules can be easily joined together.

Starting point is a µ-LED with a horizontal architecture. The size of this optoelectronic component is designed to meet the requirements of the display sector, where the smallest chip sizes are required due to very narrow pixel pitches, in terms of emission area (about 300 µm2 or less). In order to meet the requirements of other applications such as video wall, the µ-LED architecture is designed in such a way that by a simple adaptation of one process step, namely the use of another mask for layer stack or mesa structuring, light emitting diodes can be produced that consist of several subunits of this smallest µ-LED.

For example, the basic size for a base module is 15 µm×10 µm. With the mask and a suitable contacting or separation, a component with 15 µm×20 µm or 30 µm×30 µm would be just as easy to produce, which in turn is suitable for various µ-LED display applications. As already mentioned, a component comprises one or more base modules, which in turn may comprise one or more µ-LEDs.

The modular design with the smallest chip currently required as the base unit or base module, with the possibility of converting it into a larger component with a multiple of the dimensions of the base unit, the base module, by only a minor adjustment during processing, saves resources during development and opens up a certain freedom in the production of such components. If, for example, applications in the µ-LED range with a different brightness or pixel pitch are required, the chips required for this can be produced relatively easily.

In one aspect, not only the mesa (stack of layers) is structured differently, but also a contact layer. To do this, two steps are varied, but it is no longer necessary to ensure that all contact pads are connected. By using a horizontal chip architecture, further process steps for n-contact connection, such as for the vertical chip after mounting on the target substrate, can be avoided. This can simplify manufacturing and thus reduce costs compared to other manufacturing techniques.

According to another aspect, the second contact can be formed by means of a dielectric to the transition layer and the second layer electrically insulated to and at the surface area of the second layer facing away from the carrier.

Depending on the application requirements, base modules are designed as a matrix along an X-Y plane along at least one row and along at least one column, with base modules of a respective row having the same orientation. The base modules of two adjacent rows are oriented in the same way if necessary. In this way, an electrical series connection of base modules can be easily implemented.

Alternatively, the base modules of two adjacent lines are oriented in opposite directions, whereby identical contacts are arranged adjacent to each other. In this way, an electrical parallel connection of base modules is easily realized. Since in horizontal µ-LEDs both contacts for n and p are located on the bottom side, it is advantageous to arrange the chips alternately in rows. In a 2×X configuration of the chip, the contacts for the p side for both base elements are located in the middle of the chip, the n contacts on the outside, thus minimizing the risk of a potential short circuit.

Removal of the at least one light emitting diode module from the plurality of base modules is in some aspects carried out by means of a deep edge structuring through the first layer, in particular from the side of the second layer. It can be carried out by means of laser lift-off, namely from the side of a carrier facing away from the module. An etching process would also be conceivable.

Another aspect deals with the question whether and to what extent such Sub-units with sensor can be provided. For µ-displays especially in the field of Augmented Reality but also for automotive applications, it can be useful to provide sensors to record reactions or other parameters of a user. For example, in an application in the field of Augmented Reality, one or more photo sensors can be provided in order to detect the direction of gaze or a change from one direction of gaze. The amount of light can also be recorded, for example to brighten or darken an image. The same sensors can also be used for displays in automotive applications. Sensors can also be used to detect the driver's attention in order to initiate measures if necessary in case of detected fatigue.

The inventors have recognized that future displays may not have sensors that are placed outside the display. Instead, the functionality of sensors behind or in a full-surface µ-display should be made possible as an alternative to previous separate solutions.

The subdivision into µ-LED modules revealed here is used for this purpose. Redundant places for subpixels can be equipped with sensors instead of µ-LEDs. According to a first aspect a µ-display with a target matrix is proposed, which is formed on a first carrier or end carrier. The matrix or µ-display has positions that can be filled with µ-LEDs. In addition, a number of components, in particular µ-LEDs, are formed on a second carrier or replacement carrier, so that a start matrix with the same spacing as the target matrix is created from positions that can be filled with components. Furthermore, the µ-LEDs are grouped on the replacement carrier to form a number of modules and these modules are separated from the second carrier, the modules being positioned and electrically connected on the first carrier in the target matrix in such a way that a number of positions which are unoccupied by components remain in the target matrix, at which at least one sensor element is positioned and electrically connected at least in part in each case. The vacant positions of the target matrix correspond in some aspects to sub-pixel positions or pixel positions.

Furthermore, the modules or sub-units of µ-LEDs disclosed in this application are now provided. Their size or spacing corresponds to the corresponding parameters of the occupiable positions of the target matrix. The subunits are grouped into modules and positioned and electrically contacted on the target matrix in such a way that a number of unoccupied positions remain in the matrix, to which at least one sensor element is at least partially positioned and electrically connected. Modules or sub-units are thus positioned on a display module or a display so that some positions remain unoccupied, which can thus be equipped with sensors. In this way, the sensors become part of the display. This has several advantages. For example, light falling on the display can be measured directly and then the illuminance of the module or even individual µ-LEDs can be adjusted depending on the location.

According to a second aspect, a process for the production of a µ-display is proposed. This has a target matrix with positions formed on a first carrier or end carrier and which can be occupied by µ-LEDs, arranged in rows and columns. The positions that can be occupied can correspond to subpixels. In addition, the locations show a size and spacing that substantially correspond to the modules disclosed herein. In other words, the target matrix comprises locations arranged in rows and columns and can be occupied by modules of µ-LEDs.

The modules are now produced as shown here, for example with flat and deep mesa etching and grouped into modules. The modules produced in this way are removed from the replacement carrier and positioned in the free spaces on the target matrix on the end carrier and electrically connected to the end carrier. During this process, however, previously defined positions are left free. These are then filled with at least one sensor element each, which is positioned and electrically connected.

The end carrier can have line connections for the modules and the individual µ-LEDs. In addition, in some aspects the end carrier also includes at least one current source and/or control electronics for the applied modules or µ-LEDs. In another aspect, the end carrier also contains the electronics for reading out the at least one sensor element. The at least one sensor element can include a photosensor. Further examples are given below.

The prepared modules or sub-units of µ-LEDs and the corresponding area of the target matrix on the final carrier must be identically gridded or have the same size and, if necessary, the same periodicity. The spacing should be the same, especially if larger modules with several rows or columns are transferred and applied to the final carrier.

In one aspect, one or more contact areas of a module or subunit are congruent with a relevant contact area of occupiable positions on the end carrier. Thus, the modules can be integrated into the target matrix on the end carrier. The modules can thus be inserted or integrated into the target matrix on the end carrier.

It is thus possible to construct a display in which the modules, especially the µ-LED modules, are arranged at the same distance from each other for all components. Thus, in one aspect, a target matrix of a display is assembled with a very small distance between the occupiable spaces. In this aspect, each place that can be occupied can be populated with the smallest module to be produced. This results in a display that allows a very high resolution due to the small size of the pixels and the small distance between them and due to which the display can be brought very close to a user's eye.

Alternatively, it is possible to separate further the occupiable positions of the target matrix. Likewise, in some aspects, several of the subunits revealed here can be arranged on such an occupiable location. In some aspects, the positions of the target matrix arranged in rows or columns can each have a distance b from each other. The µ-LED modules each have the same size and a distance a from each other. Distance a can be equal to distance b, which is substantially the same as above. However, distance b can also be a multiple of distance a. Since the contact surfaces for the µ-LED module or subunit are also included in the occupiable areas, the available space increases with a larger distance b between the occupiable areas. In this way, larger modules can be used or several modules can be combined. If, for example, the distance b is 2.5 times the distance a, a module can be placed on an occupiable position which is composed of 4 individual modules and there is still a distance between the modules placed on adjacent positions.

This design allows different eye sensitivities and resolutions to be taken into account. The smaller the distances a and b are, the higher the resolution, the less sensitive the eye of an user can be. Thus, different displays with different pixel or subpixel sizes and pixel distances can be realized with the same µ-LED modules. This may be an advantage in that µ-LED modules can be manufactured independently of the target matrix, its carrier and its wiring.

The already disclosed flat mesa etching, which serves for the electrical contacting of the pixels and the formation of the µ-LED modules and the target matrix and in which etching is performed in the µ-LED grid, is combined with a so-called deep etching, in which the chip grid and the modules can then be defined. This chip grid can differ from the pixel chip grid depending on the application. For example, one could then produce 2×2 large chips with 4 subpixels each (4 base units). One base unit is one µ-LED each. By skillfully designing the mask for the second mesa etching, one could also create pixels each comprising one base unit less. By stringing these pixels together, a display with "holes" in the size of one base unit or multiples thereof is created. These "holes" or "missing subpixels" can then be used to accommodate various sensors, for example. This combination makes it possible to create subpixels with redundancy, whereby in some cases the redundant subpixels are replaced by the sensor.

For this purpose, it is expedient that µ-LEDs are provided with a uniform chip architecture and the same or easily variable size of chips for the production of displays. The techniques described here can be used for this purpose. When producing modules of the disclosed type, it is possible, for example, to use the cover electrode disclosed in this application or the surrounding structure to increase the light yield. In some aspects, the modules can be further processed afterwards, for example by applying a photoelectric structure. At this point, however, it should also be mentioned that the µ-LED modules can already be provided with such a structure in their manufacturing process. In some aspects, the µ-LEDs are combined into rectangular or square modules, which in turn can be combined in any way, especially into rows. By manufacturing by means of flat and deep etching, wafers can be prepared from such modules, which can then be separated as required for the target matrix. In this way, modules of different sizes can be realized. The free positioning makes it possible to leave specific positions unoccupied. Groups of cells or even entire rows or columns can also be left unoccupied. Finally, these modules can be used to equip displays whose target matrix has a different arrangement of vacant positions, e.g. not in rows and columns.

According to an embodiment, at least one module can have four pixel elements in two rows and two columns. Each pixel element can comprise one or more subpixels. In another configuration, a module can have four subpixel elements, which are also arranged in a 2×2 matrix. This is an embodiment easy to handle. In another embodiment, at least one module can have two rows and two columns, but only three components. This is an embodiment easy to handle, where an unoccupied position is already provided with the module.

In a further configuration, at least seven modules each with four pixel elements and at least two modules each with three pixel elements can be positioned and electrically connected in the target matrix on the end carrier in such a way that at least two positions unoccupied by pixel elements are created, at which in each case at least one sensor element is positioned and electrically connected. Here, too, the modules can be designed as desired and can be linked to one another on the end carrier or positioned next to one another in such a way that vacant positions can be generated in a targeted manner. Here too, the pixel elements either comprise several subpixel elements and corresponding µ-LEDs or each pixel element is itself a µ-LED.

According to a further embodiment, the positions occupied by sensor elements can be framed by components. In this way, clearly defined positions, positions not occupied by components, can be explicitly provided for sensor elements.

In some aspects, the modules can be created as subpixels. Modules emitting in different colors may have been created on different second or substitute carriers.

According to various embodiments, a large number of sensor elements may be configured as part of a sensor device formed on the first carrier or end carrier to receive electromagnetic radiation incident on a first side of the first carrier. In this way, different radiation spectra can be detected depending on the application. According to a further embodiment, a sensor element can be formed as a photodiode, in the form of a phototransistor, in the form of a photo-resistor, in the form of an ambient light sensor, in the form of an infrared sensor, in the form of an ultraviolet sensor, in the form of a proximity sensor or in the form of an infrared component. The sensor can also be a vitality sensor that records a vital parameter. The display device is therefore versatile. A vital sign can, for example, be the body temperature.

In another configuration, the vital sign monitoring sensor may be located within a display screen or behind the rear surface of a display screen, the sensor being designed to measure one or more parameters of a user. In addition to body temperature, this parameter includes, for example, the direction of vision of the eye, pupil size, skin resistance or similar.

According to a further design, a component can have a first layer formed on a carrier, on which an active transition layer is formed and on which a second layer is formed. A first contact is connected to a surface area of the second layer facing away from the carrier, and a second contact is connected to a surface area of the first layer facing away from the carrier. This embodiment corresponds to a vertical µ-LED. In this way, the components can be contacted from only one side. In further aspects, the second contact can be electrically insulated from the transition layer and the second layer by means of a dielectric to and on the surface area of the second layer facing away from the carrier.

In addition to the production of monolithic pixel arrays, µ-LEDs can also be applied to a carrier board and subsequently contacted. Due to the size of individual µ-LEDs, they are difficult to transfer and contact individually. For this reason, for some applications in the automotive sector, video walls or in special cases in augmented reality applications, µ-LEDs are first applied to a slightly larger carrier and then contacted with leads on a circuit board. The circuit board can again be a video wall, pixel matrix or a similar screen arrangement. Such arrangements sometimes require special connection techniques, which also differ from arrangement to arrangement and technology or manufacturing process. This makes the provision of different µ-LEDs or modules with such devices quite complex.

Thus, there is a need to Pixel module for different mounts which meet various requirements and are particularly suitable for manufacturing processes for video wall NPP of different generations, i.e. also for LED matrices in AR or VR applications or flexible displays in the automotive sector.

In one embodiment, a µ-LED module comprises a body with a first main surface and four side surfaces. At least three contact pads are arranged on the first main surface. These are designed to be connected electrically to one optoelectronic component each. For example, the three, or a subset of these are connected to a µ-LED with an edge length of 10 µm or less. According to the proposal, several contact bars are also provided. Each contact bar electrically connects one of the at least three contact pads. In addition, the contact webs on the first main surface lead to at least one of the four side surfaces. In other words, the contact bars are arranged on the first main surface and the at least one of the side surfaces. The contact bars form contact lugs on the side surface, i.e. they are designed for external contacting.

With the proposed µ-LED module, rewiring is thus possible, so that the module can be easily connected to the predefined connection points on a carrier or matrix. In particular, the significantly smaller µ-LEDs on the module can be arranged in advance, so that additional space for electrical connection is created with the module. This allows a higher flexibility and the use of such modules for different applications.

In addition to a module with three µ-LEDs, which can be combined into one pixel, for example, several µ-LEDs can also be combined into a larger module in this way. The individual μ-LEDs can be manufactured separately, allowing the optimum technology for the respective μ-LED to be used. Single μ-LEDs can also be designed redundantly. Larger modules are also called segments. Beside single μ-LEDs, special modules with flat and deep mesa etching, as shown here, can be used. A design in bar form or with the proposed antenna structure would also be conceivable. The proposed rewiring allows modules and μ-LEDs to be manufactured individually and adapted to the respective application.

In one embodiment, the contact ridges only run along the sidewalls, in another embodiment they are also connected to contact pads on a second main surface, the underside of the μ-LED module. This means that there are contact pads on both the upper side (for the μ-LEDs) and the lower side of the μ-LED module. This makes the μ-LED module suitable for both SMT (surface mounted technology) manufacturing processes as well as for contact bar processes in which contact bars on the carrier are brought up to the side surfaces of the module. The design makes the module more flexible and can also better compensate for manufacturing tolerances of the carrier (e.g. in contact bar length or size).

In a further embodiment, a second side face of the four side faces will only have the fourth contact web. This contact bar can be marked, for example, to be loaded in operation with a special potential. In addition, it can also differ optically from the other contact bridges, for example by its size on the side surface. This ensures that the module is placed in the correct position during transfer. In another embodiment, two of the three contact bars are arranged on different side surfaces. In one example, four contact ridges are provided, each of which is arranged on one side surface and preferably connected to a contact pad on the underside of the module, i.e. the second main surface.

In another example, contact bars are also arranged on the first main surface. These run to the edges and then along the edges of the side faces in the direction of a second main face, e.g. the bottom of the module.

Another aspect concerns the configuration of the module body. For example, the body of the module comprises a prism with the base of a rectangle or other square surface. In one embodiment, a second main surface is provided, which is opposite the first main surface and comprises a larger area than the latter. Alternatively, the first main surface may be designed to form an angle of 90° or more with each of the four lateral surfaces. This forms a prismatic or square truncated pyramid. In another configuration, the side faces are not perpendicular to the first major surface.

In a further aspect, the contact bars and/or contact pads comprise a, in particular vapour-deposited, metal tag, the thickness of which is less than 5 μm, in particular less than 2 μm or even less than 1 μm. For example, a thickness of the contact bars and contact pads can be in the range of 100 nm to 50 nm. These can be produced by appropriate photolithographic processes. Depending on the design, the metal tags and contact pads can also be deposited on an insulating layer of the module body, for example by MOCVD or similar processes. Contact pads on the bottom side can be produced in a separate step. In a further embodiment, the module body comprises at least one through-hole plated at least partially filled with an electrically conductive material, the electrically conductive material on the first main surface being connected to or forming one of at least three contact pads arranged on the first main surface.

The module body can be configured with continuous main surfaces. In another configuration, the body may comprise a recess on the first or second main surface in which at least a contact bar runs. A contact bar on the second main surface can be connected to a via and lead to a contact pad. Likewise, a contact bar can connect at least one μ-LED arranged on the first main surface to the through-hole plating.

The body can contain or be formed from silicon. It can be surrounded by an insulating layer, for example silicon dioxide, to prevent a short circuit. The silicon material may be free at one point to which a reference potential can be connected. Vias through the body are also lined with insulating material. Contact bars and contact pads are applied to the insulating layer. The module body can have a thickness of less than 30 μm, especially in the range of 5 μm to 15 μm. This allows a very low overall height of only a few 10 μm to be achieved. The overall height of the module can be further reduced by an additional recess in which the optical components are inserted.

Another aspect relates to a process for manufacturing a μ-LED module in which, among other things, a membrane wafer is structured so that it has a large number of substantially V-shaped trench-shaped recesses. The depressions are designed in such a way that a first main surface of the structured membrane wafer bounded by trenches forms an angle of 90° or greater with the flanks of the trenches. Then, several contact pads are generated on the first main surface of the membrane wafer. Optionally and/or additionally, leads, contact tabs and contact bars can be generated on the first main surface and the side surfaces. Then at least one optoelectronic component, in particular a μ-LED, is applied to the module and electrically conductively connected to a contact pad. In a subsequent step, a temporary carrier is provided and the membrane wafer is etched back up to or just before the trenches after rebonding with the temporary carrier. Finally, backside contacts are applied and optionally separated.

As already explained, in monolithic arrays a pixel error can be reduced by providing a redundant subpixel. Electrical crosstalk is avoided, while optical crosstalk between the redundant subpixels is still possible. A similar problem exists with separated pixels. Although it may be possible to test the functionality before separating, due to the small size of μ-LEDs during transfer to the backplane in production, positioning or connection errors may occur. In addition to continuous improvements of the process steps in manufacturing, there is the approach to make each pixel of a Pixel array with redundant μ-LEDs or more precisely, to provide redundant positions on which μ-LEDs can be placed. This can mean, for example, that for each RGB subpixel of a pixel two or more μ-LED chips are used instead of just one μ-LED chip for one color, which leads to an overcrowding of subpixels per pixel for most pixels. Another approach is to repair defective subpixels of a pixel. After a function text, faulty subpixels are switched off and replaced by working subpixels.

A method of making an array of pixels or an array of pixels comprising inter alia providing a substrate for arraying pixels on the substrate and electrically contacting the pixels, the substrate providing a set of primary contacts for a pixel, the set of primary contacts of the pixel being for electrically contacting a group of sub-pixels of the pixel, the substrate providing a set of spare contacts for the pixel.

Then the primary contacts of the pixel are equipped with a group of μ-LEDs, whereby the set of spare contacts of the pixel is not equipped. Then defective μ-LEDs in the group of μ-LEDs are identified and one of the possibly several replacement contacts of the set of replacement contacts of the pixel is equipped with a replacement subpixel for the defective µ-LED. In this context, a pixel may comprise one or more subpixels. The pixel may also be configured for the connection of a vertical or a horizontal µ-LED. Accordingly, a primary contact can comprise at least one contact area (in the case of a vertical µ-LED) or two contact areas (when equipped with horizontal µ-LEDs). One of the two contact areas can be used by several µ-LEDs, including the redundant one. If equipped with vertical µ-LEDs, one of the cover electrodes presented here may be provided. The pixel field can also be surrounded by a surrounding mirror layer.

In addition to separate µ-LEDs, the µ-LED modules or base modules disclosed here can also be assembled. For example, a µ-LED module can comprise two base modules, so that one base module is provided as a redundant unit.

The method according to the invention thus allows the assembly of the primary contacts for each pixel of a pixel field with a designated group of subpixels. One primary contact is equipped with one subpixel each. In each pixel, the defective subpixels on the primary contacts can then be determined. For an identified, faulty subpixel in a pixel, a replacement contact for the pixel is fitted with a replacement subpixel in a subsequent step. Thus, only one replacement contact in a pixel is equipped with a subpixel to replace functionally a subpixel identified as faulty on the primary contacts.

A redundant assembly of the pixels with several subpixels of the same color is therefore not necessary. In comparison to the redundancy concepts known from the state of the art, much fewer subpixels are used in a pixel field to be produced, since an increased assembly is only carried out after the identification of faulty subpixels. The manufacturing costs can thus be reduced.

In addition, control techniques can be used in this application to test the functionality of a µ-LED on the one hand and to disconnect safely the faulty µ-LED in case of a failure, especially in case of a "SHORT" by melting a fuse or other measures.

This allows the faulty one to remain on the pixel, thus eliminating the need for additional process steps.

It is also possible to refill the replacement contacts for a pixel individually if faulty subpixels are identified. It is also possible to replenish the spare contacts of a pixel several times, following further functional tests in a continuous processing. This increases the probability of success of the placement process. In addition, it is possible to reproduce subpixels, e.g. in the form of µ-LED chips, with selected characteristic data, for example to achieve a correct color calibration in a particular pixel.

according to an embodiment, the steps of identifying a defective subpixel in the group of subpixels and providing a replacement contact with a replacement subpixel for the identified subpixel may be repeated until there replacement subpixel it attached to the pixel for each subpixel identified as defective. For all defective subpixels of a pixel, the substrate can thus be populated with replacement subpixels in a subsequent process step.

According to another aspect, a subpixel identified as faulty does not need to be removed if the faulty pixel is declared "OPEN", i.e. no leakage current flows through the damaged or destroyed pixel. Circuitry measures can also be provided to separate an electrical contact for an identified, faulty subpixel. A current flow to the faulty subpixel when operating the pixel array can thus be avoided. Corresponding concepts are disclosed in this application and can be used for this purpose.

Compared to repair concepts, the process of removing defective subpixels can be omitted. This makes the manufacturing process faster and more cost-effective. The risk of damaging the pixel field when removing defective subpixels is eliminated. A repair by removing a defective subpixel allows the further use of the primary contact area that becomes free. However, residues and damage reduce the probability of success of a second placement and bonding process. The replacement contacts provided are free of residues and damage.

It may be provided that a subpixel identified as defective and the replacement subpixel are intended to emit light of the same color. A faulty subpixel is thus replaced by a replacement subpixel, which at least approximately emits the same color, as the faulty subpixel would have if it were functional.

The group of subpixels of a given pixel can comprise one or more sets of RGB subpixels. RGB stands for red, green and blue. The group of subpixels can therefore have three subpixels, for example. One subpixel can be configured to emit red light, another subpixel can be configured to emit green light, and yet another subpixel can be configured to emit blue light. By additive mixing of the three basic colors red, green and blue, any or nearly any color can be generated in a known manner.

The group of subpixels can also have more than one subpixel to create each primary color. For example, the group of subpixels can have 6 subpixels, with two subpixels each for creating red, green, and blue, respectively.

According to an embodiment, it is intended that no replacement contact of the pixel is equipped with a replacement subpixel if no defective subpixel is found in the pixel. The pixel field can therefore contain pixels for which the replacement contact or contacts are not fitted.

Another aspect deals with the design of the primary contacts. These are configured for anode-side and/or cathode-side contacting of the subpixels of a pixel. For example, the contacts can be configured in such a way that so-called flip chips can be arranged on these contacts and electrically connected. Flip chips are optoelectronic chips whose electrical p and n contacts are on the same surface side. The replacement contacts can also be configured for contacting the replacement sub-pixels of a pixel on the anode side and/or the cathode side. The redundancy of the contact areas for the subpixels of a respective pixel achieved by the replacement contacts can thus relate to both the cathode and the anode of a subpixel or only to one of the two connections.

In this context, a subpixel or replacement subpixel is formed by a µ-LED, which is placed on the respective contact and connected electrically and mechanically. Equipping the replacement contact with a replacement subpixel for the subpixel identified as defective can be done independently of the color of the light emitted by the replacement subpixel. Normally, each primary contact is populated and only the replacement contacts of the µ-LEDs declared as faulty. However, a primary contact does not have to differ from a secondary contact in terms of circuitry or even its structure on the surface. In this respect, a combined assembly can therefore also be carried out. In this context, it can also be said that the first contact assembled by a µ-LED of a color represents the primary contact.

The proposed concept also concerns a pixel array with a substrate for an array of pixels arranged on the substrate and for the electrical contacting of the pixels, where the substrate provides a set of primary contacts for a pixel. The set of primary contacts is intended for electrical contacting of a group of sub-pixels. The substrate also provides a set of spare contacts for the pixel. According to the proposed principle, the primary contacts are populated with the group of subpixels, wherein the group of subpixels comprises a faulty, deactivated subpixel, and wherein a replacement contact of the set of replacement contacts of the pixel is populated with a replacement subpixel as a replacement for the faulty, deactivated subpixel.

With at least two pixels of the pixel field, the number of occupied spare contacts may be different. This results from the fact that in a pixel the spare contacts are only populated with spare subpixels if subpixels on the primary contacts are identified incorrectly.

The above concepts for reducing defect or crosstalk improve the yield of functional elements during production. Several aspects deal with measures to improve a transfer of µ-LEDs. For this purpose, µ-LEDs are now increasingly being developed, whose edge lengths are usually less than 100 µm, often between 70 µm and 20 µm. For special applications in the field of augmented reality, the dimensions are also less than 20 µm, for example in the range of 1 µm to 10 µm or even 1 µm to 5 µm.

One of the technical challenges associated with µ-LEDs is in particular the manufacturing process, since a large number of µ-LEDs not only have to be produced but also installed in matrices or modules. In order to produce such modules or even larger displays, the µ-LEDs produced are transferred either as individual chips or ready in the modules presented here to a carrier surface of the module or display, where they are fixed and electrically connected. With several million LEDs to be transferred, this process is critical in terms of speed and accuracy.

Various processes are known for this, such as the transfer printing process. These use a flat stamp to simultaneously pick up a large number of µ-LEDs from a wafer, move them to the carrier surface of the subsequent display and precisely assemble them there to form a large-area overall arrangement. An elastomer stamp, for example, can be used for this purpose, to which the individual µ-LEDs can adhere without being mechanically or electrically damaged thanks to suitable surface structures and material properties. Depending on the process technology, this can be problematic, as the µ-LEDs can tilt, shift or twist when they are detached. It is therefore desirable to enable the mounting of µ-LEDs with reduced holding forces or damage.

The aspects and ideas described in the following are based on the following considerations: When using mass transfer processes, i.e. the simultaneous localized relocation of a large number of semiconductor chips, the µ-LEDs are picked up or lifted from a wafer with the aid of a suitable tool. This requires the chips to have an exact and determinable position on the wafer, for example to be able to position a tool such as an elastomer stamp with its cushion structures as precisely as possible over the respective µ-LED. At the same time, a surface structure should always be homogeneously and uniformly positioned in space so that a transfer tool can attach itself to a chip surface in a standardized manner with a high probability of success.

According to a first aspect, a method for providing a µ-LED is proposed in which a first electrically conductive contact layer is arranged on a first main surface side of the functional layer stack facing away from the substrate. The layer stack is configured as an optically active layer stack and accordingly forms in particular a µ-LED. Then at least one support layer attached to the substrate is provided which carries the µ-LED. Due to the holding structure, the contacted functional layer stack can be broken off during lift-off. Subsequently, a sacrificial layer, which is applied between a second main surface side of the functional layer stack facing the substrate and the substrate and in particular comprises AlGaAs or InGaAlP, is at least partially removed. After the partial removal, a second electrically conductive contact layer can be applied to the second main surface side of the functional layer stack in the area of the removed sacrificial layer In the process presented here, lithographic processing of a functional layer stack takes place only on one side of a substrate, thus avoiding additional rebonding if necessary. The holding structure can in turn be lithographically adapted to the requirements, the size of the layer stack and other parameters. At the same time, the layer stack is contacted on both sides, thus forming a vertical µ-LED.

According to a second aspect a µ-LED is proposed, which comprises a functional layer stack. A first electrically conductive contact layer is attached to a first main surface side of the functional layer stack facing away from a substrate and a second electrically conductive contact layer is attached to a second main surface side of the functional layer stack facing the substrate. In this case, the contacted functional layer stack is supported, in particular freely, by at least one holding structure attached to the substrate. The holding structure allows the contacted functional layer stack to be broken off in further process steps during lift-off. Accordingly, the layer stack or the µ-LED exhibits a break-off edge after lift-off and in all subsequent process steps.

With the measures proposed here, no rebonding is necessary and a simple alignment of a lithographic masking is possible. The formation of a vertical µ-LED is possible just like a horizontal LED. Absorption is reduced and light extraction through the horizontal surface is increased, whereas thinner epitaxially generated layers are possible. Without bonding, the epi-structure of a layer sequence is subject to less mechanical stress. In addition, the sacrificial layer allows a more precise etching process, since the etching process can be very selective for the sacrificial layer. The contact layer can therefore be made thinner.

In some aspects, the support structure may in particular include InGaAlP or AlGaAs or BCB or an oxide, for example SiO2, or a nitride or a combination of such materials, and in particular be electrically non-conductive. In this case, it can also be configured to passivate the stack of layers. The support structure can be at least partially epitaxially grown or generated by vapour deposition or electroplating. In contrast, the sacrificial layer can have AlGaAs or InGaAlP and can be etched away wet-chemically. The first and/or second electrically conductive contact layers can be produced by sputtering, vaporizing, galvanically or epitaxially. The contact layers can be transparent and contain ITO or ZnO or a metal. In order to avoid oxidation or degradation, some aspects are provided for, one flank of the contacted functional layer stack must be covered by a passivation layer. Alternatively, it would be possible to diffuse a metal, in particular Zn, from one flank of the contacted functional layer stack into an outer edge region of the functional layer stack. This changes the band structure in the edge area and thus keeps charge carriers away from the area affected by an increased defect density.

In order to securely attach the retaining structure, it can extend into the substrate from the first main surface side of the functional layer stack.

According to a further embodiment, a first supporting layer, in particular comprising InGaAlP and/or AlGaAs, can be formed on the functional layer stack on the first main surface side thereof, to which the first electrically conductive contact layer can be attached, the first supporting layer and the first electrically conductive contact layer being attached to the substrate at least at one point and thus together can provide the holding structure.

Another point of view deals with the question how a Avoidance of breakage edges and improved lift-off can be achieved.

A solution is proposed here, in which a mechanical connection between the µ-LED and a surrounding or underlying substrate is maintained using crystalline, dielectric support structures. However, this mechanical connection is configured in such a way that on the one hand it reliably holds the µ-LED chip in place mechanically, but on the other hand it breaks when the smallest possible bending force or tensile force is exerted, thus releasing the chip for removal.

In particular, a carrier structure is proposed to accommodate flat microchips or µ-LEDs. A carrier structure in this context means an arrangement that can accommodate a plurality of such µ-LEDs, for example with edge lengths in the range of 5 µm to 20 µm or smaller. The main purpose here is to achieve a mechanically stable fixation, for example relative to a grid or a matrix, making the best possible use of the available space. Furthermore, this carrier structure should be suitable for providing the large number of microchips for transfer with the aid of a transfer tool.

The carrier structure also has at least two receiving elements that are connected to the carrier substrate. A mounting element in this case is to be understood as a mechanism or functional element that is suitable for fixing a µ-LED spatially by mechanical contact, if necessary in interaction with other mounting elements, or for holding it in a defined spatial position. A mounting element can have diameters in the range of 1 µm, for example. In one example, a microchip is attached to two picking up elements.

In some aspects, the carrier structure comprises a flat carrier substrate. Such a carrier substrate can be, for example, a wafer, a foil, a frame or similar from the field of semiconductor production. In addition to its function as a base plate or base material for the semiconductor manufacturing process, a wafer can also provide a support or carrier function in preparation for a subsequent mass transfer. In addition, flexible materials such as films are also suitable as carrier substrates.

According to an example, a receiving element can be configured in a columnar, pillar-like or pile-like manner starting from the carrier substrate. In one embodiment, the microchip rests at its corners or edges on the at least two receptacle elements partially but not completely. The mounting elements are connected to the carrier substrate and are designed to hold a microchip detachably between the at least two mounting elements in such a way that µ-LED can be moved out with a defined minimum force perpendicular to the plane of the carrier structure.

In other words, on the one hand, a sufficiently secure hold of the µ-LED by the mounting elements should be achieved, on the other hand, the possibility should be deliberately created to detach the µ-LED with as little force as possible and, for example, to feed it to a transfer tool. For this purpose, it may be necessary to provide a contact surface for each support element that is smaller than 1/20, in particular smaller than 1/40 and in particular in the range from 1/80 to 1/50 smaller than the chip area of the µ-LED. In an alternative configuration, an edge length of the µ-LED is at least by a factor of 10, in particular at least by a factor of 20, greater than an edge length of the support element.

"Detachable" is to be understood to mean that there is no permanent, e.g. materially coherent connection such as fusing, gluing or similar between the microchip and the receiving element, but a non-destructive, detachable connection. The attachment can be based on a physical connection, such as an adhesive connection by Van-De-Waal forces or electron bridges. The same can be given by different materials and a suitable selection of them between the µ-LED and the receiving elements. This is intended in particular to avoid breaking or similar processes that would involve the destruction of material structures with the corresponding fragments, particles or splinters. Instead, alternative adhesion mechanisms such as the exploitation of mechanical friction or delamination are used here. In particular, known limited or restricted adhesion properties of materials or material combinations are exploited. According to an example, the µ-LED is placed between two or more holding elements.

At the contact surfaces, for example, adhesive forces or other adhesion forces arise, which allow mechanical fixing of the µ-LED in space. If a defined minimum force is applied to the µ-LED, e.g. by an attached transfer tool, this results in detachment forces at the contact surfaces between the µ-LED and the mounting elements. This defined minimum force can be influenced by a suitable selection of materials or material combinations at these contact surfaces.

The contact surfaces or overlaps can, for example, comprises an area dimension in the range of 0.05 µm² to 1 µm². In this case it is desirable to achieve a secure hold of the µ-LED on the carrier structure on the one hand. On the other hand, it is substantial for an effective and fast mass transfer of the µ-LED that the µ-LEDs can be lifted upwards and detached with as little force as possible. For this purpose, it may be necessary to provide for a ratio between the contact area of each element and chip and the total chip area of less than 1/20, in particular less than 1/40 and in particular in the range from 1/80 to 1/50 smaller than the chip area. In an alternative configuration, an edge length of the µ-LED is at least by a factor of 10, in particular at least by a factor of 20, greater than an edge length of the receiving element. The available area of the pick-up element may be larger, but the µ-LED rests on only a part of this area. The contact area of the chip is therefore at least 20 times, in particular at least 40 times smaller than the total chip area.

A suitable compromise must be found here, for example by the appropriate selection of materials or material combinations and the dimensioning and placement of the contact surfaces. The defined minimum force can also be influenced by designing the size and shape of these contact surfaces. Large contact areas consequently lead to a higher minimum force required to detach the µ-LED from the carrier structure. In addition to holding principles caused by friction or lamination, magnetic, electrical or similar holding forces are also conceivable.

According to another example, it is also possible that the carrier structure has only one single holding element to hold a µ-LED. Due to the low weight of the semiconductor structures, it is conceivable that a contact surface between the single holding element and the µ-LED, which is suitable in its shape and sufficiently dimensioned in terms of its size, could provide sufficient hold in combination with a suitably high minimum force for detaching the µ-LED.

In one embodiment, a substrate for the production of the µ-LEDs can also serve as a carrier structure. In such a case, a sacrificial layer may be provided. During the manufacturing process, the µ-LED is connected to the growth substrate. To expose the finished µ-LED, for example, this intermediate sacrificial layer is removed by gas or plasma-based etching processes so that a gap is created between the µ-LED and the wafer. A thickness of the sacrificial layer is, for example, 100 nm (nanometers) to 500 nm. The idea here is that when the sacrificial layer is removed, the receptacle elements take over a holding function for the µ-LED on the carrier structure. The mounting elements can have the shape of an anchor.

A pull-off of the µ-LED is usually done in a direction away from the carrier substrate, with a force vector that is at least partially perpendicular to a carrier substrate plane, which is to be understood in x-y-direction. The pick-up elements remain on the carrier substrate and in particular do not break. Thus, no residues of the pick-up element remain on the µ-LED, which could cause problems during subsequent processing.

According to an aspect, at least one mounting element is configured to simultaneously hold and/or support another, adjacently arranged µ-LED. The considerations regarding this feature can be summarized as follows: Holding structures for µ-LEDs often require space, which ideally should be minimized in order to achieve a higher yield on a wafer. Due to the manufacturing process, the µ-LEDs in turn are arranged next to each other on a wafer in a regular structure.

There are gaps in between due to the process. The inventors now propose to position a mounting element between two adjacent µ-LEDs so that this one mounting element supports or accommodates several adjacent µ-LEDs. The advantage here is that less than one entire holding structure per component can be achieved mathematically. This can reduce the total number of holding elements, thus saving space and consequently costs. In addition, an overall chip yield remains substantially constant, since no additional space is required for the holding structure on the wafer, which would be at the expense of the number of µ-LEDs.

For example, a receptacle element may have contact surfaces arranged opposite one another, which are then in mechanical contact with the adjacent µ-LED in this direction. The pick-up elements can then be distributed and arranged over a surface of the carrier substrate in such a way that a minimum number of pick-up elements are used to hold the µ-LEDs securely. This can be advantageous, for example, for the effective use of a transfer tool to enable effective and fast pick-up of the µ-LEDs. According to an aspect, the mounting elements are arranged on the carrier substrate in such a way that one µ-LED is held by exactly three mounting elements. The choice of three holding elements can be an advantageous compromise in that a good spatial stabilization in combination with a favorable distribution of the holding forces can be achieved. A shifting or tilting, especially in lateral direction on the carrier substrate can be effectively prevented here. In doing so, a support element can act on the microchip at different lateral areas in the X-direction and Y-direction, for example in the center, off-center or at an edge or corner. Several pick-up elements can also be arranged on one and the same side of a µ-LED.

According to an aspect, a delamination layer is provided on the µ-LED or on the mounting element to move the µ-LEDs out of the carrier structure. The term "delamination" is used here to describe a detachment process that occurs when two surfaces, or more generally, the connection of two layers, come into contact. This can affect similar materials, but also material connections or different material surfaces.

The deliberate creation of a so-called delamination layer is intended to prevent breakage or material-destroying or structure-altering processes and instead cause non-destructive separation of the layers or surfaces from one another. Certain combinations of materials can be used, for example a combination of $SiO_2$ and $Al_2O_3$, but also the use of non-oxidizing metals such as silver, gold or similar materials in combination with a dielectric such as $SiO_2$. In one aspect, the surface of the picking up element is thus surrounded by the delamination layer, so that the delamination layer is formed between the µ-LED and the picking up element. The delamination layer can only be a few nm thick, for example in the range of 5 nm to 50 nm. The delamination layer can also be formed as an etch stop layer in one aspect or optionally extend over other parts of the carrier structure.

According to an aspect, the picking up elements are arranged in a mesa trench of a semiconductor wafer. As already mentioned, an optimal use of space on a wafer to increase the yield is generally desirable. Holding structures for µ-LEDs often require additional space. In the manufacturing process, various process steps are used to create three-dimensional structures in which, for example, a µ-LED is formed at the end as an elevation or mesa. So-called mesa trenches are formed between these individual µ-LEDs.

The term mesa trench is used to describe a comparatively steep flank like feature on the sides of a µ-LED, whereby the trench, i.e. the area without epitaxy, references the deep structure in between. For example, the mesa can have a slope steepness in the range of 30° to 75°, especially of 45°. The idea here is to place the pick-up element exactly in this already available spatial area without taking up additional space on the wafer. This allows a better utilization of the available space on the wafer.

According to an aspect, the supporting structure and the receiving elements are made in one piece. This can mean, for example, that the receiving elements are part of the carrier substrate. The carrier substrate can be a wafer, but also a PCB board, foil, frame or similar structure. In the latter cases, this means that the mounting elements themselves are made of a different material and/or structure than the carrier substrate. This can be achieved in a manufacturing process, for example, by preserving the originally existing wafer structures in a locally limited manner through the various process steps and not removing them by etching processes, for example. These structures then serve as holding elements and holding structure for the finished µ-LEDs.

In one aspect, the mounting elements are designed to hold a µ-LED on the side and from a lower side of the µ-LED. In order to hold a µ-LED on an underlying carrier substrate, it can be useful on the one hand to create a partial contact surface or bearing surface that provides a mechanical stop in the Z-direction, i.e. in the direction of the carrier substrate. At the same time, a spatial fixation in lateral direction, i.e. in X-direction and Y-direction, can be achieved by additionally providing a lateral stop. In this way, a stable spatial fixation can be achieved in the direction of the carrier substrate and in the lateral direction on the one hand, and on the other hand, a slight lifting of the µ-LEDs away from the carrier substrate in the Z-direction can be made possible by a transfer process or a transfer tool.

In one aspect, the mounting elements have µ-LED holding surfaces that slope away at an angle relative to the carrier substrate plane, so that when the µ-LEDs are moved away from the mounting elements, a holding force on the µ-LED is reduced. In other words, the holding surfaces move away from the µ-LED the further the µ-LED is moved in the direction away from the carrier substrate. This can also be understood to mean that a holding force is successively reduced when the µ-LED is lifted away from the carrier structure by a transfer tool, for example. This is primarily intended to reduce the force required to pull off the µ-LED, in particular to reduce runtimes of the process steps and to increase the quality of a transfer process.

Traditionally, there are various ways of transferring chips from a carrier wafer to a corresponding target substrate.

State of the art transfer processes such as laser transfer printing or "self-assembly" of individual micro light emitting diode chips from a solution or electrostatically activated or diamagnetic transfer processes are known.

An extension of these concepts is achieved with the electrostatic transfer explained in more detail. A method is to be specified with which optoelectronic semiconductor chips with particularly small dimensions, i.e. µ-LEDs, can be picked up and deposited and at the same time, those µ-LEDs, which have certain defects, can be sorted out. Furthermore, a corresponding device for picking up and depositing optoelectronic semiconductor chips is to be created.

The proposed concept is based on the aspect that electron-hole pairs are generated in µ-LEDs and generally in optoelectronic semiconductor chips. The µ-LEDs may each have a semiconductor layer with a photosensitive region, also called optically active region. In the optically active region, charge carriers or electron-hole pairs can be generated by appropriate excitation, especially by incident light. An electron-hole pair consists of a defect electron and an electron, which has been brought from its ground state in the crystal to an excited state by the absorption of energy.

The electron-hole pairs can be separated from each other by suitable properties of the semiconductor material, such as two regions with different concentrations of dopants, like a p-n junction. As a result, charges are generated in the respective semiconductor chips, which create a dipole field outside the semiconductor chips. This process is also known as the photovoltaic effect. The strength of the dipole field generated by a particular semiconductor chip depends on the properties of the semiconductor chip. Semiconductor chips can have defects, such as short circuits, shunts or reduced efficiency, which typically lead to an accelerated discharge of the charges generated by the excitation and thus to a reduced dipole field. Furthermore, according to the proposed method, a pick-up tool is provided, which serves to pick up the µ-LEDs or the optoelectronic semiconductor chips and to place them at predetermined positions or locations, for example on a board on which the µ-LEDs are to be mounted. This process is also referred to as "pick and place" in the English language technical literature. It is also intended that the pick-up tool generates an electric field at least at certain locations, for example by being electrically charged at these locations. The µ-LEDs are picked up by the pick-up tool during or after the generation of the electron-hole pairs.

The electric field generated by the pick-up tool interacts with the dipole fields of the optoelectronic semiconductor chips, creating an attractive or repulsive force between the pick-up tool and the optoelectronic semiconductor chips. The electrostatic interaction or force can superimpose an interaction or force that exists between the pick-up tool and the optoelectronic semiconductor chips even without the electric dipole fields caused by the electron-hole pairs. For example, a van der Waals attraction or an electrostatic attraction can exist between the pick-up tool and the respective optoelectronic semiconductor chips even without the dipole charge generated by the excitation. The additional electrostatic attraction makes it possible to overcome a threshold above which the µ-LEDs are released from a carrier on which the µ-LEDs are arranged and are picked up by the pick-up tool.

The force required to remove the optoelectronic semiconductor chips from the carrier may be greater than the force required to hold the removed optoelectronic semiconductor chips by the pick-up tool. Therefore, the electrostatic force may only be required to remove the optoelectronic semiconductor chips and not to hold them. Consequently, the presence of the electric dipole fields is only necessary to remove the optoelectronic semiconductor chips, but not necessarily to hold the optoelectronic semiconductor chips afterwards.

µ-LEDs with certain defects, for example short circuits, shunts, low efficiency or other defects, have a lower dipole field when excited than µ-LEDs without such defects. Accordingly, the electrostatic interaction between the pick-up tool and the defective µ-LEDs is so small that the latter cannot be picked up by the pick-up tool and remain on the carrier. In other words, the electrostatic interaction between the pick-up tool and the µ-LEDs is selected in such a way that only in functioning µ-LEDs is the acting force sufficiently strong. In other words, the electric field generated by the pick-up tool is chosen so that only in interaction with functional µ-LEDs is the resulting electrostatic force sufficient to lift the µ-LEDs off. For defective µ-LEDs that have a lower dipole field, the interaction is not sufficiently strong.

Therefore, the concept presented here makes it possible that defective µ-LEDs are not picked up and, accordingly, not mounted, thus considerably reducing the repair effort caused by mounting defective optoelectronic semiconductor chips. It should also be mentioned here that the interaction also depends on the mass or size of the µ-LEDs and must therefore be selected accordingly for a nominal size so that a functional µ-LED just sticks.

Alternatively, by appropriate design, µ-LEDs or optoelectronic semiconductor chips with certain defects that reduce the dipole field can be caused to be picked up by the pick-up tool and "good" µ-LEDs with higher dipole fields can be rejected by the pick-up tool and remain on the substrate. Such configuration also causes a separation of good and defective µ-LEDs and optoelectronic semiconductor chips.

The pick-up tool can be made of a suitable material to generate an electric field. For example, the pick-up tool may have polydimethylsiloxane (PDMS) in which metal contacts are embedded. The metal contacts can be connected to an electrical power source to charge the PDMS material to generate the electric field. Furthermore, the mounting tool can be made of a suitable electrically charged material, which generates an electric field by itself.

Another option for generating the electric field is to generate the electric field, for example by contacts inside or on the surface of the pick-up tool and an electric voltage. The electric field can also extend between the pick-up tool and an electrical contact, with the µ-LEDs located between the pick-up tool and the electrical contact. The electrical contact can, for example, be the carrier on which the µ-LEDs or optoelectronic semiconductor chips are placed or integrated into the carrier.

The µ-LEDs can be produced on a semiconductor wafer and then separated, for example by sawing. After separation, the µ-LEDs can be mounted on a circuit board or other carrier using the method described here. It is also possible to transfer not only individual µ-LEDs but also µ-LED modules or smaller arrays of contiguous µ-LEDs using this process. In this context, reference is made to the µ-LED modules or structures described in this application, which can be easily transferred using the proposed transfer method.

Due to their small dimensions and possibly large number, no conventional methods can be used economically for μ-LEDs, where the LEDs are first tested and then mounted on a circuit board. Unlike conventional methods, the process described in the present application makes it possible to sort out defective μ-LEDs before mounting them.

The excitation of the μ-LEDs to generate the electron-hole pairs can be achieved by irradiating the μ-LEDs with light, especially UV light. The light spectrum must have a wavelength or a wavelength range that allows excitation, especially photoluminescence excitation. In particular, the excitation radiation must have a higher energy than the radiation emitted by the optoelectronic semiconductor chips so that electron hole pairs can be generated directly. Consequently, the wavelength of the excitation radiation must be shorter than the wavelength of the radiation emitted by the optoelectronic semiconductor chips. For example, blue μ-LEDs emit light at about 460 nm. In this case, the excitation radiation should have a wavelength of 440 nm or shorter, for example a wavelength of approx. 420 nm.

The light used to generate the electron-hole pairs can fall on the μ-LEDs through the pick-up tool. To make this possible, the pick-up tool can be made at least partially of a material that is at least partially transparent or translucent to the light. Furthermore, openings or light guides can be integrated into the pick-up tool through which the light reaches the μ-LEDs.

The μ-LEDs or semiconductor chips can be arranged on a carrier or substrate before being picked up by the pick-up tool. The light used to generate the electron-hole pairs can pass through the carrier or substrate onto the μ-LEDs. For this purpose, the carrier or substrate may be made at least partially of a material that is at least partially transparent or transmissive to the light, or openings or light guides may be integrated into the carrier or substrate.

Alternatively, the light can be radiated laterally or at an angle onto the μ-LEDs or all optoelectronic semiconductor chips.

It may be envisaged that electron-hole pairs are not generated in all μ-LEDs or optoelectronic semiconductor chips, but only selectively in some of the devices. For example, a plurality of μ-LEDs fabricated on a wafer can be provided and the electron-hole pairs are only generated in selected μ-LEDs of the plurality of optoelectronic semiconductor chips. Then, except for the defective μ-LEDs of this selection, only these μ-LEDs are picked up by the pick-up tool. The selective excitation of the μ-LEDs can be achieved, for example, by passing the light for generating the electron-hole pairs through a mask.

Another possibility for picking up only a selection of μ-LEDs is that the pick-up tool generates an electric field only in predetermined areas. This can be achieved, for example, by at least partially individually controlling the metal contacts embedded in the pick-up tool. By means of this selection it is possible to create suitable distances of μ-LEDs to be recorded (e.g. only every third, fourth, tenth etc.). The distances can be selected in such a way that the recorded μ-LEDs can be placed directly on the target matrix.

According to one embodiment, the pick-up tool has a plurality of protrusions or stamps on a surface facing the μ-LEDs. When the pick-up tool is lowered, only the protrusions come into contact with the optoelectronic semiconductor chips, so that only the protrusions pick up μ-LEDs. The areas between the elevations and the areas outside the elevations do not pick-up optoelectronic semiconductor chips. Here too, the elevations can be arranged at predefined distances corresponding to the places to be occupied in a target matrix. In this application a further concept is revealed, which continues this aspect.

Alternatively, at least in one area, the pick-up tool may have a continuous flat surface intended for picking up the μ-LEDs. This allows greater flexibility, since μ-LEDs or optoelectronic semiconductor chips arranged in different patterns and/or with different spacing can be picked up.

Furthermore, the pick-up tool can have the shape of a cylinder, which is rolled over the μ-LEDs to pick up the μ-LEDs. For example, the pick-up tool can be shaped like the drum of a laser printer. To pick up the μ-LEDs, the cylindrical pick-up tool can be moved over the μ-LEDs. Alternatively, the axis of rotation of the cylindrical pick-up tool can be stationary and the carrier with the optoelectronic semiconductor chips can be slid under the pick-up tool.

To deposit the μ-LEDs, the electrical charge of the pick-up tool can be changed via the metal contacts. For example, the polarity of the metal contacts can be reversed. This leads to a repulsive electrical interaction between the pick-up tool and the μ-LEDs polarized by the electron-hole pairs. As a result, the μ-LEDs either are noticed or hit the target matrix.

Furthermore, the charge can also be changed only at certain positions or in certain areas of the pick-up tool, so that certain μ-LEDs are selectively deposited.

Another way of depositing the μ-LEDs is that the carrier or substrate to which the μ-LEDs are applied generates an adhesive force that is greater than the attractive force between the pick-up tool and the μ-LEDs. For example, the surface of the carrier or substrate can be coated with an adhesive, a lacquer, a soldering material or other suitable materials. Furthermore, the μ-LEDs can be detached from the mounting tool by mechanical forces, for example by shearing or acceleration forces.

According to one embodiment, the pick-up tool directly touches the μ-LEDs or optoelectronic semiconductor chips to pick them up. During the transfer of the optoelectronic semiconductor chips, the pick-up tool holds them by means of Van der Waals forces.

Another aspect concerns a device intended for picking up and placing optoelectronic semiconductor chips. The device can be, for example, a pick and place machine or be integrated into a pick and place machine.

The device comprises an excitation element for generating electron-hole pairs in μ-LEDs or optoelectronic semiconductor chips and a pick-up tool for picking up and placing the μ-LEDs or optoelectronic semiconductor chips. The electron-hole pairs generate electrical dipole fields in the vicinity of the μ-LEDs or optoelectronic semiconductor chips. The pick-up tool is configured in such a way that it generates an electric field, which interacts with the electric dipole fields of the μ-LEDs, or optoelectronic semiconductor chips in order to pick them up. The picked up μ-LEDs or optoelectronic semiconductor chips are transferred to pre-determined locations and deposited there.

According to one embodiment, the excitation element is designed to generate light with a predetermined wavelength or a predetermined wavelength range to generate the electron-hole pairs in the μ-LEDs or optoelectronic semiconductor chips. The excitation element may, for example, comprise a light source and/or a light guide.

The excitation element can be arranged in such a way that the light for generating the electron-hole pairs is incident on the μ-LEDs through the pick-up tool or through a carrier on which the μ-LEDs are arranged. The pick-up tool may have a plurality of projections on a surface facing the μ-LEDs or the optoelectronic semiconductor chips. The μ-LEDs or the optoelectronic semiconductor chips can be picked up by the projections of the pick-up tool.

Alternatively, at least a portion of a surface of the pick-up tool facing the µ-LEDs or optoelectronic semiconductor chips may be continuously flat and configured to receive the µ-LEDs or optoelectronic semiconductor chips.

Furthermore, the device for picking up and depositing µ-LEDs or optoelectronic semiconductor chips can have the above-described configurations of the method for picking up and depositing µ-LEDs or optoelectronic semiconductor chips.

A further aspect for the realization of µ-displays concerns a solution in which a double transfer process is used for the transport and positioning of µ-LEDs on a backplane substrate, wherein an intermediate carrier is formed in the target size of the array, in particular the display, and has an identical µ-LED density as the wafer on which the µ-LEDs are manufactured. During the transfer to the target substrate, a thinning of the microchips is carried out, whereby in the best case the microchips of one color are transferred from the intermediate carrier to the target substrate by a correspondingly large transfer stamp in a single transfer step per color red, green. An average number of transfer steps per array can be effectively reduced by more than one order of magnitude by means of such a two-stage transfer process. This results in cost savings in the production of large area µ-displays by reducing the number of stamping steps by using an intermediate carrier According to some aspects, a process for the production of a number (n or less) of arrays A of optoelectronic pixels, which are in particular µ-displays. The process can also be carried out for each of the colors red, green and blue. In a first step, a large number of µ-LEDs with a first density are generated on a wafer or carrier substrate. Then a first transfer stamp is used to transfer the µ-LEDs to an intermediate carrier with the first density. Then a second transfer step is performed by means of a second transfer stamp. This transfers the µ-LEDs from the intermediate carrier to a target substrate with a second density that is a factor n (n in particular an integer) smaller than the first density. The target substrate provides a common array surface for a respective one of the arrays, in particular for all three colors, the size of the intermediate carrier being equal to or larger than that of the second transfer stamp and the size of the second transfer stamp being equal to or smaller than the array surface by a factor k (k in particular an integer).

In a further aspect, an intermediate carrier can be provided on which module areas removed from the carrier substrate can be set down from the first transfer stamp. The intermediate carrier can have several module areas. In this way, an intermediate carrier is provided on which module areas can be temporarily transferred completely, but which can also be removed again in a second transfer step in order to transfer to a final target substrate.

The µ-LEDs on a carrier substrate can be manufactured in such a way that they can be removed from the carrier substrate individually or in parallel by means of anchor elements. The adhesive force on the intermediate carrier must be stronger than the adhesive force of the µ-LEDs on the first transfer stamp. If the µ-LEDs are removed from the intermediate carrier for a second time, the adhesive force of the µ-LEDs on the second transfer stamp must be correspondingly greater than the adhesive force on the intermediate carrier. Likewise, the transfer from the second transfer stamp to the final substrate surface must be possible by a suitable choice of adhesive, intervias or soldering on the target substrate. The coordination of adhesive and release forces by a suitable material selection and a suitable process control for the two stamping processes leads to the provision of a starting structure.

For this purpose, the system proposes a start structure that uses a two-level use of anchor elements. On the one hand, anchor elements are used for entire module areas on which many thousands or many millions of µ-LEDs are arranged. Secondly, anchor elements are used for the transfer of µ-LEDs from the intermediate carrier to the target substrate.

According to another aspect, when creating the µ-LEDs, they can be created together with the respective module areas, which can each be connected to the carrier substrate. According to a further embodiment, when generating the µ-LEDs, first anchor elements for connecting with a first adhesive force can be formed between the module areas and the wafer and/or second anchor elements for connecting with a second adhesive force can be formed between the µ-LEDs and the module areas.

A further aspect concerns the lift-off force. A lift-off force is a force that must be applied at least to perform a lift-off. For example, when performing the first transfer steps, the lifting force of the lifting first transfer die can be set to be greater than the first adhesive force and less than the second adhesive force so that the module areas can be lifted off the wafer and transferred to the intermediate carrier. Correspondingly, it is conceivable in a further aspect that, when carrying out the second transfer steps, the lifting force of the lifting second transfer stamp is set greater than the second adhesive force in such a way that the microchips can be lifted off the module areas and transferred to the target substrate.

In another aspect, release elements are formed between wafer and module areas and/or between µ-LEDs and module areas in such a way that after their removal, a first and/or a second defined adhesive force is set in each case. It is also conceivable that when generating the µ-LEDs between the module areas and the wafer, additional first release elements for connecting with an additional first adhesive force and/or between the microchips and the module areas, additional optional second release elements for connecting with an additional second adhesive force are formed.

According to another embodiment, when carrying out the first transfer steps, the lifting force of the lifting first transfer die can be set to be greater than the total first adhesive force and less than the total second adhesive force so that the module areas can be lifted off the wafer and transferred to the intermediate carrier. Alternatively or additionally, when carrying out the second transfer steps, the lifting force of the lifting second transfer stamp can be set to be greater than the total second adhesive force so that the microchips can be lifted off the module areas and transferred to the target substrate.

In a further aspect of this, the additional second adhesive force can be reduced to zero by removing the second release elements beforehand. In this way, the lifting force of the lifting second transfer stamp need not be greater than the lifting force of the lifting first transfer stamp.

According to another embodiment, materials with a greater adhesive force than the second defined adhesive force can be used to carry out the second transfer step for the adhesion of the module areas to the intermediate carrier. The second adhesive force is set accordingly for the second transfer step using separate anchor elements and, if necessary, release elements. It is conceivable to form lifting elements directly on the module areas for lifting and transferring the module areas to the intermediate carrier in order to carry out the first transfer step.

A further aspect deals with the correct positioning of the module areas on the intermediate carrier or even the target substrate. In one aspect of this, positioning elements are formed directly on the module areas to carry out the first transfer steps for the precise transfer of the module areas to the intermediate carrier. These positioning elements serve as orientation for the first transfer stamp. The positioning elements can be provided by means of the lifting elements.

According to another embodiment, for the execution of the second transfer steps, tapping elements can be formed on the second transfer die for thinning out the µ-LEDs into the second density. The density of these elements corresponds to the second density of a display.

According to another aspect, the size of the rectangular first transfer die can be chosen smaller by a factor of s to the size of the round carrier substrate in such a way that the size of an area of lost µ-LEDs at the edge of the carrier substrate for the first transfer to completely fill the receiving area is small, in particular per color less than or equal to 20% or less than or equal to 30% of the carrier substrate area. Alternatively, the size of the rectangular first transfer stamp can be selected to be smaller than the size of the intermediate carrier by a factor r in such a way that the number of first transfer steps r for the first transfer for complete loading of the intermediate carrier is small, in particular per color less than or equal to 10 or less than or equal to 50.

According to another embodiment, the shape of the intermediate carrier can correspond to the shape of the second transfer stamp and this in particular to the shape of the array surface. The shape of the array of optoelectronic pixels can be rectangular, trapezoidal, triangular or polygonal, have rounded corners, or be any other free form. According to another embodiment, the intermediate carrier can be equipped with tested module areas from one carrier substrate or from different carrier substrates. According to another embodiment, the distances between the µ-LEDs on the respective wafer can correspond to the distance between the µ-LEDs on the intermediate carrier.

According to a further embodiment, the distances between µ-LEDs on a respective intermediate carrier and on a respective target substrate in an x-direction can be different from those in a y-direction. According to another embodiment, the target substrate can be equipped with module areas of several intermediate carriers.

According to another embodiment, the color of the microchips of a respective intermediate carrier can be monochrome red, green or blue and the number of n color arrays can be formed from three intermediate carriers, which have microchips of different colors to each other.

According to another embodiment, first first release elements can be selectively removed between wafer and module areas and then second release elements between microchips and module areas.

BRIEF DESCRIPTION OF THE DRAWINGS

In the following section, some of the above-mentioned and summarized aspects are explained in more detail using various explanations and examples.

FIGS. 3B-1 and 3B-2 illustrate a table of preferred applications for µ-LED arrays;

FIG. 15 shows a fourth embodiment of a pixel array with some aspects according to the proposed principle;

FIG. 16A is a fifth embodiment of a pixel array;

FIGS. 25A to 25J show a fourth embodiment of a process for manufacturing a μ-LED with a holding structure according to some aspects of the presented concept;

FIGS. 47A to 47E show a further embodiment of an invention-related procedure using a first start structure;

FIGS. 53A to 53F show examples of the use of anchor elements and release elements between microchips and module areas;

FIG. 59 shows a further illustration of an embodiment of a proposed base module to provide a two row and two column light emitting diode module according to some aspects of the concept presented;

FIGS. 60A to 60D show four cross sections of two oppositely oriented base modules of two adjacent rows;

FIG. 62A to 62D illustrate four cross sections of two oppositely oriented base modules of two adjacent rows;

FIG. 76 shows a schematic side view of FIG. 75;

FIGS. 77A to 77C show various embodiments in which a module is placed on a carrier and electrically contacted;

DETAILED DESCRIPTION

Figure 1A:
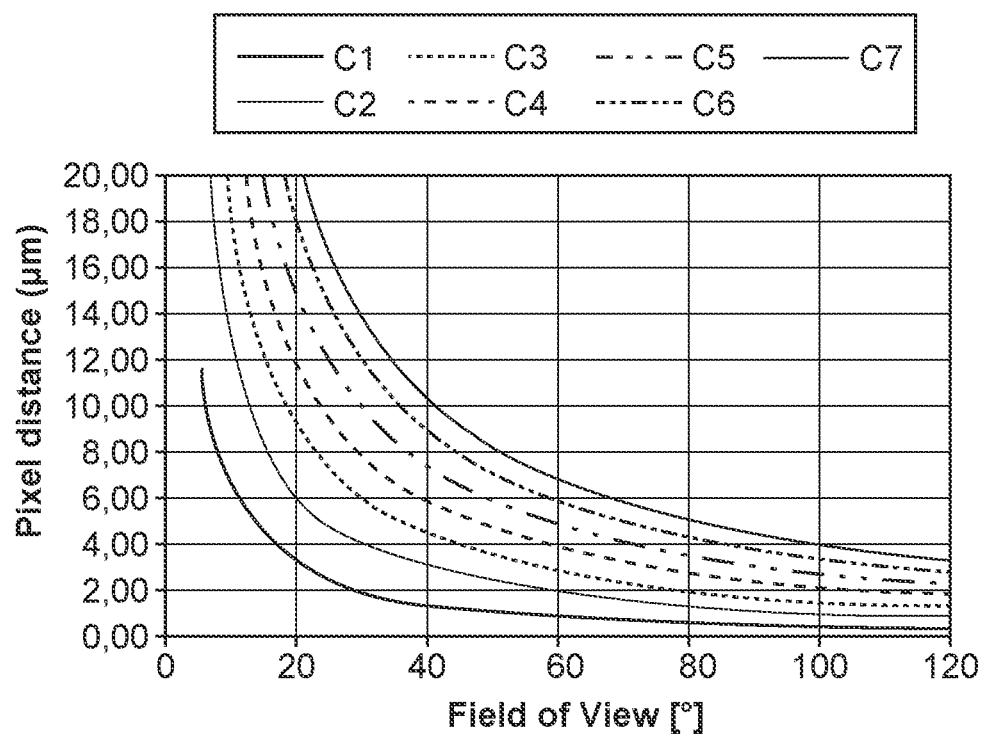
FIG. 1A shows a diagram illustrating some requirements for so-called µ-displays or micro-displays of different sizes with respect to the field of view and pixel pitch of the µ-display.

Augmented reality is usually generated by a dedicated display whose image is superimposed on reality. Such device can be positioned directly in the user's line of sight, i.e. directly in front of it. Alternatively, optical beam guidance elements can be used to guide the light from a display to the user's eye. In both cases, the display may be implemented and be part of the glasses or other visually enhancing devices worn by the user. Google's™ Glasses is an example of such a visually augmenting device that allows the user to overlay certain information about real world objects. For the Google™ glasses, the information was displayed on a small screen placed in front of one of the lenses. In this respect, the appearance of such an additional device is a key characteristic of eyeglasses, combining technical functionality with a design aspect when wearing glasses. In the meantime, users require glasses without such bulky or easily damaged devices to provide advanced reality functionality. One idea, therefore, is that the glasses themselves become a display or at least a screen on or into which the information is projected.

In such cases, the field of vision for the user is limited to the dimension of the glasses. Accordingly, the area onto which extended reality functionality can be projected is approximately the size of a pair of spectacles. Here, the same, but also different information can be projected on, into or onto the two lenses of a pair of spectacles.

In addition, the image that the user experiences when wearing glasses with augmented reality functionality should have a resolution that creates a seamless impression to the user, so that the user does not perceive the augmented reality as a pixelated object or as a low-resolution element. Straight bevelled edges, arrows or similar elements show a staircase shape that is disturbing for the user at low resolutions.

In order to achieve the desired impression, two display parameters are considered important, which have an influence on the visual impression for a given or known human sight. One is the pixel size itself, i.e. the geometric shape and dimension of a single pixel or the area of 3 subpixels representing the pixel. The second parameter is the pixel pitch, i.e. the distance between two adjacent pixels or, if necessary, subpixels. Sometimes the pixel pitch is also called pixel gap. A larger pixel pitch can be detected by a user and is perceived as a gap between the pixels and in some cases causes the so-called fly screen effect. The gap should therefore not exceed a certain limit.

The maximum angular resolution of the human eye is typically between 0.02 and 0.03 angular degrees, which roughly corresponds to 1.2 to 1.8 arc minutes per line pair. This results in a pixel gap of 0.6-0.9 arc minutes. Some current mobile phone displays have about 400 pixels/inch, resulting in a viewing angle of approximately 2.9° at a distance of 25 cm from a user's eye or approximately 70 pixels/° viewing angle and cm. The distance between two pixels in such displays is therefore in the range of the maximum angular resolution. Furthermore, the pixel size itself is about 56 µm.

FIG. 1A illustrates the pixel pitch, i.e. the distance between two adjacent pixels as a function of the field of view in angular degrees. In this respect, the field of view is the extension of the observable world seen at a given moment. This is because human vision is defined as the number of degrees of the angle of view during stable fixation of the eye.

In particular, humans have a forward horizontal arc of their field of vision for both eyes of slightly more than 210°, while the vertical arc of their field of vision for humans is around 135°. However, the range of visual abilities is not uniform across the field of vision and can vary from person to person. The binocular vision of humans covers approximately 114° horizontally (peripheral vision), and about 90° vertically. The remaining degrees on both sides have no binocular area but can be considered part of the field of vision.

Furthermore, color vision and the ability to perceive shapes and movement can further limit the horizontal and vertical field of vision. The rods and cones responsible for color vision are not evenly distributed.

Figure 1B:
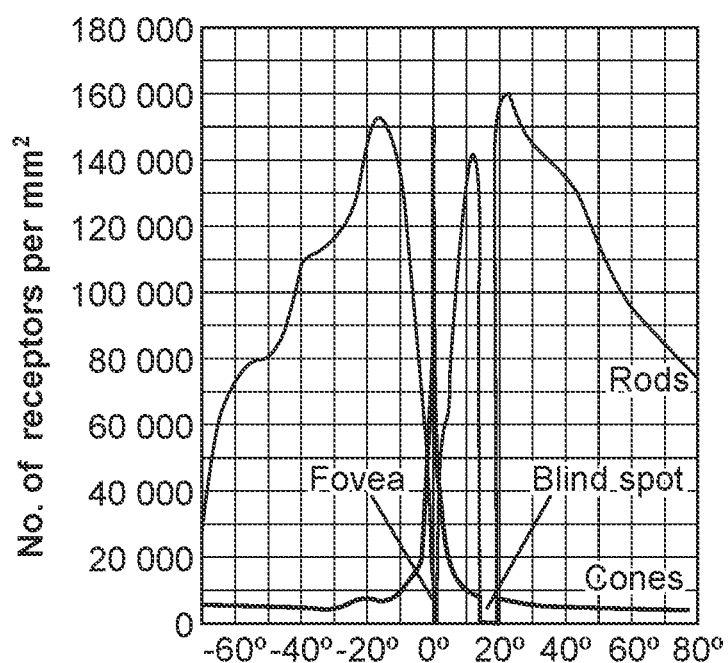
FIG. 1B shows a diagram of the spatial distribution of rods and cones in the human eye.
Figure 1C:
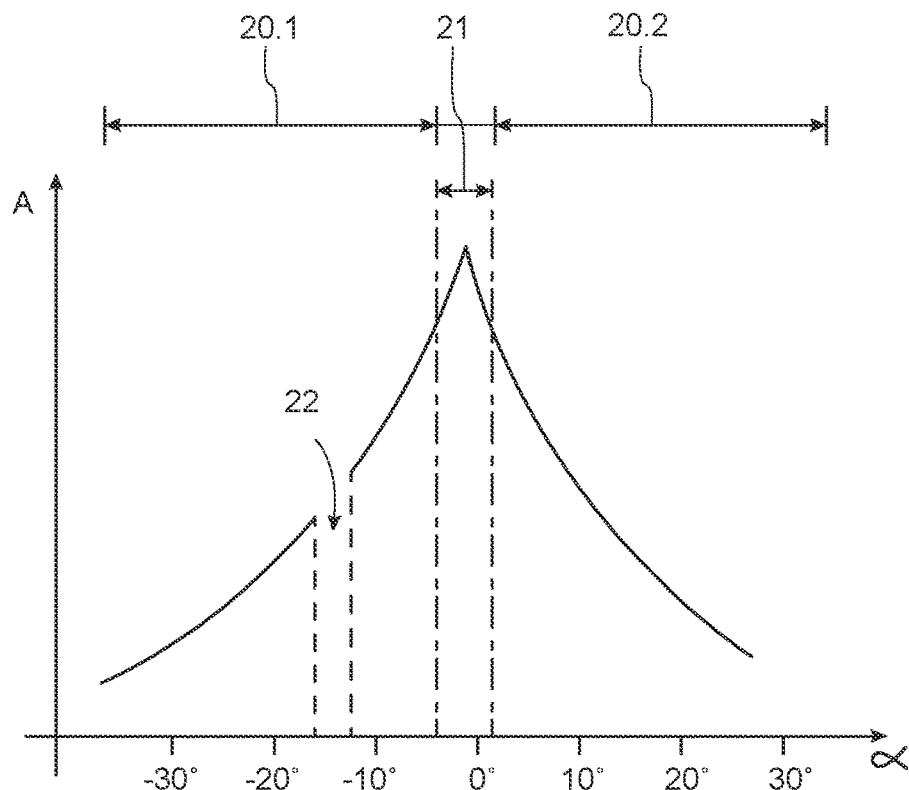
FIG. 1C shows a diagram of the perceptual capacity of the human eye with assigned projection areas.
Figure 1D:
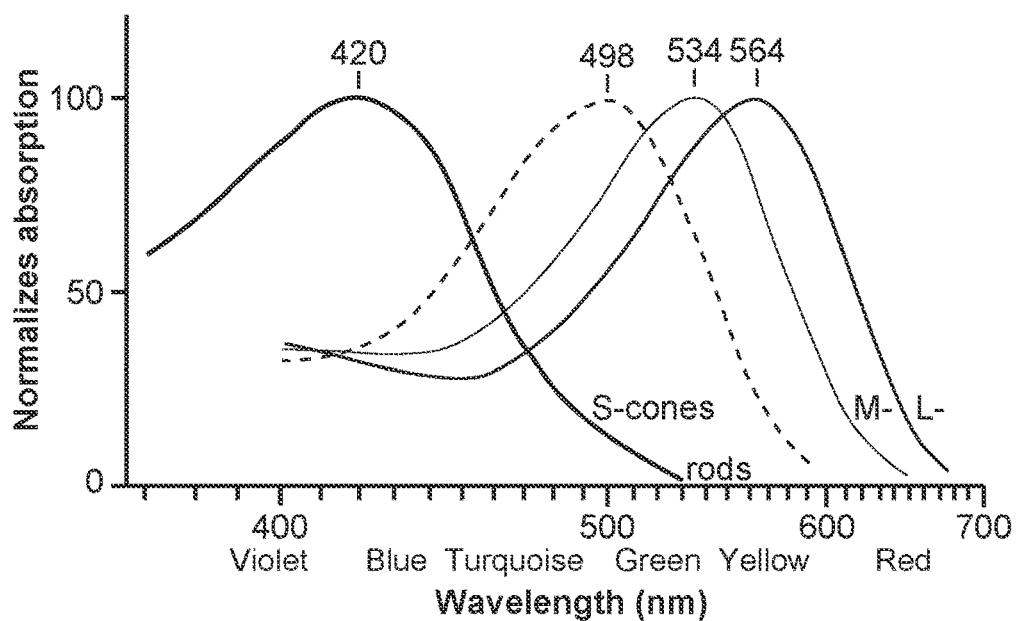
FIG. 1D is a figure showing the sensitivity of the rods and cones over the wavelength.

This point of view is shown in more detail in FIGS. 1B to 1D. In the area of central vision, i.e. directly in front of the eye, as required for Augmented Reality applications and partly also in the automotive sector, the sensitivity of the eye is very high both in terms of spatial resolution and in terms of color perception.

FIG. 1B shows the spatial density of rods and cones per $mm^2$ as a function of the fovea angle. FIG. 1C describes the color sensitivity of cones and rods as a function of wavelength. In the central area of the fovea, the increased density of cones (L, S and M) means that better color vision predominates. At a distance of about 25° around the fovea, the sensitivity begins to decrease and the density of the visual cells decreases. Towards the edge, the sensitivity of color vision decreases, but at the same time contrast vision by means of the rods remains over a larger angular range. Overall, the eye develops a radially symmetrical visual pattern rather than a Cartesian visual pattern. A high resolution for all primary colors is therefore required, especially in the center. At the edge it may be sufficient to work with an emitter adapted to the spectral sensitivity of the rods (max. sensitivity at 498 nm, see FIG. 1D and the sensitivity of the eye).

FIG. 1C shows the different perceptual capacity of the human eye by means of a graph of the angular resolution A relative to the angular deviation α from the optical axis of the eye. It can be seen that the highest angular resolution A is in an interval of the angular deviation α of +/−2.5°, in which the fovea centralis 7 with a diameter of 1.5 mm is located on the retina 19. In addition, the position of the blind spot 22 on the retina 19 is sketched, which is located in the area of the optic nerve papilla 23, which has a position with an angular deviation α of about 15°.

The eye compensates this non-constant density and also the so-called blind spot by small movements of the eye. Such changes in the direction of vision or focus can be counteracted by suitable optics and tracking of the eye.

Furthermore, even with glasses, the field of vision is further restricted and, for example, can be approximately in the range of 80° for each lens.

The pixel pitch in FIG. 1A on the Y-axis is given in µm and defines the distance between two adjacent pixels. The various curves C1 to C7 define the diagonal dimension of a corresponding display from 5 mm to approximately 35 mm. For example, curve C1 corresponds to a display with the diagonal size of 5 mm, i.e. a side length of approximately 2.25 mm. For a field of view of approximately 80°, the pixel pitch of a display with a diagonal size of 5 mm is in the range of 1 µm. For larger displays like curve C7 and 35 mm diagonal size, the same field of view can be implemented with a pixel pitch of approximately 5 µm.

Nevertheless, the curves in FIG. 1A illustrate that for larger fields of view, which are preferred for extended reality applications, very high pixel densities with small pixel pitch are required if the well-known fly screen effect is to be avoided. One can now calculate the size of the pixel for a given number of pixels, a given field of view and a given diagonal size of a µ-display.

Equation 1 shows the relationship between dimension D of a pixel, pixel pitch pp, number N of pixels and the edge length d of the display. The distance r between two adjacent pixels calculated from their respective centers is given by $$r = d/2 + pp + d/2.$$

$$D = d/N - pp \quad (1)$$

$$N = d/(D + pp)$$

Assuming that the display (e.g. glasses) is at a distance of 2.54 cm (1 inch) from the eye, the distance r between two adjacent pixels for an angular resolution of 1 arcminute as roughly estimated above is given by $$r = \tan(1/60°) * 30 \text{ mm}$$

$$r = 8.7 \text{ µm}$$

The size of a pixel is therefore smaller than 10 µm, especially if some space is required between two different pixels. With a distance, r between two pixels and a display with the size of 15 mm×10 mm, 1720×1150 pixels can be arranged on the surface.

Figure 2A:
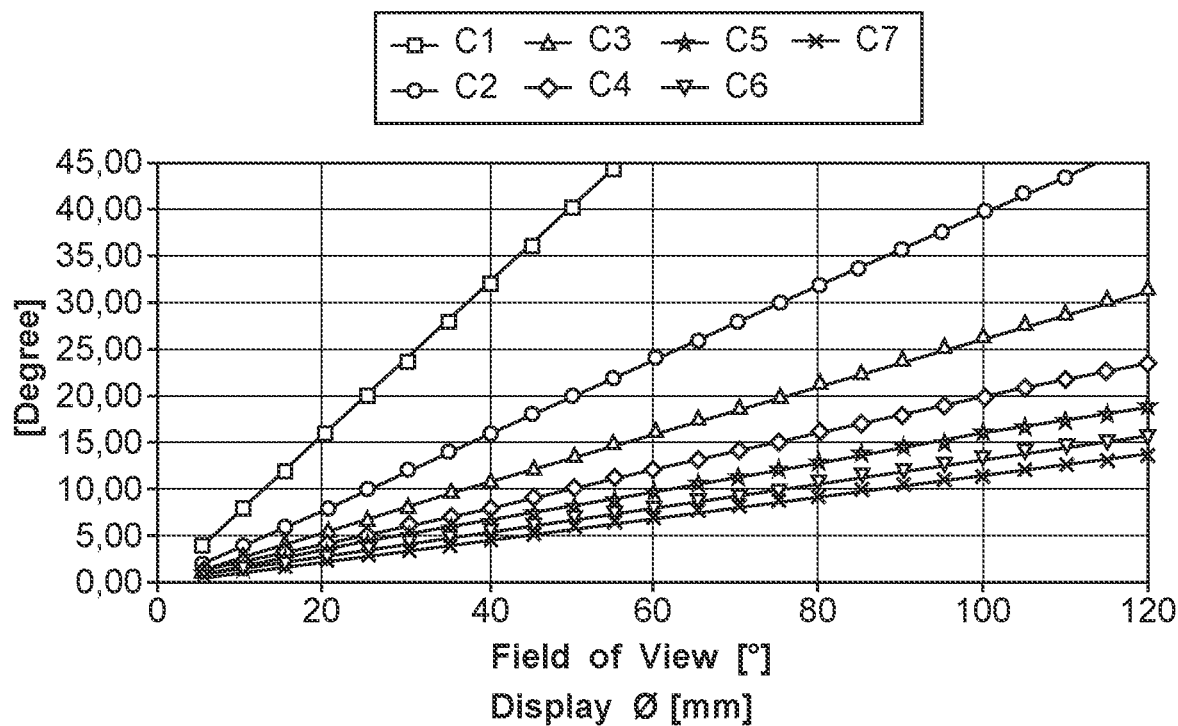
FIG. 2A is a diagram illustrating some requirements for micro-displays of different sizes in terms of the field of view and the angle of collimation of a pixel of the µ-display.
Figure 2B:
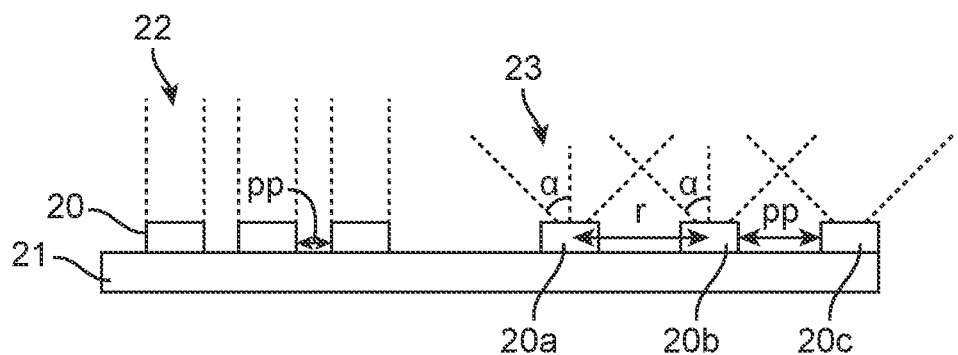
FIG. 2B illustrates an exemplary execution of a pixel arrangement to illustrate the parameters used in FIGS. 1A and 2A.

FIG. 2B shows an arrangement, which has a carrier 21 on which a large number of pixels, 20 and 20a to 20c are arranged. Pixels 20 arranged side by side have the pixel pitch pp, while pixels 20a to 20c are placed on carrier 21 with a larger pixel pitch pp. The distance between two pixels is given by the sum of the pixel pitch and half the size for each adjacent pixel. Each of the pixels 20 is configured so that its illumination characteristic or its emission vector 22 is substantially perpendicular to the emission surface of the corresponding LED.

The angle between the perpendicular axes to the emission surface of the LED and the beam vector is defined as the collimation angle. In the example of emission vector 22, the collimation angle of LEDs 20 is approximately zero. LED 20 emits light that is collinear and does not widen significantly.

In contrast, the collimation angle of the emission vector 23 of the LED pixels 20a to 20c is quite large and in the range of approximately 45°. As a result, part of the light emitted by LED 20a overlaps with the emission of an adjacent LED 20b.

The emission of the LEDs 20a to 20c is partially overlapping, so that its superposition of the corresponding light emission occurs. In case the LEDs emit light of different colors, the result will be a color mixture or a combined color. A similar effect occurs between areas of high contrast, i.e. when LED 20a is dark while LED 20b emits a certain light. Because of the overlap, the contrast is reduced and information about each individual position corresponding to a pixel position is reduced.

In displays where the distance to the user's eye is only small, as in the applications mentioned above, a larger collimation angle is rather annoying due to the effects mentioned above and other disadvantages. A user is able to see a wide collimation angle and may perceive displayed objects in slightly different colors blurred or with reduced contrast.

FIG. 2A illustrates in this respect the requirement for the collimation angle in degrees against the field of view in degrees, independent of specific display sizes. For smaller display sizes such as the one in curve C1 (approx. 5 mm diagonal), the collimation angle increases significantly depending on the field of view.

As the size of the display increases, the collimation angle requirements change drastically, so that even for large display geometries such as those illustrated in curve C7, the collimation angle reaches about 10° for a field of view of 100°. In other words, the collimation angle requirements for larger displays and larger fields of view are increasing. In such displays, light emitted by a pixel must be highly collimated to avoid or reduce the effects mentioned above. Consequently, strong collimation is required when displays with a large field of view are to be made available to a user, even if the display geometry is relatively large.

As a result of the above diagrams and equations, one can deduce that the requirements regarding pixel pitch and collimation angle become increasingly challenging as the display geometry and field of view grow. As already indicated by equation 1, the dimension of the display increases strongly with a larger number of pixels. Conversely, a large number of pixels is required for large fields of view if sufficient resolution is to be achieved and fly screens or other disturbing effects are to be avoided.

Figure 3A:
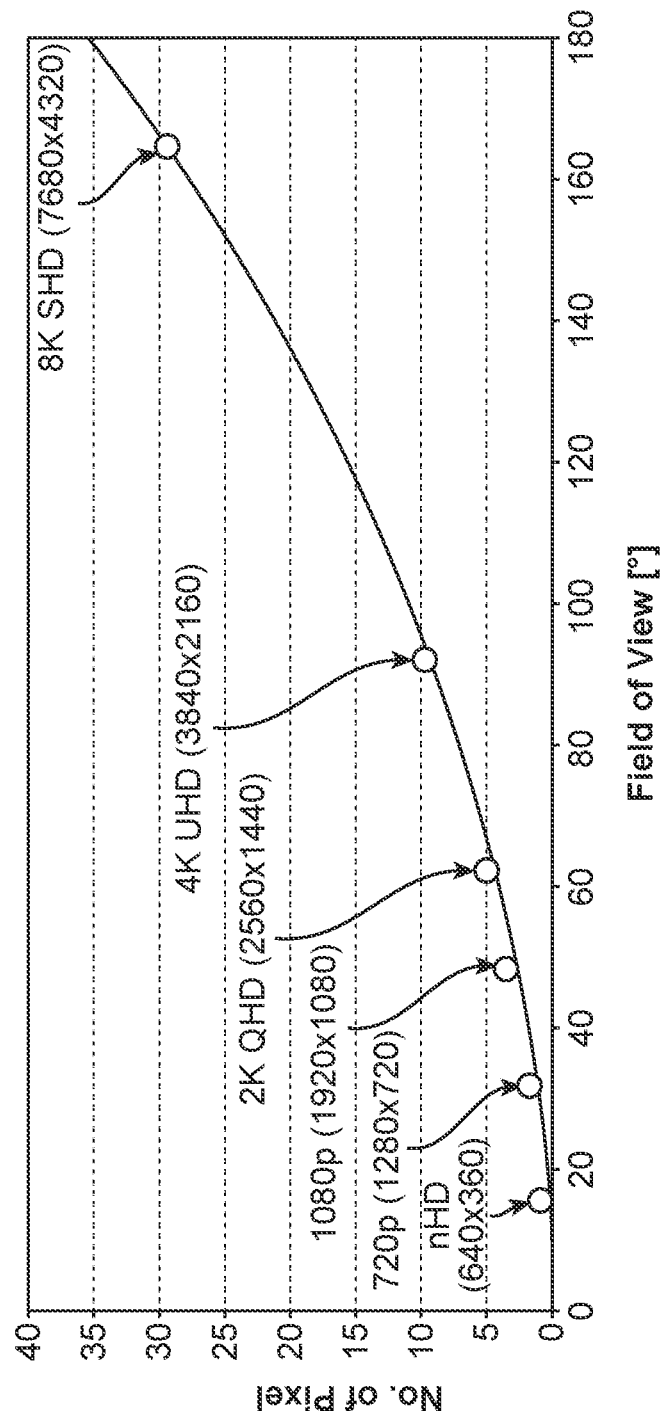
FIG. 3A shows a diagram illustrating the number of pixels required depending on the field of view for a specific resolution.

FIG. 3A shows a diagram of the number of pixels required to achieve an angular resolution of 1.3 arc minutes. For a field of view of approximately 80°, the number of pixels exceeds 5 million. It is easy to estimate that the size of the pixels for a QHD resolution is well below 10 μm, even if the display is 15 mm×10 mm. In summary, advanced reality displays with resolutions in the HD range, i.e. 1080p, require a total of 2.0736 million pixels. This allows a field of view of approximately 50° to be covered. Such a quantity of pixels arranged on a display size of 10×10 mm with a distance between the pixels of 1 μm results in a pixel size of about 4 μm.

In contrast, the table in FIGS. 3B-1 and 3B-2 shows several application areas in which μ-LED arrays can be used. The table shows applications (use case) of μ-LED arrays in vehicles (Auto) or for multimedia (MM), such as automotive displays and exemplary values regarding the minimum and maximum display size (min. and max. size X Y [cm]), the pixel density (PPI) and the pixel pitch (PP [μm]) as well as the resolution (Res.-Type) and the distance of the viewer (Viewing Distance [cm]) to the lighting device or display. In this context, the abbreviations "very low res", "low res", "mid res" and "high res" have the following meaning:

| | | |
|---|---|---|
| very low res | pixel pitch approx. | 0.8-3 mm |
| low res | Pixel pitch approx. | 0.5-0.8 mm |
| mid res | Pixel pitch approx. | 0.1-0.5 mm |
| high res | Pixel pitch less than | 0.1 mm |

The upper part of the table, entitled "Direct Emitter Displays", shows inventive applications of μ-LED arrays in displays and lighting devices in vehicles and for the multimedia sector. The lower part of the table, titled "Transparent Direct Emitter Displays", names various applications of μ-LED arrays in transparent displays and transparent lighting devices. Some of the applications of μ-displays listed in the table are explained in more detail below in the form of embodiments.

The above considerations make it clear that challenges are considerable in terms of resolution, collimation and field of view suitable for extended reality applications. Accordingly, very high demands are placed on the technical implementation of such displays.

Conventional techniques are configured for the production of displays that have LEDs with edge lengths in the range of 100 μm or even more. However, they cannot be automatically scaled to the sizes of 70 μm and below required here. Pixel sizes of a few μm as well as distances of a few μm or even less come closer to the order of magnitude of the wavelength of the generated light and make novel technologies in processing necessary.

In addition, new challenges in light collimation and light direction are emerging. Optical lenses, for example, which can be easily structured for larger LEDs and can also be calculated using classical optics, cannot be reduced to such a small size without the Maxwell equations. Apart from this, the production of such small lenses is hardly possible without large errors or deviations. In some variants, quantum effects can influence the behaviour of pixels of the above-mentioned size and have to be considered. Tolerances in manufacturing or transfer techniques from pixels to sub mounts or matrix structures are becoming increasingly demanding. Likewise, the pixels must be contacted and individually controllable. Conventional circuits have a space requirement, which in some cases exceeds the pixel area, resulting in an arrangement and space problem.

Accordingly, new concepts for the control and accessibility of pixels of this size can be quite different from conventional technologies. Finally, a focus is on the power consumption of such displays and controllers. Especially for mobile applications, a low power consumption is desirable.

In summary, for many concepts that work for larger pixel sizes, extensive changes must be made before a reduction can be successful. While concepts that can be easily up scaled to LEDs at 2000 μm for the production of LEDs in the 200 μm range, downscaling to 20 μm is much more difficult. Many documents and literature that disclose such concepts have not taken into account the various effects and increased demands on the very small dimensions and are therefore not directly suitable or limited to pixel sizes well above 70 μm.

In the following, various aspects of the structure and design of μ-LED semiconductors, aspects of processing, light extraction and light guidance, display and control are presented. These are suitable and designed to realize displays with pixel sizes in the range of 70 μm and below. Some concepts are specifically designed for the production, light extraction and control of μ-LEDs with an edge length of less than 20 μm and especially less than 10 μm. It goes without saying, and is even desired, that the concepts presented here can and should be combined with each other for the different aspects. This concerns for example a concept for the production of a μ-LED with a concept for light extraction. In concrete terms, a μ-LED implemented by means of methods to avoid defects at edges or methods for current conduction or current constriction can be provided with light extraction structures based on photonic crystal structures. Likewise, a special drive can also be realized for displays whose pixel size is variable. Light guidance with piezoelectric mirrors can be realized for μ-LEDs displays based on the slot antenna aspect or on conventional monolithic pixel matrices.

In some of the following embodiments and described aspects, additional examples of a combination of the different embodiments or individual aspects thereof are suggested. These are intended to illustrate that the various aspects, embodiments or parts thereof can be combined with each other by the skilled person. Some applications require specially adapted concepts; in other applications, the requirements for the technology are somewhat lower. Automotive applications and displays, for example, may have a longer pixel edge length due to the generally somewhat greater distance to a user. Especially there, besides applications of extended reality, classical pixel applications or virtual reality applications exist. This is in the context of this disclosure for the realization of µ-LED displays, whose pixel edge length is in the range of 70 µm and below, also explicitly desired.

Figure 4A:
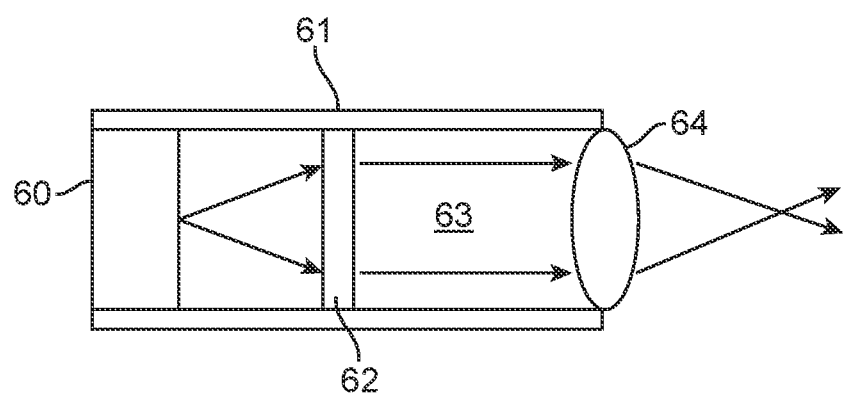
FIG. 4A shows a principle representation of a µ-LED display with essential elements for light generation and light guidance.
Figure 4B:
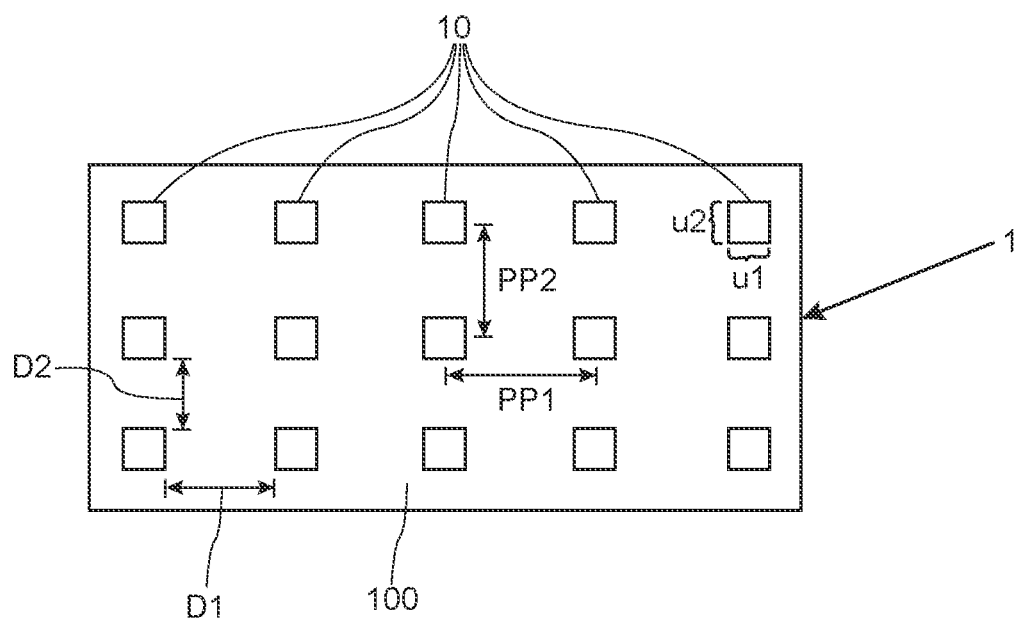
FIG. 4B shows a schematic representation of a µ-LED array with similar µ-LEDs.
Figure 4C:
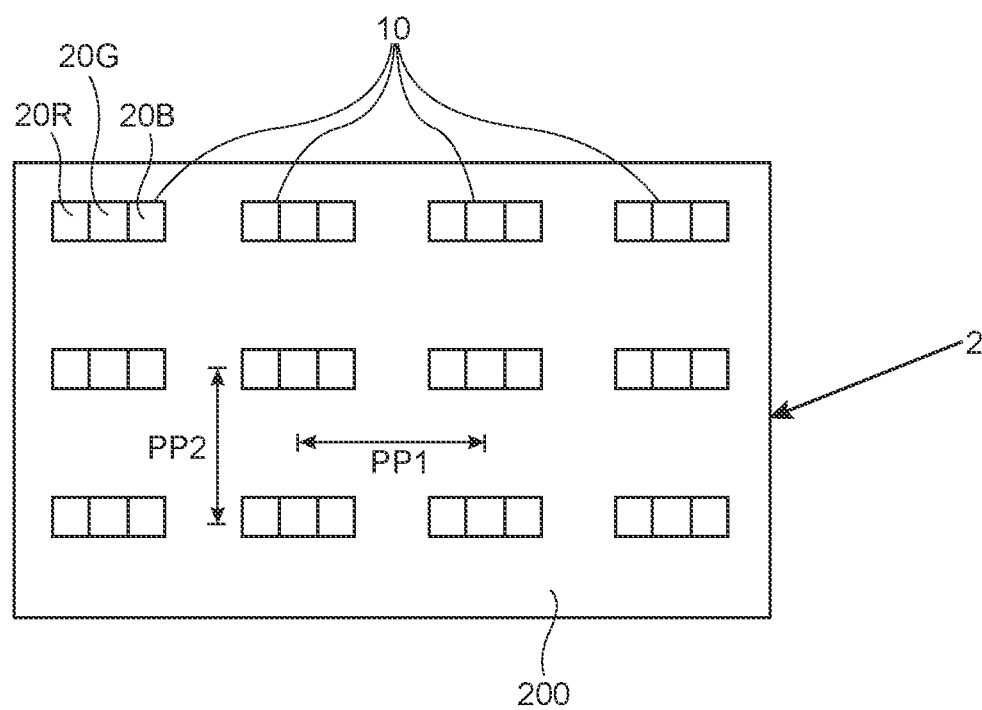
FIG. 4C is a schematic representation of a µ-LED array with µ-LEDs of different light colors.

A general illustration of the main components of a pixel in a µ-display is shown schematically in FIG. 4A. It shows an element 60 as a light generating and light emitting device. Various aspects of this are described in more detail below in the section on light generation and processing. Element 60 also includes basic circuits, interconnects, and such to control the illumination, intensity, and, when applicable, color of the pixel. Aspects of this are described in more detail in the section on light control. Apart from light generation, the emitted light must be collimated. For this purpose, many pixels in microdisplays have such collimation functionality in element 60. The parallel light in element 63 is then fed for light guidance into some optics 64, for further shaping and the like. Light collimation and optics suitable for implementing pixels for microdisplays are described in the section on light extraction and light guidance.

The pixel device of FIG. 4A illustrates the different components and aspects as separate elements. An expert will recognize that many components can be integrated into a single device. In practice, the height of a µ-display is also limited, resulting in a desired flat arrangement.

The following section concern various aspects of processing a µ-LED, which can be used to improve the electrical or optical properties or to create new fields of application or realization possibilities. It goes without saying that µ-LEDs come in different forms, structures and features. Some of those aspects are disclosed in the previous mentioned PCT-application, the disclosure of which is incorporated herein. The µ-LED are in some aspects implemented in a monolitical way, in other aspects a µ-LED or a few µ-LED form a pixel which are subsequently processed individually. As outlined herein, the various aspects of processing aim to improve the characteristics of the semiconductor structure or simplify the transfer.

Figure 5:
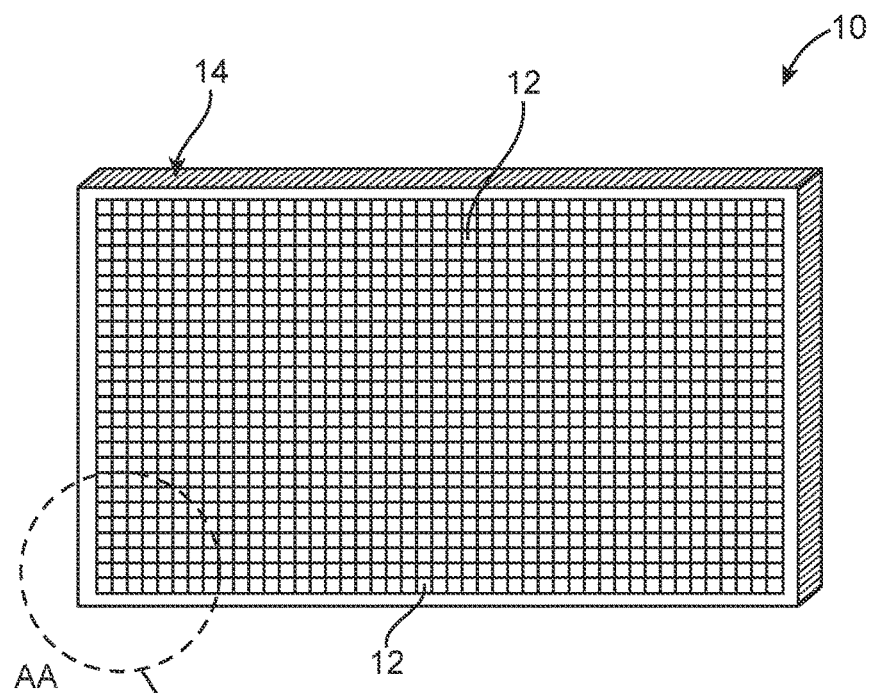
FIG. 5 shows a simplified structure of a display with pixel elements arranged in rows and columns.

For illustrating the aspect of
pixel elements with electrically separated and optically coupled subpixels
a simplified schematic diagram of an electronic display 10 is shown in FIG. 5, as it is often used in, for example, monitors, televisions, scoreboards or even small devices such as smart watches or smart phones. As is generally known, the basic structure is realized by a closely adjacent arrangement of a large number of pixels or pixel elements 12 in one plane. The pixel elements 12 are organized in rows and columns and can be controlled electronically individually. They are controlled in such a way that they can be varied in their luminosity as well as in their color tone and emitted wavelength. In the latter case, each pixel often comprises three sub-pixels, which in turn are designed to emit different wavelengths. The pixel elements 12 are often mounted on a substrate or carrier structure 14, which in this aspect are primarily intended to ensure mechanical stability of the arrangement.

This illustration shows clearly that in order to generate a sufficiently high resolution, several million of such pixel elements 12 must be spatially densely arranged both mechanically and electrically. At the same time, in many cases defective pixels 12 can be detected as dark dots between the active pixels. Especially due to extremely small dimensions, e.g. for µ-LEDs, the density and resolution of such displays increases on the one hand, while on the other hand there is a need for fault-free operation and production with as few rejects as possible.

Figure 6:
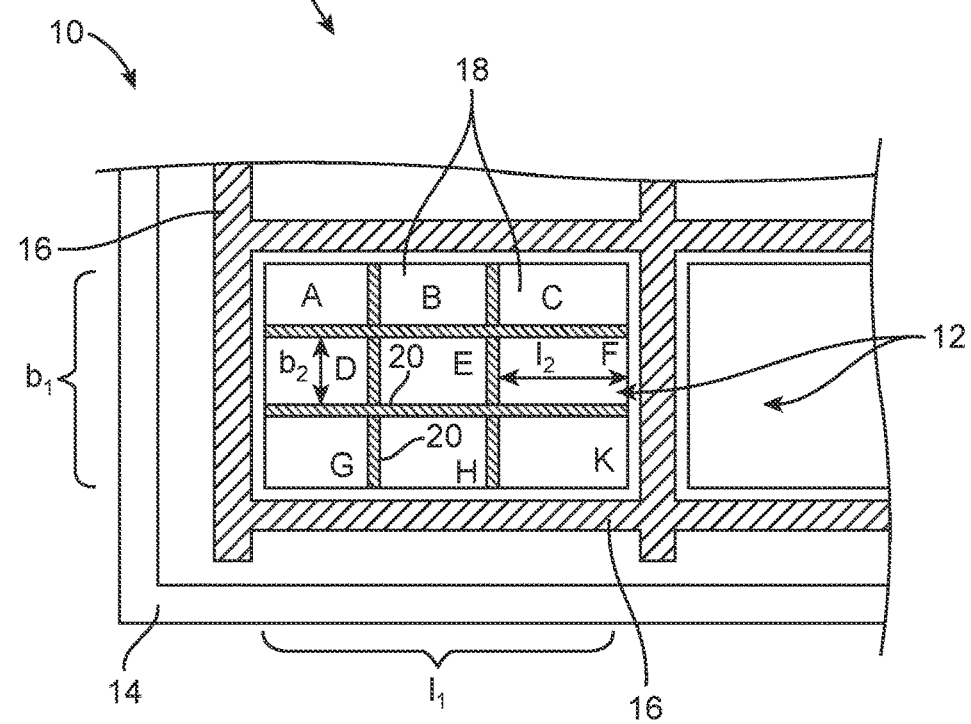
FIG. 6 shows an enlarged section of a display according to the previous figure with one pixel element and subpixels.

In FIG. 6, the section AA shown in FIG. 5 is enlarged in order to be able to describe the features of the solution in more detail. For example, substrate 14 is shown to simultaneously contain the control elements and serve as a support structure for the pixels. On substrate 14, individual pixel elements 12 are provided, which here are rectangular and of the same size. These identical sizes of the pixel elements 12 are often advantageous for manufacturing reasons, but can also be designed in different shapes or sizes according to an example. The pixel element 12 in the example shown here has a length l1 and a width b1. A pixel element separation layer 16 is provided between the pixel elements 12. The latter is in the range of a few µm, for example 0.5 µm to 3 µm.

Figure 7:
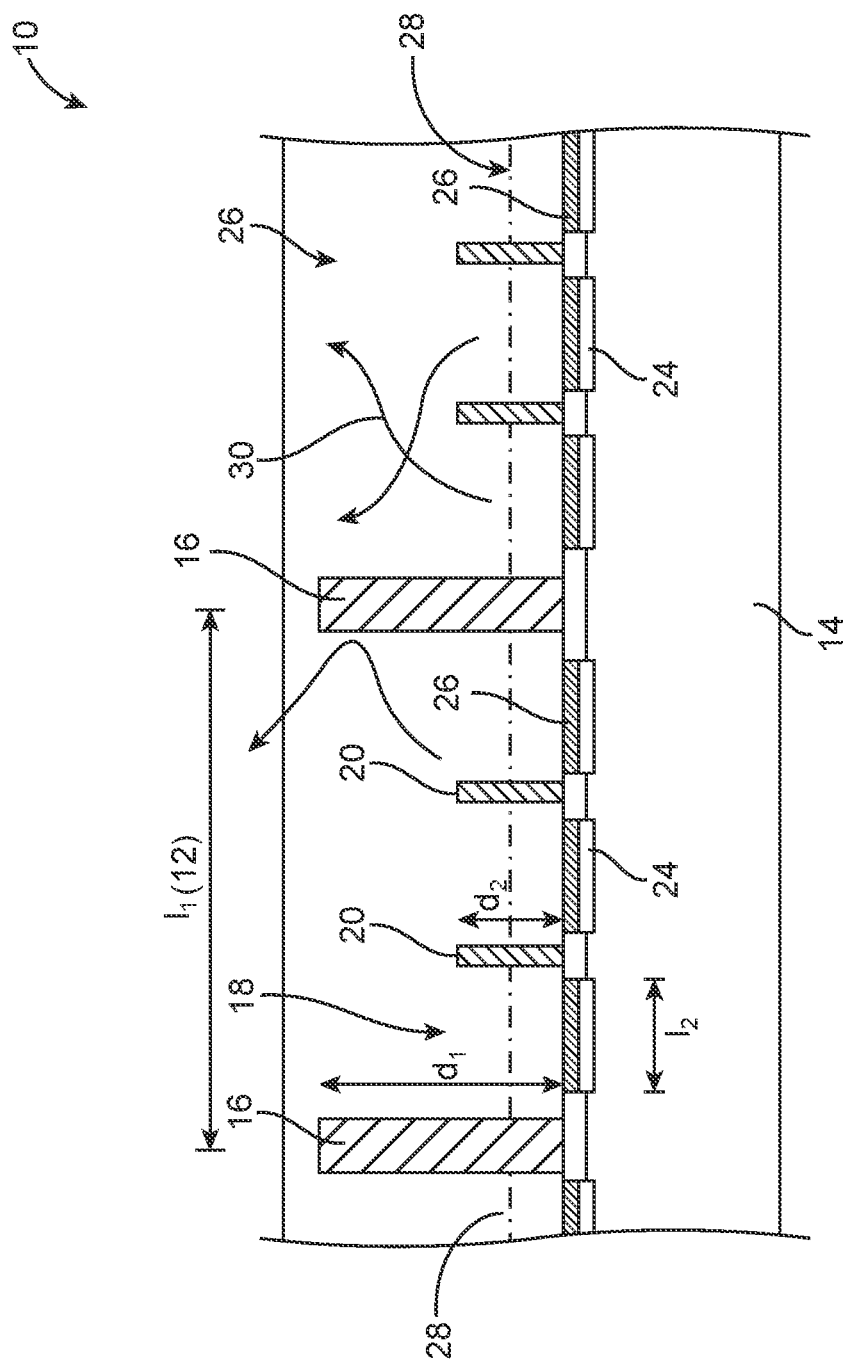
FIG. 7 shows a schematic vertical sectional view through a section of a display according to the proposed concept with a pixel element separation layer and subpixel separation elements.

The pixel element separation layer 16 is configured in such a way that the adjacent pixel elements 12 are electrically separated with respect to the control of the respective pixel elements. FIG. 7 shows a section of a pixel element in cross-sectional view. The pixel elements 12 are separated by a pixel element separation layer 16 and each comprises sub-pixels 18. The pixel element separation layer 16 provides electrical and optical separation between the pixel elements 12. This is intended to prevent light emitted by a pixel element 12 from passing through optical crosstalk into an adjacent pixel element 12 and being emitted from there.

Within a pixel element 12, a further subdivision into subpixels 18 is shown here, as an example of a selected pixel element 12. The subpixels 18, also known as fields, have the same size and shape here. A length l2 of a subpixel 18 is defined, whereby, according to an example, the length l1 of the pixel element 12 can result from a multiple of the length l2 of the subpixels 12 of the same size including any gaps. Similarly, a width b2 of a subpixel is specified, where, according to an example, the width b1 of the pixel element can also result from an approximate multiple of the width b2 of the respective equally sized subpixels 18 including any gaps. The representation selected here shows the subdivision of pixel element 12 into subpixels 18 or so-called fields for only one pixel element 12. However, the structuring is applicable to all pixel elements 12 arranged in a display 10.

Between two adjacent subpixels 18 of the same pixel element 12 a subpixel separator element 20 is also provided. This subpixel separating element 20 is configured in such a way that electrical separation takes place with respect to the control of an assigned subpixel (of length l2) (see FIG. 7). The subpixel separating element 20 is further configured in such a way that optical coupling or optical crosstalk is possible with respect to the light emitted by the subpixels 18. In other words, this means that within a pixel element 12 photons or light can cross talk from a subpixel 18 to one or more of the subpixels 18 located in the same pixel element 12, but not between two pixel elements 12.

For example, the various possible emittable colors of a pixel element 12 can be generated by combining the basic colors red, green and blue. Consequently, a pixel element 12 can contain subpixels 18, which can emit different wavelengths of light. In FIG. 6, for example, the total of nine subpixels 18 are marked with the letters A to K. According to one example, the subpixels A, D, and G are red LEDs, the subpixels B, E, and H are green LEDs, and the subpixels C, F, and K are blue LEDs. If, for example, red light is to be emitted by pixel element 12, the subpixels A, D and G are controlled simultaneously via the control electronics. If necessary, the control electronics can be used to test whether all subpixels A, D and G are functioning correctly. By this means, a desired brightness can be adjusted.

If, for example, one of the subpixels A, D or G is defective, the remaining pixels can still be controlled correctly due to the electrical separation. However, the optical crosstalk made possible by the subpixel separation element 20 allows the missing light of the defective subpixel 18 to be compensated by the adjacent subpixel 18. Thus, as long as a subpixel 18 of the same color from a group works and the remaining subpixels 18 of this group are defective, this remaining working subpixel 18 could compensate for the malfunctions of the defective subpixels and thus ensure a function of the pixel element 12 by redundancy. In an example, an optical crosstalk can also take place over several subpixels within a pixel element 12. Other possible arrangements would be, for example, the assignment of three subpixels 18 each to one of the basic colors red, green, or blue. Examples are the following grouping A/B/C, D/E/F and G/H/K. But also a diagonal assignment is conceivable, whereby an optical crosstalk should be advantageously possible.

FIG. 7 shows a sectional view through a section of a display 10. In the lower part of the figure a substrate 14 is shown, which among other things should provide a mechanically sufficiently stable support structure to accommodate the remaining structural elements. According to one example, this can be a wafer of a silicon IC. The substrate 14 can also comprise a driver circuit or drive electronics (not shown) and various electrical connections. These can, for example, be realized via conductor structures in the integrated circuit. Furthermore, contact structures 24 are provided, which can be used to drive a subpixel area 26. In the example shown here, this is arranged directly adjacent to contact structures 24. Via contact structures 24 it is possible to control an emitter chip 26 individually and selectively via the control electronics.

An epitaxial layer 26, for example, comprises different layers, which among other things allows the functionality of light-emitting diodes. For example, a p-n junction can be implemented by correspondingly differently doped layers or can also have one or more quantum well structures. Schematically and for simplicity, a region of a p-n junction 28 is indicated here by a dotted line. In the epitaxial layer 26, the structures of the pixel elements 12 and the subpixels 18 are introduced.

In detail, the individual pixel elements 12 can be identified via pixel element separation layers 16. These each have a length l1, which corresponds to a distance between two pixel element separation layers 16. Within the pixel elements 12, three subpixels 18 can be separated in the longitudinal direction. These each have a length l2. Subpixel separation elements 20 are arranged between the individual subpixels 18.

In the example shown here, the pixel element separation layers 16 and the subpixel separation elements 20 are each designed as a trench or similar structure. This means that the pixel element separation layers 16 and the subpixel separation element 20 are each incorporated into the epitaxial layer 26 as a trench-like, slit-like or similar structure, for example by etching processes. An electrically insulating material such as $SiO_2$ is then deposited in the trenches. In order to determine the electrical and optical properties of these trenches, a trench depth d1 of the pixel element separation layer 16 is chosen to be larger than a trench depth d2 of the subpixel separation element 20. Thus, it can be achieved that an optical crosstalk between subpixels 18 is possible due to the smaller depth d2 of the trench of the subpixel separation element 20.

In contrast, between two pixel elements 12, both optical crosstalk 30 and electrical crosstalk is prevented by the deeper trench d1 of the pixel element separation layer 16. According to one example, a depth d2 of the trench of the subpixel separation element 20 is chosen such that it passes through an area of a p-n junction 28. This can be advantageously used to prevent electrical interaction between two adjacent subpixels 18 or the associated emitter chips 22 and/or electrical or electromagnetic crosstalk.

In the example above, the pixel element separation layer 16 runs through the active layer to the edge of the opposite radiation surface, but does not cut through it. This allows the area close to the surface to be formed as a common contact connecting all pixels and sub-pixels with a potential connection. In addition, the pixel element separation layer 16 can include a mirror layer so that light generated by the pixel is optically redirected. In the example of FIG. 7, it is also shown that the subpixel separation element 20 passes through the active layer but ends shortly after. This prevents electrical crosstalk, but not optical crosstalk. Depending on the design and manufacturing parameters, the subpixel separator element 20 can also reach only to the active layer or slightly into it.

While in this embodiment the pixel element separation layer 16 and the subpixel separation elements 20 are designed as trenches with substantially vertical sidewalls, the invention is not limited to this. It is also possible to choose deliberately other shapes, which also have additional functionality such as light collimation or light guidance. As an example, sloping sidewalls for pixel element separation layer 16 can be mentioned.

Figure 8:
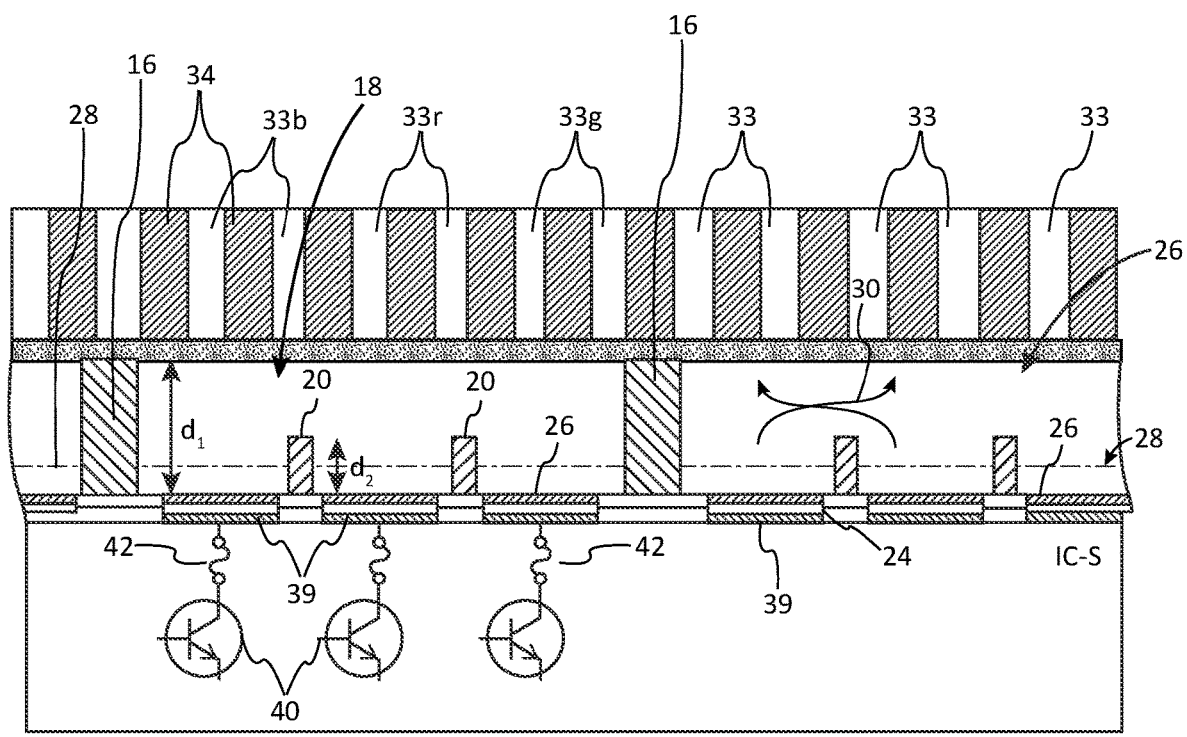
FIG. 8 illustrates a schematic vertical sectional view through pixel elements applied in a layer on a backplane.

In FIG. 8, an extension of the embodiment in the previous figure is shown. The pixel elements are implemented monolithically in or on a thin film substrate. Contacts 26 are arranged on the backside, i.e. the side facing away from the main radiation direction. These are located directly below the individual sub-pixels and are formed with a conductive metal, for example a gold or silver alloy. The size of the contacts essentially corresponds to the area of the individual subpixels. In this way, a suitable material system can be used to produce the pixels. In addition, process parameters such as temperature, precursors and others can be adjusted to the pixels to be produced.

Contacts 39 of a backplane or other substrate carrier are arranged opposite the contacts 26 of the subpixels. The backplane is configured with a different material system, e.g. silicon technology. The backplane contains the control for the individual subpixels as well as their power supply. Examples of current driver and drive concepts for µ-LEDs are disclosed in this application. In this version, the backplane includes additional fuses 42 for each individual subpixel. The fuses are in turn connected to current driver 40. If a defect occurs in one of the subpixels during production or a defect occurs during the positioning of the pixels on the backplane, the defective subpixels can be separated by means of the fuses.

The backplane is positioned with its contacts and then connected to the contacts of the pixels. Depending on the application, an auxiliary carrier (not shown here) can be provided to ensure sufficient stability for the pixel elements. For contacting, for example, the two surfaces can be glued together, provided that a conductive connection between the contacts is guaranteed.

On the other side of the pixel elements, a cover electrode is provided on the one hand, which creates an electrical contact to each subpixel. The cover electrode is led down one or more sides to a contact area. The cover electrode is transparent and consists for example of ITO. Along and above the pixel separators 14 additional metallic lines can be provided on the cover electrode. This reduces the surface resistance of the cover electrode and thus improves the current carrying capacity. The additional lines at this point do not have a negative effect on light extraction and shadows do not significantly affect the structure.

A light-shaping structure is arranged next to the cover electrode. This can either be arranged on the cover electrode or extend through the cover electrode and into the semiconductor material of the pixel, in some cases down to active region 28. The light-shaping structure comprises regions with different refractive indices. Various examples of such a structure are disclosed in this application.

Figure 9:
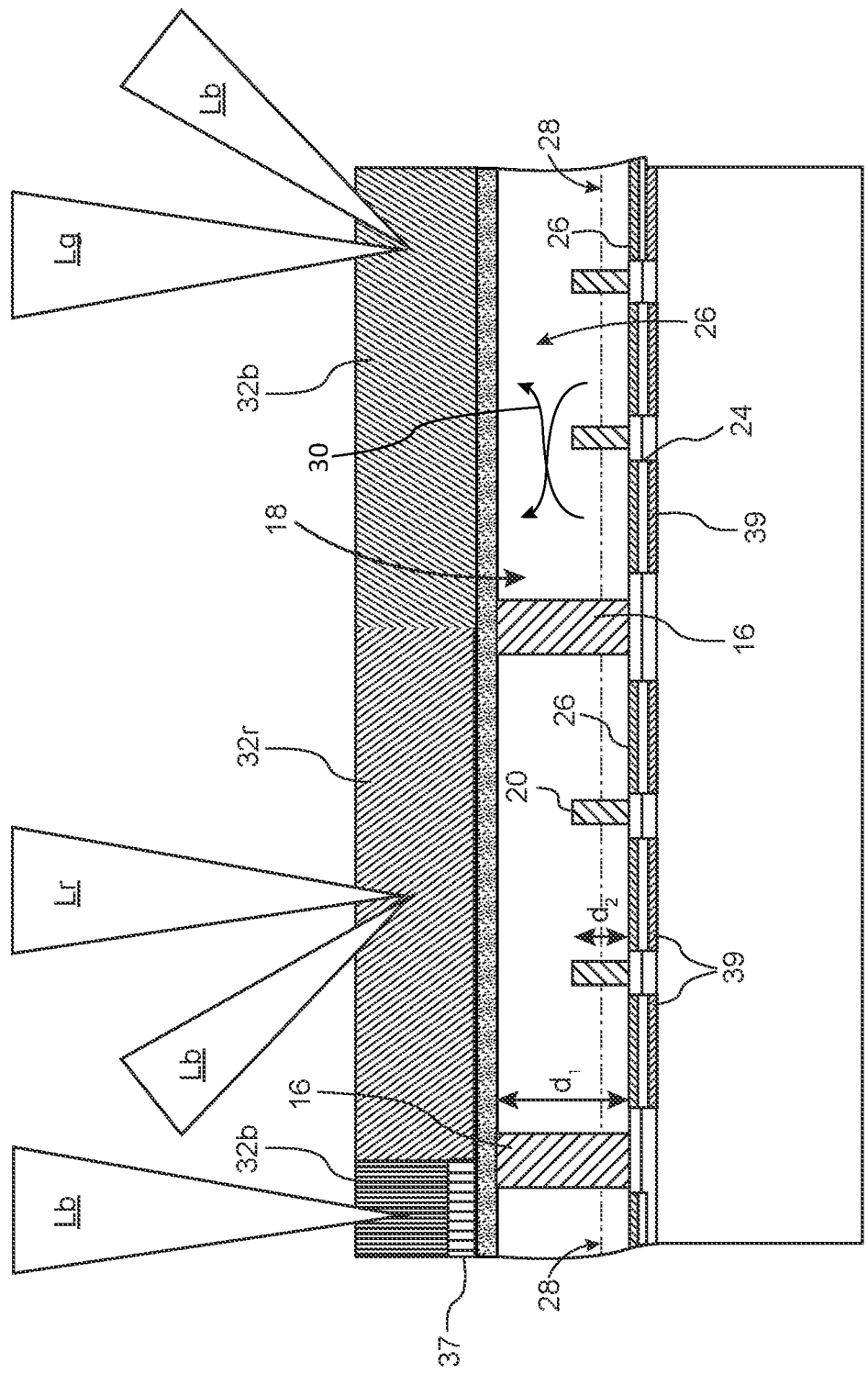
FIG. 9 is an embodiment where various converters are embedded in a light-shaping structure.

FIG. 9 shows an example. On the one hand, a converter material is incorporated into the light-shaping structure. In particular, the left side or the left pixel has a light-shaping structure 32r with converting properties. This structure converts blue light from each controlled subpixel below the structure 32r into red light. Accordingly, structure 32b converts the light emitted by the subpixels into green light.

At the same time, the light thus converted is directed through the respective structures 32r and 32b in such a way that the converted light is emitted directly upwards. In contrast, unconverted light is deflected in direction so that an exit of unconverted light directly upwards or parallel to the direction of emission of the converted light is suppressed. A directional selection can be achieved by photonic structures presented here.

The directional deflection also extends the path through the converter material, so that the conversion efficiency increases. The unconverted light is deflected towards structure 32b, which collimates light from blue subpixels.

Figure 10:
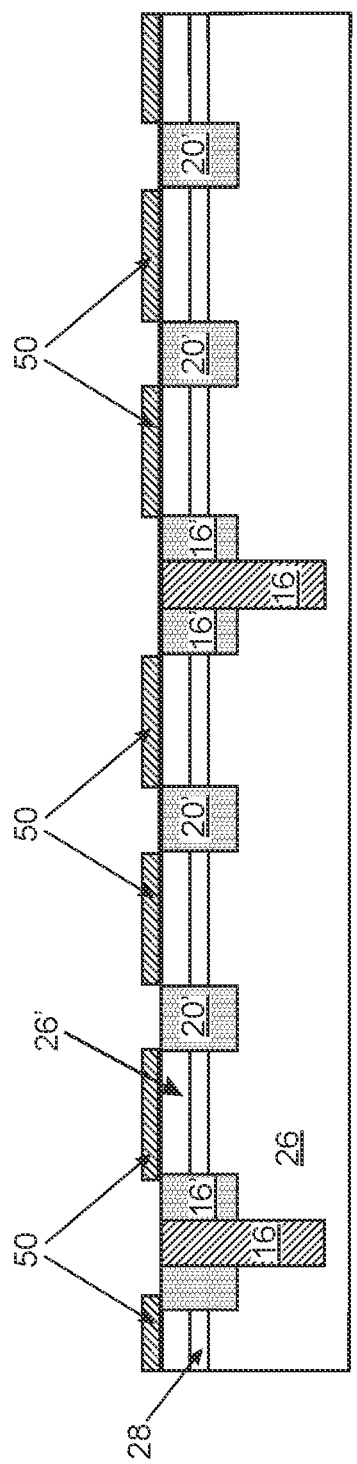
FIG. 10 illustrates another aspect where quantum well intermixing is used to create an optical separation.

FIG. 10 shows another viewpoint that is suitable for creating the optical separation elements. In addition, this embodiment improves the relationship between radiative and non-radiative recombination. The embodiment makes use of quantum well intermixing to create the subpixels within a pixel. FIG. 10 shows a structure on a non-displayed substrate carrier on which semiconductor layer 26 has been grown. The substrate carrier 26 is removed at a later time after transfer to a backplane or an auxiliary carrier. After production of the individual semiconductor layers with an active region 28 between them, a photomask 50 is applied and patterned so that the surface on the semiconductor material is exposed, in which the optical and electrical separation elements 16 are manufactured. In a subsequent step, trenches 16 for electrical and optical separation are etched and filled with an insulating or dielectric material. Then the photomask 50 is appropriately structured again so that on the one hand the areas on the surface are exposed in which the electrical separation elements 20 are manufactured. In addition, a small additional area around the electrical and optical separating elements is freed from photoresist.

In a following step, Zn or another dopant is applied and diffused. These steps can be carried out using, among others, the methods disclosed in this application. The resulting quantum well intermixing increases the band gap in these areas so that charge carriers see an additional energy barrier. This results in a certain electrical separation between the individual subpixels. Quantum well intermixing around the optical and electrical separation elements 16 creates a barrier that keeps charge carriers away from potential recombination centers and defects created by the etching process. The photoresist is then removed and the wafer is further processed.

Figure 11:
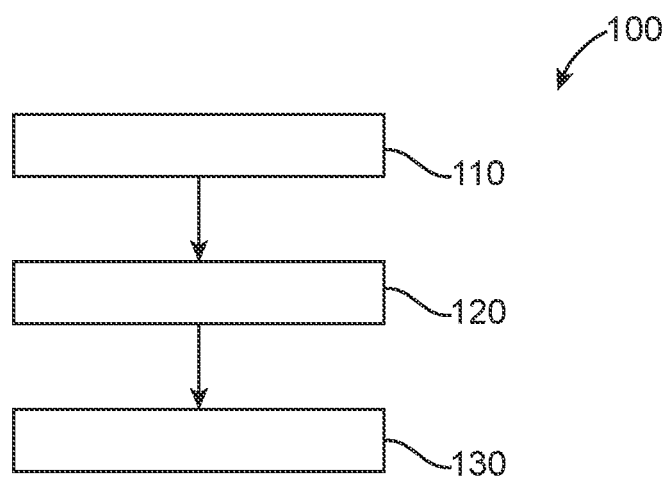
FIG. 11 shows steps of a method for calibrating a pixel element with a pixel element separation layer and sub-pixel separation elements.

FIG. 11 shows a method 100 according to the invention for calibrating a pixel element 12. In a first step 110, a subpixel 18 of a pixel element 12 is driven as described above and below. This control of the subpixel 18 should allow a test of the function of the respective subpixel 18. This can be done, for example, by control signals from an electronic control unit, which in turn can be made possible by contacting each individual subpixel 18 separately. In a following step 120, defect information of a subpixel 18 is recorded, in other words, information is generated as to whether the subpixel 18 in question is functioning correctly.

Such defect information can be, for example, a flag or a certain value that contains information about a correct function of subpixel 18. This defect information can be stored according to a following step 130, for example in a memory unit of a control electronics. This can be used to compensate defective subpixels by appropriately adapted control signals of the associated subpixels of the same wavelength and thus to achieve a correct function of the entire pixel element 12.

In an example, the subpixel separation element 20 may be designed to allow optical crosstalk between subpixels 18 of the same color or wavelength, where the subpixel separation element 20 is designed to optically separate between subpixels 18 of different color or wavelength.

Figure 12:
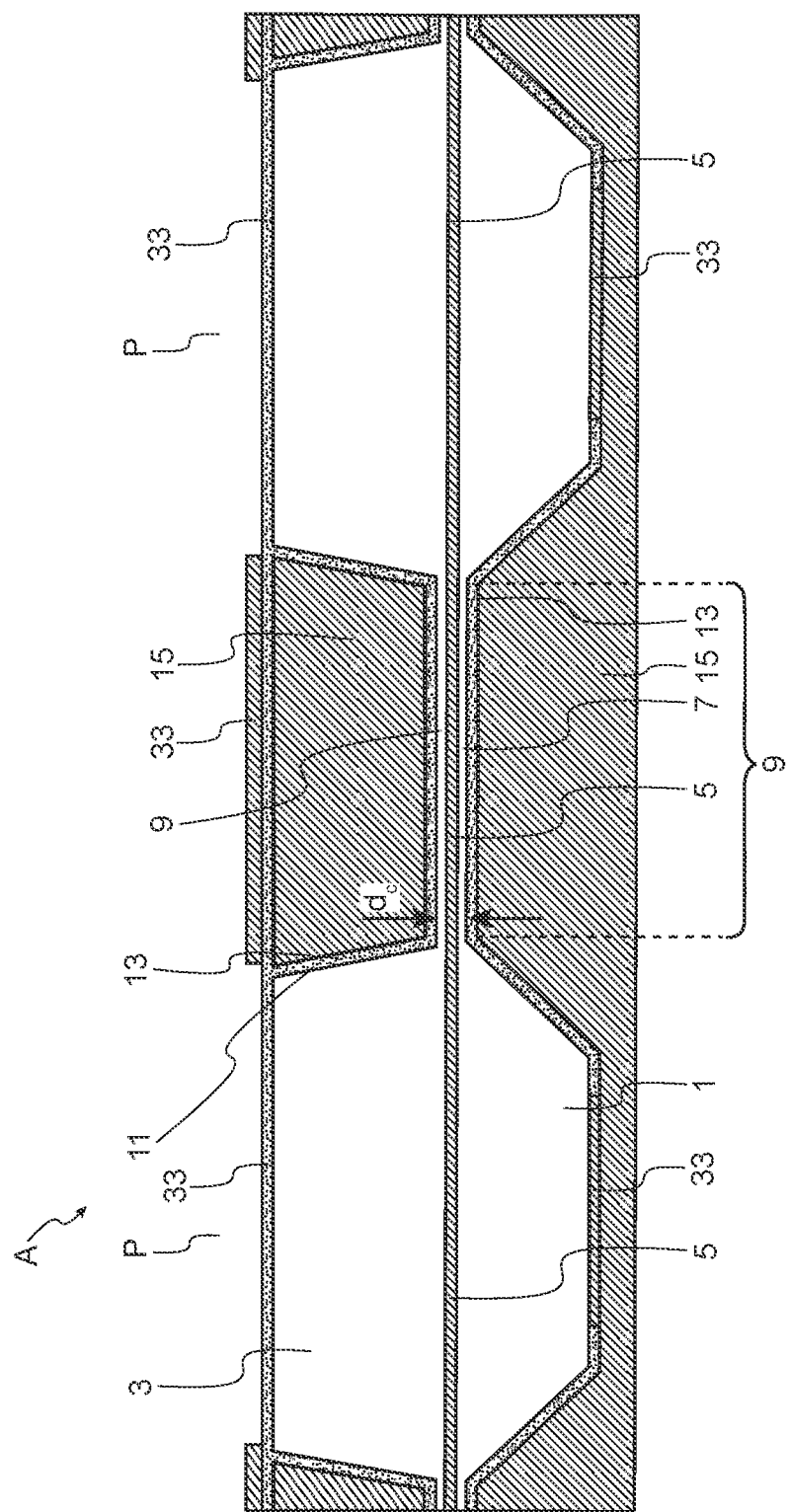
FIG. 12 shows a first embodiment of a pixel array according to some aspects of the proposed principle, where adjacent pixels are connected by a thin material bridge.

An extension of pixelated or other emitters in which optical and electrical crosstalk between pixels of an array is prevented by a pixel structure with a material bridge is shown in FIG. 12. It illustrates a section of an array A in a cross-section in which two adjacent optoelectronic pixels P are connected by a material bridge.

Array A features two optoelectronic pixels P in the form of vertical µ-LEDs, which have been manufactured over the entire surface. Each pixel P comprises an n-doped layer 1, a p-doped layer 3 as well as an active zone 5 suitable for light emission. Between the two formed pixels P material of the layer sequence was removed from the n-doped side and from the p-doped side. Only a thin material transition 9 with a maximum thickness dC remains, which comprises the active layer 5 and a thin cladding layer 7. The cladding layer can be formed from the same material as layers 3 and 5. The material transition is much longer than it is thick. The thickness dC is selected so that no electromagnetic wave can propagate in the material transition. Optical modes are thus suppressed. In other words, the electrical and/or optical conductivity of the material transition 9 in FIG. 12 is effectively reduced in the horizontal direction.

The two main surfaces of the material transitions 9 and exposed surface areas 11 of the pixels P, which are exposed as a result of the removal of the material of the layer sequence, are electrically insulated and passivated by means of a respective passivation layer 13, which in particular contains silicon dioxide. The areas of the removed material of the layer sequence are also filled with a filler material 15. Finally, the two main surfaces of the pixels P are electrically contacted by means of contact layers 33, whereby these can form end contacts. Contact layers 33 can have transparent material, for example ITO, in such a way that the light generated or received by the pixels P emits through the transparent material.

The active zone 5 comprises one or more quantum wells or other structures. Their band gap is tuned to the desired wavelength of the emitted light. The maximum thickness dC is chosen such that all fundamental modes are prevented from propagating along the active zone 5 of the material transitions 9 to the next pixel P. The maximum thickness dC of an active zone 5 of a material transition 9 for this condition depends on the refractive index difference between the active zone 5 and the cladding layers 7 of the material transition 9 corresponding to a waveguide. In general, this means that the material transition should be as thin as possible. On the one hand, this makes crosstalk of optical modes more difficult, since the wave cannot propagate in the horizontal direction. On the other hand, the low maximum thickness dC makes further electrical crosstalk more difficult. The thin cladding layers 7 of the active zone 5 surrounding the active zone generally show a high surface resistance and can only carry little current. A further reduction also reduces electrical crosstalk here due to the increasing resistance.

The maximum thickness dC also depends on the refractive index and the thickness of the active zone 5. The maximum thickness dC is greater than or equal to the thickness of the active zone 5. The maximum thickness dC also depends on the distance between adjacent pixels P. The greater the distance, the greater the maximum thickness dC can be. A suggested range of the maximum thickness dC is ≤1 μm and ≥30 nm.

The layers shown in FIG. 12 have thicknesses that depend on the materials used, including the doping materials, the doping profile of the concentration versus depth, the angles of the sidewalls, the pixel size, the pixel spacing and the total array size. A lower limit for the total thickness is about 100 nm.

Suitable material systems for the pixels P are for example In(Ga,Al)As(Sb,P), SiGe, Zn(Mg,Cd)S(Se,Te), Ga(Al)N, HgCdTe. Suitable materials for contact layers 33 are metals such as Au, Ag, Ti, Pt, Pd, Cr, Rh, Al, Ni and the like, alone or as alloys with Zn, Ge, Be. This material can also be used as the filling material 15, which then serves as a bonding material in addition to the filling function. Conductive material also has possible reflective and other properties. Transparent conductive oxides such as ZnO or ITO (InSnO) can also be used as contact layers 33 for bonding and also provide a common contact for either the p-side or the n-side of the array.

Dielectrics such as fluorides, oxides and nitrides of Ti, Ta, Hf, Zr, Nb, Al, Si, Mg can be used as transparent insulators. This material can be used for passivation layers 13. This material can also be used as the filling material 15, which then serves as an electrical insulator in addition to the filling function. Values of the refractive indices of active zone 5 and cladding layers 7 depend entirely on the materials used.

The maximum thickness dC also depends on the refractive index of the dielectric generated by the passivation layer 13 and/or the filler material 15. The smaller the refractive index difference between active zone 5 and dielectric, the greater the maximum thickness dC can be for equal crosstalk.

Figure 13:
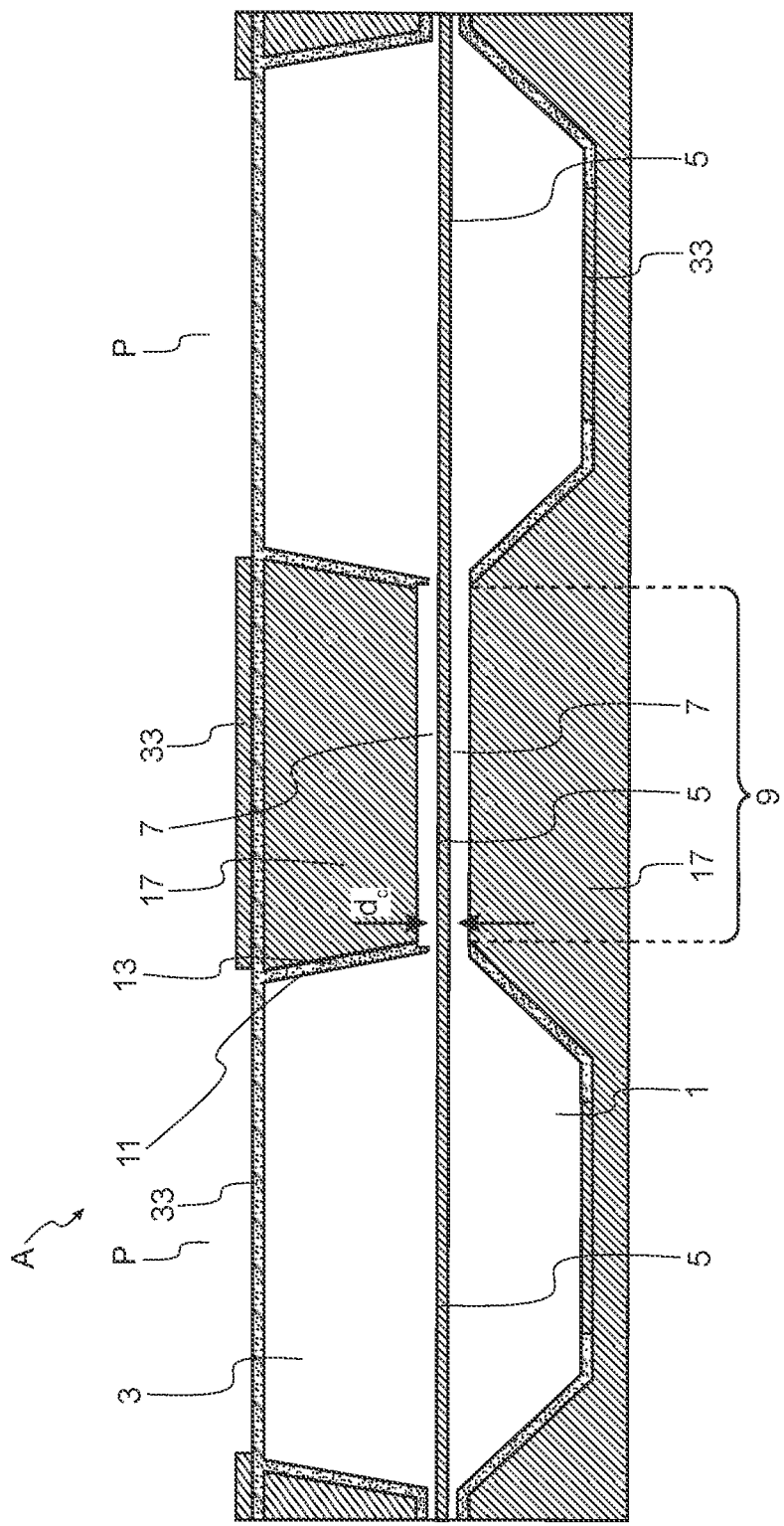
FIG. 13 shows a second embodiment of a pixel array with two µ-LEDs connected by a material bridge.

FIG. 13 shows a second embodiment of a pixel array A in a cross-section. The array A shown here in FIG. 13 differs from the array A shown in FIG. 12 in that a light-absorbing material 17 having a relatively small band gap at least partially fills the areas of the removed material of the layer sequence. Furthermore, the light-absorbing material 17 adjoins directly at the material transitions 9, since no passivation layers 13 are formed at these. Only exposed surface areas 11 of the pixels P are electrically insulated and passivated by means of a respective passivation layer 13. Their material can contain silicon dioxide, for example, so that no electrical short circuit occurs between material 3 and 17.

In FIG. 13—not shown there—alternatively only one—in FIG. 13 upper or lower—side of the material transition 9 between the two pixels P is filled by the light absorbing material 17. On the other side, for example, a filling material 15 is formed at the material transition 9, leaving the passivation layer 13 between them. By using the light-absorbing material 17, additional suppression of optical crosstalk is provided. The light-absorbing material 17 between the pixels P reduces wave guiding by absorbing the light that leaves the active zone 5 in the area of the material transitions 9. There is an attenuation of the waveguide along the material transitions 9.

Suitable light-absorbing materials 17 are metals, alloys, dielectrics or semiconductors with a smaller band gap than the band gap of the material transition 9, which initially acts as a waveguide. This means that the energy of the light is also greater, so that it is absorbed by the material 17. For example, floating eye can be used, which absorbs 50% of red wavelengths. The light-absorbing material 17 is grown at the material transitions 9, for example by CVD (chemical vapour deposition) or PVD (physical vapour deposition) by creating epitaxial layers. The light absorbing material 17 was applied or grown on the cladding layers 7.

Figure 14A:
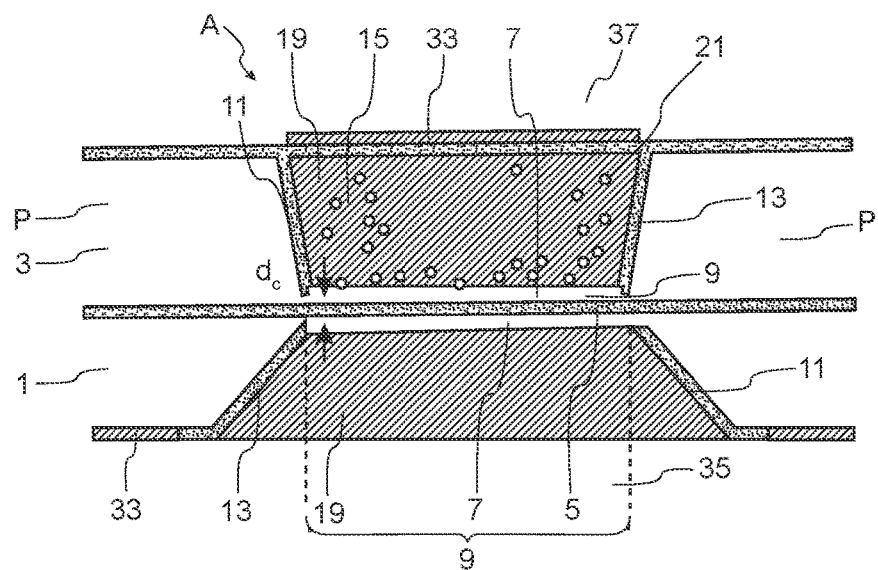
FIG. 14A is a third embodiment of a pixel array with some aspects according to the proposed principle.

FIG. 14A shows a third embodiment of a pixel array A in a cross-section. At the locations of the material removed from the n-doped and/or from the p-doped side of the layer sequence of the pixel array, a material 19 is formed with a refractive index which is larger compared to the removed material, in particular to the doped material or a filler material 15, but which should not be greater than the refractive index of the cladding layers 7 or the active zone 5. This also attenuates the waveguide in the material transition 9. The layer sequence on the substrate 35 is finally covered by a protective top layer 37.

The material 19 with an increased refractive index is grown epitaxially at the material transitions 9, for example by means of chemical or physical vapor deposition. The application or growth takes place after the removal of the original n-doped and/or p-doped layer material between two pixels P each and after passivation of exposed surface areas 11, in particular side areas, of the pixels P by applying passivation layers 13.

The material 19 with increased refractive index was applied or grown on the cladding layers 7. No passivation layers 13 are formed at the material transitions 9. This is the area below the material transition 9. For example, GaAs as material 19 with increased refractive index can be grown on an active zone 5 of a material transition 9, which contains AlGaAs. Alternatively, the material 19 with increased refractive index is formed by diffusing or implanting a refractive index increasing material 21 into a filler material 15 up to or into the cladding layers 7. This is represented in FIG. 14A by the area above the material transition 9. Increased refractive index material 19 may be formed above the material transition 9 and/or below the material transition 9 in FIG. 14A. An area free of material 19 with a higher refractive index can be filled with a filler material 15.

Figure 14B:
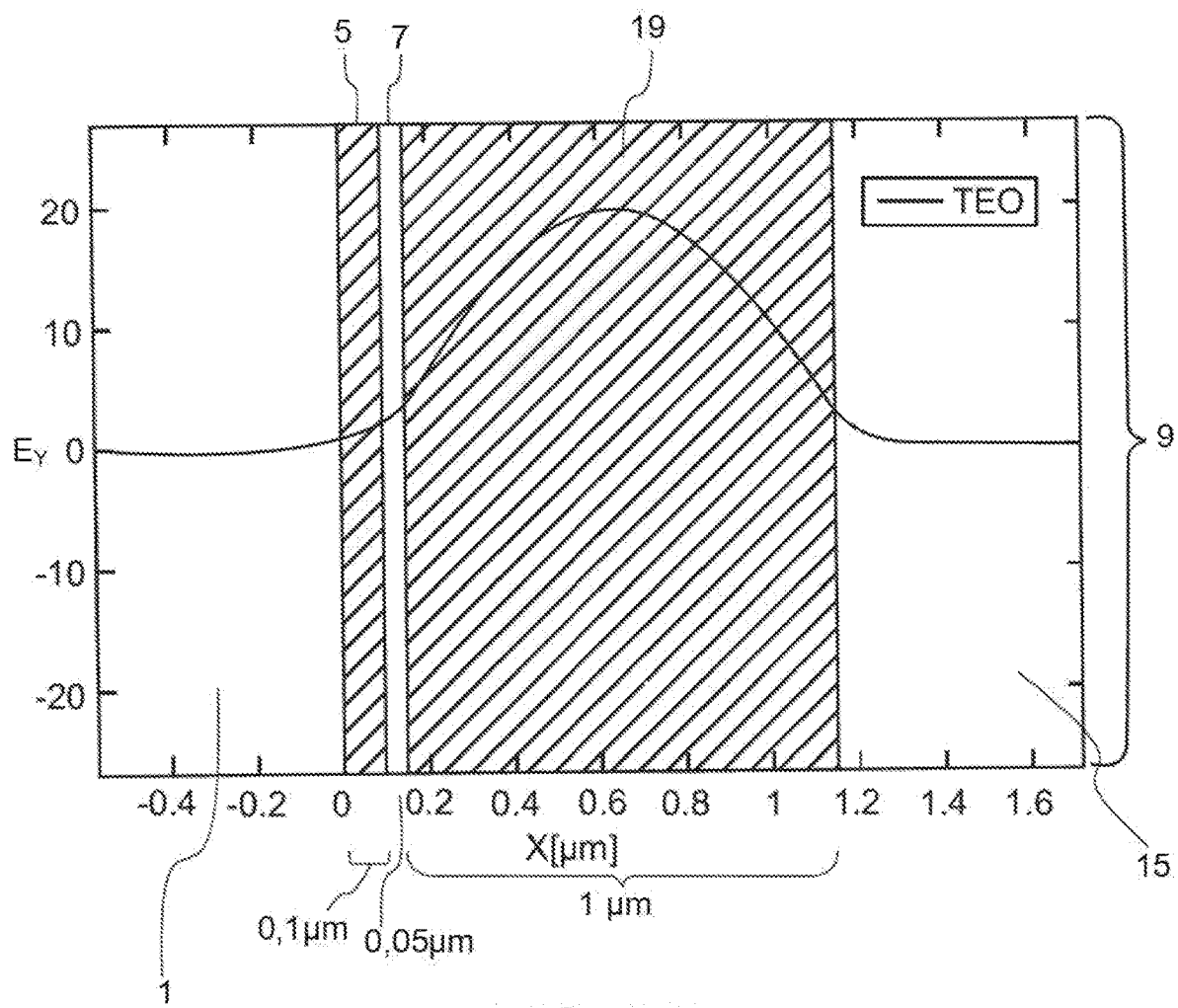
FIG. 14B is a diagram for the embodiment of the previous figure, which illustrates the energy flow with regard to the material bridge.

FIG. 14B shows a simulation of the propagation of light in the area of the material transition of the third embodiment of a pixel array according to the proposed principle. It shows the cross section of a material transition 9 where only an upper side has been etched and filled with a material 19 with an increased refractive index. The material 19 with an increased refractive index has a refractive index equivalent to the quantum well material 5, i.e. the active zone 5 and the material 19 with increased refractive index are shown in dark grey in the diagram. The cladding layer 7 or non-etched semiconductor material of an n-doped layer 1 and a filler material 15 are shown in white.

The 0.1 μm thick layer is the active zone 5 or the area of the quantum well material. The 0.05 μm thick layer is still "residual cladding" or a remaining cladding layer 7. The 1 μm thick layer is the material 19 with the increased refractive index.

In the area of the material transition 9 between two pixels P, an active zone 5 with a refractive index of 3.5 and a layer thickness of 0.1 μm is arranged on a lower, unetched n-doped layer 1 having a refractive index of 3. On this first inner layer, a cladding layer 7 with a refractive index of 3 is formed as a second inner layer of the material transition 9 with a layer thickness of 0.05 μm. A relatively thick third inner layer of a material 19 with an increased refractive index of 3.5 and a layer thickness of 1 μm is formed thereon. The third inner layer is covered by a layer comprising a filler material 15 with a refractive index of, for example, about 3.

For a simulation on this layer structure, a vacuum light wavelength of 0.63 μm was assumed. The generated light can be TM- and/or TE-polarized. One speaks of TM-polarized light when the direction of the magnetic field is perpendicular to the plane ("plane of incidence") defined by the vector of incidence and the surface normal (TM=transversely magnetic), and of TE-polarized light when the electric field is perpendicular to the plane of incidence (TE=transversely electric). For the simulation, FIG. 14B with the x-axis represents the value of a spatial extension x in μm. The y-axis shows the value of a y-component of an electric field strength E. FIG. 14B shows how a fundamental mode TE0 emerges from the active zone 5 and is stopped by the other optical barriers present between two pixels P above and/or below the material transition 9 acting as a waveguide. The optical barriers here are the interfaces between the layers of different refractive indices according to the layered structure of FIG. 14A described above. The fundamental mode TE0 enters the thick third inner layer of material 19 with increased refractive index and does not reach the adjacent pixel P.

In practice, a material with a higher refractive index is often also a more absorbent material, especially due to a smaller band gap.

FIG. 15 shows a fourth embodiment of a pixel array A in a cross-section. Identical reference signs to the other FIGS. 141 to 140A indicate identical features in FIG. 15. In contrast to a design according to FIG. 12, here between two filler layers 15 and two passivation layers 13, additional material 23, 24 is introduced into the active zone 5 of a material transition 9, which effectively reduces electrical and/or optical conductivities of the material transition 9 acting as waveguide. The additional material is, on the one hand, a material 23, which increases light absorption in the active zone 5 of the material transition 9. Absorption in the active zone 5 between pixels P is increased by reducing the bandgap of the material of the active zone 5. For this purpose, bandgap-reducing elements are implanted or diffused into the active zone 5 of the material transition 9. In particular, dopants are diffused or implanted into the central region of the active zone 5 between pixels P. The reduction of the band gap is achieved by a so-called band gap renormalization. The greater the amount of material 23 introduced along a material transition 9, the greater the absorption of light in the active zone 5.

Alternatively or cumulatively, the additional material is, on the other hand, a material 24, which increases an electrical resistance in the active zone 5 of the material transition 9. For this purpose, elements, which increase the electrical resistance, are implanted or diffused into the active zone 5 of the material transition 9. This further increase in electrical resistance serves to reduce further electrical crosstalk from one pixel P to the adjacent pixel P. For example, to increase the electrical resistance Fe can be implanted in an active zone 5 of a material transition 9 with InGaAsP. The greater the amount of material 24 introduced along a material transition 9, the greater the increase in electrical resistance of the active zone 5 of the material transition 9 between two pixels P.

Materials 23, 24 are both diffused or implanted into the active zone 5 of a respective material transition 9 before the application of passivation layers 13.

FIG. 16A shows a further example of a pixel array A in a cross-section, in which, in contrast to a structure in FIG. 12, an optical structure 25 is incorporated in the area of the material transition. The structure 25 is inserted between two filler layers 15 and two passivation layers 13 along the active zone 5 of a material transition 9. This reduces an optical conductivity of the material transition 9 acting as waveguide between two pixels P. A waveguide is reduced. Optical structures 25 can be a photonic crystal and a Bragg mirror or another dielectric structure. The structure 25 forms periodic structures of the refractive index along the material transition 9 above, below or on both sides of the active zone 5, which leads to an optical band gap and prevents the propagation of photons along the material transition.

The periodicity of the optical structures depends on the light wavelengths, the size of the optical structures, the length of the structured material transition 9 and the refractive indices of the materials used. FIG. 16A shows only one optical structure 25 on a lower side of the material transition 9, which acts as a waveguide. This optical structure 25 can also be formed on the upper side of the wave guiding material transition 9. The optical structure 25 shown in FIG. 16A is a Bragg mirror. After forming the optical structure 25, passivation layers 13 are applied.

Figure 16B:
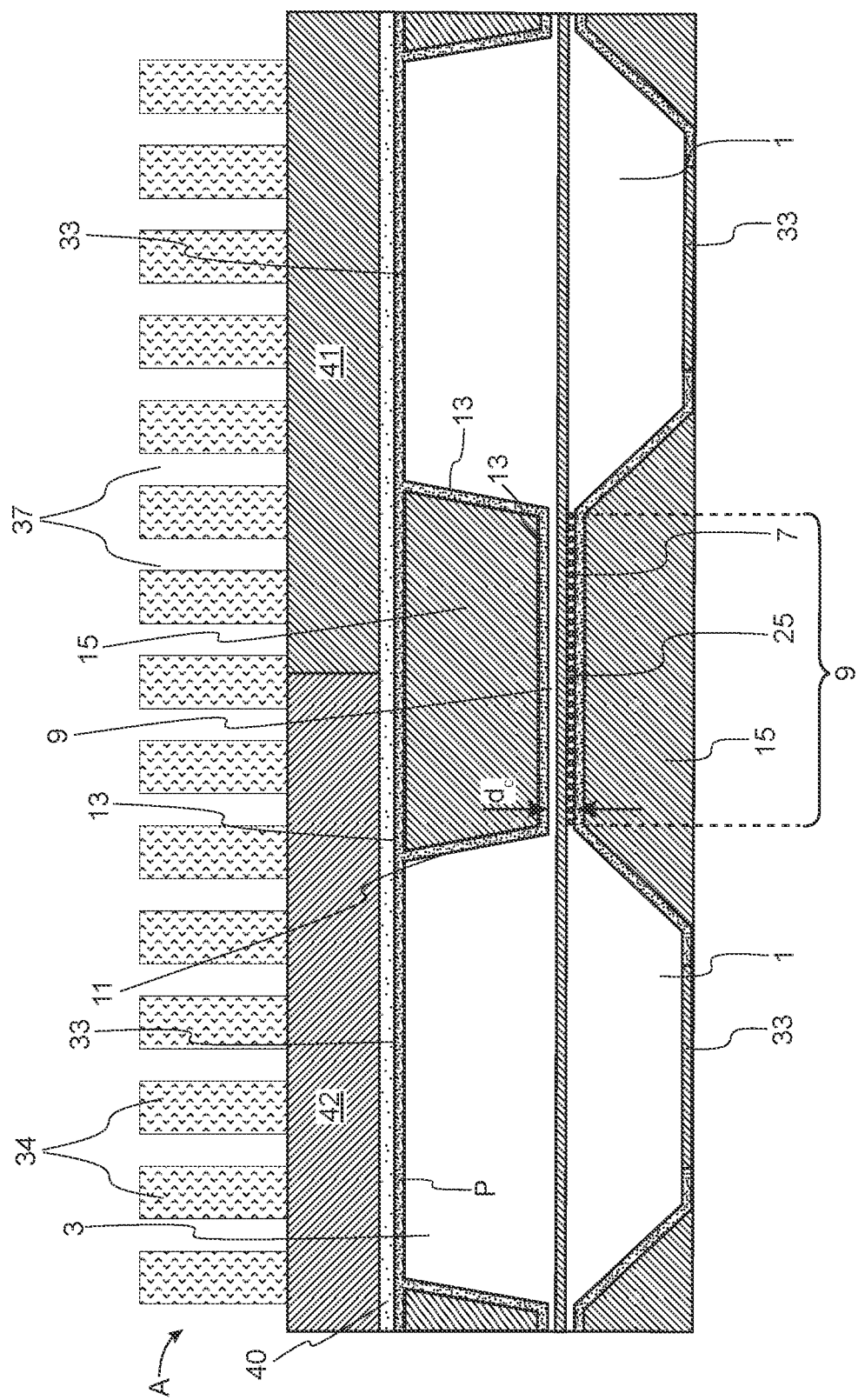
FIG. 16B shows an embodiment of a pixel array with adjacent µ-LEDs, a material bridge, with an additional output structure according to some of the aspects revealed here.

An extension of the example in FIG. 16A is shown in FIG. 16B. A converter material 41 or 42 is applied to the surface. The converter material 41 and 42 extends to approximately the middle between two μ-LEDs. As the walls of the μ-LED are self-reflecting, the light generated in the active layer of a μ-LED is directed by the μ-LEDs towards the converter material. Light that enters the converter material from the μ-LED is converted there. Crosstalk is prevented by an optional reflective layer between the converter materials.

On the surface of the converter materials, photonic structures 34 and 37 are deposited on each pixel to direct the light. In an alternative embodiment, the photonic structure extends into the converter material or even into the semiconductor material.

Figure 17:
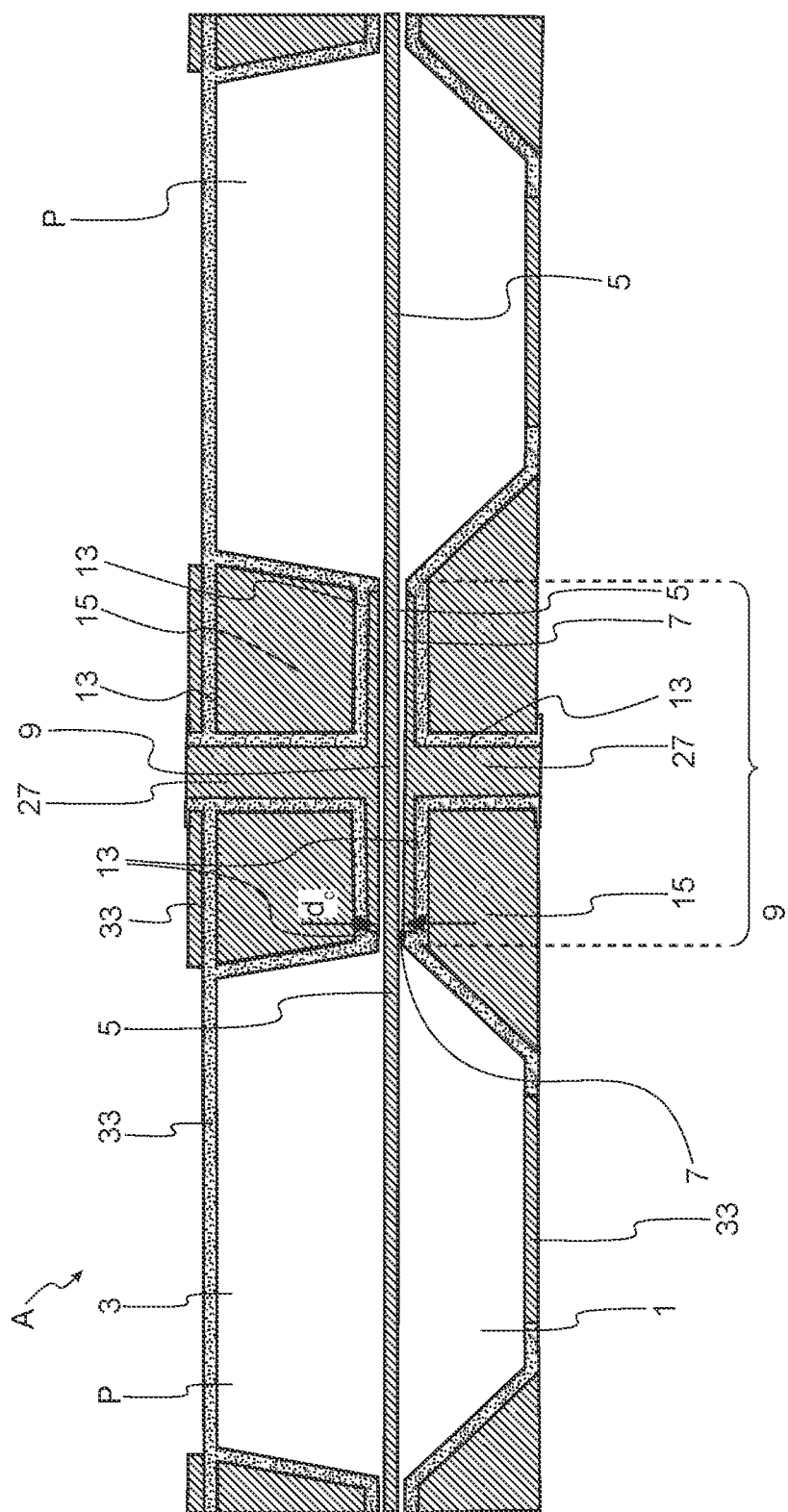
FIG. 17 shows a sixth embodiment of a pixel array.

FIG. 17 shows a sixth embodiment of pixel array A in a cross-section in accordance with the invention. In contrast to an embodiment according to FIG. 13, in two filler layers 15, along the active zone 5 of a material transition 9, two additional electrical contacts 27 are introduced at both main surfaces of the material transition 9 acting as waveguide, which effectively reduces electrical and/or optical conductivities of the material transition 9 acting as waveguide between two pixels P. These opposite electrical contacts 27 apply an electrical bias to both main surfaces of a respective material transition 9 between two pixels P.

By means of the applied electrical bias voltage (Bias), a static electrical field is generated, by means of which the optical properties of the material transition 9, which initially acts as a waveguide, are changed in such a way that a waveguide along the material transition 9 is effectively reduced.

As a result of applying the electrical bias to the material transition 9 between the pixels P, which initially acts as a waveguide, an absorption of light in the waveguide is increased by means of the so-called "quantum confined Stark" effect (QCSE; limited Stark effect), as is used in an electro-absorption modulator, for example. In an electro-absorption modulator, the fundamental absorption of a semiconductor is effectively increased by applying an electric field. Accordingly, optical crosstalk between pixels P is reduced. Suitable electrical contacts 27 are conventional Schottky contacts or metal-insulator contacts. Furthermore, everything that is conventionally used for band bending without current flow is suitable.

After the two opposing electrical contacts 27 have been formed, passivation layers 13 are applied to the two opposing electrical contacts 27, in particular to their surfaces where filler material 15 is formed and which are adjacent to the pixels P. Identical reference signs to the other FIGS. 138 to 142A are shown in FIG. 17, which shows identical characteristics.

Figure 18:
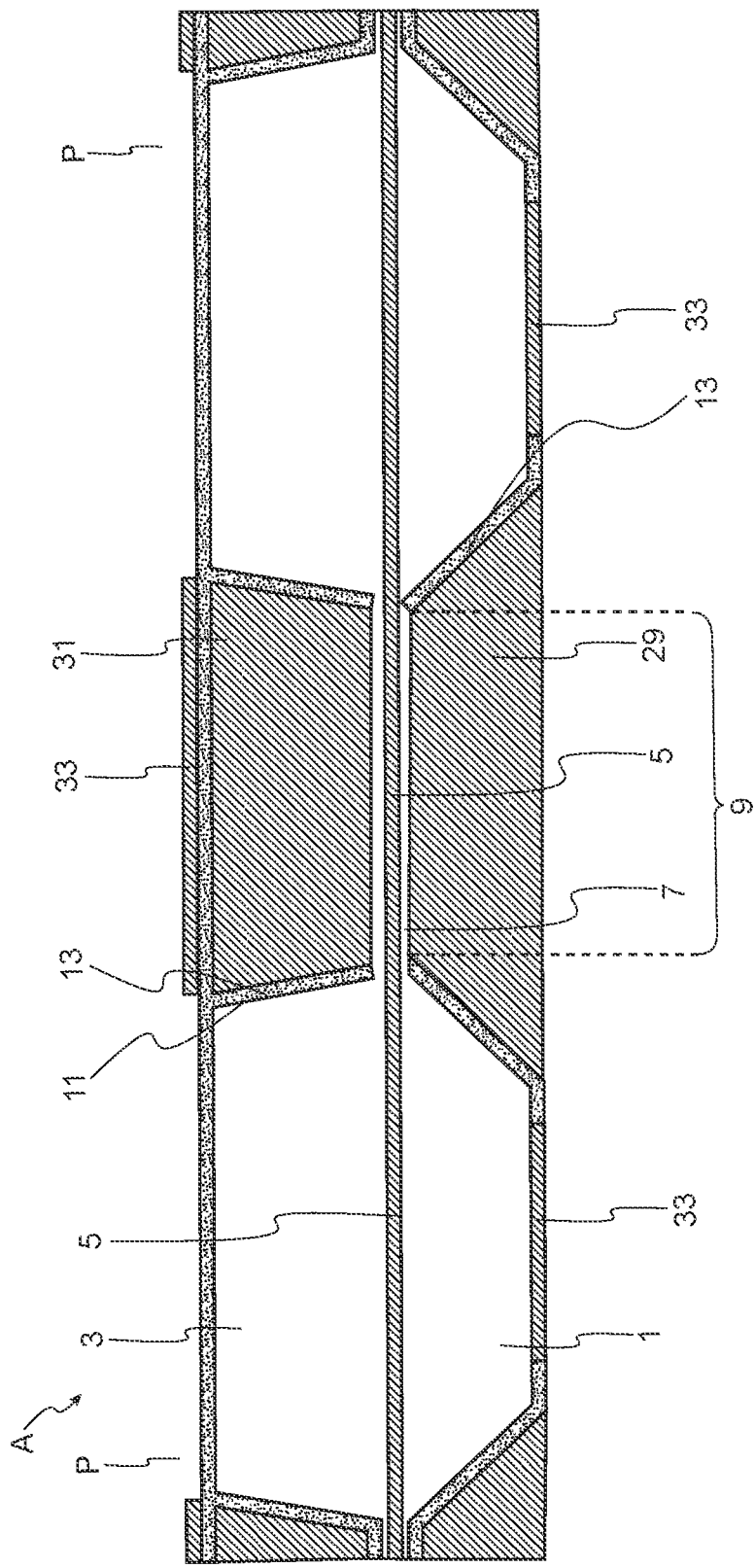
FIG. 18 is a seventh embodiment of a pixel array with further aspects.

FIG. 18 shows a seventh embodiment of a pixel array A in a cross-section. In contrast to the embodiment in FIG. 17, an electric field is generated here inherently, i.e. by selecting a suitable material system. For this purpose, at least one layer of n-doped material 29 and/or p-doped material 31 is arranged on at least one of the two main surfaces of a material transition 9 in such a way that an electric field is generated by it, which is thus incorporated into the material transition 9 without further means. If only one layer of doped material is formed on one of the two main surfaces of the material transition 9 and the layer on the other main surface of the material transition 9 is undoped, a so-called depletion field is provided which is sufficient as an electric field to increase light absorption in the material transition 9. Alternatively, the electric field for increasing light absorption in the material transition 9 is generated by forming a layer of n-doped material 29 on one main surface of the material transition 9 and a layer of p-doped material 31 on the opposite main surface of the material transition 9.

The material used to provide the electric field, in particular the n-doped material 29, the p-doped material 31 and possibly the undoped material are grown epitaxially by means of CVD (chemical vapor deposition) or PVD (physical vapor deposition) in such a way that a built-in bias is provided between adjacent pixels P on the thin waveguide. For n- and p-doping, InGaAlP can be doped with Si and Zn.

By means of the doped material 29 and/or 31, a bias is provided which has the same effect as the embodiment as shown in FIG. 17. Furthermore, the material providing the electric field is directly applied to the material transitions 9, as no passivation layers 13 are required at these. Only exposed surface areas 11 of the pixels P are electrically insulated and passivated by a respective passivation layer 13. Their material may contain silicon dioxide, for example. The pixels P are electrically connected via electrical contact layers 33.

Figure 19:
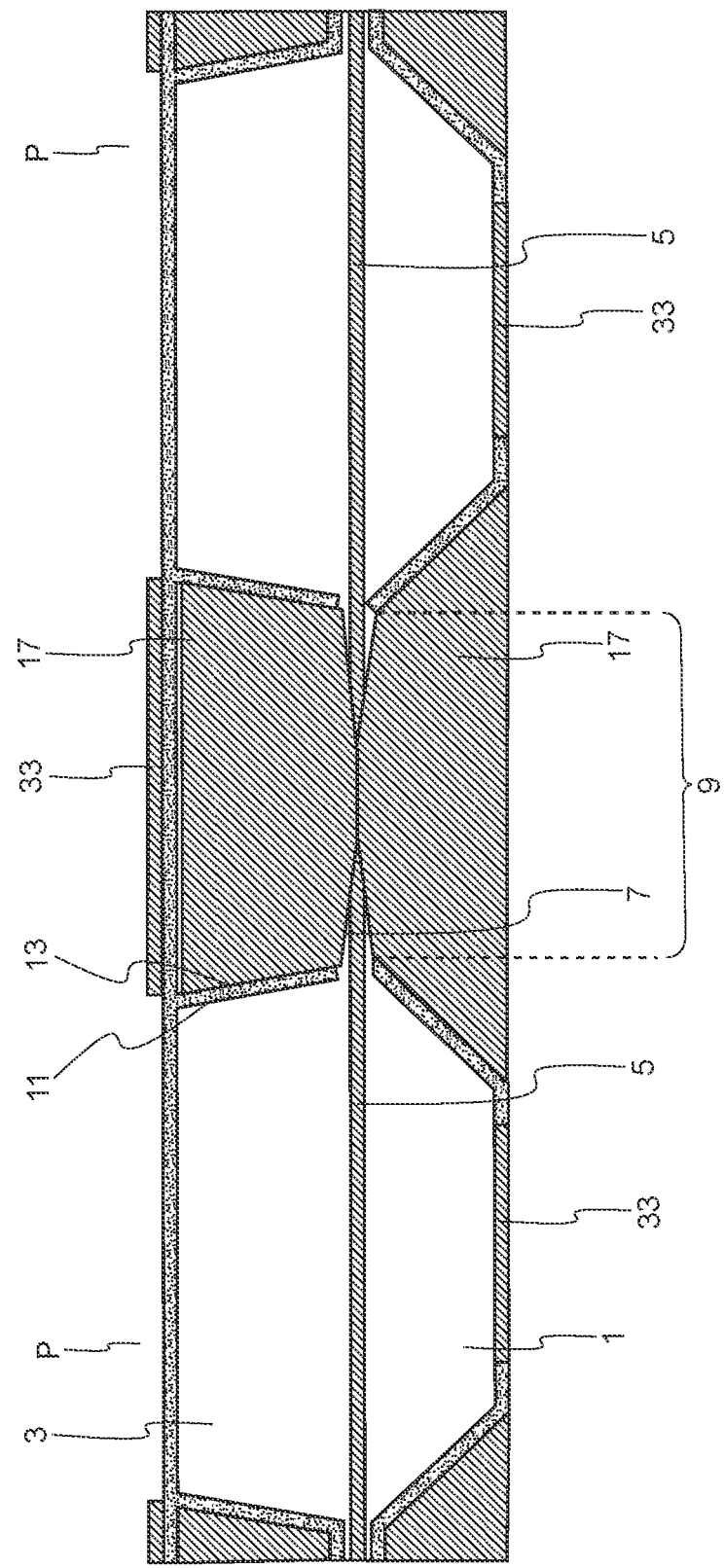
FIG. 19 shows an eighth embodiment of a pixel array.

FIG. 19 shows an eighth embodiment of a pixel array A in a cross-section. In this example, the active zone 5 was etched in a controlled manner. In other words, damage to the active zone 5 or the occurrence of defects in the active zone 5 in the area of the material transition is allowed in a controlled manner. According to FIG. 19, the material transition 9 is completely interrupted in its center to the two pixels P, between which the material transition 9 is formed. At the transitions to the two pixels P, the material transition 9 is formed with a maximum thickness dC.

Figure 20:
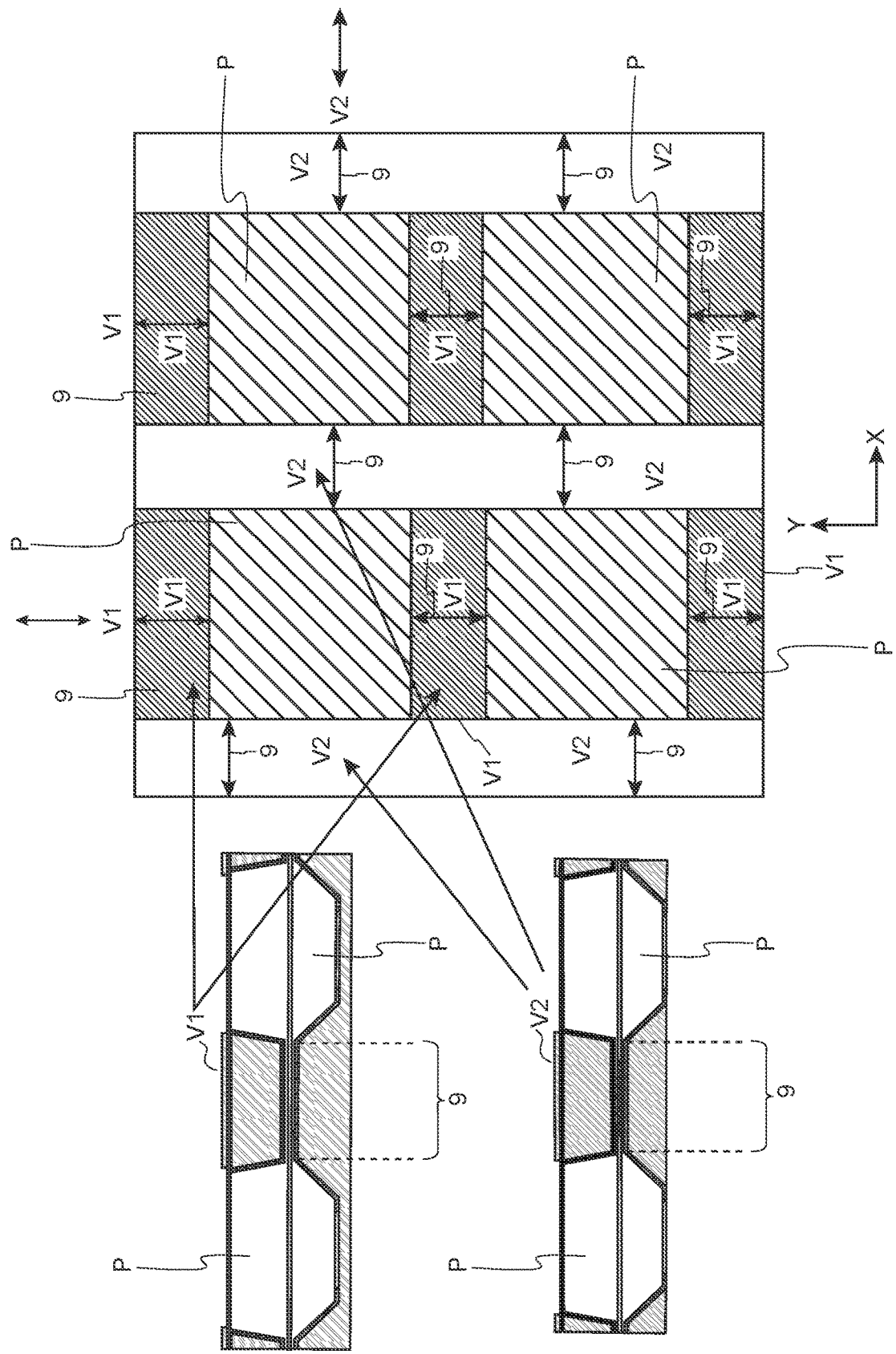
FIG. 20 shows a ninth embodiment of a pixel array.

FIG. 20 shows a ninth embodiment of a pixel array A. On the left side, two different embodiments of the suppression of crosstalk between two adjacent pixels P are shown in cross section. The upper variant V1 shows the first embodiment according to FIG. 12, the lower variant V2 shows the fourth embodiment according to FIG. 16A. On the right side, a top view of four adjacent pixels P is shown.

Four adjacent pixels P are assigned to each pixel P, whereby here along an x-direction material transitions 9 are formed according to the second variant V2. Along a y-direction the material transitions 9 are formed according to the first variant V1. In principle, each material transition 9 to the other material transitions 9 can be designed differently, in accordance with the embodiments described in this application. In principle, material transitions 9 can be designed in the same way along a respective spatial direction. The material transitions 9 can be designed according to the desired patterns. The material transitions 9 along a respective spatial direction can alternate in design.

In this way, an array A according to this application includes all possible embodiments or variants as well as combinations of embodiments of material transitions 9. The plan view in FIG. 20 shows that all variants V can be combined depending on the direction, for example. This also applies to all possible shapes of pixels P, which can be round or square, especially here rectangular.

Figure 21:
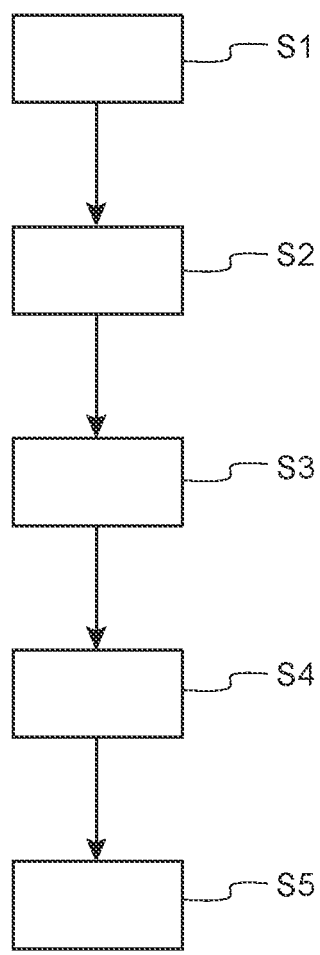
FIG. 21 shows an embodiment with different steps for a method of manufacturing a pixel array according to the proposed concept.

FIG. 21 shows an example of a method of manufacturing a pixel array A according to the invention. The method of manufacturing an array A of optoelectronic pixels P comprises the following steps. In a first step S1, a whole-surface layer sequence of an n-doped layer 1 and a p-doped layer 3 is generated along the array A, between which an active zone 5 is formed. Various techniques are explained and disclosed in this application.

In a second step S2, material of the layer sequence is removed between pixels P to be formed, in particular by etching, from the n-doped side and from the p-doped side. This is done in such a way that at least the active zone remains as a material transition. Likewise, thin cladding layers 7 can remain in the material transition 9 above or below or on both sides of the active zone 5. The thick dC is thus significantly reduced and optical modes cannot propagate laterally between the pixels. The higher resistance also reduces electrical crosstalk. Overall, the electrical and/or optical conductivity of the material transitions 9 is reduced.

The thickness dC is sufficiently thin, which is required according to the specifications for array A or for a desired device in terms of brightness or responsivity. The thickness in the area of the material transition depends, among other things, on the material system and the wavelength of the emitted light.

In one aspect, etching is performed from both sides up to or into the thin mantle layers 7 on each side of the active zone 5 or up to the active zone 5, in such a way that all fundamental modes are prevented from propagating along the active zone 5 to the next pixel P. The maximum thickness dc of an active zone 5 of a material transition 9 for this condition depends on the refractive index difference between the active zone 5 and the cladding layers 7 of the material transition 9 acting as a waveguide.

Reducing the maximum thickness dC results in a reduction of optical crosstalk because more light is emitted from the waveguide. A reduction of the thickness dC also means a reduction of electrical crosstalk. The thin undoped cladding layers 7 of the active zone 5, which remain between individual pixels P, can hardly carry any current. This therefore reduces electrical crosstalk.

With further steps S3 to S5, after etching, the individual pixels P and the waveguide can be covered with other materials necessary for further suppression of optical and/or electrical crosstalk outside the waveguide. In step S3, the exposed main surfaces of the material transitions 9 and exposed surface areas 11 of the pixels P are electrically insulated and passivated by means of a respective passivation layer 13, in particular comprising silicon dioxide. The electrical insulation and passivation of the exposed main surfaces of the material transitions 9 can be omitted, depending on which measure is used in the fourth step S4 to reduce crosstalk.

In a fourth step S4, from the n-doped side and/or from the p-doped side, the removed material is at least partially replaced, e.g. by a filler material 15. In step S5, contact layers 33 are applied to the main surfaces of the Pixel P and thus the structure is electrically contacted. According to one design, steps S1 to S5 are first performed for one main surface of the array and then, after a substrate change, for the other main surface of the array.

To reduce further optical and/or electrical crosstalk, further measures can be taken in the fourth step S4 cumulatively to form the material transitions 9 with the maximum thickness dC. Some of these are listed here as examples, others are described above for the various embodiment. For example, from the n-doped side and/or the p-doped side, areas of the removed material can be filled with light-absorbing material 17 and/or with more strongly refractive material or material 19 with an increased refractive index instead of filling material 15. No passivation layer 13 is formed here at the material transitions 9.

Furthermore, in the fourth step S4, the light absorption and/or the electrical resistance of the active zone 5 can be increased alternatively or cumulatively. A passivation layer 13 should also be applied to the material transitions 9.

The application of these concepts allows the manufacturing of arrays A of optoelectronic pixels P, in particular micropixel emitter and detector arrays without etching through the active zone 5, without optical and electrical crosstalk and without performance and reliability problems compared to solutions with etched active zones.

Figure 54:
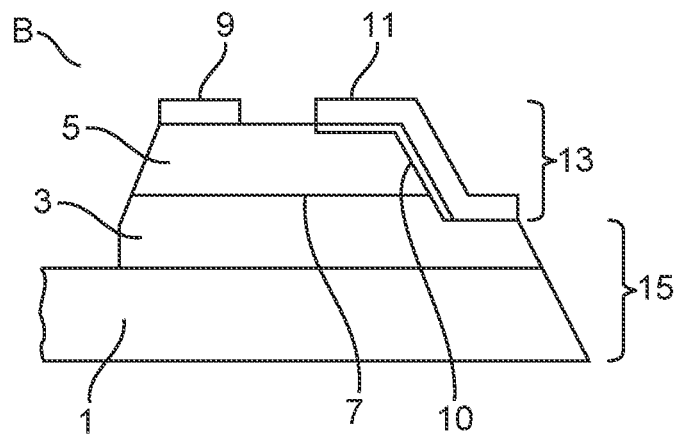
FIG. 54 shows an illustration of an embodiment of a proposed base module for the provision of light emitting diode modules according to some aspects of the proposed concept.

FIG. 54 shows a modular architecture of subunits of μ-LEDs. These show different horizontal μ-LEDs, which are combined in so-called base modules for the provision of μ-LED modules. The base module comprises a layer stack, which has a first layer 3 formed on a carrier or replacement carrier 1, on which an active layer 7 and on which a second layer 5 is formed. A first contact 9 is applied to a surface area of the second layer 5 facing away from the carrier 1, and a second contact 11 is connected to a surface area of the first layer 3 facing away from the carrier 1. The second contact 11 is electrically insulated from the active layer 7 and the second layer 5 by means of a dielectric 10 and is formed to and on the surface region of the second layer 5 facing away from the carrier 1.

When manufacturing the base module, a surface area of the first layer 3 facing away from the carrier 1 must be exposed after the generation of the layer stack. This means that material of the second layer 5, the active layer 7 and partly of the first layer 3 is removed at an edge area of the layer stack.

This can be carried out, for example, by means of flank structuring of the at least one stack of layers, in particular from the side of the second layer 5, a trench being created surrounding the at least one stack of layers, in particular in a flank structuring area 13. A layer stack can also be described as a mesa structure. The trench is also referred to as a mesa trench. The flanks of a stack of layers are called as mesa flanks accordingly. This structuring is carried out using appropriate masks.

In the case of edge structuring, etched areas can be coated with an insulating layer or a dielectric, especially by means of inductively coupled plasma ICP or reactive ion etching RIE, using chemical vapor deposition. The dielectric used is SiO or ZnO. The second contact 11 can have ITO (indium tin oxide) and is produced by sputtering or physical vapor deposition.

A plurality of base modules can be generated as a matrix along an X-Y plane along at least one row and along at least one column on a carrier 1. For this purpose, in addition to the shallow one, a further, deep flank structuring through carrier 1 and the first layer 3 is implemented on the right edge area. Area 15 corresponds to the deep flank structuring.

In this way, one module from a matrix of a plurality of base modules can be removed from a carrier 1. The deep edge structuring can be carried out by etching, in particular dry chemical etching or plasma etching.

Figure 55:
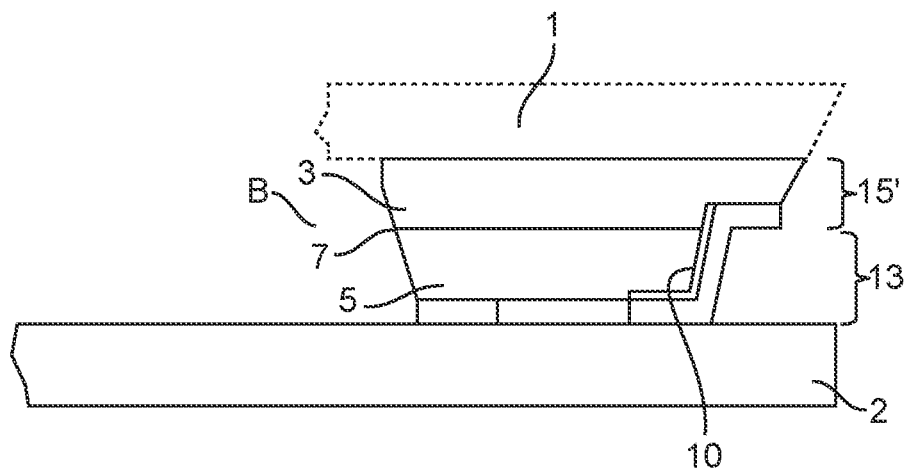
FIG. 55 shows the embodiment according to FIG. 54 on a replacement carrier according to further aspects.

FIG. 55 shows an example of the embodiment of a base module B as shown in FIG. 54, arranged upside down on another carrier or end carrier 2. The further carrier or end carrier 2 can be transparent to the light emitted by the optoelectronic component. In addition, the material of carrier 1 has been removed.

This can be done, for example, by grinding away or by so-called laser lift-off (LLO). The base module B is thus arranged as a flip chip on the further carrier or end carrier 2 and contacted there.

Figure 56:
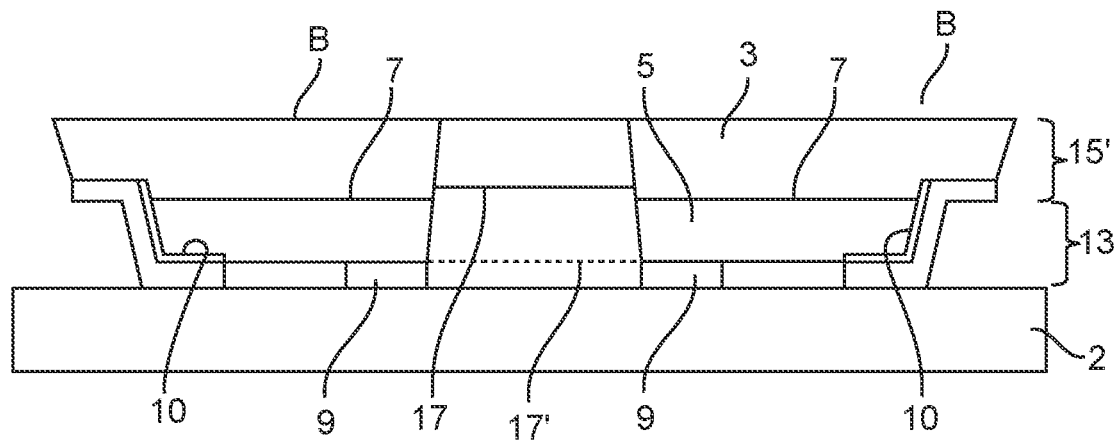
FIG. 56 illustrates the embodiment according to FIG. 55 with a further basic module.

FIG. 56 shows the embodiment according to FIG. 55 with a further base module B with edge area 15' without carrier 1. Both base modules B are oriented opposite to each other, whereby identical contacts, namely first contacts 9, are arranged adjacent to each other. Both base modules B may originally have been formed on carrier 1 in two adjacent rows of a matrix. After removing carrier 1, base modules B are arranged upside down on another carrier or end carrier 2. The two adjacent base modules B, oriented opposite to each other, have been created here as a common layer stack. In this case, the dashed line 17' in FIG. 56 would be a surface area of the second layer 5 in the middle between the two base modules. However, to prevent crosstalk, layer 5 in the middle has been removed by structuring. After such structuring, which also cuts through the active layer, the solid line 17 shows a surface area of the first layer 3.

Figure 57:
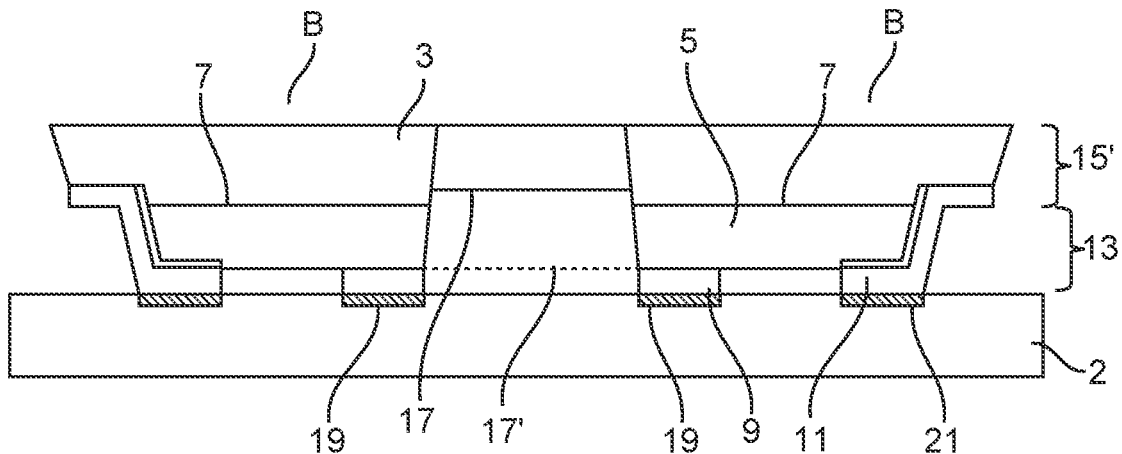
FIG. 57 shows the embodiment according to FIG. 56 with separate contacting of the contacts.

FIG. 57 shows the embodiment according to FIG. 56 with separate contacting of the contacts. First contacts 9 and second contacts 11 are electrically isolated and connected to corresponding contacts on the end carrier 2. A first contact 19 is electrically connected to the first contact 9 of each module and a second contact 21 is electrically connected to a second contact 11. Contacts 21 and 19 have been made in previous steps in end carriage 2. The base modules are then placed on the end carrier 2, thus creating an electrical connection.

As in the previous version, the middle area is partially removed by additional structuring. Alternatively, it can also be left in place.

Figure 58:
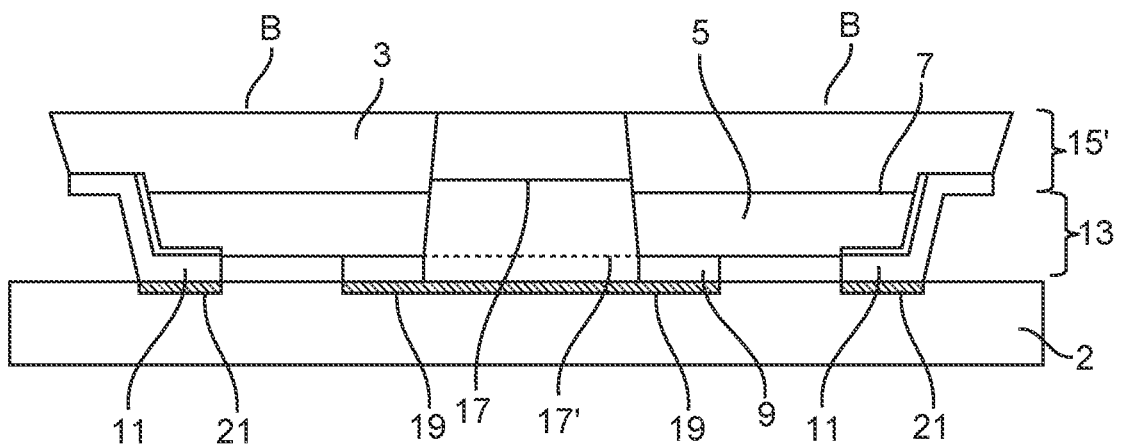
FIG. 58 illustrates the embodiment according to FIG. 57 with common contacting of the first contacts.

FIG. 58 shows the embodiment according to FIG. 56 with common contacting of the first contacts. Second contacts 11 are electrically isolated and connected to contacts of end carrier 2. A first contact 19 applied to a surface of the end carrier 2 is electrically connected to two first contacts 9. Second contacts 21 are electrically connected separately to second contacts 11.

As in the previous version, the middle area is partially removed by additional structuring. Alternatively, it can also be left in place.

In FIGS. 56 to 58, a first layer 3, a transition layer 7 and a second layer 5 can be completely removed as a result of a deep flank structure between the two base modules B. The two base modules B can be contacted to the further carrier or end carrier 2 using flip-chip technology.

FIG. 59 above shows another example of the embodiment of a proposed base module B of a single µ-LED to provide a µ-LED module with two rows and two columns of base modules B as shown below. The base module B shown above can be provided here on a carrier 1 but also without a carrier. In this top view, a first contact 9 and a second contact 11 are visible, and in addition, the first layer 3, the transition layer 7 and the second layer 5 are shown.

As shown in FIG. 59 below, four base modules B have been grouped together to form a µ-LED module. Already on carrier 1, this matrix with two rows and two columns in an X-Y plane may have been selected. When producing adjacent rows on carrier 1, the base modules B of a row can be oriented in the same way. Here, the lower row has base modules B, which are arranged opposite to the upper base modules B. The µ-LED module shown in FIG. 59 below can still be arranged on the not shown carrier 1 after a flat edge structuring. It is grouped into the rectangular LED module by selecting a release area. This is extracted by means of a deep edge structuring along a rectangle surrounding the µ-LED module. The resulting 2×2 (two rows by two columns) µ-LED module comprises a width of approximately 20 micrometers and a length of approximately 30 micrometers.

FIGS. 60A to 60D show four cross-sections of two oppositely oriented base modules B, which are arranged upside down, i.e. as flip chips on another carrier or end carrier 2. A base module B can have a width of approximately 10 micrometers and a length of 15 micrometers. Depending on the masking during mesa etching, especially to provide a shallow edge structuring, precursors of µ-LED modules can be created, which can subsequently be removed from a carrier, especially carrier 1, to or as a light emitting diode module, especially by means of a deep edge structuring. Reference symbol 10 designates a dielectric.

According to FIG. 60A, two oppositely oriented individual base modules B are arranged adjacent to each other. Their first contacts 9 are in contact with each other, but do not touch each other. The cross section according to FIG. 60A shows that a flat flank structure was brought out from the side of the second layer 5. This creates a shallow trench that runs around a respective base module B or a respective layer stack. A deep flank structuring was led out from the side of the first layer 3 so that the individual base modules are separated. In this way, several base modules still connected to each other are first placed on the end carrier 2 and then separated from the side 3 by means of the flank structuring. The original carrier 1 was removed.

According to FIG. 60B, two oppositely oriented individual base modules B are also arranged adjacent to each other. Their first contacts 9 are in contact with each other, but do not touch each other. The cross-section according to FIG. 60B shows that a shallow flank structuring of the layer stacks was carried out from the side of the second layer 5.

In contrast to FIG. 60A, a deep flank structuring of the layer stacks was carried out from the side of the second layer 5, i.e. from the same side as the shallow flank structuring. The original carrier 1 was removed.

FIG. 60C shows an intermediate step. After that, two oppositely oriented base modules B are arranged, which are created together as one piece. Their first contacts 9 are adjacent to each other. A common layer stack of two adjacent base modules oriented in opposite directions to one another is produced, with a first layer 3, a transition layer 7 and a second layer 5 each being produced as a unit along the end carrier 2. The cross section according to FIG. 60C shows that a shallow flank structuring of the layer stack was performed from the side of the second layer 5, with only the edge areas of the two second contacts 11 having a shallow flank structuring. The area between the first two contacts 9 is not flank structured, i.e. the second layer 5 there remains unprocessed. After contacting, a deep edge structuring of the layer stack is carried out here as shown in FIG. 60A from the side of the first layer 3 and the modules are separated (not shown). The original carrier 1 has been removed.

According to FIG. 60D, two oppositely oriented base modules B are also arranged, which were created as one piece. Their first contacts 9 are adjacent to each other. A common layer stack of two adjacent base modules oriented in opposite directions to each other has been produced, whereby a first layer 3 has been produced as one unit along the end carrier 2. The cross-section shown in FIG. 60D shows that a shallow flank pattern has been created on the stack of layers from the side of the second layer 5, creating a shallow trench around each base module B. In particular, the area between the two first contacts 9 is flank structured, i.e. the second layer 5 there and the transition layer 7 as well as part of the first layer 3 have been removed there as well as in the edge area of the second contacts 11. A deep flank structuring of the stack of layers was carried out here, as in FIG. 60B, from the side of the second layer 5. Only a small ridge remains in the figure, but this can still be separated if necessary.

Figure 61:
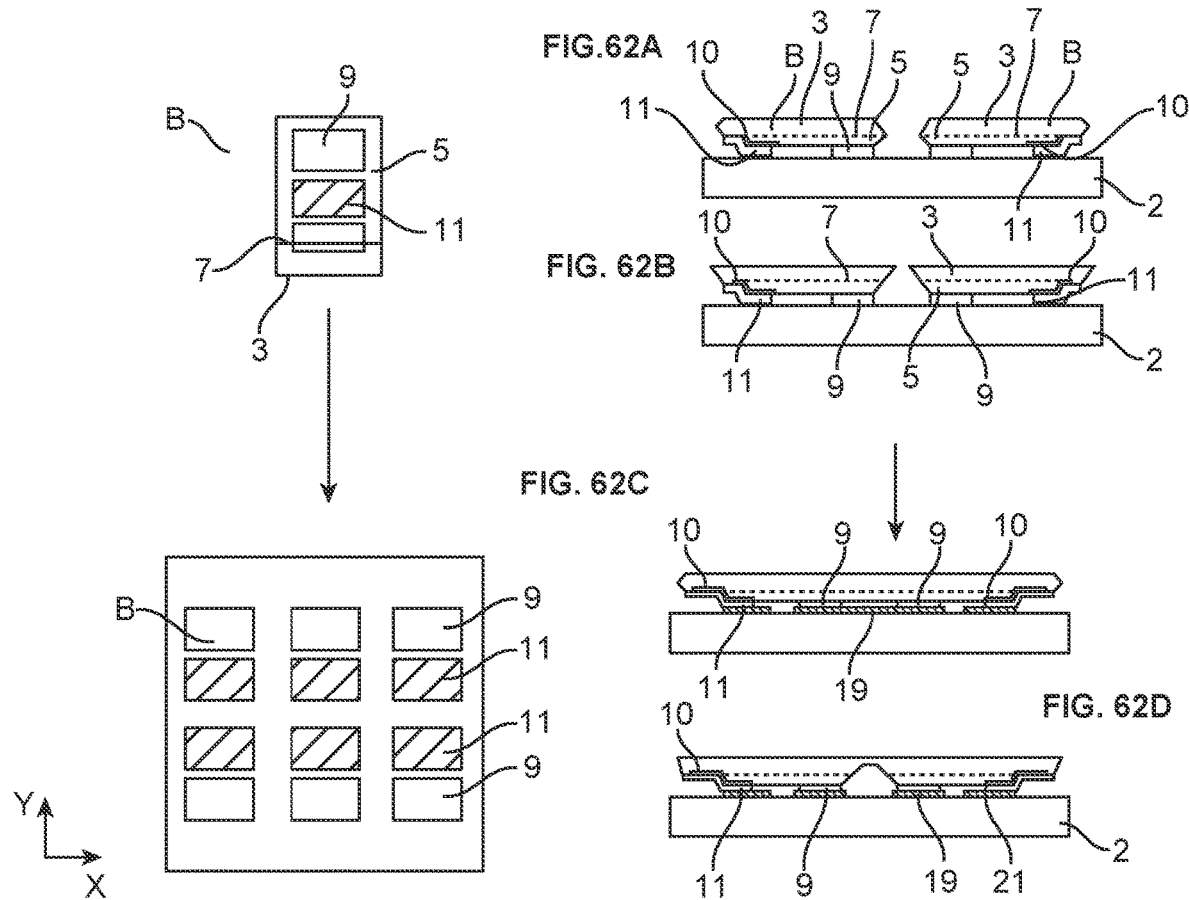
FIG. 61 shows a further illustration of an embodiment of a proposed base module to provide a two row and three column light emitting diode module.

FIG. 61 shows a further illustration of an embodiment of a proposed base module B to provide a µ-LED module with two rows and three columns (2×3) of base modules B, as shown below the base module B shown above can be provided here on a carrier 1, but also without a carrier. In this plan view, a first contact 9 and a second contact 11 are shown, as well as the first layer 3, the transition layer 7 and the second layer 5 are visible.

According to FIG. 61 below, six base modules B are grouped together to form a µ-LED module. This matrix with two rows and three columns in an X-Y plane is already selected on carrier 1. In addition, when producing adjacent rows on carrier 1, the base modules B of one row are oriented in the same way. The lower row here has base modules B, which are arranged opposite to the upper base modules B. The µ-LED module shown in FIG. 61 below can still be arranged on carrier 1 after a flat edge structuring. A grouping into the rectangular LED module shown below takes place by selecting a release area. This can be detached by means of a deep edge structuring along a rectangle enclosing the µ-LED module. The generated 2×3 (two rows by three columns in an X-Y plane) µ-LED module has a width of approximately 30 micrometers and a length of approximately 30 micrometers. With this method, any combination of a matrix of base modules can be extracted and produced as a µ-LED module.

FIGS. 62A to 62D show four cross sections of two oppositely oriented base modules B of a μ-LED module as shown in the lower illustration in FIG. 61.

FIG. 62C shows, in contrast to FIG. 60C, that the first contacts 9 are electrically connected and contacted by means of a common first contact 19 created on the end carrier 2. The second contacts 11 are individually electrically connected to second contacts 21 on the end carrier.

FIG. 62D shows, in contrast to FIG. 60D, that first contacts 9 are individually connected to first contacts 19 and second contacts 11 are individually connected to second contacts 21 of the end carrier 2.

Figure 63:
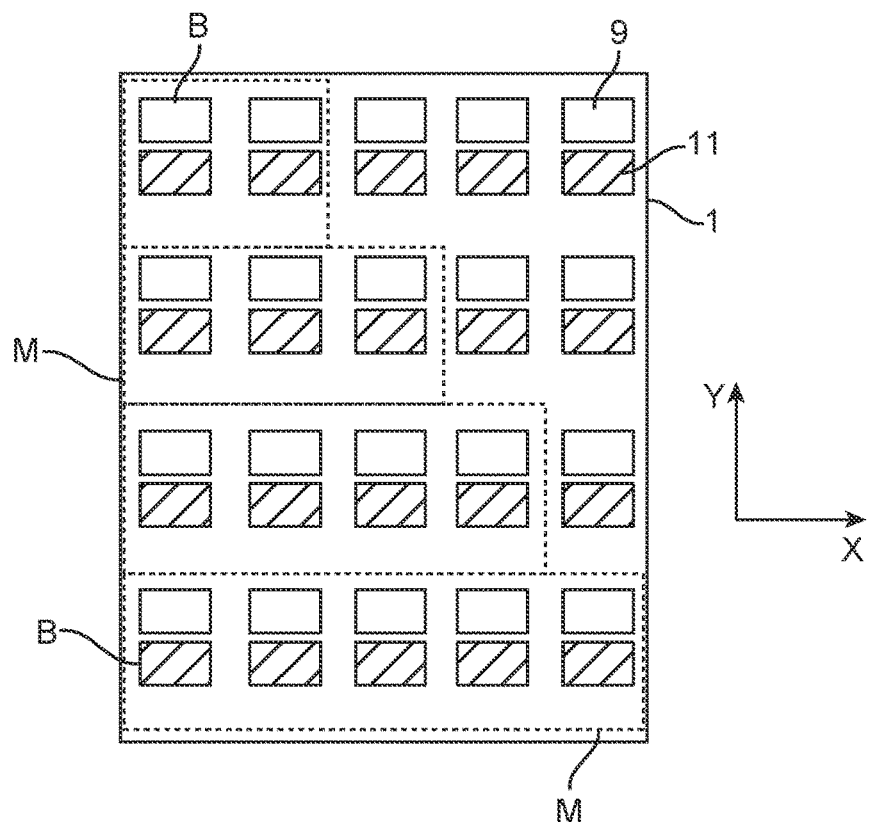
FIG. 63 shows a top view of a matrix containing basic modules with groupings to explain further aspects.

FIG. 63 shows a top view of a matrix of a carrier (wafer or carrier 1) with groupings in an X-Y plane, which has base modules B. The base modules B are all originally generated on a carrier, in particular carrier 1, in the same orientation. There was no rotation or rotation of base modules B. A generated μ-LED module only comprises one base module B in a Y-direction and is therefore single-line. Any number of base modules can be provided in an X direction. In FIG. 63 base modules B have been grouped into four μ-LED arrays or μ-LED modules M.

Figure 64:
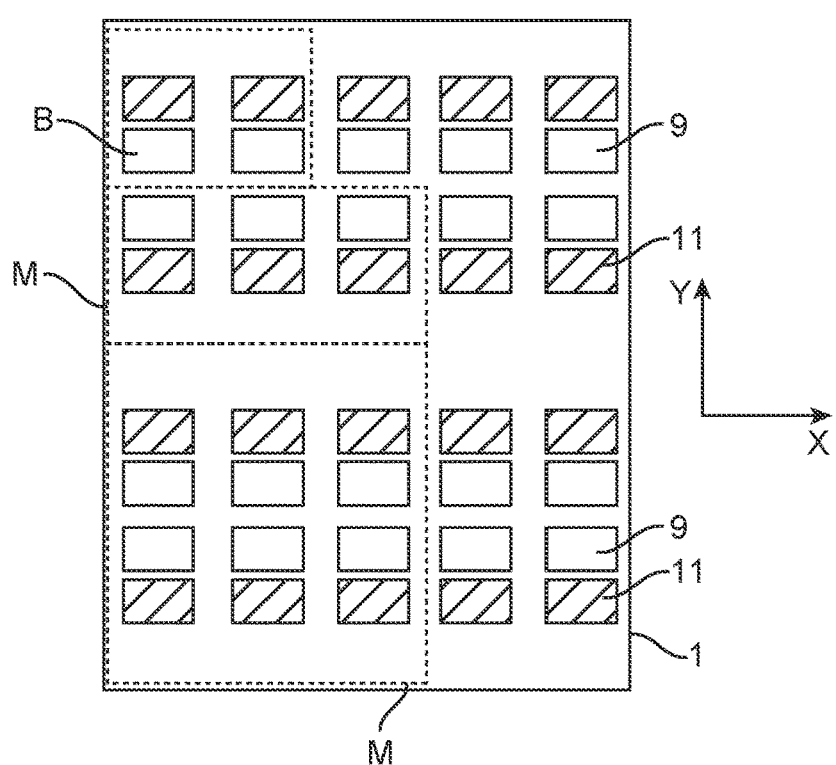
FIG. 64 illustrates a top view of a matrix with basic modules and further groupings.

FIG. 64 shows a top view of a matrix of a carrier (wafer or carrier 1) with other groupings, which comprises base modules B. Here, the base modules B of two adjacent rows are oriented opposite to each other by rotating the base modules B of one of these rows. The dotted lines represent the rectangles of the μ-LED modules M still to be separated. FIG. 64 shows μ-LED modules M with one or two rows along a Y-direction, whereby the number of columns in the X-direction can be arbitrary.

Figure 65:
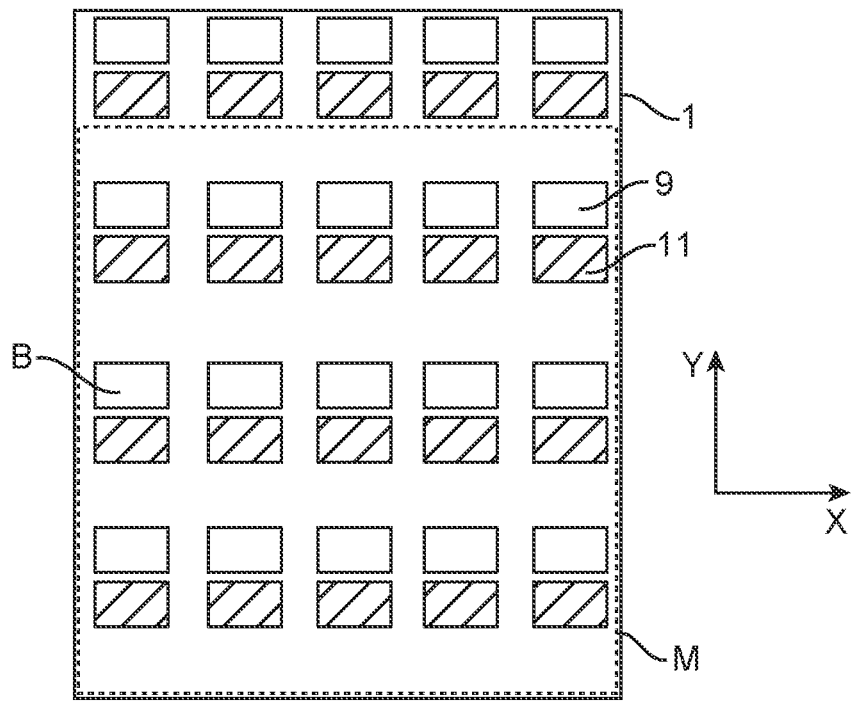
FIG. 65 shows a top view of a matrix with basic modules and another possible grouping.

FIG. 65 shows another top view of a further matrix of a carrier, in particular a carrier 1 or wafer, with a further grouping, which comprises base modules B. This grouping creates a rectangular μ-LED module M in an X-Y plane, which comprises three rows and five columns. The μ-LED module M thus has 15 base modules B, which are evenly distributed in the rectangle. The base modules B are equally spaced along one row. The rows are also equally spaced. All base modules B have the same orientation.

Figure 66:
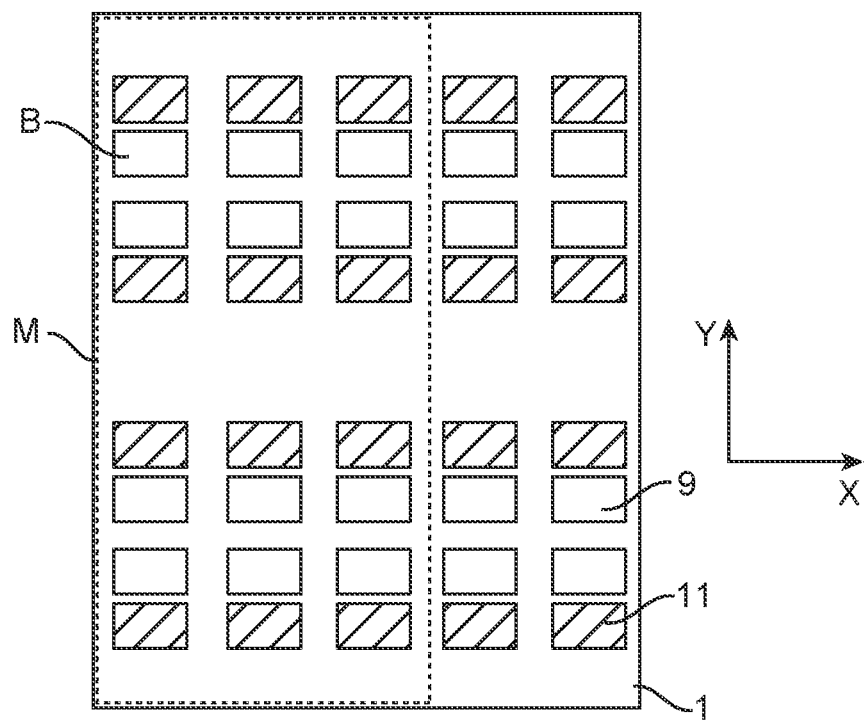
FIG. 66 is a top view of a matrix with basic modules and another possible grouping.

FIG. 66 shows a further top view of a further matrix of a carrier, in particular a carrier 1 or wafer, with a further grouping, which comprises base modules B. This grouping creates a rectangular μ-LED module M in an X-Y plane, which has four rows and three columns. The μ-LED module M thus comprises 12 base modules B, which are evenly distributed in the rectangle. The base modules B are equally spaced along one row. The base modules B comprise two pairs of lines, whereby in one pair of lines the base modules B of both lines are oriented opposite to each other and are equally spaced apart. The distances between the pairs of lines can be different from the distances between the lines in a pair of lines. In this way, a chip cluster of μ-LEDs can be formed on a carrier 1 or wafer. The result is a modular μ-LED architecture.

The manufactured μ-LED modules M can be electrically contacted by means of flip-chip technology and integrated into μ-LED displays, for example. Base modules B can be electrically connected in series or in parallel.

Figure 67A:
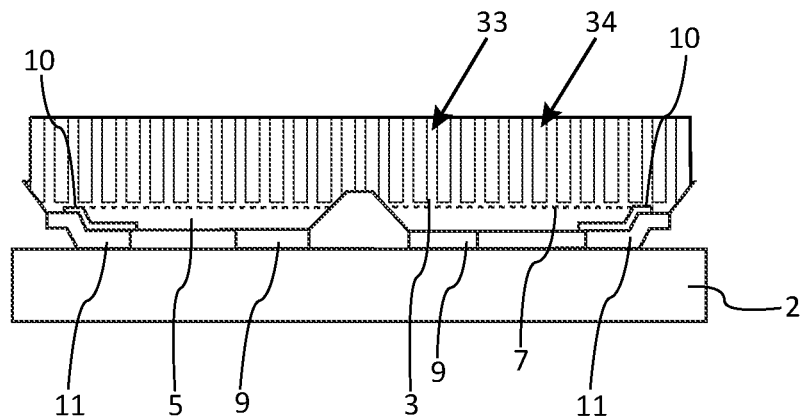
FIG. 67A illustrates a cross-sectional view of another embodiment of a μ-LED module with an additional photonic structure.

FIG. 67A shows an embodiment in which the μ-LED module was structured either after the intermediate transfer step or before on the light emission side. Several periodically arranged holes were etched into the semiconductor layer facing the light emission side, which can be described as so-called negative pillars or columns. This result in a periodic variation of the refractive index, since the surrounding semiconductor material comprises a higher refractive index than the holes filled with air. In this embodiment, the depth of the periodic structure reaches approximately to the active region, but is at least in the order of one wavelength of the light to be emitted. In this embodiment, the holes in the semiconductor material are not filled. However, it can be useful to fill them with a material with a different refractive index in order to achieve the desired optical properties on the one hand and to achieve a planar surface on the other.

Figure 67B:
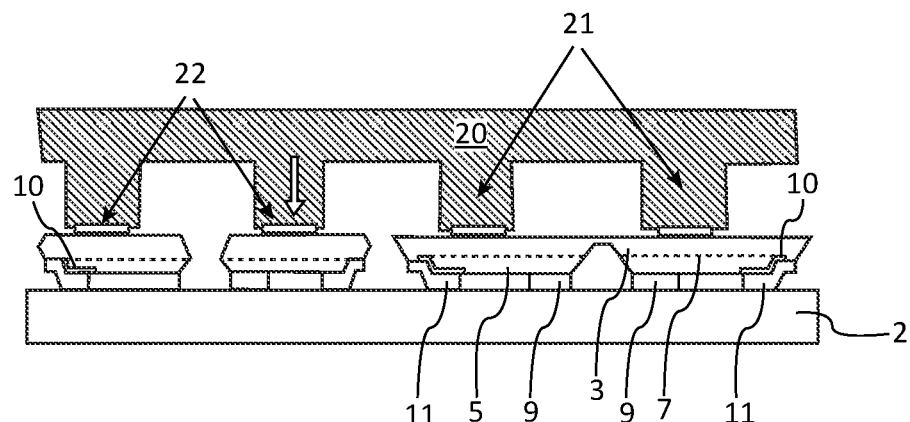
FIG. 67B shows an example of how the proposed μ-LED module can be lifted off by a transfer stamp described in this application.

The μ-LED modules can be transferred to a backplane after deep edge structuring as well as after a complete etching. The defined size of the μ-LEDs from the combined base modules is particularly suitable for this, as it defines the distances in a fixed manner. In addition, a class of stamps can possibly be used to transfer modules of different sizes. FIG. 67B illustrates an example of such a transfer process with a stamp, as described in more detail in this application. Stamp 20 has several cushions 21 and 22, spaced at fixed intervals, each of which can be charged with a surface tension or surface charge, as described in this application. The distances between the cushions correspond to the size of the individual base modules of each base module.

If a base module or μ-LED module is to be removed from the composite and transferred, the stamp generates a potential on its side facing the module so that it adheres to the cushion. The adhesive force is determined by the charge or voltage of a cushion. In this respect, larger modules can also be transferred, provided that the electrostatic force generated by the cushions is sufficient.

Figure 68:
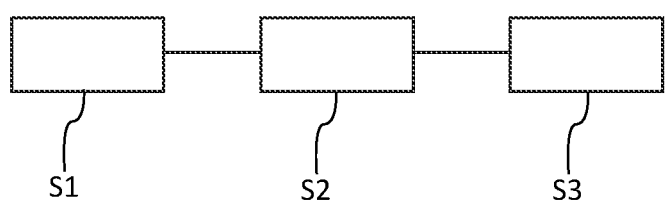
FIG. 68 shows several steps of an embodiment of a proposed process for manufacturing μ-LED modules.

FIG. 68 shows an example of a proposed method for the manufacture of light emitting diode modules. In a first step S1, at least one layer stack providing the base module is created. The stack comprises a first layer formed on a carrier 1, on which an active layer and a second layer are applied. The active layer can comprise a quantum well or similar.

In a second step S2, a surface area of the first layer facing away from substrate 1 is exposed. Finally, in a third step, a first contact is applied to a surface area of the second layer facing away from carrier 1. In addition, a second contact is created on the surface area of the first layer facing away from carrier 1 and exposed. The second contact is electrically insulated from the transition layer and the second layer by means of a dielectric and runs on the surface area of the second layer facing away from carrier 1.

In this way, any number of base modules can be generated as a matrix on a wafer or carrier 1, whereby the base modules can be grouped into μ-LED modules and then separated. LED modules preferably have a rectangular or square shape in an X-Y plane of the matrix. In this plane, base modules can be arranged regularly in the rows and columns with equal spacing. The base modules are preferably generated and arranged evenly distributed along the matrix over a wafer, carrier or replacement carrier 1.

The manufacturing process shown here is greatly simplified. In fact, a large number of the techniques described here can also be used. For example, each base module can have a current constriction by doping the change in band structure accordingly. Since the base modules are separated if necessary, it is also advisable to change the band gap of the material system and the active layer at the possible predetermined breaking points by quantum well intermixing or other measures. This reduces non-radiative recombination at possible edge defects, since the charge carriers are repelled by the changed potential of the band structure. The manufactured μ-LED modules can still be structured in the surface to improve the radiation characteristics. This makes it possible to apply a photonic crystal or a converter layer to larger modules or modules of different colors. Each μ-LED module can also be equipped with its own control unit, which has already been implemented in the end carrier 2.

Another aspect deals with the question whether and to what extent such sub-units with sensor can be provided. As already mentioned, the manufactured and grouped modules are transferred to a target matrix, which comprises for example a backplane or similar.

Figure 69:
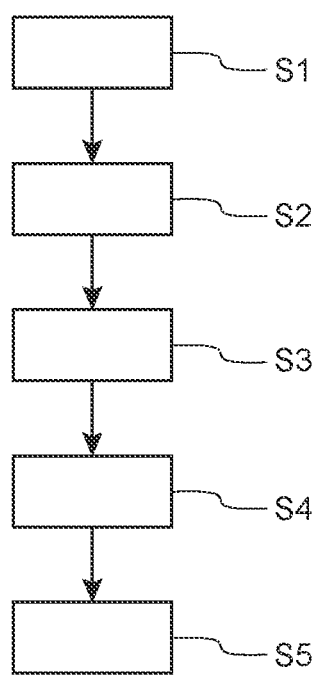
FIG. 69 illustrates a schematic representation of another method for the production of μ-LED modules according to some aspects of the proposed principle.

FIG. 69 shows the steps S1 to S5 of a proposed process for the production of a display with such sensors, which will be manufactured using the modules presented here.

The method is used to produce a µ-display with a full-surface target matrix of components, in particular µ-LEDs 5, arranged in rows and columns next to each other on a first carrier 3 or end carrier. The µ-LEDs in turn are part of modules.

In a first step S1, a number of µ-LEDs 5 are formed on a carrier or a replacement carrier 17 in a starting matrix 7. The spacing and size of the µ-LEDs 5 in the start matrix 7 are in a fixed, in particular integer, ratio to the spacing and size of the free spaces of the later target matrix 1 on the first carrier or end carrier 3. The µ-LEDs are formed by the methods described in this application. In particular, the wafer is prepared for deep mesa etching in order to obtain a module structure. The individual µ-LEDs later form the subpixels or also pixels on the target matrix. In this respect, the start matrix 7 can be congruent with at least part of the target matrix 1. In this way, groups of components 5 can be transferred for this part from the replacement carrier 17 to the final carrier 3. Correspondingly, the replacement carrier with the µ-LEDS formed on it can be at least partially congruent with the end carrier in terms of size and spacing.

In a second step S2, the µ-LEDs 5 are grouped to a number of modules 9 on the replacement carrier 17, especially by means of deep mesa etching.

In a subsequent step S3, the modules 9 structured in this way are lifted off the replacement carrier 17, in particular by means of laser lift-off or a mechanical or chemical process, and then transferred as modules to the final carrier 3 and thus to the target matrix 1. Contact areas of the modules contacting the µ-LEDs 5 are configured in such a way that they correspond to contact areas of the target matrix after the transfer. In other words, for at least a partial area of the final carrier 3 and thus the target matrix 1, the modules and the µ-LEDs are arranged with their contact areas on the replacement carrier 17 in rows and columns next to each other in such a way that the distances between the µ-LEDs 5 on the replacement carrier 17 are equal to the distances between the µ-LEDs 5 on the target matrix 1 of the final carrier 3.

In the fourth step S4, the modules 9 are positioned and electrically connected to the primary end carrier 3 in the target matrix 1 in such a way that a number of unoccupied positions 11 remain in this matrix. For this purpose, the modules themselves may be unevenly designed, so that, for example, one module is missing. Alternatively, the modules can also be transferred to the target matrix in such a way that some positions, for example rows or columns, remain unoccupied.

In a fifth step S5, at least one sensor element 13 is positioned and electrically connected at least partially at each of the unoccupied positions 11.

Figure 70A:
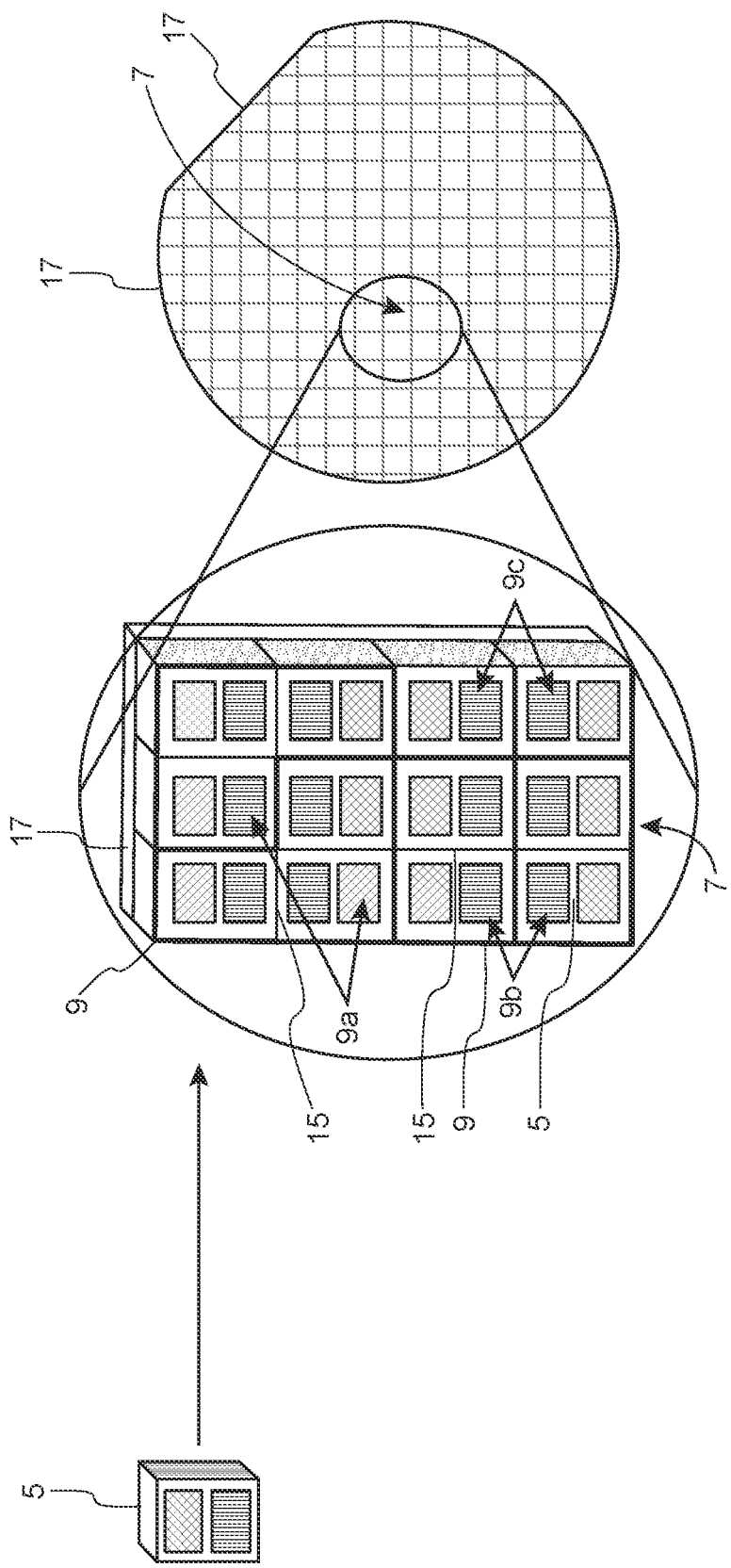
FIG. 70A are illustrations of some steps of the method presented in FIG. 69.

FIG. 70A shows a diagram to illustrate the different aspects and differences between µ-LED, module and the replacement carrier. Replacement carrier 17 comprises a sapphire substrate on which various semiconductor layers, including at least one active layer, have been deposited in several steps disclosed in this application. A starting matrix 7 of µ-LEDs is created on the replacement carrier 17 by means of shallow etching. The µ-LEDs 5 are still interconnected and have only electrically mutually insulating areas created by means of shallow etching, so that they can be individually addressed. Such methods are disclosed in this application. In one aspect, vertical µ-LEDs are formed in which a first contact faces the substrate and a second contact faces away from the substrate. In addition to this embodiment, µ-LEDs can also be produced which are designed as flip-chips with their contacts next to each other on the same side. In the present example, a µ-LED 5 is designed as a flip chip, with the two contacts facing away from the substrate and electrically insulated from each other. The µ-LED 5 forms a cuboid element. The µ-LED 5 represents a basic element and comprises, for example, a width of approximately 10 µm and a length of approximately 15 µm. A component 5 is shown as a base unit on the left side of FIG. 70A.

By means of an additional, this time deep mesa etching—this corresponds to the second step S2 of FIG. 69—the µ-LED 5 are grouped to modules 9. In the middle of FIG. 70A, a start matrix 7 of twelve components 5 is created on the replacement carrier 17 by means of a shallow etching, whereby the µ-LEDs 5 are arranged along common sides 15 in four rows and three columns next to each other. The thick edges in FIG. 70A center surround modules 9 grouped in this way, which can combine a plurality of components 5. In this way, two modules 9a are created, each grouping together three µ-LED 5. Furthermore, two modules 9b with two µ-LEDS each and two modules 9c with one µ-LED each are created.

Figure 70B:
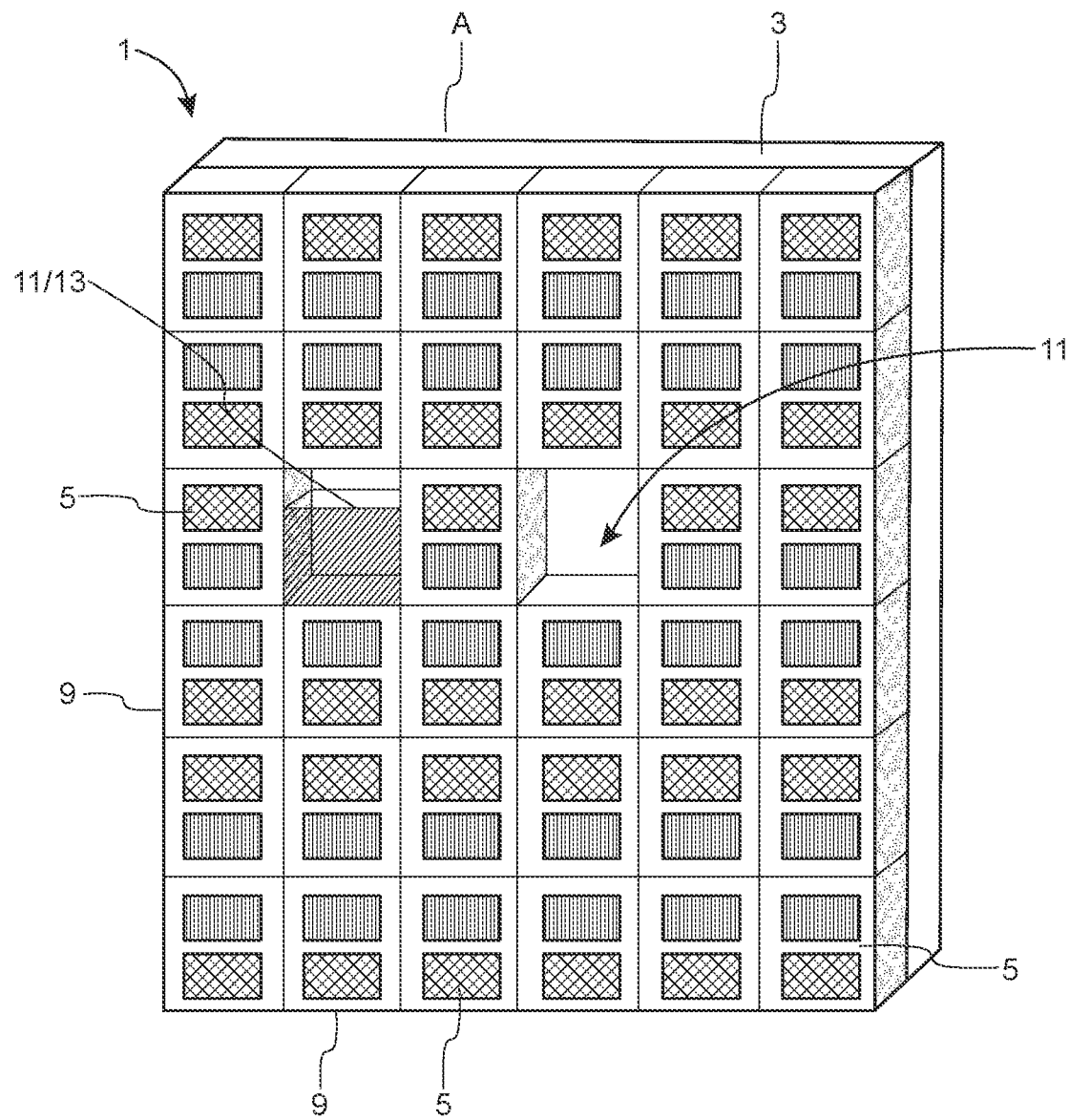
FIG. 70B shows an illustration of further steps of the method presented in FIG. 69 for an explanation of various aspects.

FIG. 70B shows an illustration of the modules and µ-LEDs after transfer to the final carrier 3. 6 columns and rows can be seen on the final carrier 3, whereby the number of columns and rows can of course be chosen at will. The module arrangement is chosen so that there is no further distance between the modules, i.e. the components are close together. However, modules are selected which do not completely fit into this matrix. For example, 2×2 modules could completely cover the end carrier shown here. However, two modules are configured in such a way that they are not designed as a 2×2 matrix but as a 2×1 matrix, i.e. they only have three µ-LEDs, so that one position 11 remains unoccupied. When positioning in the above-mentioned way, two positions 11 thus remain free, whereby the position of these in turn depends on the positioning of the respective module. The left of the two free positions is occupied by a sensor element 13. In the version shown, only one position is already occupied. In embodiments, however, the sensor element can also consist of two individual or several elements, which are then divided between the unoccupied positions.

FIG. 70B thus shows a large number of µ-LED 5, which are grouped together in the form of modules 9 and arranged on the end carrier 3. In this way, a single full-surface target matrix 1 is equipped. For a µ-display, modules 9 are designed and combined as subpixels. Modules 9 for the three different colors red, green and blue are created and arranged next to each other in such a way that they together create a pixel (picture element) as subpixels. Then the picture elements are arranged along the target matrix 1 in rows and columns. By using redundant µ-LEDs, sensor elements can also be positioned in some places instead of redundant subpixels.

Figure 70C:
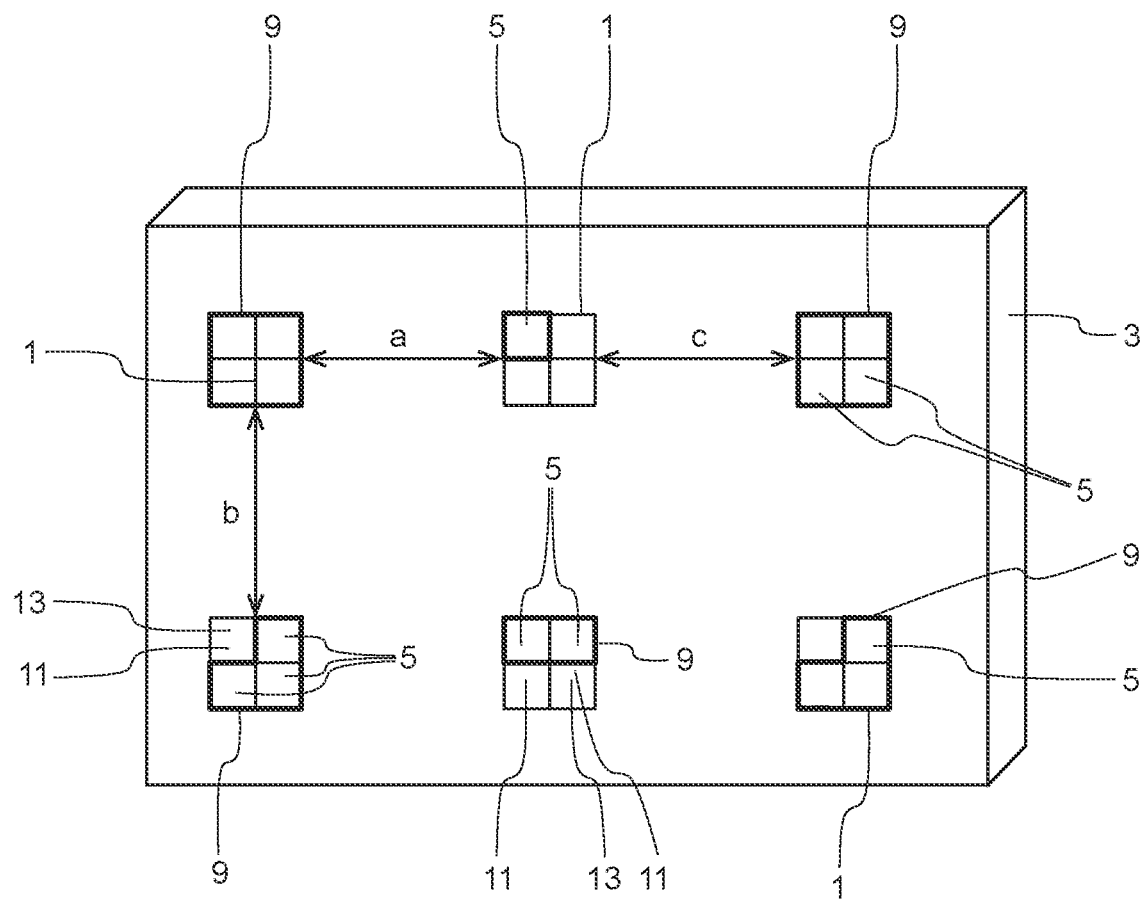
FIG. 70C shows a representation of an arrangement of a large number of full-surface target matrices.

FIG. 70C shows a representation of an arrangement of a large number of full-surface target matrices 1.

In contrast to FIG. 70B, a large number of full-surface individual target matrices 1 are used, each of which can also comprise a large number of modules 9 according to FIG. 70B. For a clear description of FIG. 70C, each single full-surface target matrix 1 comprise only two rows and two columns. Here, the target matrices 1 comprise the same uniform size in the area. Alternatively, the target matrices 1 can create areas of different sizes. In this way, a display device can be flexibly adapted to a particular application.

For example, in the upper left target matrix 1, a module 9 covers all the vacant positions in target matrix 1. To the right of it, only one module 9 is formed with a component 5 in target matrix 1, leaving three positions 11 unoccupied. Below this, two components 5 form a module 9, leaving two positions 11 unoccupied. A module 9 is positioned in the target matrix 1 at the bottom left, consisting of three components 5, whereby only one position 11 remains unoccupied. For example, sensor elements 13 can be formed at least partially at the unoccupied positions 11. Three of the four above-mentioned target matrices 1 can each have components 5 for one color red, green and blue and together form a picture element. This picture element can be repeated horizontally and vertically along the first carrier or end carrier 3 so that a display function can be provided. Since a homogeneous radiation of the sub-pixels is generally desired, they are preferably equipped with the same modules 9 for each color. The fourth target matrix 1 can alternatively be completely equipped with sensor elements 13.

The distances a and c for respective distances of the target matrices 1 in a row and the distance b as an example for a distance of the target matrices 1 in a column can be selected according to the desired resolution of the display. This also applies to the distances to the edges of the first carrier or end carrier 3. The distances a and b, or a and c, or b and c or a, b and c can be the same. Likewise, the distances a and b and c can be whole multiples of the spatial extension of a component 5 or the distance of the components 5 to each other.

Figure 70D:
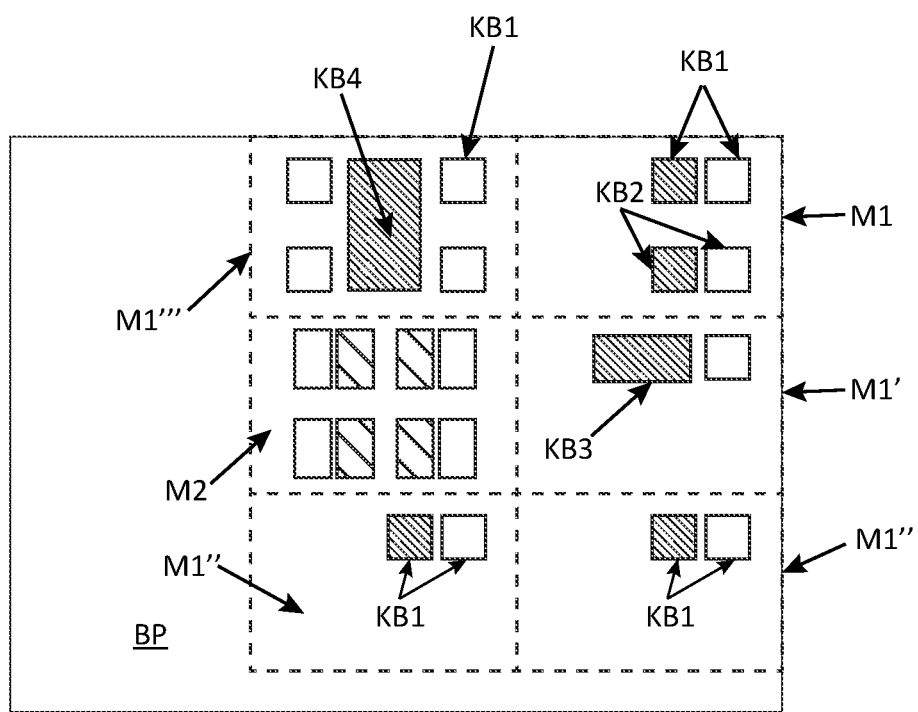
FIG. 70D illustrates schematically various contact surfaces that are suitable for contacting the proposed µ-LED modules.

FIG. 70D shows examples of different contact possibilities for electrical contacting of μ-LED modules on a backplane or other substrate. In M1 a contact panel M1 with two areas KB1 and KB2 is shown, which are suitable for two single base modules. The base modules can be placed on the surface individually or also in combination. Contact panel M1' expands the contact area KB3. This allows a μ-LED module comprising two connected base modules with shallow mesa etching to be placed and controlled together. Panels M1" are similar to Panel M1', but only contact areas are provided for one base module. In Panel M2 a μ-LED module is shown, which is arranged above the contact areas. Panel M1''' illustrates an area where a common connection is provided.

Figure 70E:
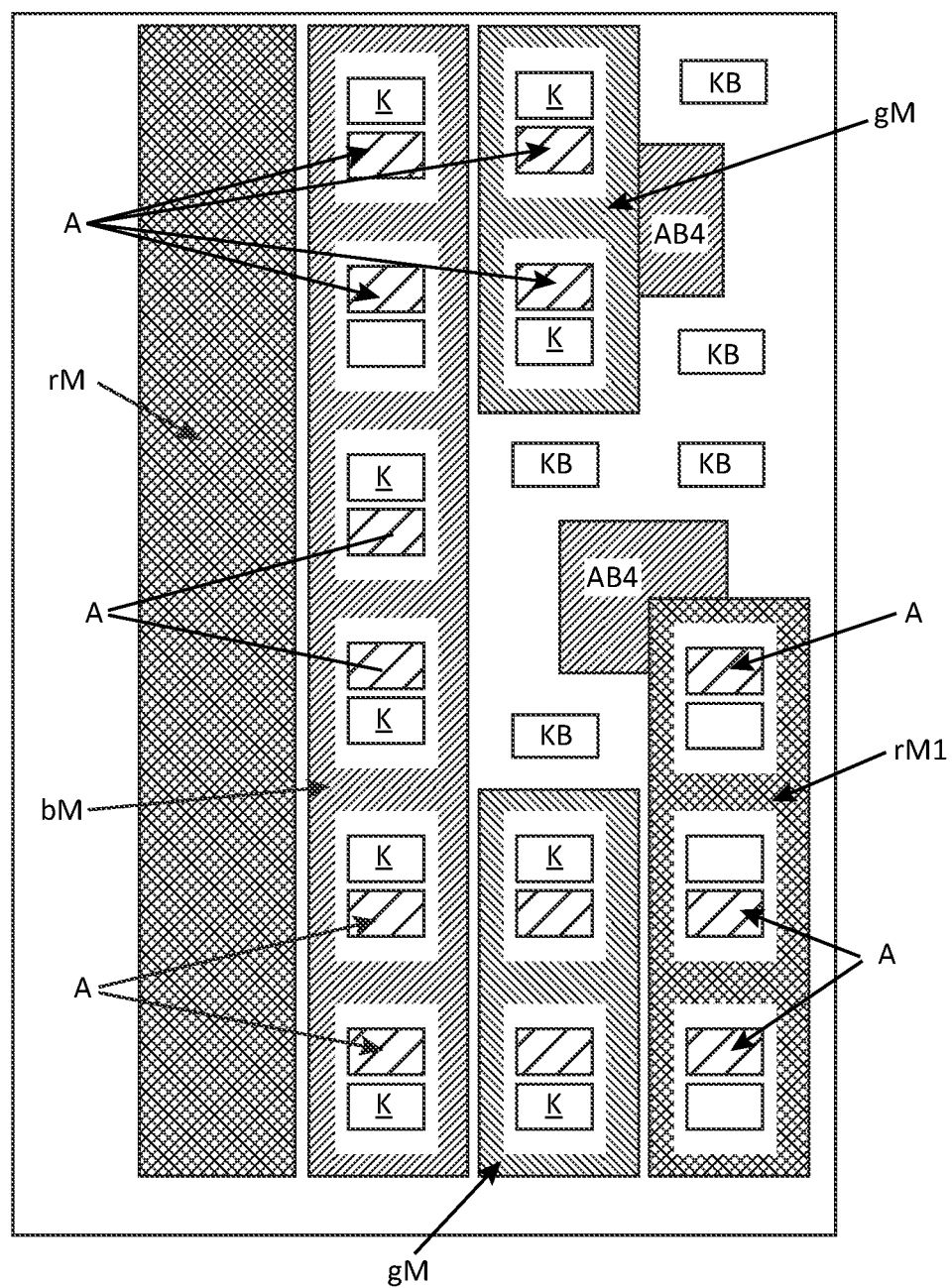
FIG. 70E shows a section of a display with contact areas and some µ-LED modules.

FIG. 70E shows a section of a partially equipped backplane or plane to illustrate some aspects of this. As already mentioned, the μ-LEDs can be manufactured as an array in rows and columns. This allows the assembly of several μ-LED modules and modules with different colors. This is shown in FIG. 70E. The section shows a red module rM in direct top view. It is manufactured from a 6×1 module according to the proposed principle and is mounted and contacted on the plane. Adjacent to the red module is a blue module bM in a kind of sectional view to illustrate the different contacts. Contacts connected together are marked with K. In this context, the term "common" should be understood to mean that these contacts have the same potential as at least some other adjacent contacts. Accordingly, a common contact area AB4 is applied on the plane. This always contacts contacts K of several base modules as shown. Further contacts Kb are used for individual control of each base module. Consequently, a total of 5 contact areas must be formed on the plane in order to control 4 base modules individually. As shown in the illustration, the jointly used contact areas can thus also be used jointly by μ-LED modules of different colors.

Figure 71:
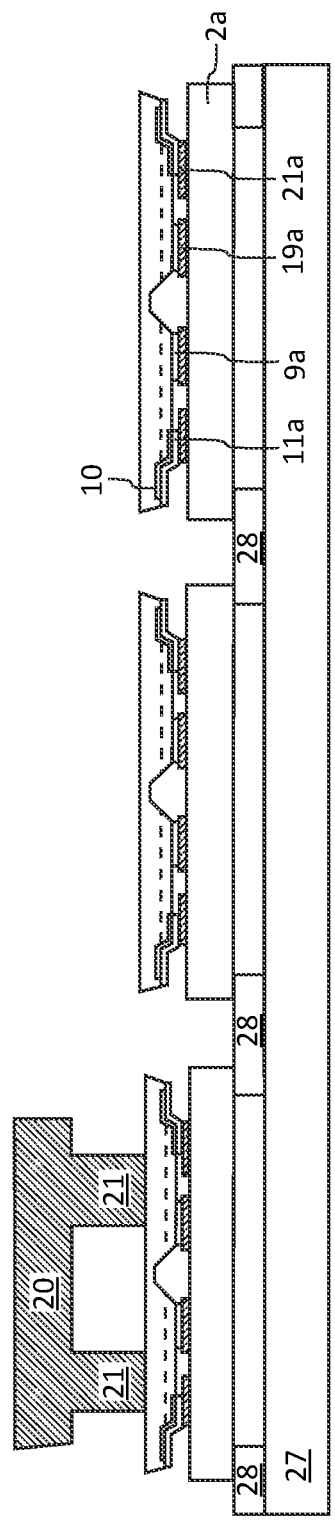
FIG. 71 shows an embodiment for a double transfer process with proposed µ-LED modules.

FIG. 71 finally shows another aspect of the transfer process. By periodically arranging and organizing the μ-LED modules into base modules, after a separation of μ-LED modules in the desired way, the modules can be transferred using the twofold transfer process presented in this application. FIG. 71 shows a transfer arrangement 20 with two cushions 22 whose size corresponds to the distance between the base modules.

Figure 72:
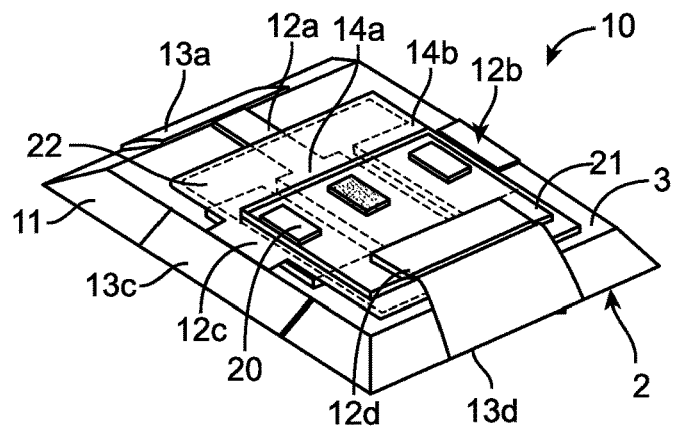
FIG. 72 shows a first embodiment of a µ-LED module for vertical and horizontal mounting with some aspects according to the proposed principle.
Figure 74:
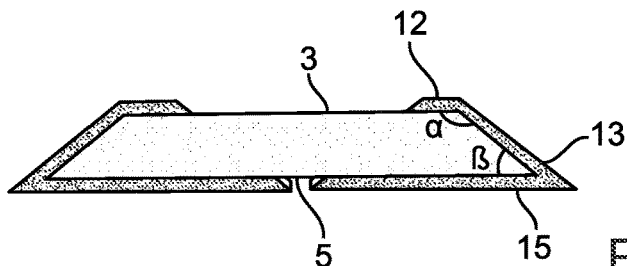
FIG. 74 shows a sectional view of the first embodiment along the X-X axis in FIG. 73.

In addition to the production of monolithic pixel arrays, μ-LEDs can also be separately applied to a carrier board and subsequently contacted. FIG. 72 shows an embodiment of a pixel module for different mounts
10 with some aspects according to the proposed principle. Module 10 comprises a body 2 with a first main surface 3, a total of four side surfaces 11 and a second main surface, not shown here in this view, which forms the bottom. Body 2 is made of, for example, silicon or another semiconductor material. In some embodiments, however, the body can also be formed from another material, conductive or non-conductive. The second main surface is arranged parallel to the first main surface 3 and thus forms the underside of the module and body 2. The side surfaces are diagonal to the first main surface or upper side of the body, thus forming a truncated pyramid as shown. Thus, as shown in FIG. 74, an angle α between the first main surface and the side surfaces shows more than 90°, while the angle β between the second main surface 5 and the side surfaces is less than 90°.

Referring again to FIG. 72, the upper surface 3 comprises an insulating layer 22, which is arranged in the middle. In this example, the insulation layer does not extend completely over the first main surface, but a free area remains at the corners. Several contact pads 14a to 14c are now arranged on the insulation layer. Each contact pad 14a to 14c is connected to a contact bar 12a to 12c, the width of which is smaller than the actual contact pad as shown. The contact pads 12a to 12c are also insulated from body 2 of the module. Continuations 13a to 13c of the contact bars are now attached to the side faces 11 of the body. As contact tabs, these are in turn much wider on the side surface than the contact bars 12a to 12c. This increases the possible contact area on the side faces, allowing greater positioning tolerance and greater flexibility in contacting.

One μ-LED with vertical design is arranged on each of the contact pads 14a to 14c. These are configured to emit light in different wavelengths, for example red, green and blue light. The μ-LEDs comprise an edge length of a few μm, for example 5 μm, and are therefore slightly smaller than the contact pads 1a to 14c. The latter are also spaced apart from each other on surface 3, so that a slight offset is possible when positioning the μ-LEDs without restricting the functionality of module 10. The μ-LEDs are designed as vertical μ-LEDs, i.e. they comprise one electrical contact each on their bottom and top side. The contact on the bottom side is electrically connected to the contact pad.

On the upper side, a transparent conductive layer 21 forms a common contact pad for the three μ-LEDs and leads to a fourth contact bar 12d. This is excellent, as it forms the common connection for all three μ-LEDs. In the embodiment, it is significantly wider and thicker than the contact bars 12a to 12c. This enables visual identification, making it easier to transfer and position the µ-LED modules correctly for connection. The contact bar is electrically connected to a contact tab 13*d* on the last side surface.

Figure 73:
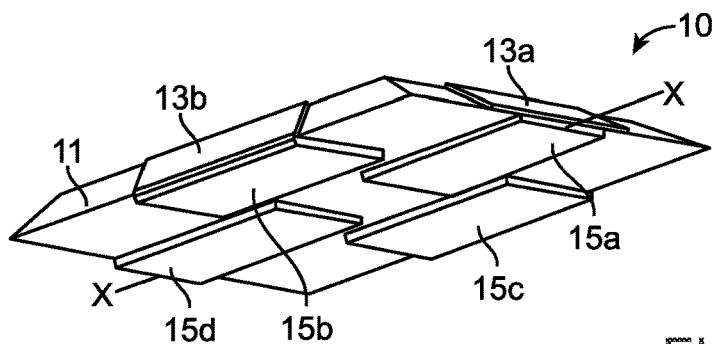
FIG. 73 shows the bottom of the first embodiment.

With the contact tabs on the side surface, the module or the µ-LEDs can be electrically contacted if the module is inserted into a matrix or similar. FIG. 73 also shows another aspect, which increases the possible applications of the module. Several contact pads 15*a* to 15*d* are arranged on the underside of the module, which are electrically connected to the contact tabs 13*a* to 13*d*. The contact pads on the underside can be configured in different ways and can thus be adapted to the requirements of different applications. In the example, the contact pads 14*a* to 14*d* are substantially rectangular.

FIG. 74 shows a section through the µ-LED module along the X-X-axis in FIG. 73. The bevelled side faces are clearly visible. These include an angle α greater than 90° with the first main surface, i.e. the top of the module. For example, the angle can be between 100° and 150°, especially in the range 110° to 130°. The angle depends on the manufacturing process and the parameters used for production, as explained in detail below. Accordingly, the angle β is less than 90°. The contact tabs and bars form a continuous metallization. The thickness of the module body is in the range of 10 µm to 100 µm, the metallization has a thickness in the range of some 100 nm to approx. 10 µm. This allows the module itself to be kept quite flat, but the body itself is stable enough.

Figure 75:
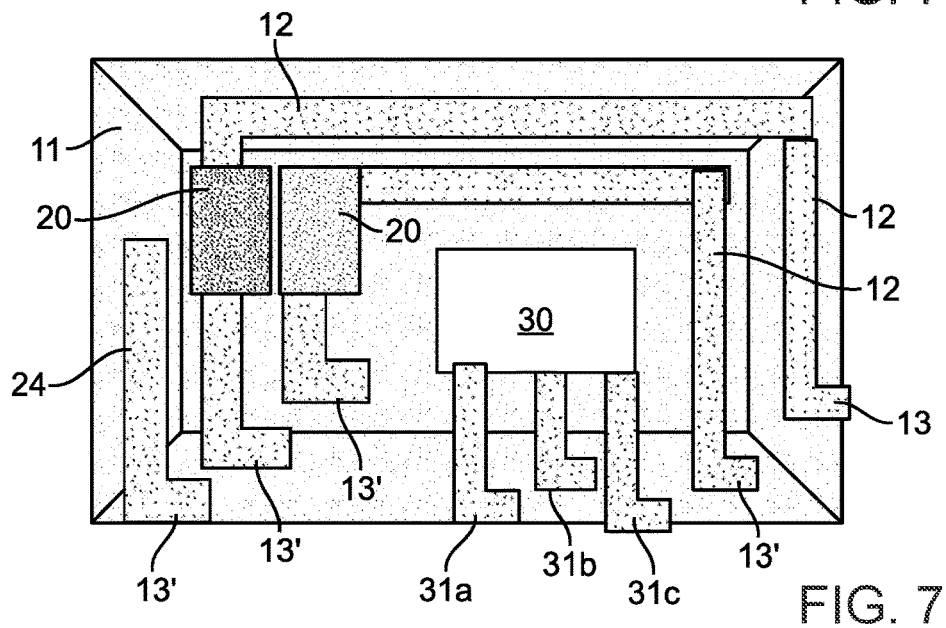
FIG. 75 shows another embodiment of a µ-LED module for vertical and horizontal mounting with some aspects according to the proposed principle.

FIG. 75 shows a top view of a further embodiment of the µ-LED module according to the proposed principle, from which further aspects can be seen. In this embodiment, the module with the module body is equipped with only two µ-LEDs 20 and additionally a further semiconductor chip 30 containing integrated circuits. In this version, the µ-LEDs are configured as horizontal flip-chips, whose underside, which cannot be seen, comprises the two contacts. The µ-LEDs are mechanically and electrically connected to the contact bars 12. Each µ-LED is thus connected to two contact bars 12, some of which are guided to corresponding contact tabs on the side surfaces. In addition, some contact tabs are arranged on the top side of the module, thus forming further contact pads. The IC chip 30 is connected to contact tabs on one side of the module body via its own contact bars.

In this embodiment, the individual contact bars do not run in a straight line to the side surfaces. Instead, the embodiment shows a rewiring in which contact bars are used that run along the surface and/or the side surfaces in order to electrically connect the chip 30 as well as the components 20. The contact tabs 13' along the side face are placed substantially parallel to the edge of the side face, i.e. they run along the side edge. This increases the effective contact area with external contacts. The module can thus also be easily offset or placed with greater placement tolerance on a matrix, display or similar.

In a side view according to FIG. 76, this aspect is clarified once again. It shows a combination of contact tabs on one side surface and a contact pad 15 on the bottom of the module. The contact tabs 13' are placed on the side face, but at different heights.

FIG. 77A shows an example of further processing of a µ-LED module according to the proposed principle. Module 10 is manufactured in a separate process and then placed on a carrier in a separate step. Carrier 50 comprises a large number of signal, control and power lines, of which line 56 is shown here as an example. In addition, carrier 50 also includes integrated circuits 55, buffers and similar. In this example, the module is placed on the carrier directly next to line 56 and fixed there. In order to achieve an electrical contact and connection between pad 56 and contact tab 13, these two are connected in a further step. This is shown in FIG. 77B. Contact pad 56 is attached to contact tab 13 by reflow or other soldering method. Material 57 is a conductive metal. This not only creates an electrically conductive connection, but also fixes the module mechanically to the carrier. In such a case, additional fastening of the module body to the carrier is not necessary.

FIG. 77C shows various contact options in this context. In the upper illustration of FIG. 77C, the module body is placed on contact pads 56*b* on carrier 50 in such a way that the contact pads on the underside of the module body overlap with them. A firm connection between the two pads is created by means of paste, reflow or other methods after heating. This requires an exact positioning of the module on the carrier.

In the lower illustration of FIG. 77C, a similar shape is shown as in FIG. 77B. The contact tab on the side face of module body 2 is attached to carrier 50 by soldering a wire to the carrier 50. In one case, this lead 56 on the carrier is designed so that it also partially overlaps with the contact pad on the underside of the module body. This makes the electrical connection even more reliable. At the same time, this embodiment is somewhat less sensitive to positioning fluctuations, as the lines on carrier 50 can be made larger and at the same time, a connection is improved with the additional solder. To ensure that the solder does not create a short circuit, the area 50 should be insulated apart from the contact area of line 56. However, it is advisable to configure the area around the contact of line 56 in such a way that solder also reaches the line, thus improving the electrical connection.

Figure 78A:
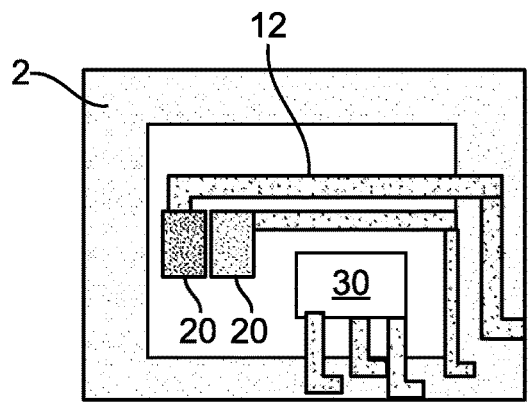
FIGS. 78A and 78B show a second embodiment with some aspects according to the proposed principle.
Figure 78B:
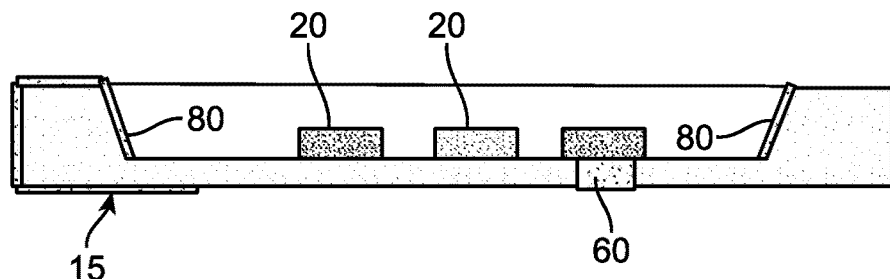

FIGS. 78A and 78B show an example of another version of a special module body. In this module, body 2 is configured with a central recess in which the components 20 and 30 are arranged. This allows the height of the module to be further reduced. In addition, the edge area of the module body can serve as a mounting for optical elements such as lenses and the like. The contact lines to the optical semiconductor components 20 and 30 run along the bottom of the recess and the side surface. As shown in FIG. 78B, the side surface of the recess is sloped. To make contact, the leads 80 are routed along the inner side face, over the main face along the outer side face, to the rear contact pad 15. In this illustration, the outer side surface is substantially vertical. However, this is not necessary, in some configurations this side surface can also be bevelled in the same way as in the previous embodiments.

The module body also has a through hole or via 60, which extends through the material of the module body in the recess. The via is filled with a metal for contacting, which is also insulated from the body. This combination of vias and contact tabs and pads creates a very flexible concept that can produce modules for a variety of technologies and connection variants in a standardized way.

Figure 79A:
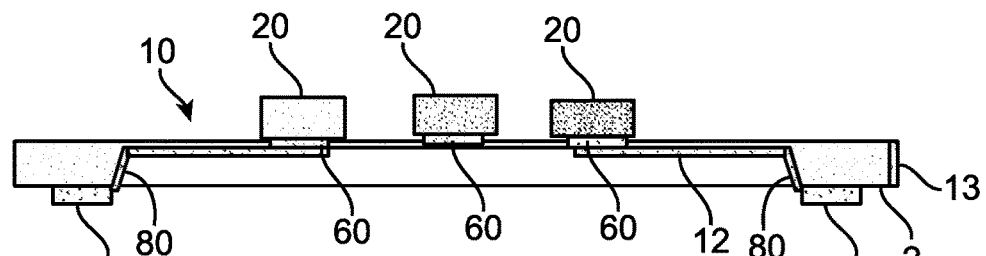
FIGS. 79A and 79B shows a third embodiment with some aspects according to the proposed principle.
Figure 79B:
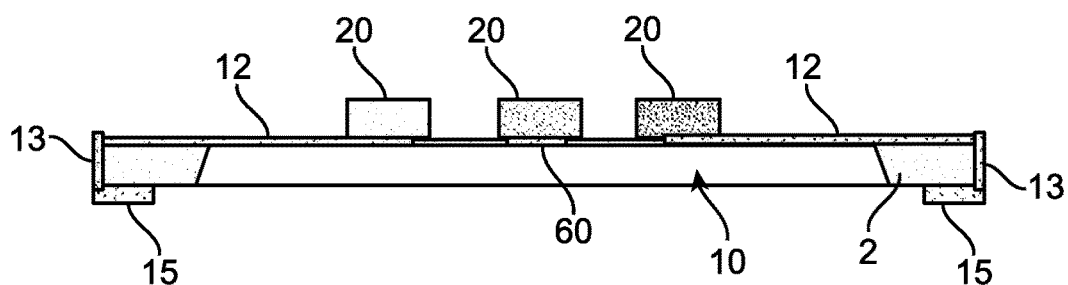

FIGS. 79A and 79B continue this principle. In both FIGS. 79A and 79B, module body 2 also comprises a recess or notch, but the recess or notch is in the bottom of the module body. The µ-LEDs are located on the upper side of module body 2. In the examples, several vias 60 are provided which extend through the material of body 2 and are connected to contacts of components 20. On the side facing away from the components, i.e. in the recess, contact bars 12 are now provided which connect the via 60 in an electrically conductive manner and lead along the recess to ridges 80 on the side surfaces. The bars 80 on the inner side surface of the recess are then connected to contact pads 15 on the bottom side.

In contrast to FIG. 79A, the lower contact pads in the FIG. 79B version are contacted via the outer surfaces of the module body. Both versions can also be combined with each other, i.e. through-plated holes are provided as well as contact lines, which are electrically connected to contact tabs on the outer side surface and/or contact pads. Due to the increased surface area of the module body, a specifically adapted wiring can be carried out, the flexibility for wiring is significantly increased. The embodiment of FIGS. 79A and 79B makes it possible, when positioning the module, to provide 10 additional circuits on the carrier whose position is in the recess. This results in a higher integration density.

Figure 80:
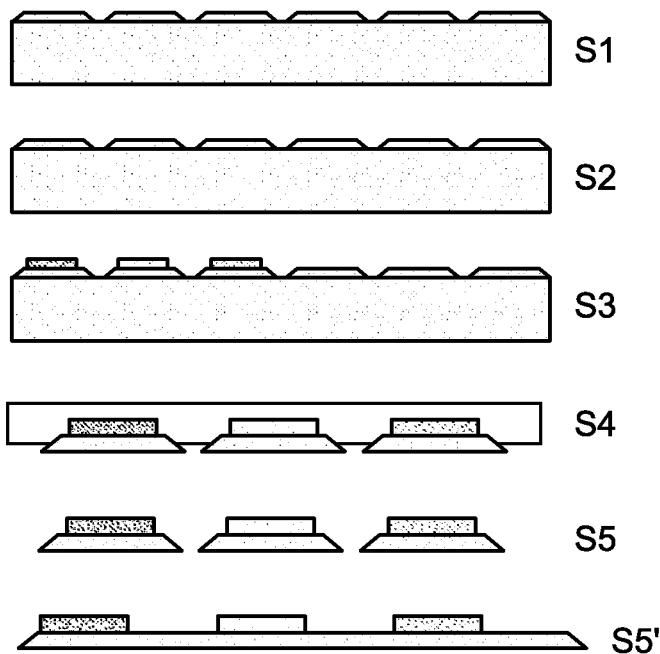
FIG. 80 shows an embodiment with different process steps.
Figure 84:
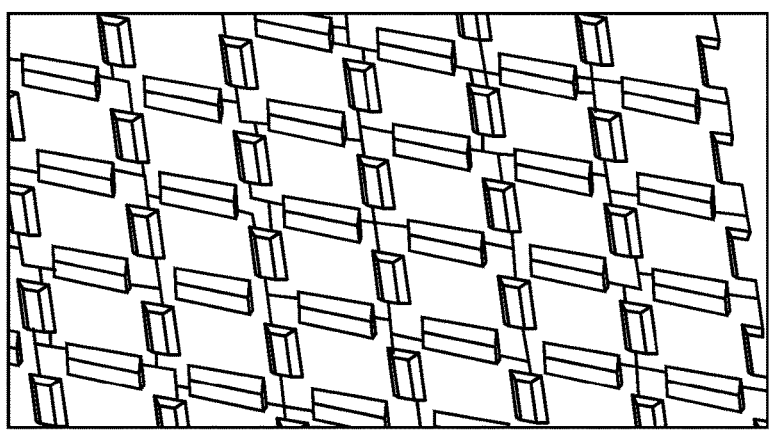
FIG. 84 shows an example of a structured membrane wafer during the manufacturing process of a module according to the proposed principle.

FIG. 80 shows in this context an example of a manufacturing process for a module according to the proposed principle. It should be noted in this context that various techniques disclosed in this application are used for the production. One component, however, is a structured membrane wafer as shown in step S1. This is done by providing the membrane wafer and structuring it by etching in such a way that V-shaped recesses and trenches are formed in sections. A plan view of such a structured membrane wafer is shown in FIG. 84.

In step S2, contact pads and leads or contact bars and tabs are generated on the structured membrane wafer. For this purpose, a photomask is applied and, for example, the metallic leads are formed by MOCVD. If necessary, previously formed isolated vias can also be filled with a metallization in this step. In step S3, the μ-LEDs are now placed on the contact pads and connected to them.

In step S4, the membrane wafer is rebonded onto an auxiliary carrier so that the back of the membrane wafer is exposed. Then in step S5, this is etched back to the trenches. This allows the modules to be separated so that each module now carries the intended number of μ-LEDs. In the exemplary step S5, it is a component. Alternatively, step S6 can also be carried out, in which etching is also carried out, but several μ-LEDs are now combined to provide a module, which is similar to the previous examples. There is no limit to the number of μ-LEDs and their positioning, but depends on the requirements and the later use. In a last optional step, contact pads are attached to the underside of the module body and these are electrically connected to the contact tabs on the side surface.

Figure 81:
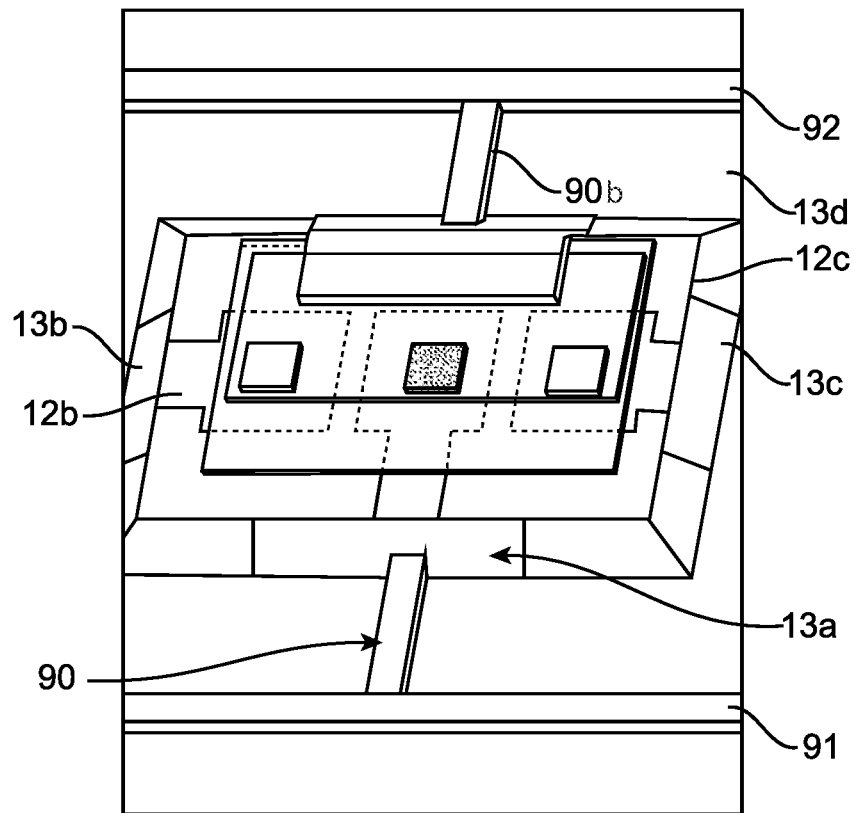
FIG. 81 shows a first embodiment of a contacting in perspective.

FIG. 81 shows a perspective view of the module of FIG. 72 after it has been placed on a carrier. The carrier includes several supply lines and control lines. A supply line 92 is connected to the common contact pad 13d via a contact bar 90b. Contact pad 13b is designed as a top contact and connects the top contacts of the respective vertical μ-LEDs to a common connector. A further supply line 91 contacts the contact pad 13a on the side surface of the module body via bar 90 and thus connects a connection of the red μ-LED. The slanted side surfaces ensure a secure electrical connection between bar 90 or 90b and the respective contact tabs. In addition, the module is attached using a soldering process, in which the bars 90 are soldered to the tabs 13a to 13d. Since the contact tabs 13a to 13d cover a relatively large part of the respective side surface, the requirements for positioning accuracy are somewhat lower.

Figures 82A, 82B:
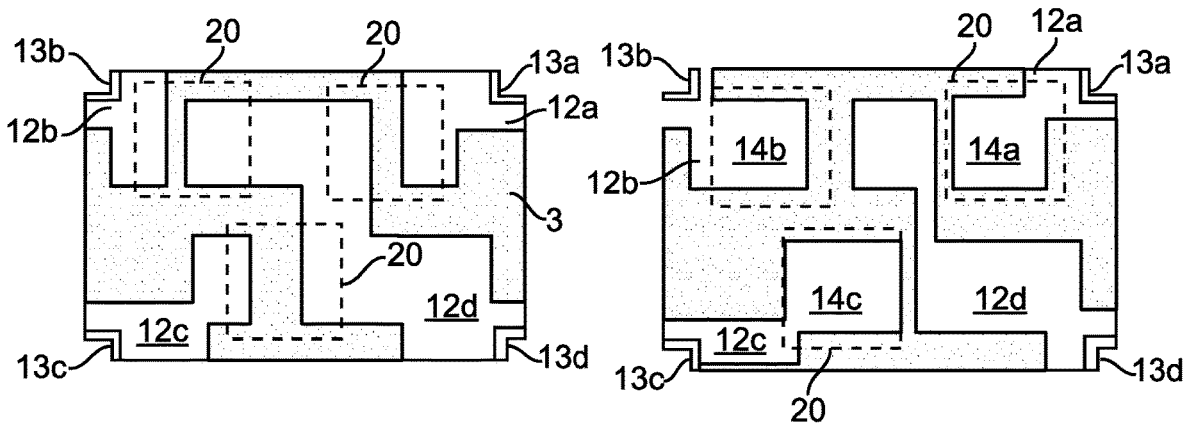
FIGS. 82A and 82B shows two top views with a schematic wiring diagram for a module based on the proposed principle.

FIG. 82A shows a top view of a module with three μ-LEDs of different colors with metal bars 12a to 12d on the surface of the module body for contacting three μ-LEDs. These form a subpixel of a pixel and are designed as SMT μ-LEDs. They have a contact pad on their underside on each side and thus form horizontal LEDs. Schematically, the μ-LEDs 20 are represented by the dotted line. Their contact pads are arranged laterally. For perfect contacting they are thus connected on one side to one of the contact bar 12a to 12c. In addition, a common contact is realized with the bar 12d and the metallization there. Each of the bars 12a to 12c leads into one of the corners and to a contact tab 13a to 13c along one corner.

FIG. 82B shows an alternative embodiment in which the μ-LED components 20 are vertical μ-LEDs with one contact pad on the bottom and another on the top. In this example, the contact pads 14a to 14c are larger and have essentially the same dimensions as the μ-LED. The latter is placed on the contact pad and electrically connected to it. Contact bars 12a to 12c also connect the respective corner tabs 13a to 13c with the contact pads. The fourth common contact bar 12d is wide and serves to contact the top side of the μ-LEDs 20 via a transparent electrically conductive material.

Figure 83:
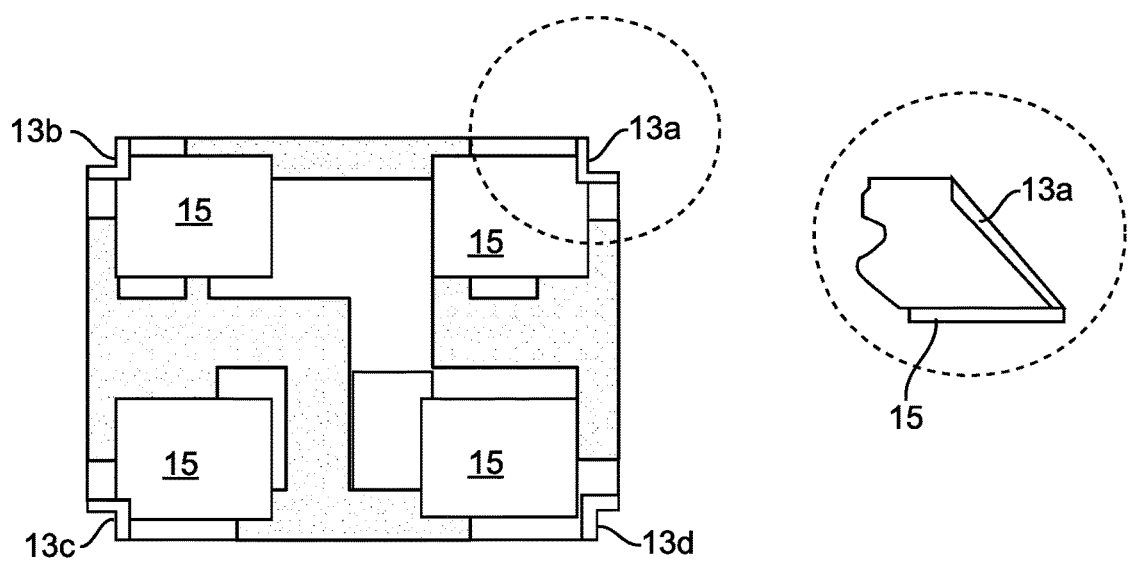
FIG. 83 shows a view of a bottom side of the above embodiments.

FIG. 83 shows the underside of the version according to FIG. 82A. Contact pads 15 on the underside are contacted by the contact tabs 13a to 13d on the side surface. These are designed to have a relatively large surface area. The cut-out also shows a side view. In one design, one of the contacts is larger than the other and forms the connection for the common contact lead 12d on the top side.

Figure 85A:
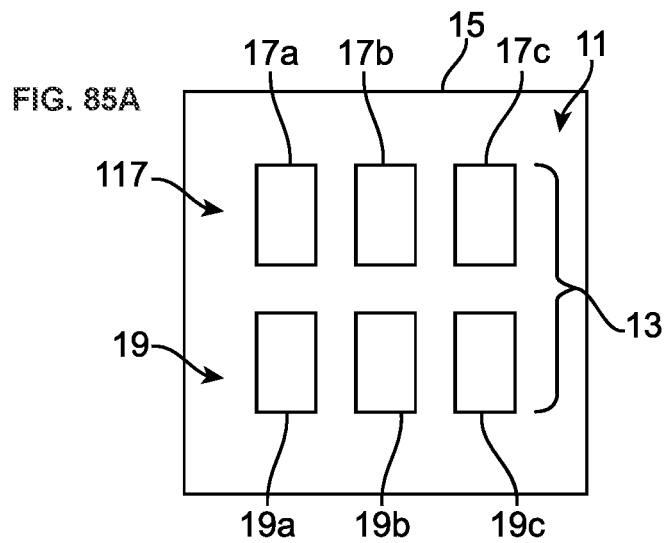
FIG. 85A is a top view of the contacts of a substrate in an unpopulated state provided for a pixel according to an aspect of the proposed concept.
Figure 85B:
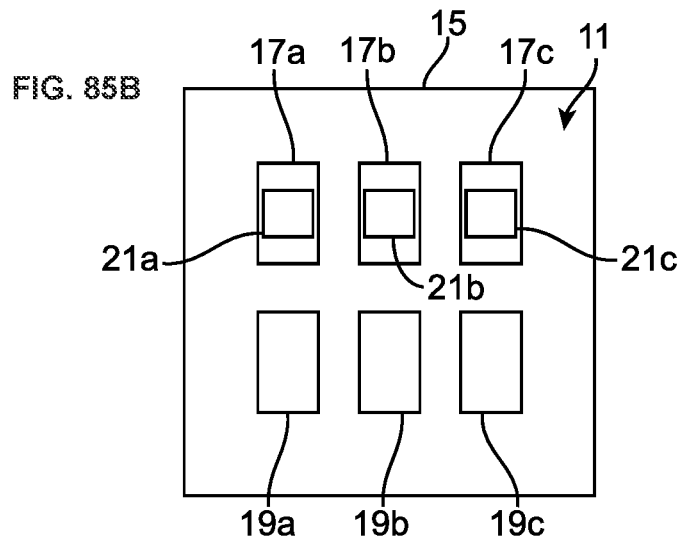
FIG. 85B shows a top view of the contacts of the substrate of FIG. 85A provided for the pixel after an initial assembly of µ-LEDs.
Figure 85C:
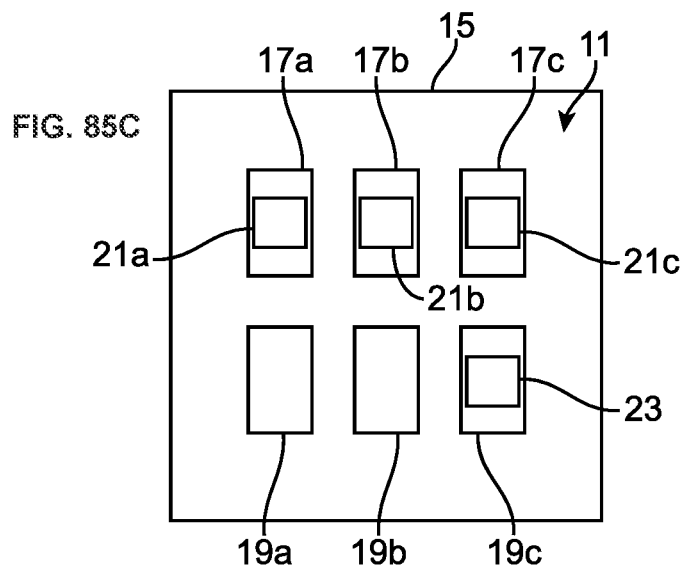
FIG. 85C shows a top view of the contacts of the substrate of FIG. 85A provided for the pixel after a second assembly of µ-LEDs.

In addition to the production of a monolithic display, some applications and designs also involve the transfer and attachment of μ-LEDs to a carrier substrate and contact areas there. In order to reduce the error rate during a transfer and the following process steps, the following propose examples and designs show for a pixel array with redundant μ-LEDs
positions. Those can assembled with components if needed. The FIGS. 85A to 85C show a top view of the contacts 13 provided for one pixel 11 on a substrate 15. The substrate 15 comprise several such contacts 13 for further pixels, which are arranged in field or array fashion. After an assembly with subpixels, as shown below, a pixel field or pixel array results, which can be arranged in a display, for example.

The contacts 13 can be divided into a set 17 of primary contacts 17a, 17b and 17c and a set 19 of replacement contacts 19a, 19b and 19c. Each of the contacts 13 can be equipped with a subpixel, for example a μ-LED. FIG. 85A shows the unpopulated state.

In a first assembly step the pixels 11 of the substrate 15 are assembled in such a way that for each pixel 11 the primary contacts 17a-17c are assembled with one subpixel 21a, 21b, 21c each, while the spare contacts 19a, 19b, 19c remain free. The subpixel 21a can be a μ-LED, for example, which can emit light in the red spectral range. The subpixel 21b, for example, can be a μ-LED that can emit light in the green spectral range. The subpixel 21c, for example, can be a μ-LED that can emit light in the blue spectral range. Pixel 11 thus has a set of RGB subpixels 21a-21c after the first assembly, as FIG. 85B shows.

After the first placement, the subpixels 21a-21c can be checked for errors. For example, subpixel 21c can be identified as faulty.

In a second assembly step, the replacement sub-pixel 19c can be equipped with a replacement sub-pixel 23, which can be a μ-LED emitting in the blue spectral range. The replacement subpixel 23 thus replaces the faulty subpixel 21c, which can be left on the primary contact 17c.

In the case of substrate 15 as shown in FIGS. 85A to 85C, each pixel 11 has a respective, assigned replacement contact 19a-19c for each primary contact 17a, 17b, 17c. The substrate 15 thus allows each sub-pixel 21a-21c on a primary contact 17a-17c to be replaced by a substitute sub-pixel on a substitute contact 19a-19c.

Figure 86A:
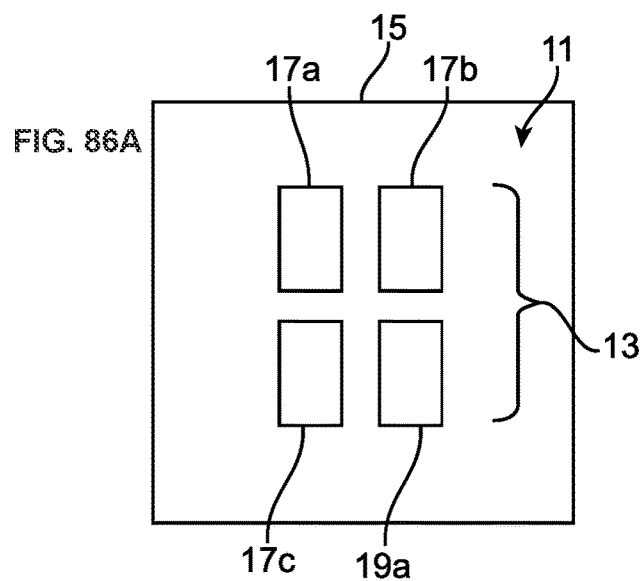
FIG. 86A illustrates a top view of the contacts of another substrate in an unpopulated state, provided for one pixel.
Figure 86B:
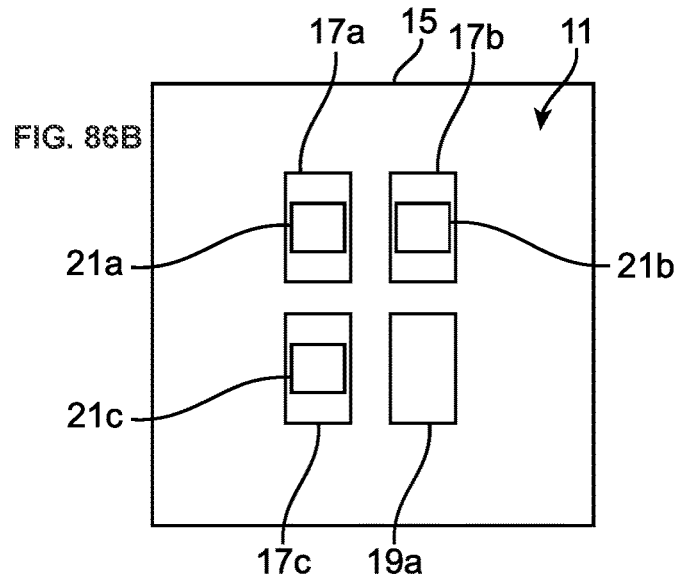
FIG. 86B is a top view of the contacts of the substrate of FIG. 86A provided for the pixel after an initial placement.
Figure 86C:
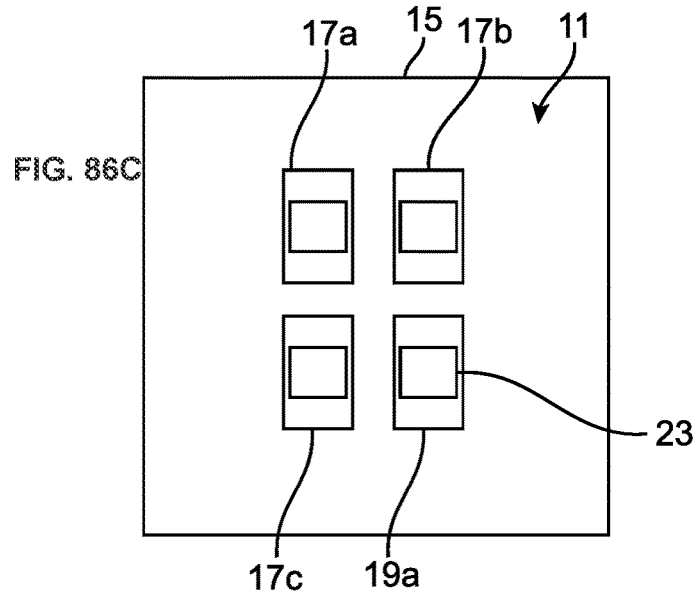
FIG. 86C shows a top view of the contacts of the substrate of FIG. 86A provided for the pixel after a second placement.

In contrast, as shown in FIGS. 86A to 86C, the substrate 15 comprises three primary contacts 17a, 17b and 17c per pixel 11 and only one replacement contact 19a, which makes it possible to replace a faulty subpixel on one of the primary contacts 17a to 17c. Additional circuitry measures shall be provided to ensure that the pixel with its subpixel on the secondary contact is addressed in the correct color.

FIG. 86A again shows a top view of the contacts 13 for a pixel 11 in unpopulated condition. As FIG. 86B shows, after a first assembly step, the primary contacts 17a-c are equipped with subpixels 21a-21c, which in turn can be μ-LEDs for the primary colors red, green and blue.

In a subsequent step, for example, subpixel 21a can be identified as faulty. As a replacement for this faulty subpixel, a replacement subpixel 23 can be placed on the replacement contact 19a as shown in FIG. 86C, which emits light of the same color as subpixel 21a if it were faultless.

Figure 87A:
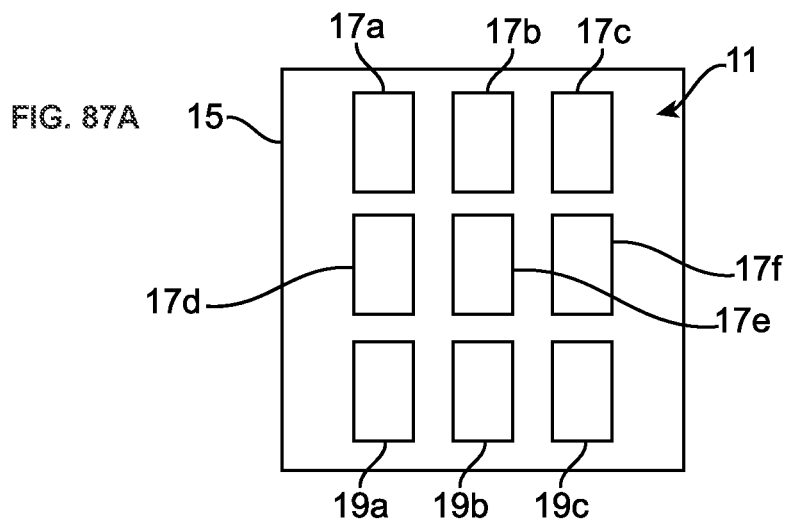
FIG. 87A shows a top view of the contacts provided for one pixel of yet another substrate in an unpopulated state to illustrate further aspects of the proposed concept.
Figure 87B:
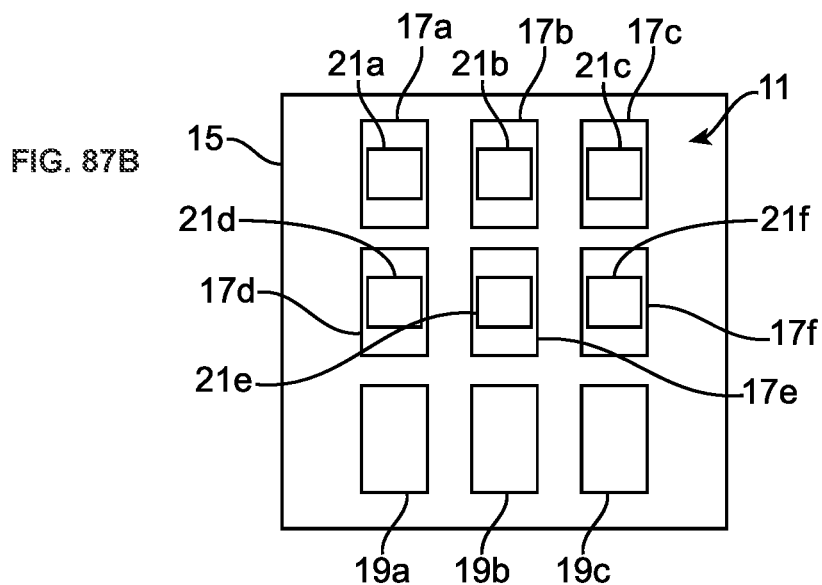
FIG. 87B shows a top view of the contacts of the substrate of FIG. 82A provided for the pixel after an initial placement.
Figure 87C:
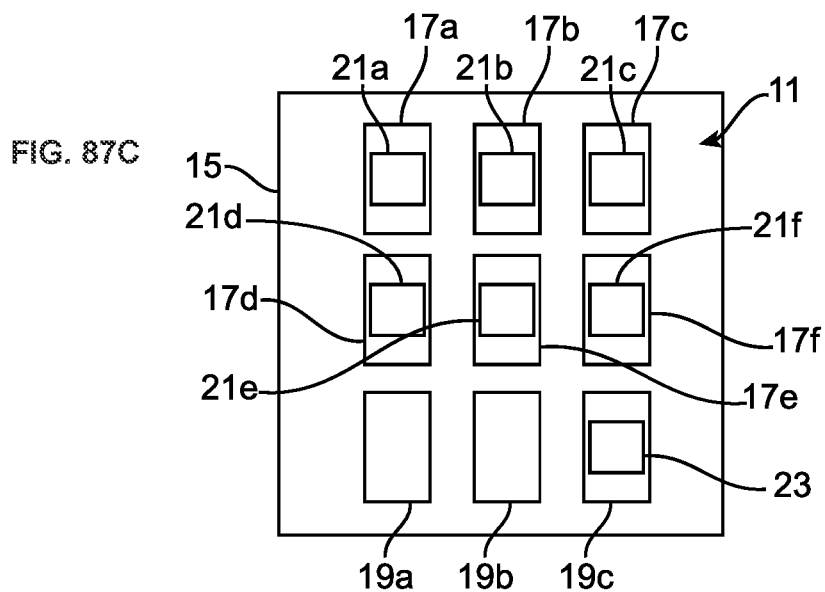
FIG. 87C is a top view of the contacts of the substrate of FIG. 82A provided for the pixel after a second placement.

FIGS. 87A to 87C show a respective top view of a substrate 15, in which a set of primary contacts is provided for a respective pixel 11, comprising six primary contacts 17a, 17b, 17c, 17d, 17e and 17f. In addition, the substrate 15 comprise three spare contacts 19a, 19b, 19c for a respective pixel 11. FIG. 87A shows the primary and replacement contacts in an unpopulated state.

In a first assembly step as shown in FIG. 87B, the primary contacts 17a-17f are assembled with respective subpixels 21a-21f. Two subpixels of each primary color red, green and blue can be provided. This provides double redundancy for each of the primary colors red, green and blue. In addition, the provision of 2 subpixels per color allows a more precise gradation of brightness and thus an improved brightness resolution. Despite the redundancy, subpixels 21a-21f can be checked for errors. For example, if it turns out that both subpixels 21c and subpixels 21f, which emit light of the same color, are faulty, a replacement subpixel 23 can be provided on the replacement contact 19c to replace the two faulty subpixels 21c and 21f.

The primary contacts 17a-17f as well as the spare contacts 19a-19c can be used for the electrical contacting of the subpixels 21a-21f, 23 arranged on them. The subpixels can be μ-LEDs in particular, as explained above.

The described manufacturing method is particularly suitable for the production of pixel fields for μ-displays, which use μ-LEDs as subpixels with horizontal flip-chip design. In this design, p- and n-contact are located on the bottom side of each μ-LED. This allows an electro-optical characterization of the individual μ-LEDs before further process steps prevent the substrate 15 from being refilled. The described manufacturing process is also advantageous for pixel arrays with vertical μ-LED chips. Depending on the test method used to find defective subpixels, the redundant replacement contacts 19a-19c can be re-equipped in different steps of the manufacturing process. Attention should be paid to a further processing option for the electrical contacting of the replenished replacement contacts 19a-19c or the replacement subpixels 23.

With regard to the electrical connection of the primary contacts 17a-17f and the replacement contacts 19a-19c there are different approaches. For example, with reference to FIG. 87, the redundant contacts 21a and 21d or 21b and 21e or 21c and 21f can be integrated into the same respective subpixel circuit. The redundancy can thus only refer to the primary contacts for the subpixels, but not necessarily to a circuit for controlling the subpixels.

The spare contacts 19a-19c can be wired in such a way that they can be controlled after an assembly instead of a subpixel identified as faulty.

The primary and replacement contacts assigned to each other can also be connected in parallel, whereby a supply line to a primary contact is disconnected if the sub-pixel arranged on it proves to be faulty and the replacement contact is equipped with a replacement sub-pixel.

As can be seen with reference to FIGS. 86A to 86C, at least one spare contact 19a may also be provided as a redundant placement facility for the sub-pixels on primary contacts 17a-17c, the spare contact 19a allowing for a placement of a spare subpixel regardless of the color of the emitted light. This redundant spare contact 19a can be connected like a fourth subpixel. A programming of the control of the replacement contact should be adapted to the population of the replacement contact 19a depending on the color of the subpixel identified as defective on one of the primary contacts 17a-17c.

In the following, some concepts for measures to improve a transfer in the form of an improved mass transfer printing process are presented. Background of the process is a transport of μ-LEDs of a wafer onto a carrier surface of a display. There, the individual μ-LEDs are fixed and attached and electrically connected. On the one hand, the dimensions of the individual μ-LEDs are in the range of only a few [μm]n, on the other hand a large number of these μ-LEDs have to be transferred locally at the same time. Often several million of such microstructures have to be transferred from a large number of wafers to a common carrier surface.

Figure 27A:
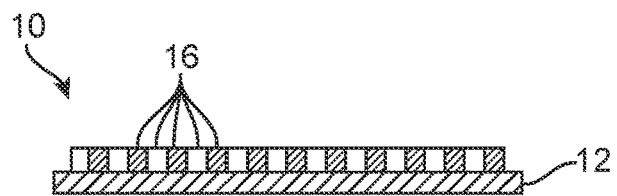
FIGS. 27A to 27D show the schematic sequence of a mass transfer printing process for a large number of μ-LEDs on a wafer.

In the example shown here in FIG. 27A, a wafer 12 is initially planned on which epitaxial layers have been created by various semiconductor manufacturing processes, from which the individual μ-LEDs 16 are then formed. In some aspects, the μ-LEDs can emit different colors and wavelengths during operation. This is indicated here by the different shades. The μ-LEDs are flat at least on their underside and/or top surface to allow for easy mounting and transport, for example. As part of the manufacturing process, the μ-LEDs 16 can be mechanically separated from wafer 12. This is done by removing a so-called sacrificial layer (see for example FIGS. 24A to 24D as well as 22J, 23J and 25J), if necessary supplemented by one or more release layers.

Figure 27B:
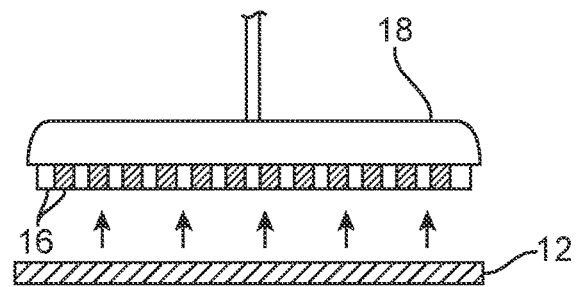

FIG. 27B shows how an elastomer stamp 18 is moved vertically from above towards the wafer 12 and adheres to a surface of the μ-LEDs 16 by means of a suitable surface structure of the elastomer stamp 18. For example, a maximum tensile force can be proportional to a size of the surface of the μ-LED 16. Adhesion can be created by silicone materials, for example, especially by so-called PDMS elastomers. Due to the separation of the μ-LEDs 16 from wafer 12, the μ-LEDs in their plurality can be lifted off wafer 12 together, whereby they adhere to the elastomer stamp 18. This elastomer stamp 18 is now moved in a transfer movement away from wafer 12 to a carrier surface 14 of a display mounted next to it, for example. This can be done, for example, with the aid of a transfer tool, whereby the elastomer stamp 18 can be regarded as part of such a tool.

Figure 27C:
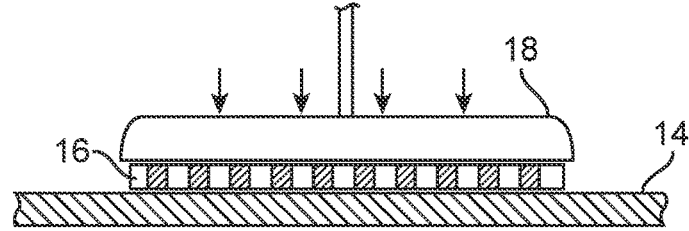
Figure 27D:
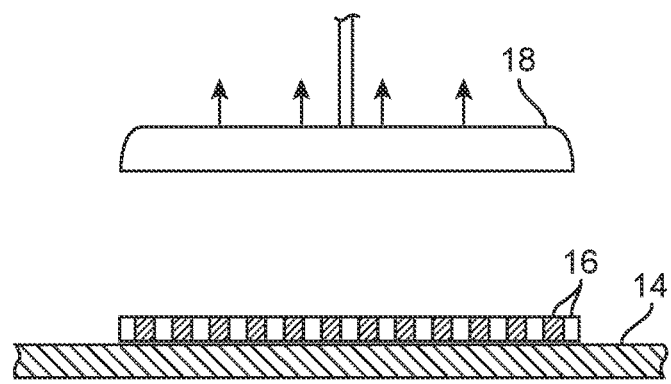

In FIG. 27C, the elastomer punch 18 is now initially located above the carrier surface 14 and is lowered onto a surface of the carrier surface 14 in a lowering movement. In this process, the underside of the μ-LEDs 16 comes into mechanical contact with the carrier surface 14. In a subsequent step, as shown in FIG. 27D, the μ-LEDs 16 are detached from the elastomer stamp 18. The elastomer stamp 18 is then moved upwards, for example to start a new transfer cycle. The μ-LEDs 16 can, for example, be permanently attached to the carrier surface 14 by an adhesive process.

The steps shown in FIGS. 27A to 27D indicate that due to the high number of μ-LEDs 16, reliable and accurate placement in the shortest possible time is desirable. Especially when the μ-LEDs 16 are picked up by the stamp 18, it may be desirable to keep the occurring forces low on the one hand and to achieve a reliable positioning and holding of the μ-LEDs 16 on wafer 12 on the other hand. In particular, avoiding fluctuations in the adhesive force or excessive adhesive forces on the wafer and/or on the stamp can bring about significant improvements here.

FIGS. 22A to 22J show a first example of a process for manufacturing a μ-LED with a μ-LED supporting holding structure. The manufacturing process of the μ-LED is simplified. It should be noted in this context that the process can be supplemented and extended with the measures disclosed here.

Figure 22A:
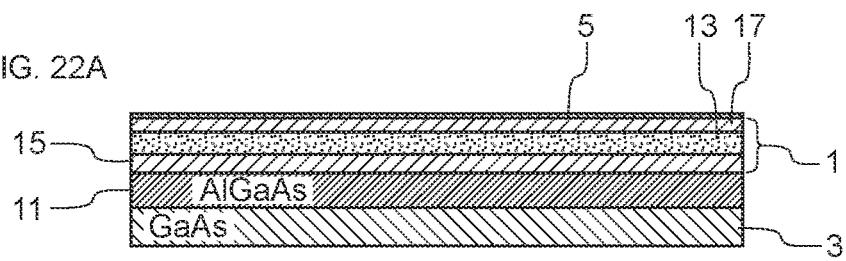
FIGS. 22A to 22J show a first embodiment of a process for manufacturing a µ-LED with a holding structure according to some aspects of the presented concept.

FIG. 22A shows a step in which a sacrificial AlGaAs sacrificial layer is first applied to a substrate 3, which here shows GaAs. A functional layer stack 1 is then epitaxially grown on this sacrificial layer stack, which thus has at least one quantum well or another optically active structure 13. In addition, the layer stack comprises two layers 15 and 17, which are doped differently. The n-doped semiconductor layer 15 is here attached to the sacrificial layer 11. A first electrically conductive contact layer 5 is then deposited on a side of the functional layer stack 1 facing away from the substrate 3. This may, for example, contain ITO (indium tin oxide).

Figure 22B:
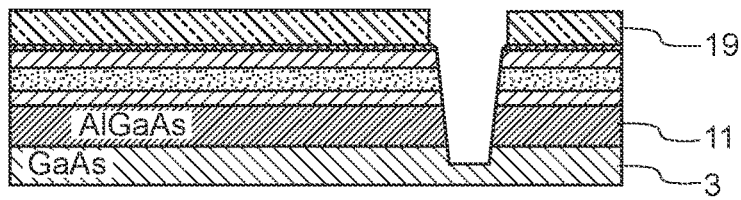

FIG. 22B shows a step in which a first lithographic processing is carried out on the main surface side of the functional layer stack 1 on the first electrically conductive contact layer 5, which is turned away from the substrate 3. In particular, a first masking layer 19 is applied to the first electrically conductive contact layer 5, whereby an area of the first electrically conductive contact layer 5 remains uncovered by the first masking layer 19 in order to create a holding structure 9. From this side of the layer sequence, the first electrically conductive contact layer 5, the functional layer stack 1, the sacrificial layer 11 and a part of the substrate 3 can then be etched out in the uncovered area so that the recess shown in cross-section is formed. The sidewalls are very steep or fall down essentially vertically.

Figure 22C:
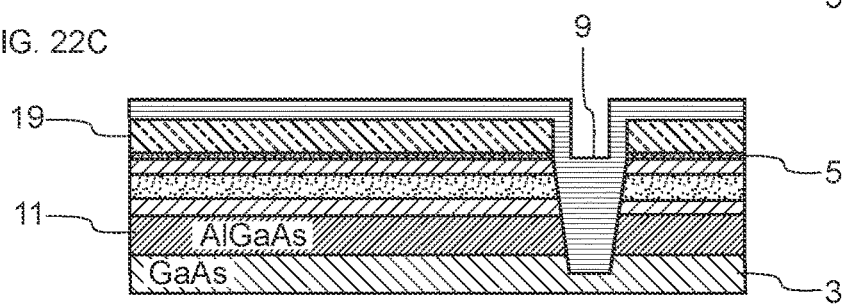

FIG. 22C shows a step in which a support structure 9 is formed in the etched out area of the layer sequence. This is done by depositing material from a gas phase, which extends over the masking 19 and fills the trench until a small recess remains in the material of the web 9 at the level of the masking layer. The recess can be production-related and optionally omitted, for example by applying material until the recess is completely filled. A too thick layer of material on masking 9 can be thinned again by CMP or other methods.

Figure 22D:
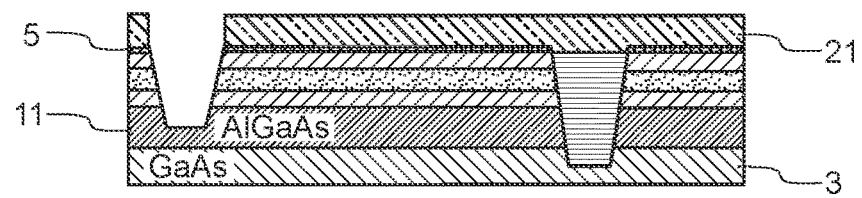

FIG. 22D shows another aspect after the material on masking layer 19 and layer 9 itself has been removed. A second photomask 21 is then applied and patterned in a second area to provide access to the sacrificial layer. The area between the holding structure and the patterning forms the μ-LED. After patterning, etching is again carried out through layers 5 and 1 to the sacrificial layer 11. This results in the structure shown in FIG. 22J. Here the etching process can form a trench or similar to define the dimensions of the μ-LED.

Figure 22E:
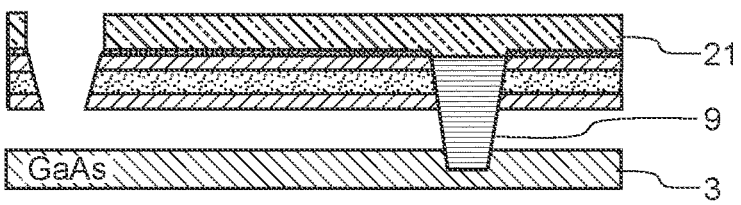
Figure 22F:
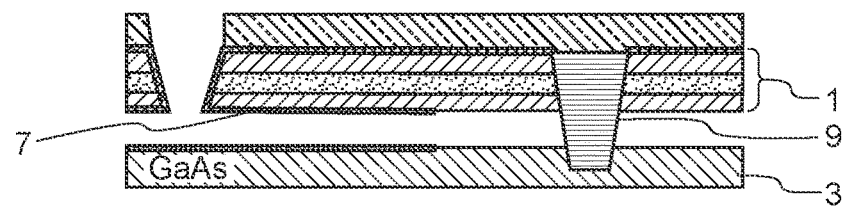

FIG. 22E shows the structure after the etching process, in which the sacrificial layer 11 is removed from the layer sequence, especially by wet chemical etching. The functional layer stack 1 is then supported by the holding structure 9, which is attached to the substrate 3. In a final step, a second electrically conductive contact layer 7 is attached to the functional layer stack 1 on the side of the functional layer stack 1 facing the substrate 3 in the area of the removed sacrificial layer 11. The material of the second electrically conductive contact layer 7 may contain ITO (indium tin oxide). In the area where the sacrificial material has been etched away, the second electrically conductive contact layer 7 can be applied by sputtering, see FIG. 22F. In this way, the space between the substrate 3 and the functional layer stack 1 can be accessed. In addition, when the second electrically conductive contact layer 7 is applied, flanks of the functional layer stack 1 and an area of the exposed area of substrate 3 can be covered. It is also possible to deposition from the gas phase, electroplating or other techniques.

Figure 22G:
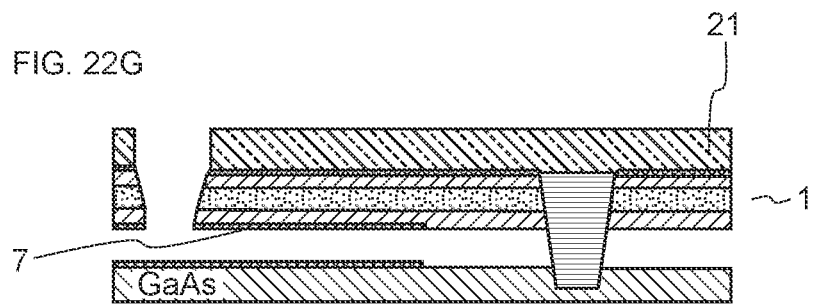
Figure 22H:
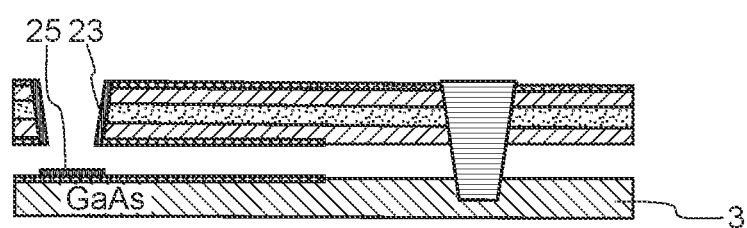
Figure 22I:
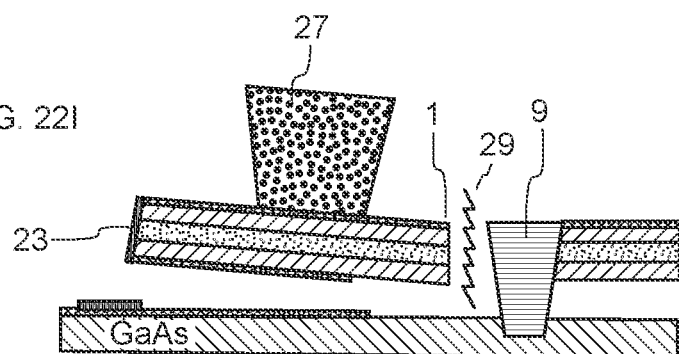
Figure 22J:
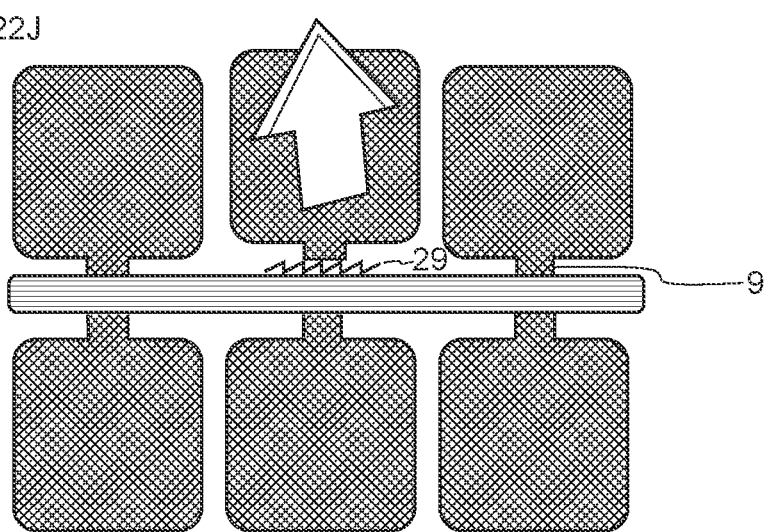

After finishing the contacts 7 on the underside of the structure, the electrically conductive material is removed again on the flank and especially in the area of the trench. The structure thus produced is shown in FIG. 22G. FIG. 22H shows a step in which the flanks of the functional layer stack 1 that are free of electrically conductive material are covered by a passivation layer 23. This is optional. The second masking layer 21 has also been removed. A further passivation layer 25 can also be created on the substrate 3 covered with electrically conductive material of the second electrically conductive contact layer 7.

The structure shown in this way can now be broken away from the holding structure using the stamp described above or another transfer tool. The flanks of layer stack 1 are also covered by a passivation layer 23. FIG. 22J again shows the step of breaking off the μ-LED thus produced as a top view. The large arrow is intended to show the break-off from a holding structure 9 and the jagged area is intended to represent a break point 29.

Figure 23A:
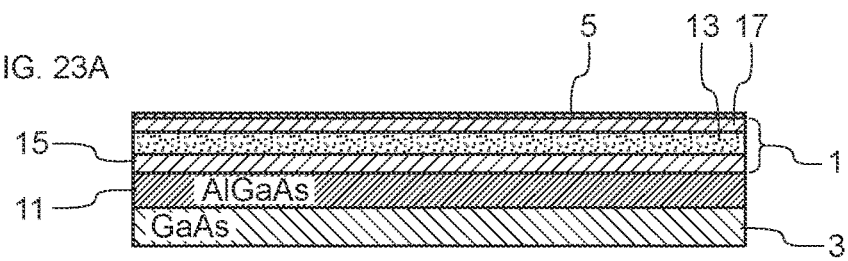
FIGS. 23A to 23J show a second embodiment of a process for manufacturing a μ-LED with a holding structure according to some aspects of the presented concept.
Figure 23B:
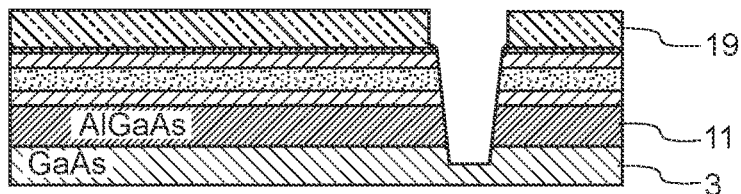
Figure 23C:
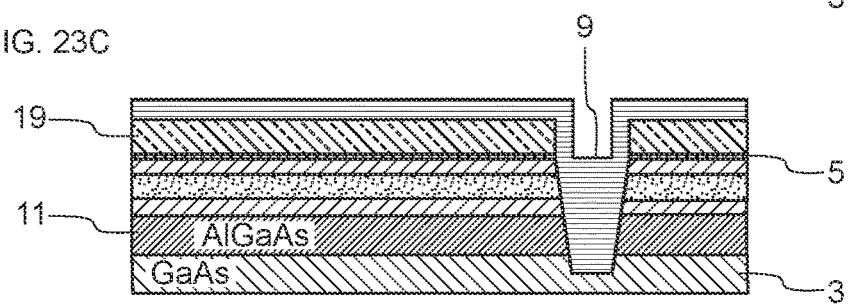
Figure 23D:
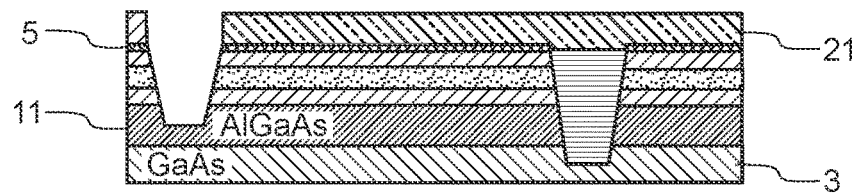
Figure 23E:
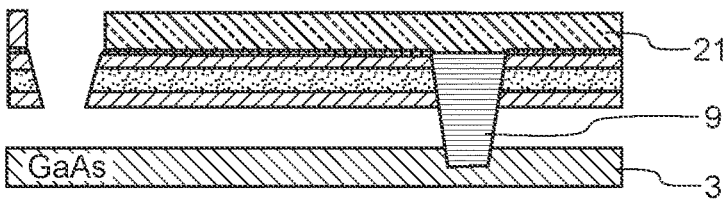
Figure 23F:
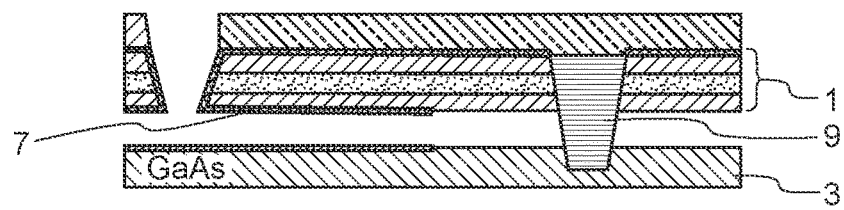
Figure 23G:
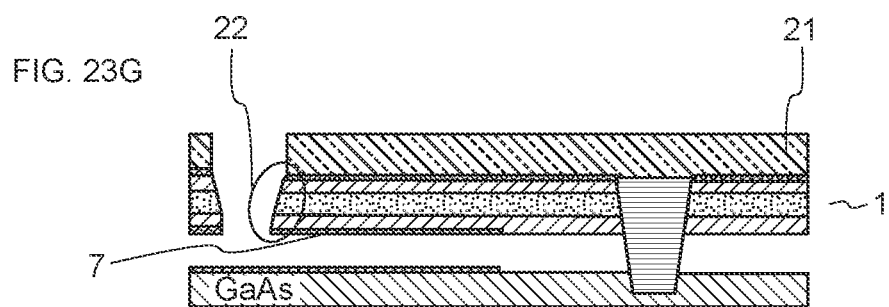
Figure 23H:
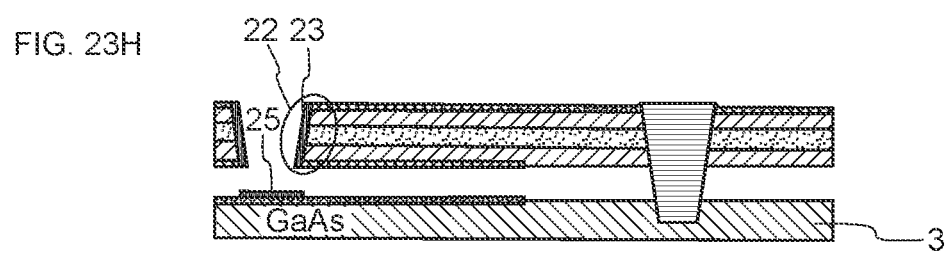
Figure 23I:
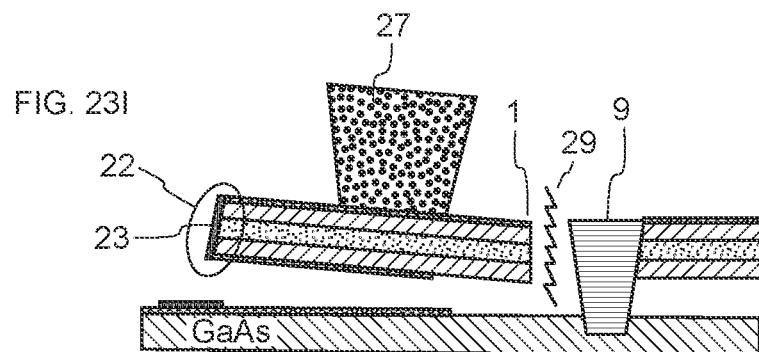
Figure 23J:
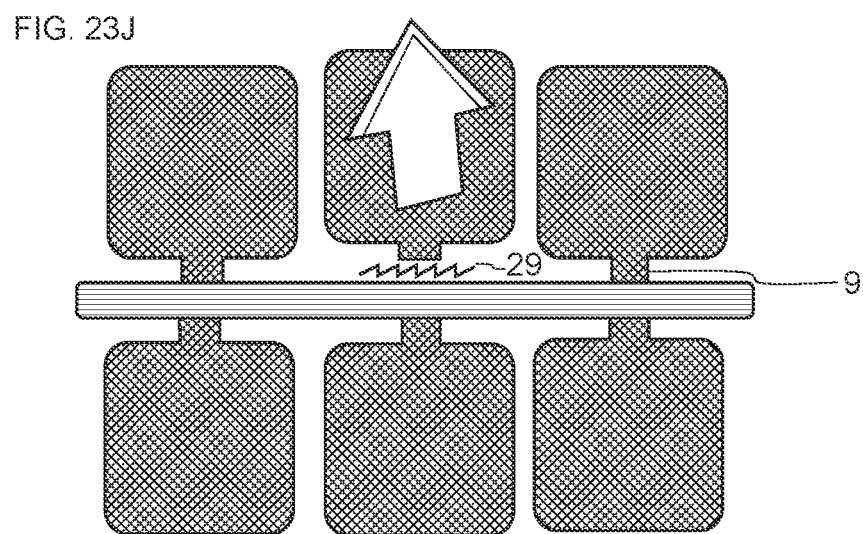

A further example is shown in FIGS. 23A to 23J. FIGS. 23A to 23F show steps identical to those in FIGS. 22A to 22F. In contrast to the steps shown in FIG. 22G, FIG. 23G involves removing the electrically conductive material deposited on the flanks of the functional layer stack 1. Then, before or instead of passivation, a metal is deposited on the flanks and diffused. This material can be Zn in particular. It diffuses into the edge area of the layer stack and produces a change in the band structure there, so that charge carriers are kept away from this area of high defect density. Accordingly, the non-radiative recombination of charge carriers in the functional layer stack is reduced in this way. This is followed by the same steps as in FIGS. 22H to 22J as shown in FIGS. 23H to 23J.

FIGS. 24A to 24I show a third embodiment of a proposed process for manufacturing a μ-LED with a holding structure.

Figure 24A:
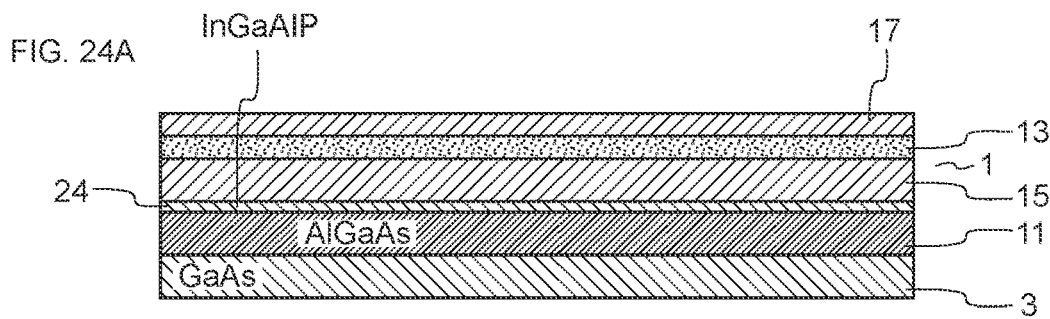
FIGS. 24A to 24I represent a third embodiment of a process for manufacturing a μ-LED with a holding structure according to some aspects of the concept presented.

FIG. 24A shows a step in which a functional layer stack 1 was epitaxially deposited on a GaAs substrate 3 over a sacrificial layer 11 of AlGaAs. Between the functional layer stack 1 and the sacrificial layer 11, a second supporting layer 24 is also epitaxially formed, which contains, for example, InGaAlP and is relatively thin compared to the sacrificial layer 11. Similar to the previous explanations, the doped semiconductor layer of layer stack 1, which is adjacent to layer 24 and the sacrificial layer, is n-doped. The second semiconductor layer 17 is p-doped.

A first electrically conductive contact layer 5 not shown here is subsequently applied to a side of the functional layer stack 1 remote from the substrate 3, especially the main surface side. This can then have ITO (indium tin oxide), for example.

Figure 24B:
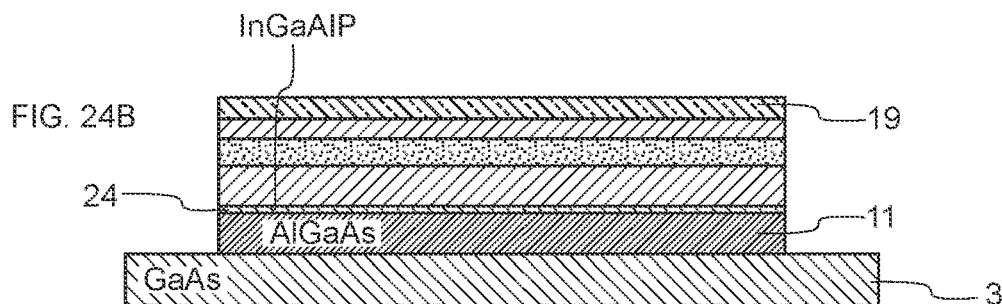

FIG. 24B shows a step in which a first lithographic processing is carried out on the main surface side of a functional layer stack 1 that faces away from a substrate 3.

For this purpose, a first masking layer 19 is applied to the second semiconductor layer 17 of the functional layer stack 1, whereby, for the creation of a holding structure 9, outer edge regions of the functional layer stack 1 remain uncovered by the first masking layer 19. From this side of the layer sequence, the functional layer stack 1, the second supporting layer 24 and the sacrificial layer 11 can be removed, in particular etched away by means of ICP (inductively coupled plasma etching), in these uncovered edge regions up to the substrate 3. Finally, the first masking layer 19, is removed again. The trench thus formed can extend around all sides of the body, thus forming one or more µ-LED structures separated by trenches.

Figure 24C:
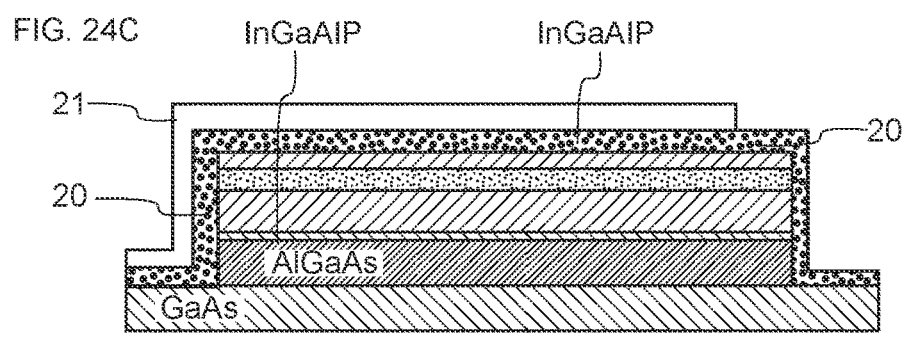

FIG. 24C represents a further step in the process, in which a first support layer 20 is formed on the substrate 3, on exposed edge areas of the layer sequence and on a main surface of the µ-LED 1 facing away from the substrate 3 to provide a support structure 9. The material of the support layer 20, which is deposited from a gas phase and epitaxially grown, for example, has InGaAlP. The support layer 20 envelops the layer sequence at least on one side up to substrate 3, it thus extends from the second main surface side over at least one side flank to substrate. Finally, a second masking layer 21 is applied to the main surface of the first support layer 20 facing away from substrate 3. An outer edge region of the layer sequence remains uncovered by the second masking layer 21.

Figure 24D:
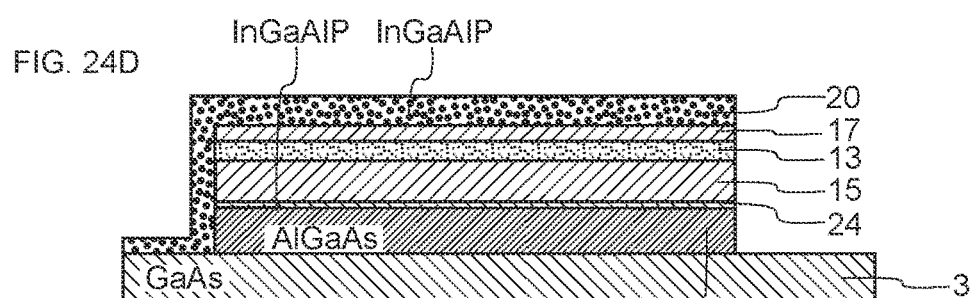

FIG. 24D shows a step in which an outer edge region uncovered by the second masking layer 21 of the layer stack 1, the second support layer 24 and the sacrificial layer 11 up to the substrate 3 has been removed, in particular by etching. In this way, an access to the sacrificial layer 11 will be formed from this side of the layer sequence. The areas covered by the second masking layer 21 remain intact even after the second masking layer 21 has been removed in FIG. 24D.

Figure 24E:
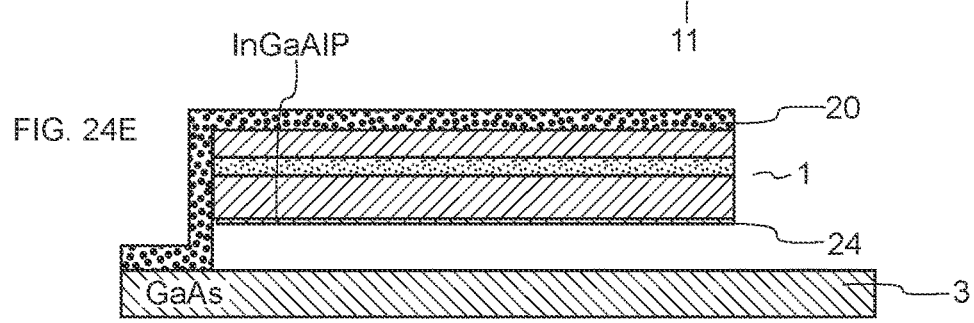

FIG. 24E shows a step in which the sacrificial layer 11 is removed from the layer sequence, in particular by wet chemical etching. The removal is performed from the outer edge of the layer sequence exposed in step 24D. The functional layer stack 1 is then supported by the first support layer 20 and the second support layer 24, the first support layer 20 being attached to the substrate 3. In this way, a support structure 9 is provided which supports the functional layer stack 1, without the sacrificial layer 11.

Figure 24F:
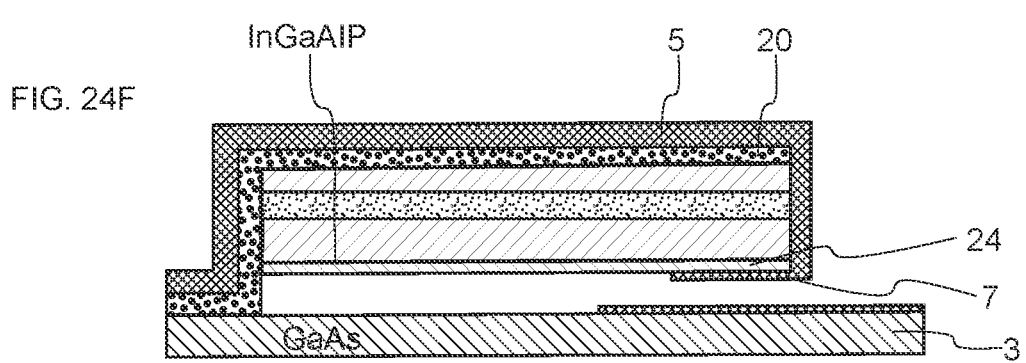

FIG. 24F shows the structure after which a first electrically conductive contact layer 5 and a second electrically conductive contact layer 7 are formed. An electrically conductive layer is formed, which is attached to the side facing away from the substrate 3 on the first supporting layer 20, which is attached to the functional layer stack 1 in a supporting and electrically conductive manner. The electrically conductive layer is also applied to the side of the functional layer stack 1 facing the substrate 3 in the area of the removed sacrificial layer 11 on the second supporting layer 24. The material of the electrically conductive layer may contain ITO (indium tin oxide). Especially in the area where the sacrificial layer 11 was etched away, the electrically conductive layer can be applied by sputtering. In this way, a space between the substrate 3 and the functional layer stack 1 is easily accessible. When the electrically conductive layer is applied, flanks of the functional layer stack 1 and at least part of the exposed area of substrate 3 can also be covered.

Figure 24G:
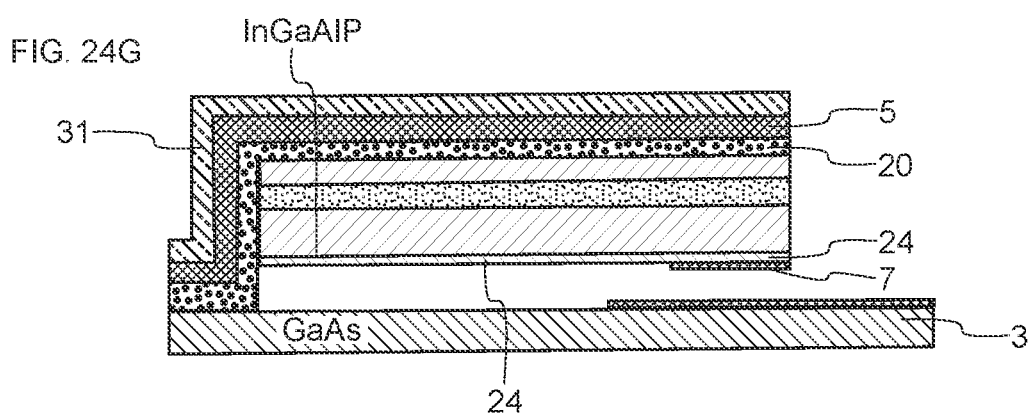

FIG. 24G shows a step in which the electrically conductive material deposited on the flanks of the functional layer stack 1 is at least partially removed, in particular etched away, in such a way that the first electrically conductive contact layer 5 on the side facing away from the substrate 3 is produced electrically separately from the second electrically conductive contact layer 7 on the side of the functional layer stack 1 facing the substrate 3. In this way, a contacted functional layer stack 1 is formed.

For this purpose, a third masking layer 31 is first applied to the first base layer 20. This third masking layer 31 leaves edges to the flanks of the functional layer stack uncovered. This third masking layer 31 covers edge areas of the first support layer 20 that are attached to the substrate 3. By means of removal, in particular by etching, firstly the first and second contact layers 5 and 7 are electrically separated from each other and the support layer 20 is mechanically reinforced by the first contact layer 5 in such a way that a retaining structure 9 is additionally mechanically reinforced.

Figure 24H:
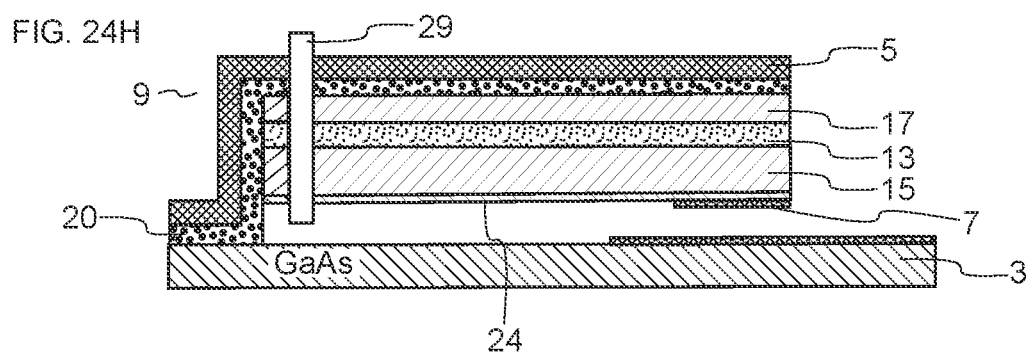
Figure 24I:
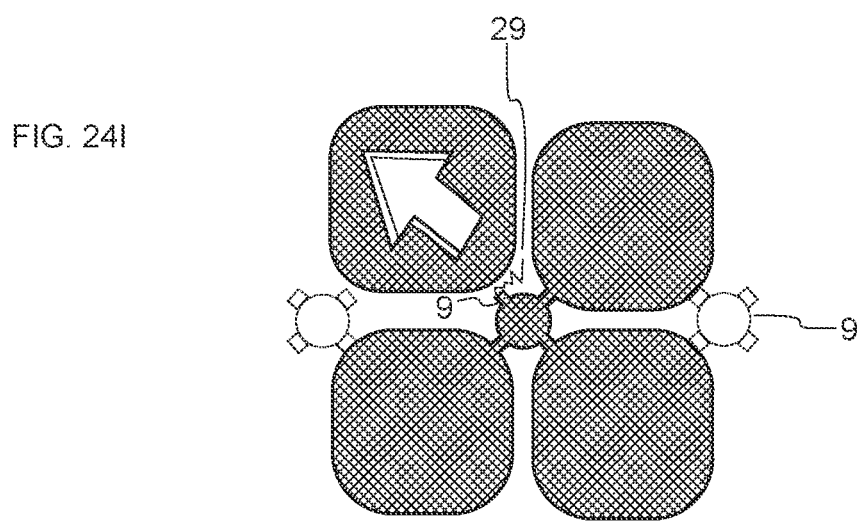

FIG. 24H shows a step where the third masking layer 31 has been removed. The functional layer stack 1 is attached to the substrate 3 by a retaining structure 9. For attachment, the first support layer 20, reinforced by the first electrically conductive contact layer 5, interacts with the functional layer stack 1, stabilized and protected by the second support layer 24. By means of a lifting head 27, the contacted—i.e. indirectly coated with the contact layers 5 and 7—functional layer stack 1 can be lifted off and thereby broken off from the holding structure 9. Reference mark 29 denotes a predetermined breaking point at which an electronic component or a contacted functional layer stack 1 can be detached from a substrate 3.

FIG. 24I again shows a step of breaking a layer stack 1, which has electrical contacts and provides at least one function, in contrast to the cross-sections in FIGS. 24A to 24H, this time as a top view. The large arrow is intended to show the breaking off of a retaining structure 9 and the jagged point is intended to represent a break point 29. A detachable electronic component, in particular a detachable micro-light-emitting diode, may be attached to several retaining structures 9, for example, in planar view, at rounded corners of the component.

FIGS. 25A to 25J show a fourth example of a proposed method. FIGS. 25A to 25D show steps similar to those in the previous example in FIG. 24.

In contrast to FIG. 24E, FIG. 25E shows a step in which only part of the sacrificial layer 11 is removed by wet chemical means. This exposes a part of layer 24 and the contact layer 7 is then applied. The removal is performed from the outer edge of the layer sequence exposed in step 141D. The functional layer stack 1 is then supported by the first support layer 20 and the second support layer 24, with the first support layer 20 attached to the substrate 3. In this way, a support structure 9 is provided to support the functional layer stack 1 without the complete sacrificial layer 11.

FIG. 25F shows a step in which a first electrically conductive contact layer 5 and a second electrically conductive contact layer 7 are formed on a sacrificial layer 11, which is only partially removed in FIG. 25E. In this process, an electrically conductive layer 5 is formed, which is attached to the side facing away from the substrate 3 on the first support layer 20, which is attached to the functional layer stack 1 in a supporting and electrically conductive manner. The electrically conductive layer also extends to the side of the functional layer stack 1 facing the substrate 3 in the area of the removed sacrificial layer 11. Especially in the area where the sacrificial layer 11 has been etched away, the electrically conductive layer can be applied by sputtering. In this way, a space between the substrate 3 and the functional layer stack 1 is easily accessible. When applying the electrically conductive layer, flanks of the functional layer stack 1 and the exposed area of the substrate 3 can also be covered with the electrically conductive material.

Figure 25G:
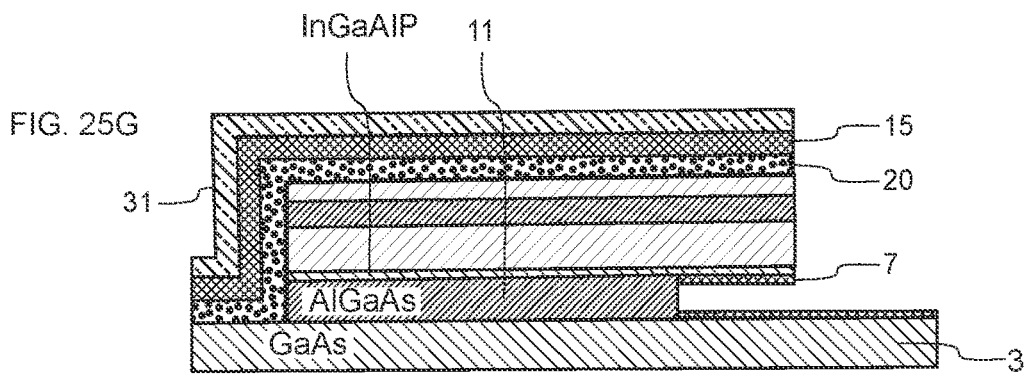
Figure 25H:
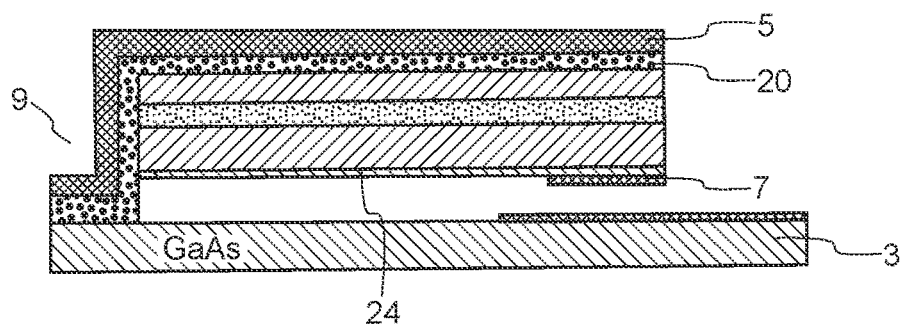
Figure 25I:
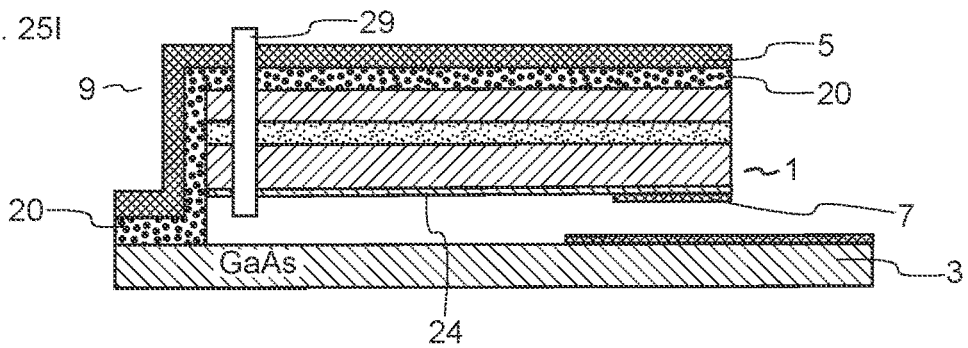
Figure 25J:
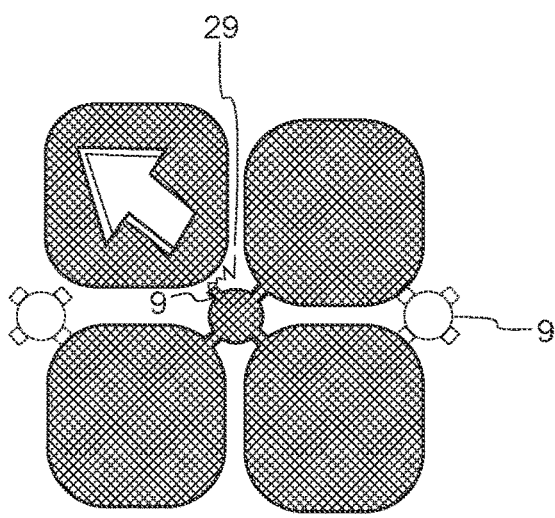

FIG. 25G shows a step in which the electrically conductive material deposited on the flanks of functional layer stack 1 is at least partially removed. The first electrically conductive contact layer 5 on the side facing away from the substrate 3 is thus electrically separated from the second electrically conductive contact layer 7 on the side of the functional layer stack 1 facing the substrate 3.

For this purpose, a third masking layer 31 is applied to the first base layer 20. This third masking layer 31 leaves edges to the flanks of the functional layer stack uncovered. This third masking layer 31 covers edge areas of the first support layer 20 that are attached to the substrate 3. By means of an etching process, the first and second contact layers 5 and 7 are electrically separated from each other. Independently of this, the first contact layer 5 mechanically reinforces the support layer 20. The remaining sacrificial layer 11 is retained during this step.

FIG. 24H shows the structure after removing the third masking layer 31 and the remaining sacrificial layer 11, both of which can be removed by various etching processes. The functional layer stack 1 is attached to the substrate 3 by a retaining structure 9. For attachment, the first support layer 20, reinforced by the first electrically conductive contact layer 5, interacts with the functional layer stack 1, stabilized and protected by the second support layer 24. FIG. 25I again shows the predetermined breaking point 29. FIG. 25J again shows a step of breaking a μ-LED 1 with electrical contacts as a top view. Depending on the design, a holding structure can hold several such μ-LEDs so that they can be lifted off together or one after the other by a transfer instrument.

In the last versions shown here, a breaking edge is formed. Although this is only very narrow, it can still lead to non-radiating recombination centers, so that the efficiency of the μ-LED is somewhat reduced. In addition, somewhat higher demands are placed on the transfer stamp or transfer technology.

Figure 26A:
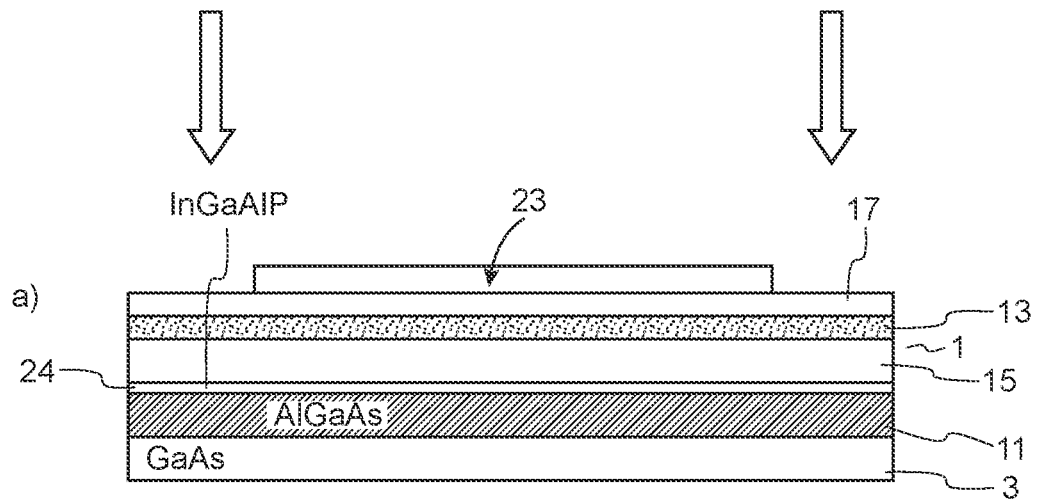
FIGS. 26A and 26B represent two additional steps that can be used in the various embodiment.
Figure 26B:
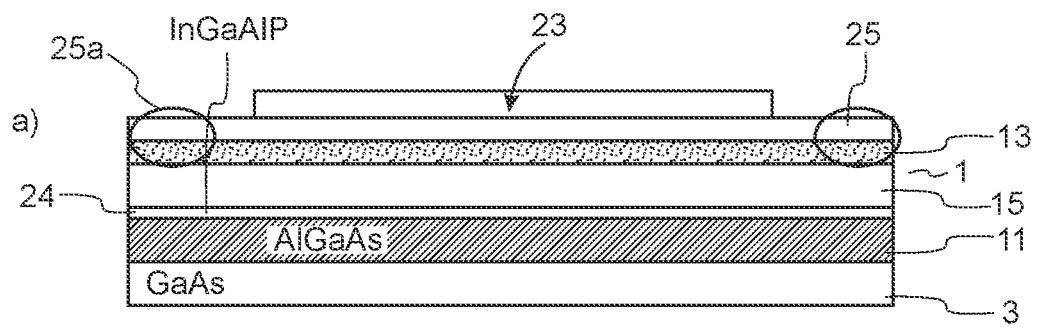

An aspect that leads to a further reduction of the influence of non-radiative recombination centers is shown in FIGS. 26A and 26B. As already mentioned, the fracture edge often generates recombination centers, which leads to an increase in non-radiative recombination in this area and thus reduces efficiency. After processing the semiconductor layer sequence, a photomask 23 is now applied and patterned so that the surface adjacent to the later edge regions is exposed. In contrast, photoresist remains over the area of the later active layer or the active region. Subsequently, a dopant, for example Zn, is deposited on the surface. In the next step, shown in FIG. 26B, a diffusion step is performed. The Zn diffuses through layer 17 and reaches the active region. With suitable process parameters, quantum well intermixing occurs, provided that the active region is formed by one or more quantum wells. Quantum well intermixing shows a strong change in the region of the mask edge as explained in this application, so that the course of the band gap is quite steep and resembles a band gap jump. The increased band gap thus occurs mainly in the edge region and also in the region 25*a*, where the breaking edge is later formed. The breaking edge is thus formed in an area of increased band gap, so that charge carriers are kept away from the defects caused by the edge during operation. After quantum well intermixing has been generated, the device can be further processed as described above.

Figure 28:
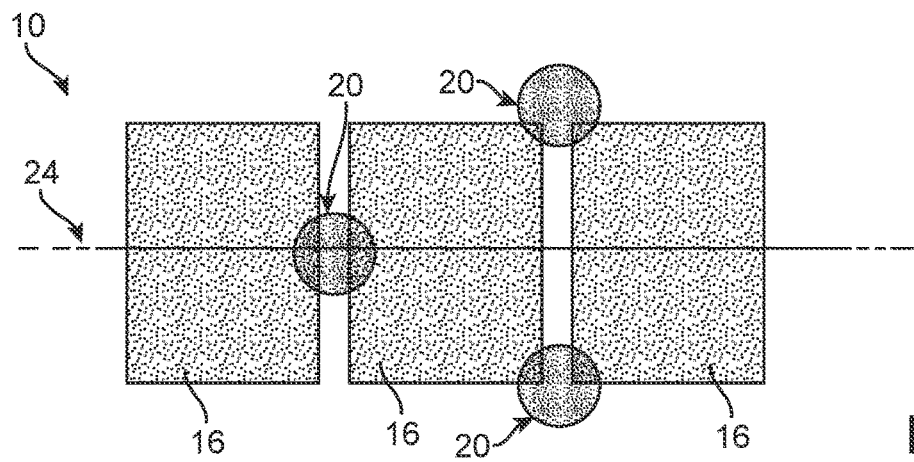
FIG. 28 shows a support structure according to the proposed principle in a top view with 3 mounting elements.

Referring back again to FIGS. 27 and 28, these show a further embodiment of a support structure 10 according to some suggested principles for avoidance of breakage edges and improved lift-off. In principle, the basic structure corresponds to the diagram in FIG. 27A. In particular, the wafer shown in FIGS. 27A and 27B comprises the wafer structure shown in the following, whereby FIG. 28 refers to a simplified top view of a wafer 12 from a top side. Three μ-LEDs 16 can be seen, which in this example are each flat rectangular and arranged next to each other. Other shapes of chips are possible for example hexagonal. On a wafer 12, a large number of such μ-LEDs 16 can be provided on a surface of 16 or 18 inches, for example, arranged side by side.

Prior to a transfer process, these μ-LEDs 16 are mechanically detachably arranged on wafer 12. This means that they can be removed by a stamping tool 18. In the example shown here, the μ-LEDs 16 are partially detached from wafer 12 on their underside (not visible) and are now held by holding elements 20. The mounting elements, which appear round here due to the top view, can be columnar or pole-like with, for example, a round, angular or elliptical cross-section, made from a carrier substrate 22 underneath. As shown, the μ-LED 16 shown here in the middle is held in position by a total of three mounting elements 20. The three support points in particular make it possible to achieve coplanarity, i.e. an arrangement that is stable from the point of view of the distribution of forces and is in the same plane as the other μ-LEDs 16. Two of the mounting elements 20 each hold two μ-LEDs 16 at their corners or edges.

In the following FIGS. 29A to 29D, a vertical sectional view (see line 24 in FIG. 28) is shown for various possibilities of designing a support structure 10. A wafer 12 or, in general, a carrier material or bonding material serves as the basis for mechanical stabilization and for accommodating other components such as electrical connections, electronic control elements and the like. A first release layer 26 is arranged vertically above it. The release layer 26 serves to enable controlled delamination, i.e. the deliberate and controlled separation of the layers from each other by means of a defined tensile force. Furthermore, such a layer can serve as an etch stop layer to leave adjacent layers unchanged during an etching process. This can, for example, replace a breakage process, as it has been used up to now in the state of the art, with a peeling process in which no disturbing residues remain on the μ-LED.

Figure 29A:
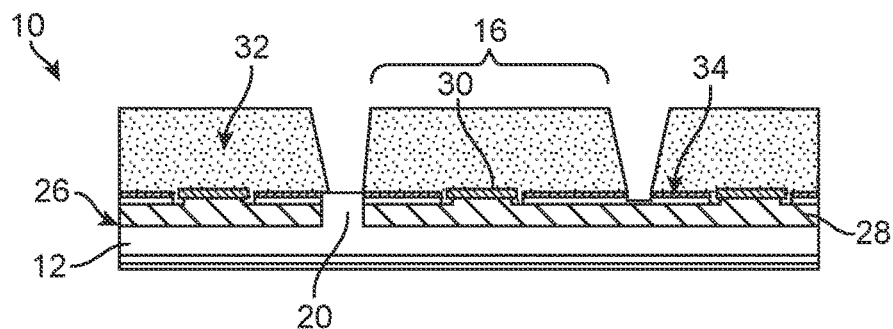
FIGS. 29A to 29E show a total of four vertical sectional views through a carrier structure for holding flat μ-LEDs suitable for the proposed transfer.
Figure 29B:
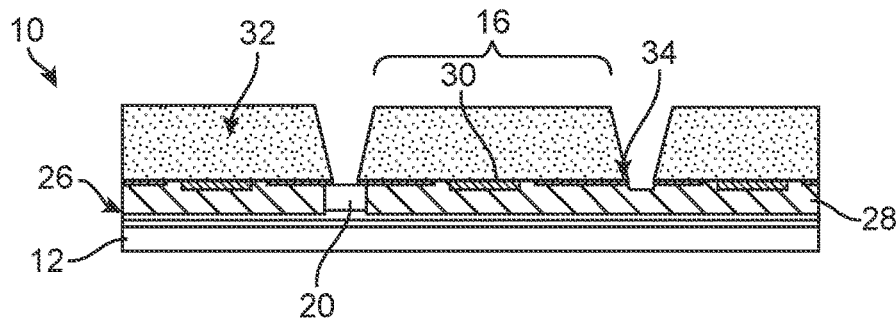

A sacrificial Layer 28 is also provided for. The background to this is that silicon, for example, is used as the material for such layers, which can then be removed in one process step by chemical processes, for example to separate the μ-LED 16 from the wafer 12 below it. The μ-LED 16 also has a contact pad 30, which can have a semiconductor active area such as a p-n junction. FIG. 29A and FIG. 29B show the cross-section of a μ-LED 16 with an epitaxial layer 32 as an example. This epitaxial layer 32 can also be supplemented by a second release layer 34, which is formed between the sacrificial layer 28 and the epitaxial layer 32. This second release layer 34 can be arranged at different locations depending on the design variant.

FIGS. 29A and 29B each show a design variant in which a receiving element 20 as a pole-like, columnar or post-like elevation from wafer 12 extends in one piece vertically between two μ-LEDs 16 through the sacrificial layer 28 and ends before the epitaxial layer 32. Here, the epitaxial layer 32 tapers tightly towards the top, thus forming a V-shaped mesa trench 38 (see FIGS. 30 and 31). While in FIG. 29A the second release layer 34 extends to a side or partial underside of contact pad 30, the second release layer 34 ends horizontally in front of contact pad 30 with sacrificial layer 28 filling the remaining gap. A gaseous or liquid etching substance can then reach the sacrificial layer 28 via the mesa trench 38, i.e. the space between two μ-LEDs 16.

In FIG. 29B, the delamination layer on the exposed surface of the receiving element is also removed by the etching process. By controlling the etching process, the removal of the delamination layer can be selectively adjusted. For example, the delamination layer may have a significantly lower etch rate than the sacrificial layer 28 with respect to the etching process used. This ensures complete removal of the sacrificial layer without overly attacking the delamination layer or the carrier substrate by the etching process. In an alternative embodiment, which is not shown here, the etching process is also used to etch through the delamination layer and into the carrier substrate. In other words, the funnel-shaped recess between the two μ-LEDs is continued in the receiving element. This results in a V- or U-shaped recess for the receiving element, leaving two columns on which the μ-LEDs are placed. The depth of such an etch in the receiving element can also be set by the process. In general, however, not the entire receiving element is etched through. Rather, the receiving element is etched only up to half of its height or less, so that sufficient stability of the receiving elements is ensured. In particular, it is ensured that the remaining columns do not break when the μ-LEDs are removed, but that the μ-LED is lifted off by overcoming the adhesive force of the delamination layer.

Figure 29C:
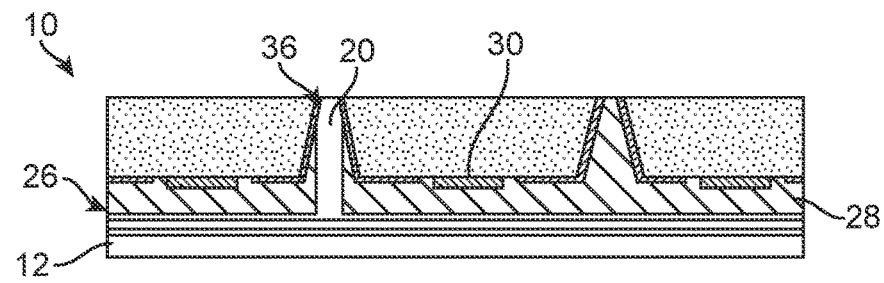
Figure 29D:
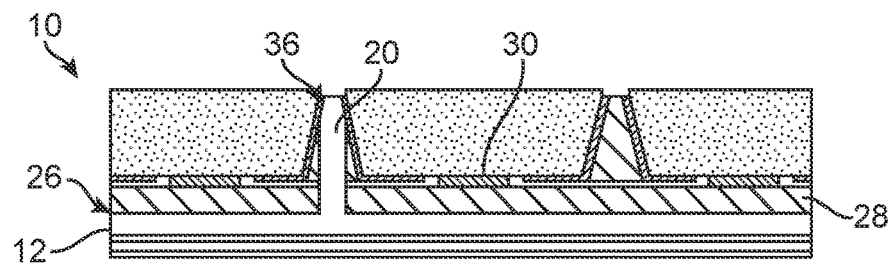

FIGS. 29C and 29D show a further embodiment, particularly with regard to the design of the mounting element 20. Here, the receiving element 20 protrudes in one piece from the plane of wafer 12 through the sacrificial layer 28 to an opposite side of the support structure 10. In this case, the pick-up element 20 is tapered at its upper end or designed with slanted μ-LED retaining surfaces 36, which can allow easier lifting of the μ-LEDs 16 while at the same time ensuring a secure fit on wafer 12. In FIG. 29D, according to one example, the receiving element 20 ends vertically before the end of the epitaxial layer 32. The contact pad 30 connects the layers inside the μ-LED and especially the light emitting layer. As shown in FIGS. 29B and 29D, the contact pad 30 is the vertically lowermost element in each case and can therefore come into direct mechanical and thus electrical contact with an electrical contact element (not shown) on a support surface of the display or module, if necessary without additional bridging solder or conductive adhesive. A contact pad 30, for example, can have edge lengths in the range of 1-15 μm.

Figure 29E:
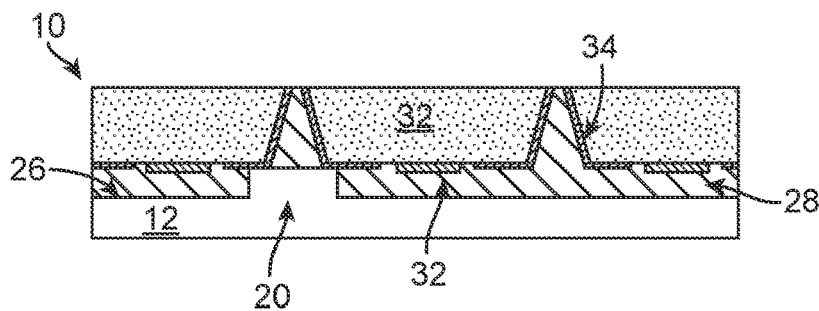

Finally, FIG. 29E shows an embodiment in which the receiving element is significantly widened and the delamination layer extends completely over the surface of the receiving element. As shown in FIGS. 29C and 29D, sacrificial layer 28 extends through the funnel-shaped region between the individual μ-LEDs with its epitaxy 32. Each μ-LED comprises an epitaxy whose lateral dimensions are larger on the light-emitting side than on the side facing the contact pad 32. In other words, the μ-LEDs widen from the side with the contact pad 32, resulting in an "inverted" V-shape in the shown sectional structure. A further layer 34 is applied to the surface of the areas of the epitaxial layer 32, especially on the sloping sides forming the funnel and on the surface containing the contact pad. This serves as an etching stop and, together with the delamination layer 26, produces a defined adhesive force. For lift-off, the sacrificial layer 28 is now removed by plasma etching, gaseous etching or another process in the V-shaped areas between the μ-LEDs and below, so that the chips only rest with their layer 34 on the delamination layer of the receiving elements.

Figure 30:
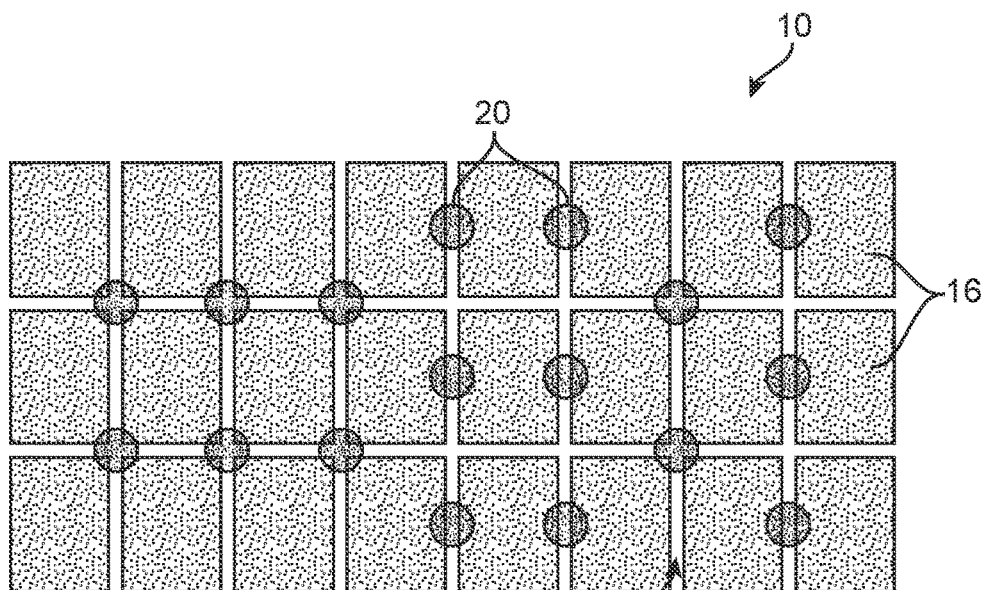
FIG. 30 shows a layout of a carrier structure according to some aspects of the proposed concept with flat μ-LEDs and a variety of mounting elements in different arrangements.
Figure 31:
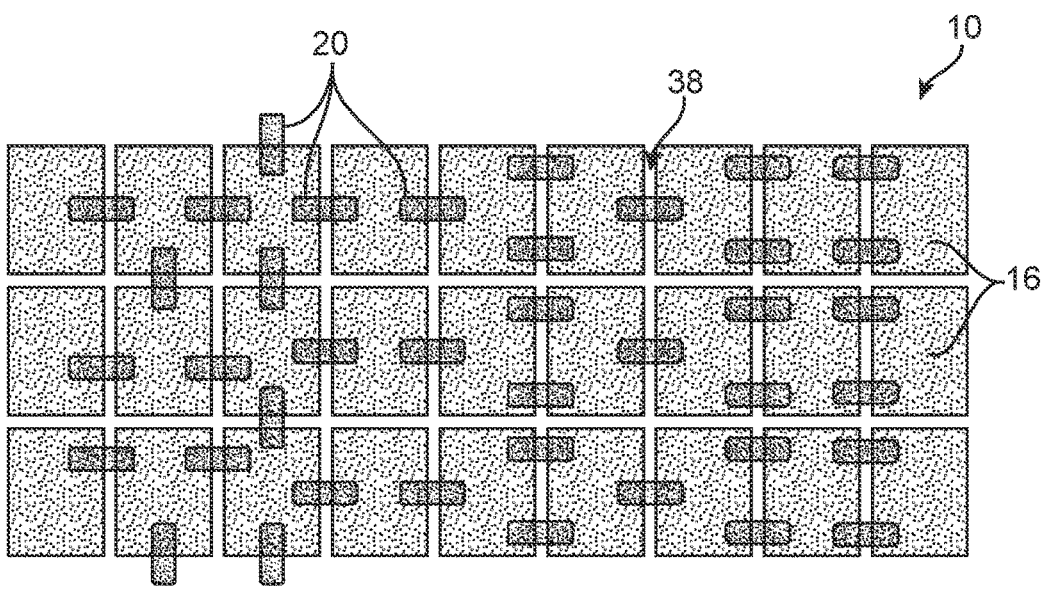
FIG. 31 shows another layout of a support structure, prepared and suitable for the proposed transfer process.

FIG. 30 and FIG. 31 each show an example of a carrier structure 10 with exemplary 24 μ-LEDs 16 arranged in a matrix on a wafer (not shown). FIG. 30 shows a total of 17 carrier elements 20. These are partly arranged in a mesa trench 38 between two adjacent μ-LEDs 16, partly also at the corners of the respective μ-LEDs 16. This arrangement can lead to the fact that a total of fewer pick-up elements 20 are required than a total number of μ-LEDs 16. In addition, a mounting element 20 in the example shown here can support or accommodate up to four adjacent μ-LEDs 16.

In FIG. 31, the base of receptacle 20 is not round as in FIG. 30, but has a rectangular or square base. This means that the contact area 36, with which the mounting element is in contact with the μ-LED 16, may vary. This can ensure stable mounting of the μ-LED 16, even if the μ-LED 16 shifts slightly in its position in the x-direction or y-direction. In other words, a total contact area consisting of all contact surfaces 36 on the μ-LED 16 remains the same or at least approximately the same, even with small shifts in the lateral direction. Furthermore, the mounting elements 20 can also be arranged on the outer edge of a carrier structure 12 and engage on an outer lateral surface of a μ-LED 16. As an example, it can be seen here that exactly three support points for the same μ-LED can provide particularly stable spatial stabilization. Here, too, a mounting element 20 can support two or more adjacent μ-LEDs 16 and thus reduce space requirements and thus costs through multiple use. In the examples shown, the contact area is shown much larger than the chip area. In practical implementations, the contact area is significantly smaller to reduce the adhesive force so that the delamination layer remains on the carrier and does not break off.

Figure 32A:
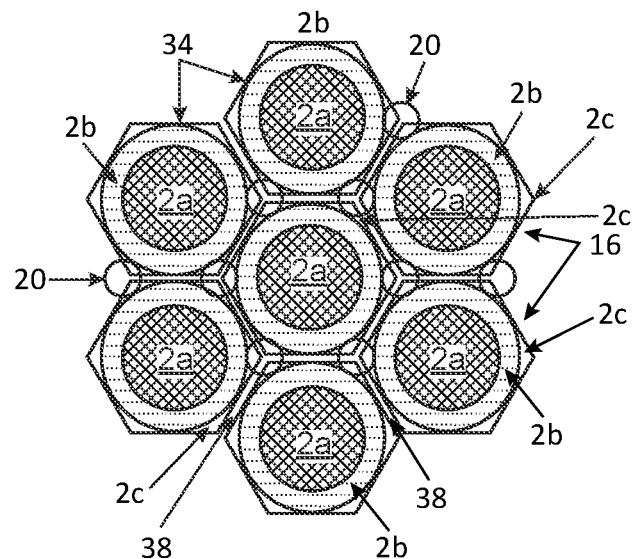
FIG. 32A shows another embodiment of a support structure.

FIG. 32A shows an embodiment in which several μ-LEDs 16 have been monolithically produced on a carrier substrate. Each μ-LED has the shape of a hexagon, i.e. 6 side faces, each facing a side face of an adjacent μ-LED. The corners of the individual μ-LEDs each rest on a mounting element 20. In addition, an edge structuring has been carried out, i.e. trenches have been etched so that the μ-LEDs are only held by the mounting elements. Each μ-LED comprises a centrally arranged and round active area 2a. This is surrounded by an area 2b, the diameter of which substantially corresponds to the distance between two opposite side surfaces of a μ-LED. In other words, the area extends to the side edge of each hexagonal structure of the μ-LEDs, while the corners of each μ-LED do not include the area 2b.

In a different embodiment, area 2b is slightly larger, so that two areas 2b of two adjacent μ-LEDs would meet virtually extended beyond the side edges. However, this part of the second area is removed during processing of the deep edge structure. The second region now comprises a larger band gap generated by quantum well intermixing than the band gap of the active region 2a. The quantum well intermixing was generated, for example, using one of the methods disclosed and presented in this application. The quantum well intermixing and the resulting increase in the band gap effectively keeps the charge carriers away from the edge regions and thus the edges of the μ-LED, since there is an increased defect density there due to the processing, which leads to non-radiative recombination.

Figure 32B:
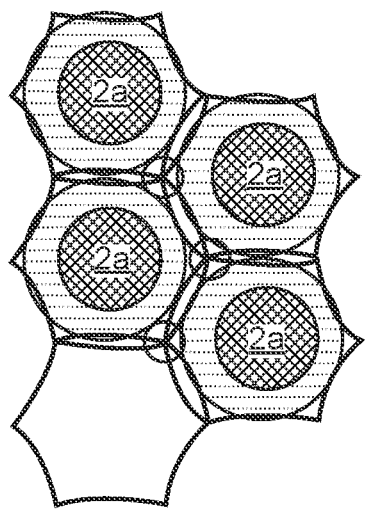
FIG. 32B is an alternative to the previous embodiment.

FIG. 32B shows another version of the embodiment, which was created by an improved mask structuring. The benefit for this embodiment is to reduce the number of photomasks and transfer steps required. In this version, a photomask was chosen which leads to smaller bulges at the corners. This results in this slightly changed structure.

In the examples shown here, the μ-LEDs are manufactured using various semiconductor technologies. The techniques disclosed in this application can be used for this purpose. However, it is also possible to transfer the antenna structures in this way. The wafer onto which the transfer is made can have contact areas, so that electrical contact is possible. Likewise, control, power sources and other elements may already be present in this wafer. The μ-LEDS transferred in this way will then be further processed in several versions. For example, a converter layer or a light-shaping element will be applied to the μ-LED. In principle, individual μ-LEDs were transferred in these designs. However, the process is not limited to such. The above modules can also be formed with these carrier structures to facilitate the transfer of such modules. The columns or the carrier elements are formed after it is known what size the modules should have.

Traditionally, there are various ways of transferring chips from a carrier wafer to a corresponding target substrate.

State of the art transfer processes such as laser transfer printing or "self-assembly" of individual micro light emitting diode chips from a solution or electrostatically activated or diamagnetic transfer processes are known.

An extension of these concepts achieved with the electrostatic transfer is explained in more detail. A method is to be specified with which optoelectronic semiconductor chips with particularly small dimensions, i.e. μ-LEDs, are picked up and deposited and at the same time, those with a defect are sorted out.

Figure 33A:
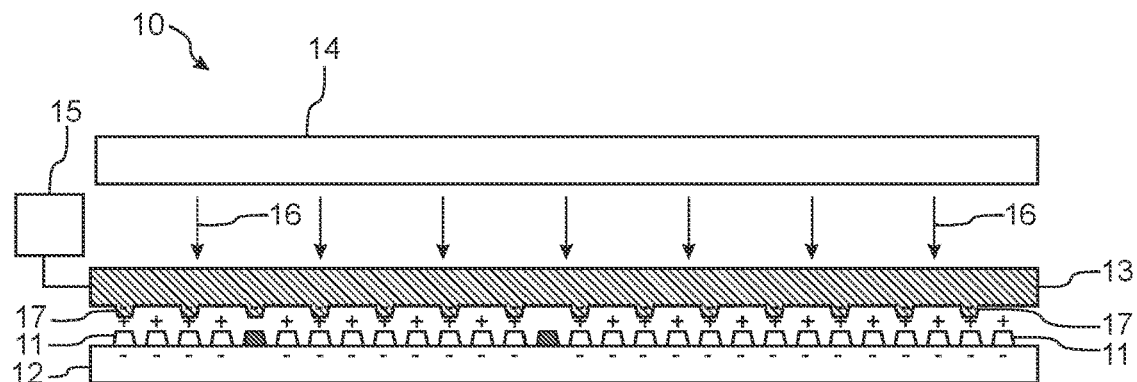
FIGS. 33A to 33D are illustrations of a process and a device for picking up and placing μ-LEDs or optoelectronic semiconductor chips to explain various aspects of the concept presented.

FIG. 33A schematically shows a device 10 for picking up and placing optoelectronic semiconductor chips as an example of an invention. In this example, the optoelectronic semiconductor chips are designed as μ-LEDs 11 and are arranged on a carrier 12 at a distance from each other. The device 10 comprises a pick-up tool 13, an excitation element 14 and a voltage source 15.

The excitation element 14 emits light 16 with which the μ-LEDs 11 are irradiated. The light 16 emitted by the excitation element 14 comprises wavelengths that generate electron-hole pairs in the optically active region of the μ-LEDs 11 by excitation. The electron-hole pairs cause an electrostatic polarization within the μ-LEDs 11, which generates an electric dipole field in the vicinity of the respective μ-LED 11. In the present embodiment, the pick-up tool 13 is arranged between the excitation element 14 and the μ-LEDs 11. The pick-up tool 13 is at least partially transparent for the light 16 emitted by the excitation element 14 so that the light 16 can reach the μ-LEDs 11.

The pick-up tool 13 has metal contacts embedded, for example, in polydimethylsiloxane (PDMS for short) or another suitable material. The metal contacts are connected to the voltage source 15. An electrostatic field can be generated by applying a voltage to the metal contacts. Furthermore, the pick-up tool has 13 elevations 17, which extend from a surface on the underside of the pick-up tool 13 in the direction of the μ-LEDs 11.

Based on FIGS. 33A to 33D, a procedure for picking up and placing the μ-LEDs 11 with the aid of the fixture 10 is described below as an embodiment according to the proposed concept. The light 16 emitted by the excitation element 14 causes an excitation and a resulting electrostatic polarisation in the μ-LEDs 11. At the same time, the pick-up tool 13 is charged by the voltage source 15 in such a way that an attractive interaction between the pick-up tool 13 and the μ-LEDs 11 is caused.

The recording tool 13 is shut down to the μ-LEDs 11 until the elevations 17 are in contact with the μ-LEDs 11 below.

Figure 33B:
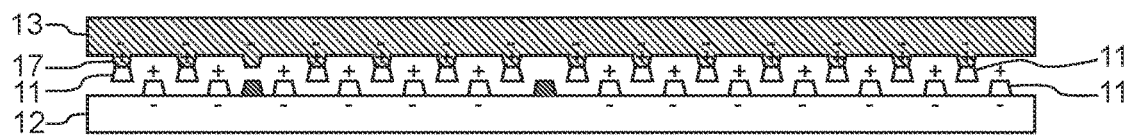
Figure 33C:
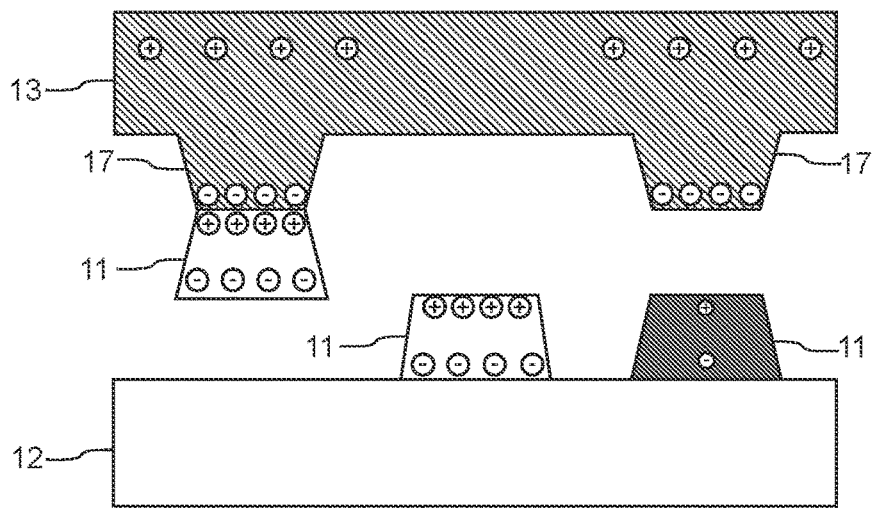

In this example, every second μ-LED 11 is in contact with one of the protrusions 17. As FIG. 33B shows, the pickup tool 13 is then raised together with the LEDs 11 adhering to the bumps 17. FIG. 33C shows an enlarged section of FIG. 33B. FIG. 33C shows the electrostatic charge of pick-up tool 13 and the polarization of the μ-LEDs 11. For simplicity, the excitation element 14 and the voltage source 15 are not shown in FIG. 33B and all subsequent figures.

Figure 33D:
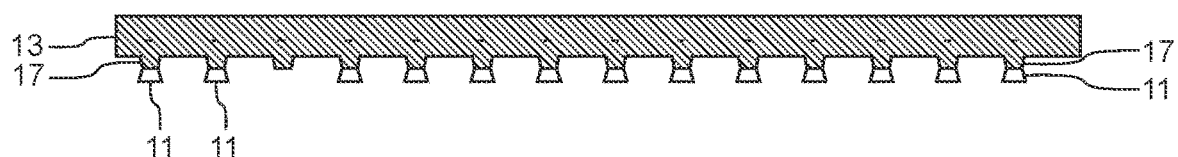

The μ-LEDs 11 located between the elevations 13 are not lifted by the recording tool 13. Furthermore, μ-LEDs 11 are not lifted where the light 16 emitted by the excitation element 14 causes little or no polarization due to defects in the μ-LEDs 11. These μ-LEDs 11 are highlighted in FIG. 33A to 33C. The lower polarization compared to intact μ-LEDs 11 makes it possible to sort out μ-LEDs 11 with corresponding defects without having to test the μ-LEDs 11 beforehand. Then, as shown in FIG. 33D, the μ-LEDs 11 are transferred to a desired location using the recording tool 13 and stored there.

Figure 34:
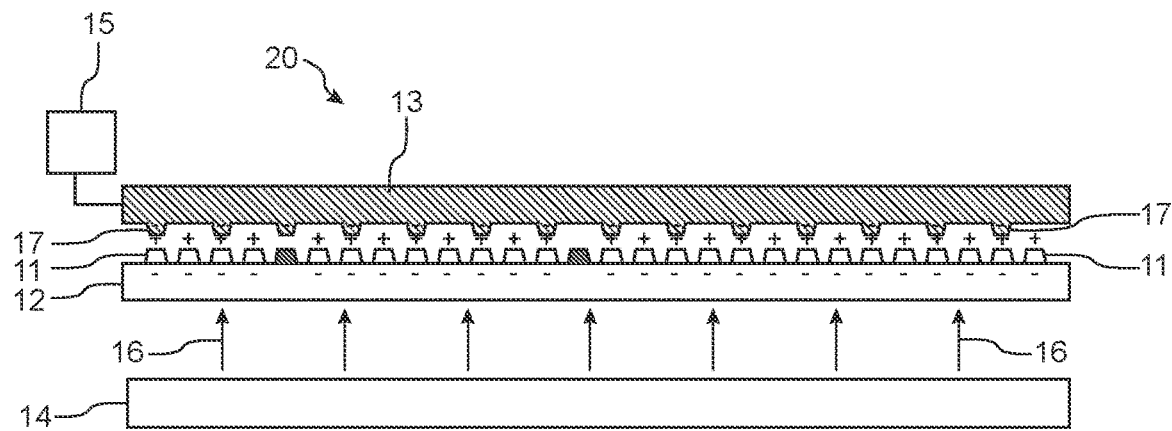
FIG. 34 shows a representation of another device for picking up and placing μ-LEDs or optoelectronic semiconductor chips.

FIG. 34 schematically shows a device 20 for picking up and placing optoelectronic semiconductor chips as a further example of an invention. The device 20 shown in FIG. 34 is largely identical to the device 10 in FIG. 33A. The difference is that the excitation element 14 in FIG. 34 is located below the carrier 12 on which the μ-LEDs 11 are located. In this case, the support 14 must be at least partially transparent to the light 16 emitted by the excitation element 14 in order for photoluminescence excitation to occur in the μ-LEDs 11.

Figure 35A:
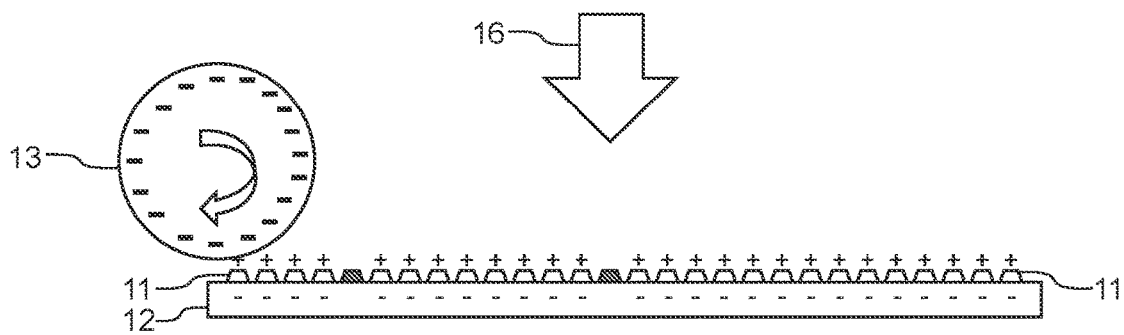
FIGS. 35A and 35B show illustrations of an embodiment of a process for picking up and placing μ-LEDs or optoelectronic semiconductor chips using a cylindrical pick-up tool.
Figure 35B:
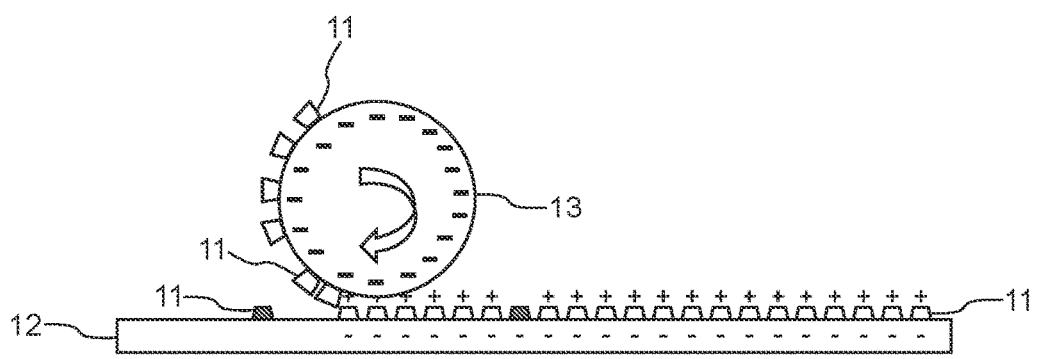

FIG. 35A schematically shows a cylindrical shaped pick-up tool 13, which can be designed like the drum of a laser printer. The pick-up tool 13 is electrostatically charged in such a way that there is an attractive interaction between the surface of the pick-up tool 13 and the μ-LEDs 11 below it due to the polarization caused by the photoluminescence excitation. As shown in FIG. 35B, the cylindrical pick-up tool 13 is rolled over the support 12 and those μ-LEDs 11 are picked up in which sufficient polarization has been produced by the incident light 16.

Figure 36:
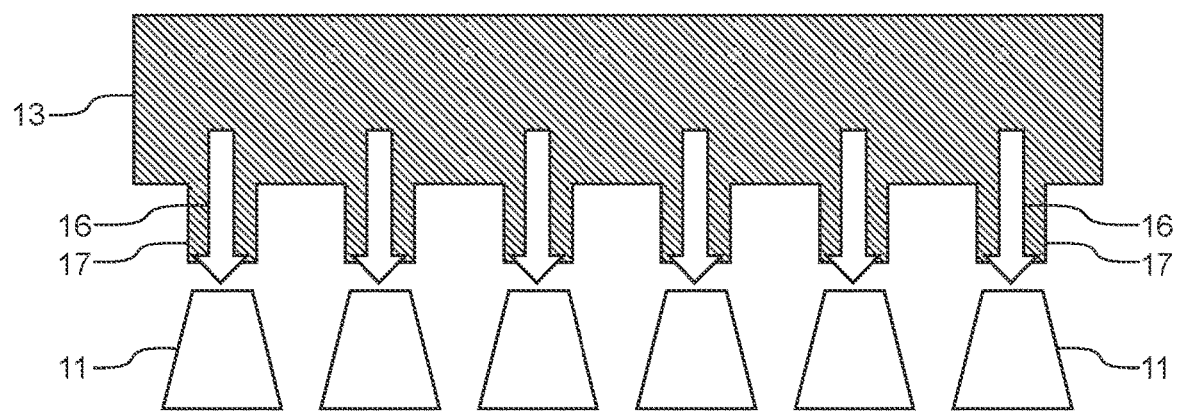
FIG. 36 illustrates an illustration of a pick-up tool with elevations for picking up μ-LEDs or optoelectronic semiconductor chips.

FIG. 36 schematically shows a pick-up tool 13 with elevations 17 on its underside extending in the direction of the μ-LEDs 11 located below the pick-up tool 13. The light 16 emitted by the excitation element 14 not shown in FIG. 36 passes through the pick-up tool 13 onto the μ-LEDs 11. To allow the passage of the light 16, the pick-up tool 13 is made of a material that is at least partially transparent to the light 16. Alternatively, corresponding through-holes or light guides can be integrated into the pick-up tool 13.

Figure 37:
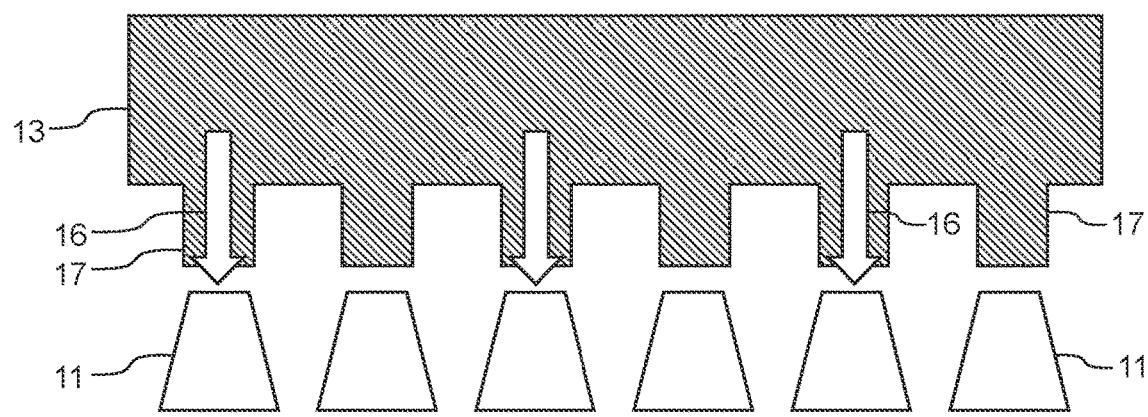
FIG. 37 shows a version of a pick-up tool that is suitable for selective irradiation of μ-LEDs or optoelectronic semiconductor chips.

FIG. 37 shows the pick-up tool 13 from FIG. 36, but in FIG. 37, only certain μ-LEDs 11 are selectively irradiated with the light 16, e.g. every second μ-LED 11. To make this possible, corresponding through-holes or light guides may be integrated in the pick-up tool 13 or a corresponding shadowing mask may be provided which allows the light 16 to fall only on the specified μ-LEDs 11. As a result, only the μ-LEDs 11 irradiated with the light 16 are excited to photoluminescence and only these μ-LEDs 11 can be picked up by the pick-up tool 13, provided that they form a sufficient polarization by the photoluminescence excitation.

Figure 38:
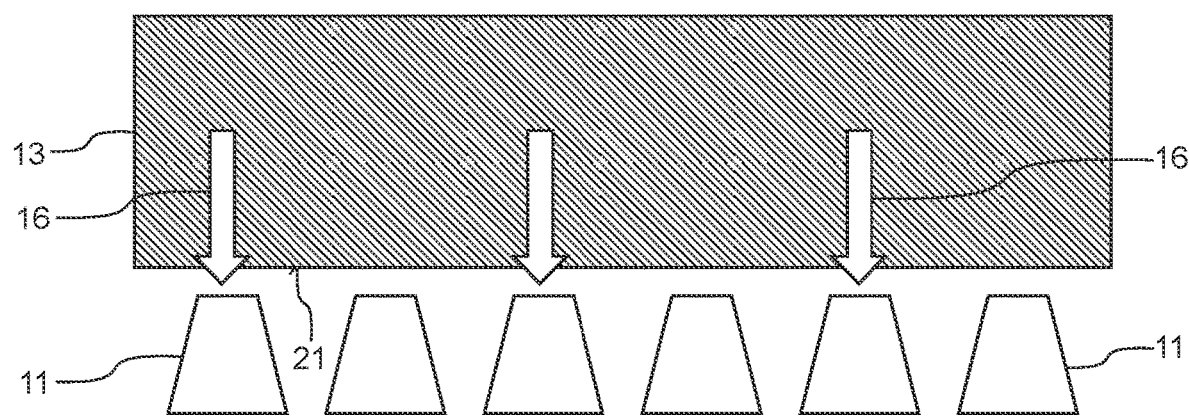
FIG. 38 illustrates a representation of a pick-up tool with a flat surface for picking up μ-LEDs or optoelectronic semiconductor chips.

FIG. 38 schematically shows a pick-up tool 13, which comprises a continuous flat surface 21 on its underside. The flat surface 21 makes it possible to pick up μ-LEDs 11 arranged in different patterns and/or at different distances. Furthermore, shading elements, e.g. a mask, can be provided to excite selectively only certain μ-LEDs 11 to photoluminescence.

Figure 39A:
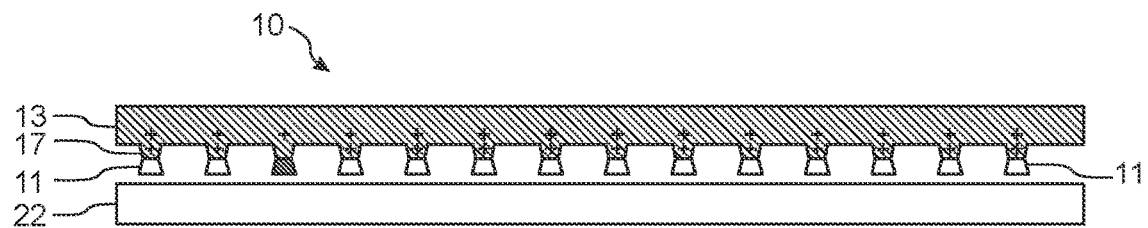
FIGS. 39A through 39C show illustrations of a method for depositing μ-LEDs.
Figure 39B:
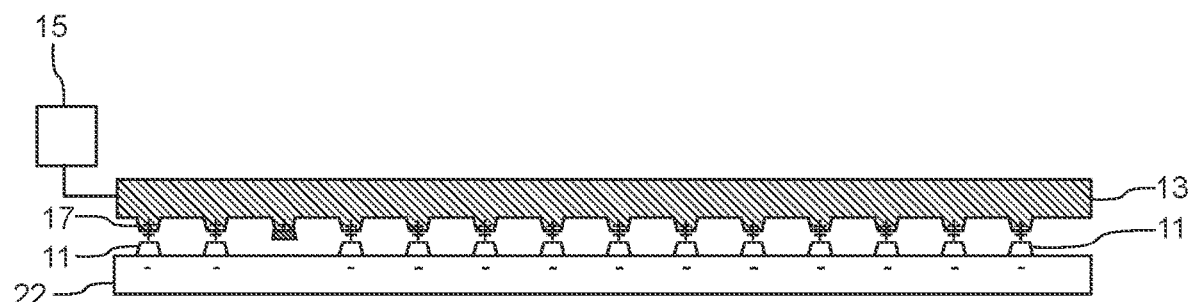
Figure 39C:
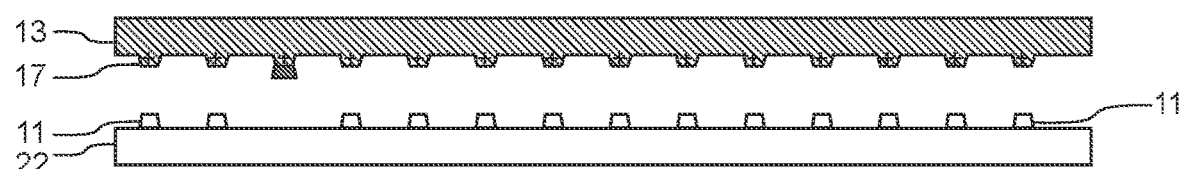

FIG. 39A to 39C shows the fixture 10 while placing the μ-LEDs 11. After picking up the μ-LEDs 11 as shown in FIG. 33A to 33D, the pickup tool 13 is transferred to a board shown in FIG. 39A on which some of the μ-LEDs 11 are to be mounted.

Using the voltage source 15 shown in FIG. 39B, the electrostatic charge of the pick-up tool 13 is changed in such a way that the attractive interaction between the pick-up tool 13 and the μ-LEDs 11 is reduced or converted into a repulsive interaction. By means of the individually controllable metal contacts in the pick-up tool, the electrical charge in certain areas of the pick-up tool can be changed in the desired way so that only a predetermined number of μ-LEDs 11 are deposited on the board 22. The pickup tool 13 is then removed from the board 22, as shown in FIG. 39C. The μ-LEDs 11 remaining on the pickup tool 13 can be removed or placed elsewhere, for example on a cleaning tape.

Figure 40A:
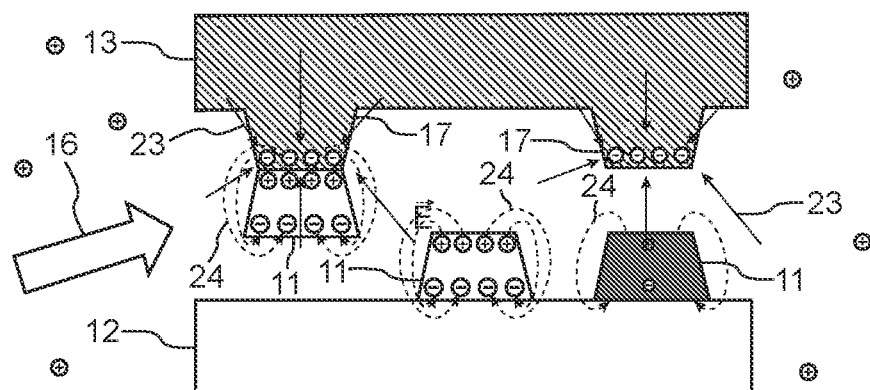
FIGS. 40A to 40C are different representations of some of the ways in which an electric field is generated by the pick-up tool.
Figure 40B:
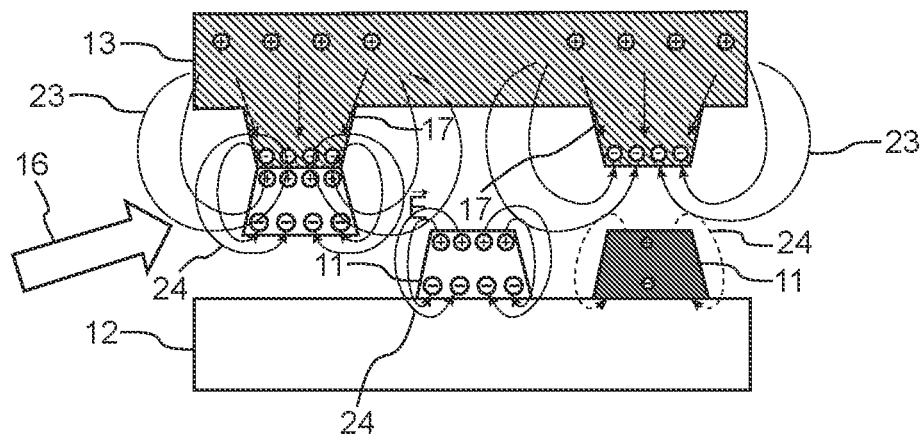
Figure 40C:
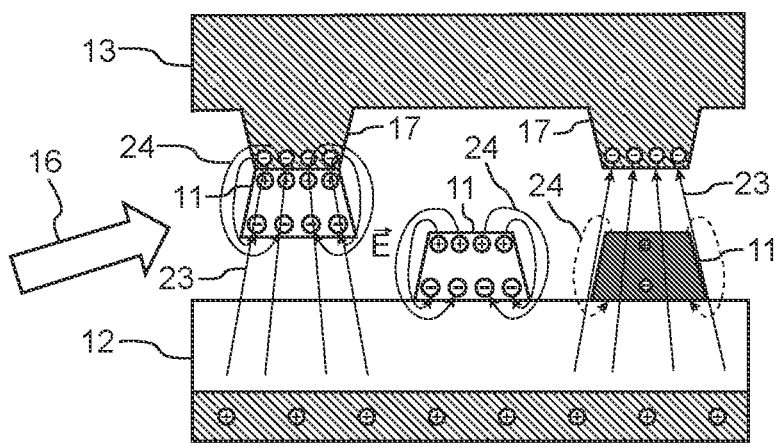

FIGS. 40A through 40C schematically illustrate various options for generating an electric field using pickup tool 13. The field lines 23 shown in FIG. 40A through 40C indicate the direction and strength of the electric field at the location.

In the configuration shown in FIG. 40A, charges are located in the elevations 17 of the pick-up tool 13, and the counter charges are located in the vicinity of the pick-up tool 13. This results in an electric field around each of the bumps 17, similar to the field of a point charge. In FIG. 40B, there are dipole charges in the pick-up tool 13, arranged in such a way that the electric field strength is particularly strong at the tips of the bumps 17. In FIG. 40C, the bumps 17 of the pick-up tool 13 are electrically charged and the counter-charges are arranged below the carrier 12 so that the μ-LEDs 11 to be picked up are located between the pick-up tool 13 and the countercharges and thus within the electric field.

The electric fields generated by the recording tool 13 should not be homogeneous in order to exert an effective force on the dipoles of the μ-LEDs 11 so that they can be recorded by the carrier 12. FIGS. 40A to 40C also show electric field lines 24 of μ-LEDs 11 generated by the excitation. The interaction of the field lines 24 of the μ-LEDs 11 with the field lines 23 of the pick-up tool 13 is not shown for simplification.

Figures 41A, 41B:
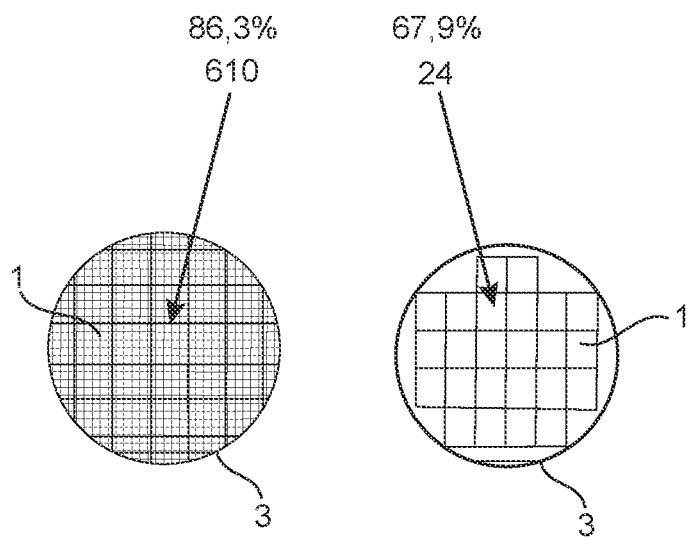
FIGS. 41A and 41B show illustrations showing transfer steps of a conventional method and the proposed method.

FIGS. 41A and 41B show illustrations with regard to transfer steps of a conventional method and with regard to a method according to the concept of a double transfer process. The parallel, error-free transfer of many μ-LEDs from a carrier substrate 3 to a display substrate 7 plays a decisive role in the production of μ-displays. The number of necessary transfer steps is important for the manufacturing costs. The fewer transfer steps required, the lower the corresponding process costs. Parallel to the cost consideration, the technical feasibility of reducing the number of transfer steps is also relevant.

In general, the density of μ-LEDs on a carrier substrate is 3 orders of magnitude higher than on a μ-display. The ratio depends on the μ-LED size, the chip-to-chip distance (wafer pitch) on carrier substrate 3 and the target resolution of the μ-display (pixel pitch).

The transfer from carrier substrate 3 to the target substrate 7 can be carried out according to a conventional method in such a way that the μ-LEDs are removed from carrier substrate 3 according to the pixel pitch of the display and transferred to the corresponding substrate 7. The size of the transfer stamp as well as the size of the removable area on carrier substrate 3 and the total size of the μ-display then define the number of transfer steps for a μ-display. It is advantageous if the stamp size is selected in such a way that the display size can be fully populated by means of integer multiples of the stamp size in x and y direction. In this way, individual transfer processes can be avoided. For the production of color displays, the transfer for all three colors red, green, blue of the μ-LED onto the target substrate must be carried out.

Both FIGS. 41A and 41B show a carrier substrate 3 on which μ-LEDs 1 have been formed. Accordingly, a carrier substrate 3 provides μ-LEDs of one color, for example red, green and blue. Now the number of transfer steps by means of which μ-LEDs are transferred from a carrier substrate 3 directly to a μ-display is to be determined, whereby this corresponds to a conventional method.

For example, the display has a spatial extension of 200 mm in the x-direction and 100 mm in the y-direction. The carrier substrate 3, for example, has a diameter of 300 mm. The pitch between the μ-LEDs is 10 μm. The pitch between the pixels of the display is 100 μm, ten times as large. A color display with red, green and blue μ-LEDs is to be produced. Therefore, this whole process has to be done for each color.

FIG. 41A shows maximum stamp positions per carrier substrate 3 for a small transfer stamp size. FIG. 41B shows maximum stamp positions per carrier substrate 3 for a relatively large transfer stamp size. In FIG. 41A, the size of the transfer stamp is 10 mm in the x-direction and also 10 mm in the y-direction. Accordingly, for a display area of 20,000 mm$^2$ (200 mm×100 mm) with the selected area of the transfer stamp of 100 mm$^2$, a total of s=200 transfer steps must be performed for each color. Using the three colors red, green and blue results in 600 transfer steps for one display. FIG. 41A shows that up to 610 transfer steps can be carried out with this design, allowing 86.3% of the wafer to be used. However, it should be noted that it is assumed that each transfer step does not involve a transfer error, i.e. all μ-LEDs to be transferred are also picked up.

Small transfer stamps result in a large area of use on the carrier substrate 3 In other words, a large number of μ-LEDs can be removed from a carrier substrate if the transfer stamp is small. However, the resulting high utilization factor is associated with a large number of transfer steps. FIG. 41B shows a design, in which the size of the transfer die is designed with spatial extensions of 40 mm in an x-direction and 50 mm in a y-direction.

Accordingly, for a display area of 20,000 mm$^2$ with the selected area of the transfer stamp of 2,000 mm$^2$, a number of r=10 transfer steps must be carried out for each color. Using the three colors red, green and blue results in only 30 transfer steps for one display. FIG. 41B shows, however, that up to 24 transfer steps can be carried out with this design, which means that only 67.9% of the wafer can be used. As a result, although larger transfer dies result in a smaller number of transfer steps, the usable area on carrier substrate 3 is also smaller. In other words, a larger stamp cannot easily reach some areas on the carrier substrate.

Now the number of transfer steps is to be determined by means of which μ-LEDs are transferred from a carrier substrate 3 via an intermediate carrier 5 to a target substrate for a μ-display. In contrast to the conventional method, instead of a display, an intermediate carrier 5 is now first assembled in the same way as in the conventional method. All size specifications described above still apply. Accordingly, a transfer stamp as shown in FIG. 41A requires s=200 transfer steps per color and a transfer stamp as shown in FIG. 41B requires r=10 transfer steps per color.

Since the pitch of the μ-LED on the carrier substrate 3 is 10 μm, and the pitch of the pixels of the display is ten times as large at 100 μm, the conventional transfer method can only transfer fewer μ-LEDs than possible by a factor of n=100. In other words, both stamps transfer less µ-LED per transfer in the conventional manner than it would be possible.

In the method according to the proposed principle, all µ-LEDs present on the carrier substrate 3 and accessible by the stamp are transferred to the intermediate carrier 5 during the transfer. These are so-called first transfer steps, which are carried out by means of a first transfer stamp 4. In the proposed process, the intermediate carrier 5 is the same size as the display, so that a display for one color can be completely assembled with one transfer by means of a second transfer step using a second transfer stamp 6 of the same size. Since the first density of µ-LEDs on the intermediate carrier 5 is greater by a factor of n=100 than the density of the pixels on the display, a number of n=100 displays of one color is produced from an intermediate carrier 5. For color displays, 3×100 second transfer steps are then required, which, together with the first transfer steps, result in a respective following total number of transfer steps per 100 color displays:

For the small transfer stamp 4 as shown in FIG. 41A, this results in a total number of 3×200+3×100 transfer steps for 100 color displays, i.e. 9 transfer steps per 1 color display. For the larger transfer stamp 4 as shown in FIG. 41B, the total number of transfer steps is 3×10+3×100 for 100 color displays, i.e. 3.3 transfer steps per 1 color display.

This is a significant improvement over the conventional method, which requires 600 transfer steps per 1 color display for the small transfer stamp shown in FIG. 41A and 30 transfer steps per 1 color display for the larger transfer stamp shown in FIG. 41B. The transfer steps per color display are average values from which real manufacturing processes may differ within tolerances and due to defects.

Figure 42:
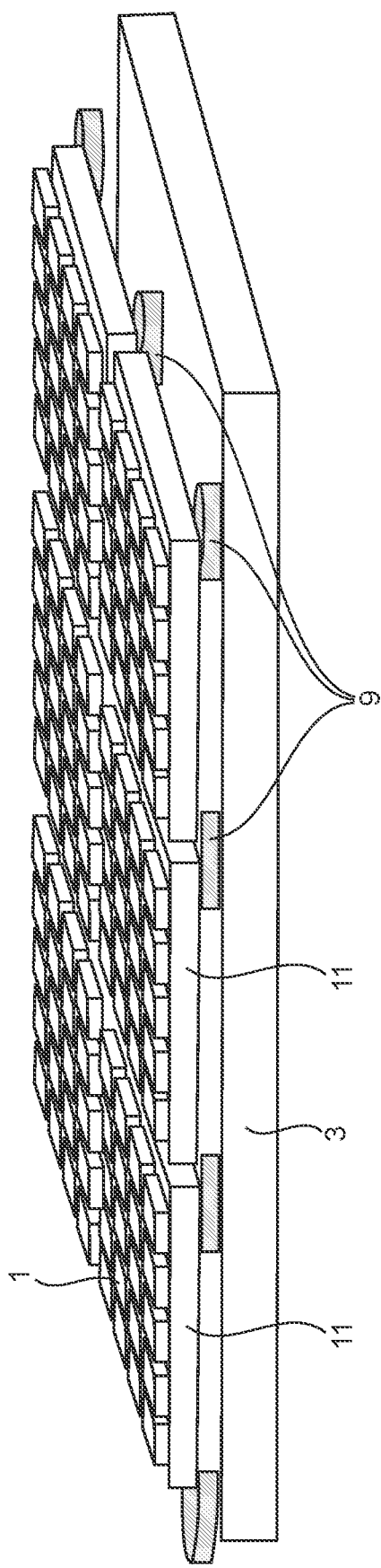
FIG. 42 is a first embodiment of a start structure for a procedure according to some suggested aspects in a top view.

FIG. 42 shows a first embodiment of an inventive start structure for an inventive process in a top view. This start structure is used to execute the two transfer steps safely and reliably. FIG. 42 shows µ-LEDs 1 arranged at module areas 11, which adhere to a carrier substrate 3 by means of first anchor elements 9. The module areas 11 can be assembled from one or several carrier substrates 3.

The first anchor elements 9 are connected to the carrier substrate 3 and are designed to hold several module areas 11 detachably between the first anchor elements 9 in such a way that the module areas 11 can be separated from the carrier substrate 3 in first transfer steps S2 with a first defined minimum lifting force transverse to the substrate plane by means of the first transfer stamp 4, moved out and then transferred to the intermediate carrier 5. The minimum lift-off force must be applied at least to enable lift-off and must be set in a defined manner by the anchor elements 9.

Figure 43:
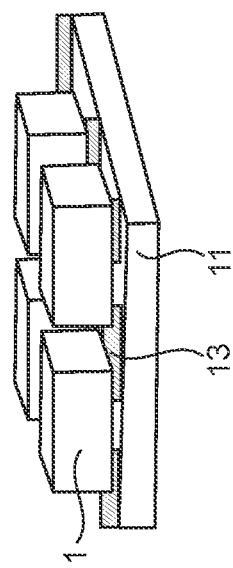
FIG. 43 shows the first embodiment according to FIG. 42 of the start structure for the procedure in an enlarged view.

The adhesive force with which the µ-LEDs 1 adhere to the first transfer stamp 4 is greater than the first defined minimum lifting force. FIG. 43 shows the first embodiment according to FIG. 42 of the starting structure in an enlarged view using the proposed concept for the procedure.

The enlarged view shows that the µ-LEDs 1 adhere to module areas 11 by means of second anchor elements 13. The module areas 11 thus carry a plurality of transferable µ-LEDs. In particular, second anchor elements 13 are formed which are connected to the module areas 11 and are configured to hold µ-LEDs 1 detachably between the second anchor elements 13 in such a way that the µ-LEDs 1 are separated from an intermediate carrier 5 by means of the second transfer stamp 6 in a respective second transfer step S3 with a second defined minimum lifting force transverse to the plane of a respective module area 11, moved out and then transferred to the target substrate 7.

The adhesive force with which the µ-LEDs 1 adhere to the second transfer stamp 6 is greater than the second defined minimum lifting force. FIG. 42 and FIG. 43 show the first starting structures that can be used to carry out the presented method. By means of first anchor elements 9 a respective first transfer step can be performed and by means of second anchor elements 13 a respective second transfer step can be performed safely and reliably. By means of the anchor structures 9, 13 defined minimum lift-off forces are set for a lift-off during the two transfer steps.

Figure 44:
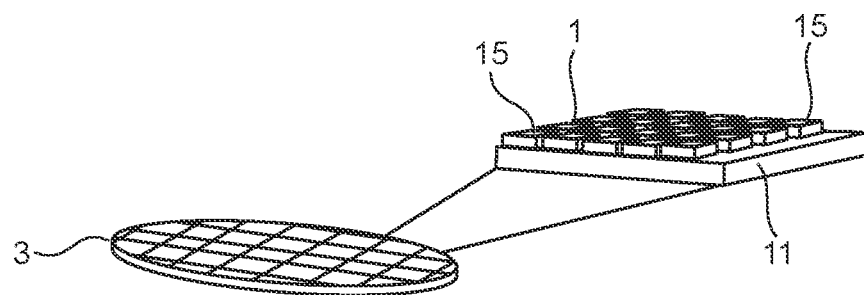
FIG. 44 shows a further illustration for a manufacture of a first start structure according to some of the proposed aspects.

FIG. 44 shows a further illustration with regard to the production of a first launch structure in accordance with the invention. On the left, a round carrier substrate 3 is shown, in which rectangular module areas 11 are drawn. Carrier substrate 3 has the double anchor elements in the form of the first anchor elements 9 for the module areas 11 and the second anchor elements 13 for the micro light emitting diodes. On the right side, an enlarged representation of a rectangular module area 11 is shown. The module also includes lifting elements 15 at two diagonally opposite corners. These serve to ensure that the module areas 11 can be safely transferred. The lifting elements 15 can alternatively be formed in the four corners of a module area 11 or in the four corners of a module area 11 and additionally in its center. Lifting elements 15 provide working surfaces for a first transfer stamp for lifting module areas 11. Thus, module areas with µ-LEDs 1 can be assembled from different carrier substrates 3.

In some aspects, the lifting elements 15 are designed as µ-LEDs 1, which are not to be transferred and are directly attached to the module areas 11. Lifting elements 15 are thus µ-LEDs 1, which are directly connected to module areas 11 without second anchor elements 13. Without anchor elements, the lifting elements 15 have a high adhesive force on the respective wafer area 11. Lifting elements 15 create a square or round surface or structures such as crosses. The number of lifting elements 15 can be selected proportionally to the size of the module area 11. If the lifting elements 15 are only structures directly connected to module area 11, the arrangement of the structure of the lifting elements 15 is selected as an integer multiple of the display pixel pitch to generate the least loss of chip area. If µ-LEDs 1 are provided as lifting elements 15, they can no longer be used as display elements.

Alternatively or cumulatively, according to the lifting elements 15 positioning elements 17 can be designed as positioning aids for a spatially accurate transfer. Lifting elements 15 are then the positioning elements 17. The accuracy of a wafer pitch of the individual µ-LEDs on the transferred module areas 11 is not affected by the transfer process. Since the positioning accuracy of large-area module areas 11 in relation to one another is not negatively influenced by the expansion effects of a transfer stamp during the transfer, greater overall accuracy can also be achieved when "denominating" a temporary intermediate carrier 5. This also results in lower tolerances in the final assembly of displays with micro light emitting diodes.

Figure 45:
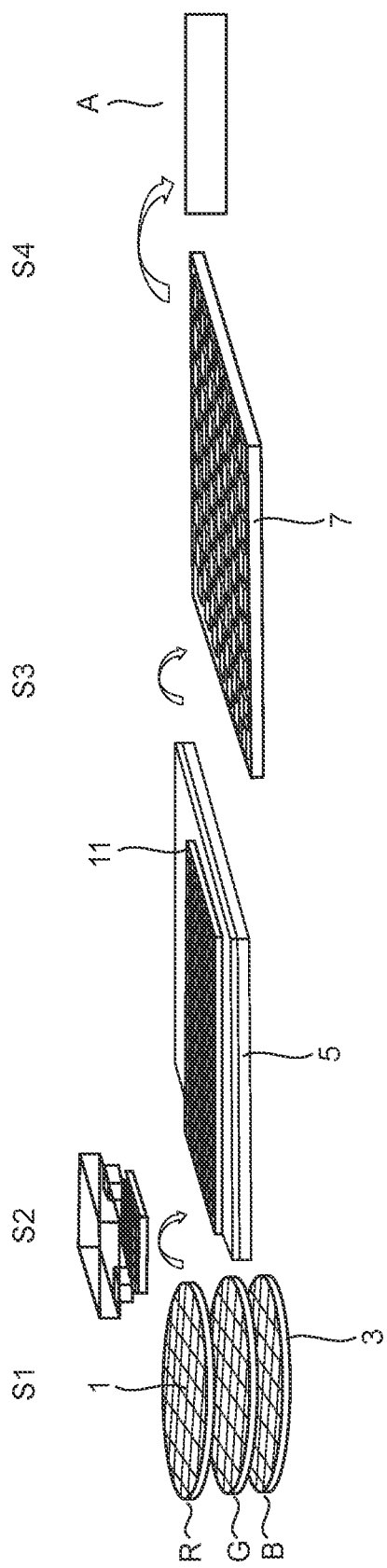
FIG. 45 is an embodiment of the inventive step with some aspects of the proposed principle.

FIG. 45 shows an example of an inventive method. In a first step, an intermediate carrier 5 is produced in the target size of the display product with the same µ-LED density as the carrier substrate 3. The basic shape of the intermediate carrier 5 is rectangular. It is then thinned out during transfer to the display. For this purpose, the intermediate carrier 5 is provided on which module areas 11 of wafer 3 can be temporarily transferred completely. In a second stamping step or transfer step S3, individual µ-LEDs with the correct pixel pitch are removed again to be transferred to a final target substrate 7. An important criterion is the positional accuracy during transfer to the intermediate carrier 5 as well as the spatially accurate, preferably error-free placement during transfer to the target substrate 7.

Figure 46:
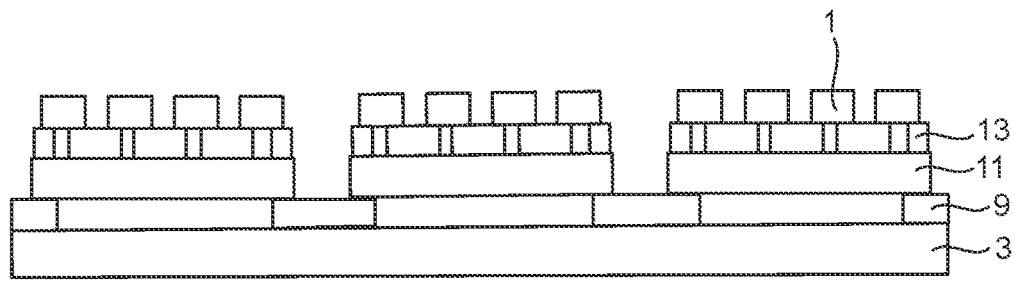
FIG. 46 shows the first embodiment of the start structure for a procedure in a cross-section.

To create a color display, the following steps are carried out for each of the colors red, green and blue, in particular in the example of FIG. 46:

With a first step S1, µ-LEDs 1 are generated on a carrier substrate 3 with a first density. In this process, first anchor elements 9 and second anchor elements 13 are formed on the carrier substrate 3 for positioning module areas 11 and µ-LEDs 1. These anchor elements 9, 13 thus provide double anchor element structures or double anchor element structures as starting structures for the process. After the carrier substrate 3 has been processed, the module areas 11 located on the carrier substrate 3 are tested in such a way that, for example, functioning µ-LEDs are distinguished from defective µ-LEDs 1, a yield is determined or color locations are determined.

With a second step S2, a respective first transfer step is carried out by a first transfer stamp 4, which transfers the µ-LEDs 1 to an intermediate carrier 5 with the first density. Depending on the test results, only certain module areas 11 are arranged on an intermediate carrier 5. In this way, for example, only functioning module areas 11 or only module areas 11 with suitable color can be formed.

Depending on the design, a multiple transfer takes place until the intermediate carrier 5 is completely equipped with module areas 11. These are attached to the intermediate carrier 5 with an adhesive material or adhesive film. The adhesive force can be generated by self-hardening or cross-linking by means of ultraviolet light or exposure to high temperature. Optionally, thermal or thermocompressive treatment of the intermediate carrier 5 can be carried out, which improves the planarity and/or adhesion. An intermediate carrier 5 is used for each color, for example a 12.3 inch intermediate carrier 5. The intermediate carrier 5 can be equipped with module areas 11 of different carrier substrates 3.

With a third step S3 a respective second transfer step is executed. Here, a second transfer stamp 6 is used to transfer the µ-LEDs 1 from the intermediate carrier 5 to a target substrate 7 with a second density that is a factor n smaller than the first density. The distance between the pixels and thus also between the µ-LEDs on the target substrate 7 corresponds to a multiple of the distance between µ-LEDs of the same type on the intermediate carrier 5 and can be different in both spatial directions. In other words, µ-LEDs on the intermediate carrier are selected and transmitted based on the pitch on the target substrate 7. This result in a thinning of the µ-LEDs on subcarrier 5, but a corresponding number of color displays can be created from three assembled subcarriers.

The target substrate 7 provides a common array area for each of the n arrays, especially for all three colors. Size and shape of the intermediate substrate 5 and the second transfer stamp 6 are equal to each other and preferably equal to the array surface. In this way, a backplane of a display can be equipped with µ-LEDs of one color in a second transfer step. If intermediate carrier 5 and second transfer stamp 6 are smaller than the display by a factor k, correspondingly k second transfer steps must be carried out, which increases the manufacturing effort. The target substrate 7 can be equipped with several intermediate carriers 5, for example to produce colored screens.

The display can be further processed by means of a further processing S4. For example, the production of a respective electrical top contact in the case of vertical micro light emitting diodes or the production of both electrical contacts in the case of horizontal micro light emitting diodes. In addition, optical out-coupling structures or out-coupling layers or surface refinement layers can be formed, which can serve to improve the black impression, for example. A modulation can also be carried out.

FIG. 46 shows the first embodiment of a start structure for the proposed method in cross-section. The start structure comprises several µ-LEDs 1, which are connected to module areas 11 by means of second anchor elements 13. These in turn are connected to a carrier substrate 3 by first anchor elements 9. Between carrier substrate 3 and module areas 11 on the one hand and µ-LEDs 1 and module areas 11 on the other hand, anchor elements 9, 13 are configured in such a way that with a defined first minimum lifting force of the lifting first transfer stamp 4, the module areas 11 are separated from the module areas 11 in a first transfer step S2 and with a defined second minimum lifting force of the lifting second transfer stamp 6, the µ-LEDs 1 are separated from the module areas 11, lifted and then transferred in a second transfer step S3.

FIGS. 47A to 47E show a further example of a proposed method using the first start structure shown.

Figure 47A:
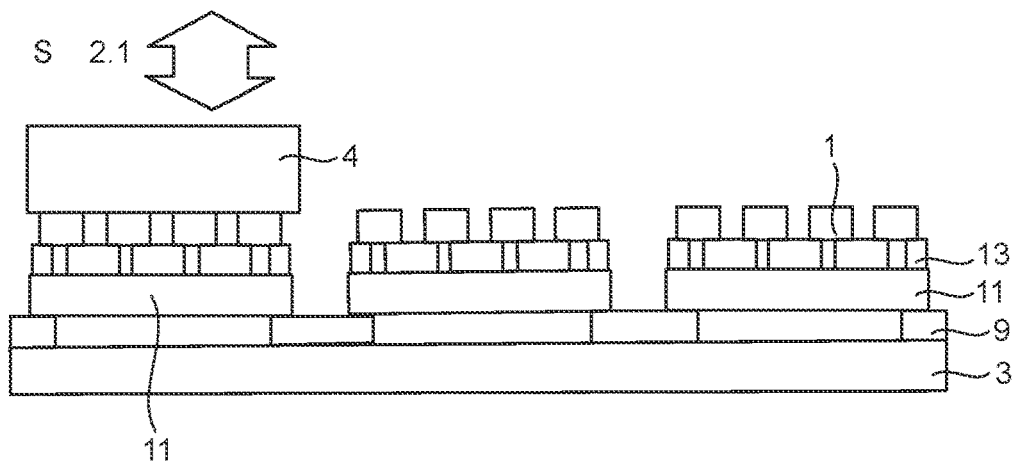

FIG. 47A shows how a large number of module areas 11 with µ-LEDs 1 are detached from the first anchor elements 9 and the wafer 3 with a step S2.1. This is done by means of a first transfer stamp 4. For lifting off the module areas 11, the adhesive force of the µ-LEDs 1 on the module areas 11 (second adhesive force) is greater than the adhesive force (first adhesive force) of the module areas 11 on the carrier substrate 3. In addition, the adhesive force of the first transfer stamp 4 on the µ-LEDs 1 is also greater than the first adhesive force of the module areas 11 on the carrier substrate 3. The first minimum lifting force applied by the first transfer stamp 4 is again greater than the first adhesive force of the module areas 11 on the carrier substrate 3 and smaller than the second adhesive force of the µ-LEDs 1 on the module areas 11 and less than the adhesive force of the µ-LEDs 1 on the first transfer stamp 4.

Figure 47B:
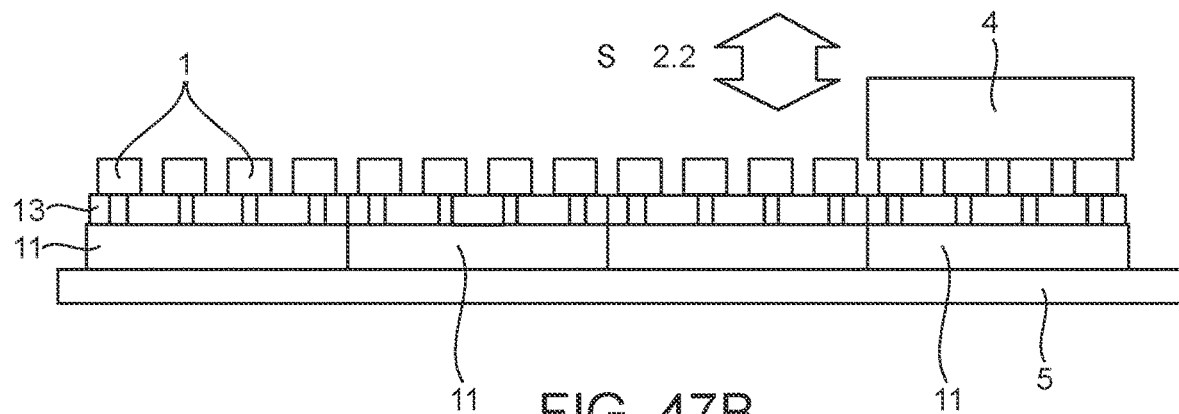

For successful placement of the module areas 11 carrying µ-LEDs 1 on the intermediate support 5 as described in FIG. 47B, the second adhesive force of the µ-LEDs 1 on the module areas 11 must be greater than the adhesive force of the µ-LEDs 1 on the first transfer stamp 4. The adhesive force of the module areas 11 on the intermediate support 5 must be greater than the adhesive force of the µ-LEDs 1 on the first transfer stamp 4. First anchor elements 9 and second anchor elements 13 are used to set the respective first and second adhesive forces. Thus, the first adhesive force between the module areas 11 and the wafer 3 is provided by the first anchor elements 9. The respective second adhesive force between the µ-LEDs 1 and the module areas 11 is provided by the second anchor elements 13. The release force applied by the first transfer stamp 4 must be greater than the adhesive force of the µ-LEDs 1 on the first transfer stamp 4 and smaller than the second adhesive force of the µ-LEDs 1 on the module areas 11. The release force is the minimum force that must be applied in order to carry out releasing.

FIG. 47B shows a subsequent step S2.2 of applying the module areas 11 carrying µ-LEDs 1 to the intermediate carrier 5, which is also carried out using the first transfer stamp 4.

By selecting a suitable material, a connection between the module areas 11 and the intermediate support 5 can be provided with the required adhesive force. For example, an adhesive can be used. The adhesive force of the μ-LEDs 1 on the first transfer stamp 4 can also be changed by suitable movement guidance of the first transfer stamp 4 during lifting and setting down, e.g. by movement guidance with shear component, i.e. parallel to the plane of the intermediate carrier. The adhesive force of the μ-LEDs 1 on the first transfer stamp 4 can be reduced, e.g. during setting down.

Steps S2.1 and S2.2 are carried out several times until, for example, for a color of red, green or blue, the intermediate carrier 5 is fully loaded.

FIG. 47C shows a subsequent step S3.1 of lifting the μ-LEDs 1 from the module areas 11 for transfer to the target substrate 7, which is done by a second transfer stamp 6. The μ-LEDs 1 are released from the second anchor elements 13 and the intermediate carriers 5. Here μ-LEDs 1 are released simultaneously from several intermediate carriers. The density of the μ-LEDs 1 on the module areas 11 does not correspond to the density of the μ-LEDs 1 on the target substrate 7. For example, the first density can be twice as high as the second density. Accordingly, the second stamp has 6 sensing elements 19, which correspond to the distance of the μ-LEDs 1 on the target substrate 7. FIG. 47C shows that the first density of μ-LEDs 1 on module areas 11 is twice as high as the second density of μ-LEDs 1 on target substrate 7.

The adhesion of the second transfer stamp 6 must also be stronger than the adhesion of the μ-LEDs 1 on the intermediate carrier 5. To lift off the μ-LEDs 1, the adhesive force of the μ-LEDs 1 on the second transfer stamp 6 must be greater than the second adhesive force of the μ-LEDs 1 on the module areas 11. Furthermore, the adhesive force of the module areas 11 on the intermediate carrier 5 must also be greater than the second adhesive force of the μ-LEDs 1 on the module areas 11. The defined second minimum lifting force applied by the second transfer stamp 6 must be greater than the second adhesive force of the μ-LEDs 1 on the module areas 11 and less than the adhesive force of the module areas 11 on the intermediate carrier 5 and less than the adhesive force of the μ-LEDs 1 on the second transfer stamp 6.

For successful placement of the μ-LEDs 1 from the second transfer stamp 6 onto the target substrate 7 as described in FIG. 47D, the adhesive force of the μ-LEDs 1 on the target substrate 7 must be greater than the adhesive force of the μ-LEDs 1 on the second transfer stamp 6. Conversely, the release force applied by the second transfer stamp 6 is greater than the adhesive force of the μ-LEDs 1 on the second transfer stamp 6 but less than the adhesive force of the μ-LEDs 1 on the target substrate 7. The second anchor elements 13 as well as connecting means and the movement guide of the second transfer stamp 6 are used to set the respective adhesive forces. The respective second adhesive force between the μ-LEDs 1 and the module areas 11 is provided by the second anchor elements 13.

FIG. 47D shows a subsequent step S3.2 of applying the μ-LEDs 1 to the target substrate 7, which is also done with the second transfer stamp 6. μ-LEDs 1 are applied to a target substrate 7, which is part of a display.

The adhesive force of the μ-LEDs 1 on the second transfer stamp 6 can also be changed by suitable movement guidance of the second transfer stamp 6 during lifting and setting down, e.g. by movement guidance with shear component, i.e. parallel to the target substrate plane. The adhesive force of the μ-LEDs 1 on the second transfer stamp 6 can be reduced, e.g. during setting down. By selecting a suitable material, a connection between the μ-LEDs 1 and the target substrate 7 can be provided with the required adhesive force. For example, adhesives, intervias or solder can be used.

Steps S3.1 and S3.2 are carried out several times until, for example, target substrate 7 of a display is fully populated for all colors of red, green and blue.

FIG. 47E shows further processing steps S4 on the target substrate 7, including the production of mechanical and electrical contacts on the target substrate 7 by means of conventional processes, such as deposition of an Intervia material, curing and subsequent structuring and/or back etching.

For example, a respective electrical top contact is produced in vertical μ-LEDs or both electrical contacts are produced in horizontal μ-LEDs. In addition, out-coupling structures or out-coupling layers or surface refinement layers are formed, for example to improve the black impression. Modularization can also be carried out. In this way, a large number of arrays A in μ-display design can be produced simply and cost-effectively.

Figure 48:
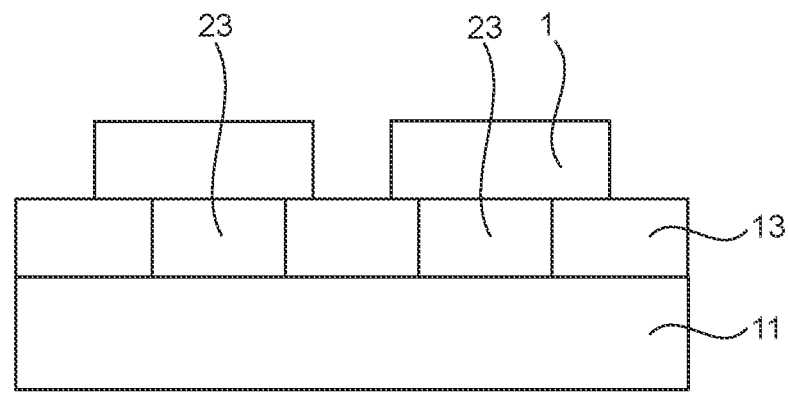
FIG. 48 is a first illustration of the mode of action of anchor elements and release elements according to some aspects presented.

FIG. 48 shows a further example of a connection of μ-LEDs 1 at module areas 11, for which additional anchor elements 13 and second release elements 23 are provided in addition to the second anchor elements 13 and on these. Before executing a second transfer step S3 the μ-LEDs 1 are in contact with second anchor elements 13 and second enabling elements 23, each of which is connected to a module area 11. The μ-LEDs 1 are mechanically connected to the module area 11 with a large adhesive force by means of the second anchor elements 13 and the second enabling elements 23.

Figure 49:
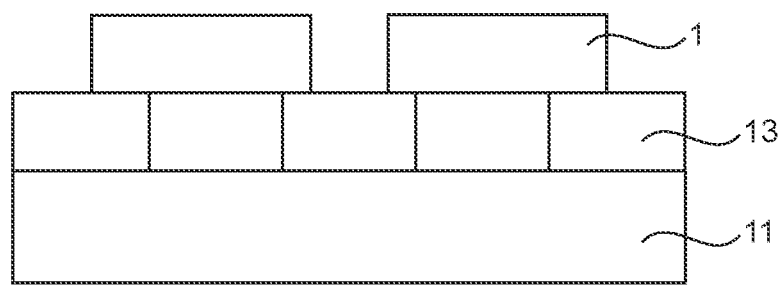
FIG. 49 is a second illustration of how anchor elements and release elements work.

FIG. 49 shows the embodiment according to FIG. 48, whereby the second release elements 23 have been removed, thus effectively and purposefully reducing the adhesive force of the μ-LEDs 1 to the module area 11.

Figure 50:
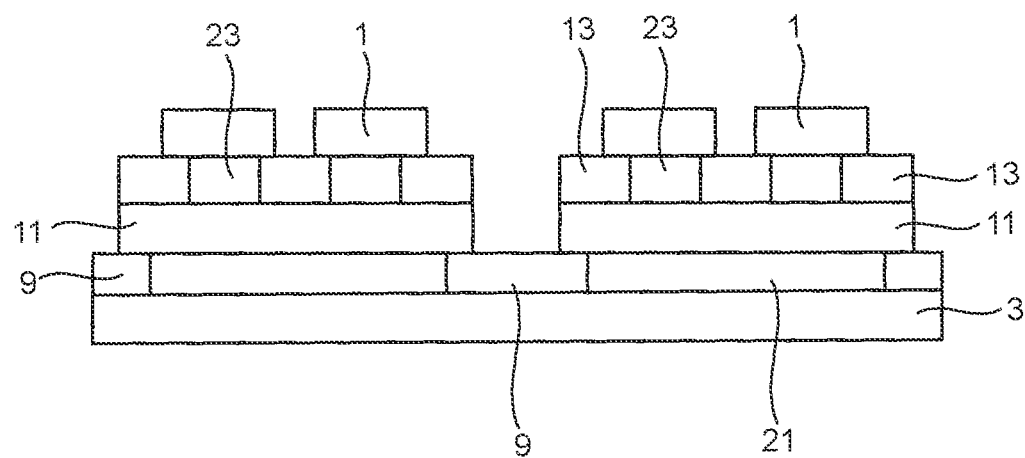
FIG. 50 shows a second embodiment of a starting structure for a transfer procedure according to some suggested aspects.

FIG. 50 shows a second start structure with μ-LEDs 1, which are connected to module areas 11 by means of second anchor elements 13 and second release elements 23, which are connected to a wafer 3 by means of first anchor elements 9 and first release elements 21. The μ-LEDs 1 are in contact with second anchor elements 13 and second enabling structures 23, which in turn are in contact with module area 11. The module areas 11 are in contact with first anchor elements 9 and first enabling elements 21. In contrast to the first start structure according to FIG. 46, enabling elements 21, 23 are used in addition to anchor elements 9, 13. In this way adhesive forces can be reduced in a targeted manner so that module areas 11 are removed first and μ-LEDs 1 afterwards by removing first release elements 21 and then second release elements 23.

The first anchor elements 9 for module areas 11 can vary in number, size and distribution. For example, they can be used to optimize a release process depending on the size of the module areas 11 in such a way that adhesive forces are selected in the correct ratio to lifting forces. A minimum lift-off force must be applied to enable lift-off. This minimum lift-off force can be set in a defined manner using anchor elements and release elements.

Figure 51A:
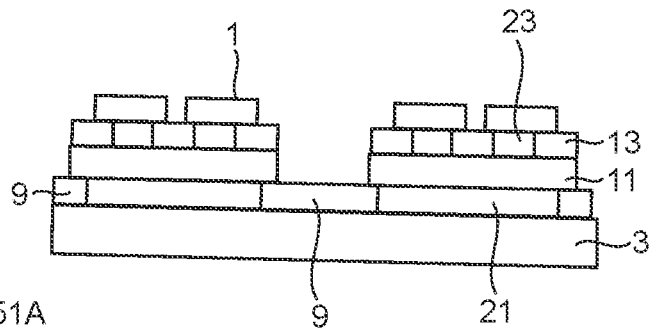
FIGS. 51A to 51E show another embodiment of a proposed procedure using the second start structure.
Figure 51B:
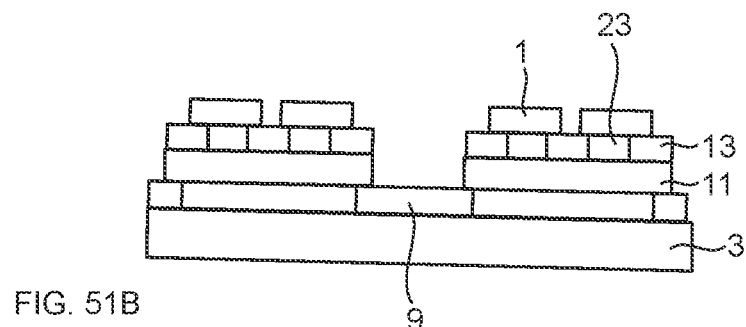
Figure 51C:
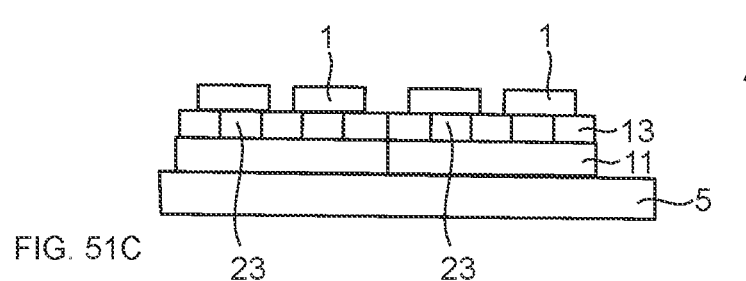
Figure 51D:
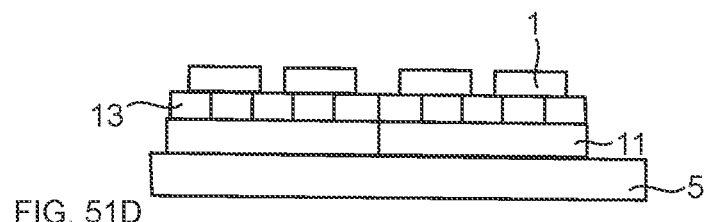
Figure 51E:
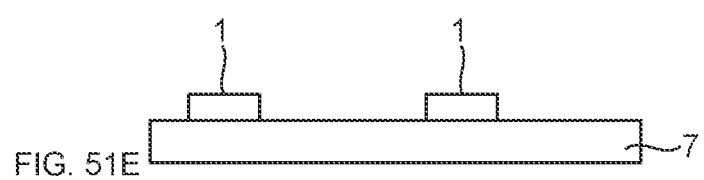

FIGS. 51A to 51E show a further example of an inventive method using the second launch structure shown in FIG. 50, which uses first release elements 21 and second release elements 23 in addition to first anchor elements 9 and second anchor elements 13. FIG. 51B shows that the first release elements 21 are removed first. FIG. 51C shows that in a first transfer step S2 module areas 11 are detached from wafer 3 and placed on the intermediate carrier 5. Then, as shown in FIG. 51D, the second release elements 23 are removed. In a second transfer step S3, the µ-LEDs 1 of module areas 11 are detached and placed on the target substrate 7. This step can be seen in FIG. 51E.

Figure 52A:
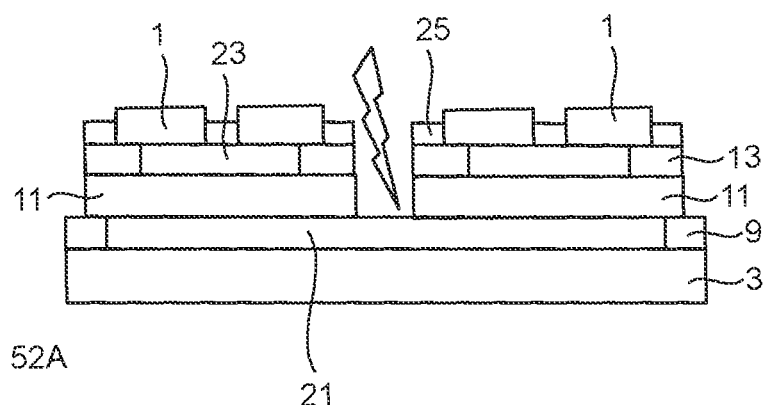
FIG. 52A is a first illustration of the selectivity of release elements according to some aspects of the proposed concept for a transfer.
Figure 52B:
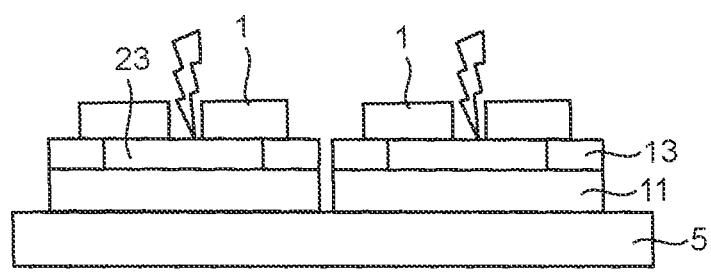
FIG. 52B shows a second illustration of the selectivity of release elements.

FIGS. 52A and 52B illustrate the aspect of selectivity of enabling elements. In FIG. 52A, the first share elements 21 are removed. FIG. 52B shows how two second release elements 23 are removed after the first release element 21 has been removed, the module areas 11 containing µ-LEDs 1 have been transferred to an intermediate carrier 5 and protective layers 25 have been removed.

Selectivity between first enabling elements 21 and second enabling elements 23 for successive removal can be achieved in different ways:
a) Different materials with different properties can be used, which are matched to each other. For example, $SiO_2$ can be etched with HF. Si can also be etched with SF6. Further possible materials are for example $SiO_2$, Si, $Al_2O_3$, SiN, SiON, AlN, HfOx, metallic layers as well as organic materials, which can be used as adhesives.
b) Different rates of material removal can be used. For example, by exposing relatively large areas of the first release element 21 to the removal process. In second release approval element 23, relatively small areas are exposed to the removal process. For example, only small openings are designed in such a way that liquids and/or gases can only penetrate slowly.
c) The second release elements 23 can be protected from the removal process by protective layers 25. After removal of the first release elements 21, the protective layers 25 can be removed, for example by dry chemical, wet chemical or gaseous etching, after which the second release elements 23 can be removed.
d) The release elements 21, 23 can be removed in different ways. For example, by means of chemical processes such as wet chemistry or by means of gas phases, by means of thermal processes, by means of mechanical processes, by means of optical processes, for example by using UV light.

FIGS. 53A to 53F show embodiments of the arrangement of second anchor elements 13 and second release elements 23 between µ-LEDs 1 and module areas 11, which are here alternatively designed as a complete carrier substrate 3. The second anchor elements 13 for the µ-LEDs 1 can vary in number, size and distribution. For example, a release process can thus be optimized depending on the size of the µ-LEDs 1 in such a way that adhesive forces are selected in the correct ratio to lift-off forces. The second release elements 23 rest against the second anchor elements 13 accordingly. Anchor element 13 and release element 23 are also arranged on a module area 11, which is a carrier substrate 3. The main surface area of the module area 11 is greater than or equal to the main surface area of the release element 23.

FIG. 53A shows an embodiment in which a second anchor element 13 forms a smaller main surface area to µ-LED 1 and is partially connected to µ-LED 1 in an edge area at one corner of µ-LED 1. A second release element 23 comprises a larger main surface area than the µ-LED 1 and is arranged on the µ-LED 1 in such a way that the second release element 23 at least partially frames the second anchor element 13.

FIG. 53B shows a further embodiment in which two second anchor elements 13 each form a smaller main surface compared to µ-LED 1 and are arranged in the edge area at opposite corners of the µ-LEDs 1. A second release element 23 comprises a larger main surface area compared to the µ-LED and is arranged on the µ-LED 1 in such a way that the second release element 23 at least partially frames the second anchor elements 13. FIG. 53C shows a further embodiment in which a second anchor element 13 forms a smaller main surface compared to the µ-LED 1 and is arranged completely on the µ-LED 1 in a core area of the µ-LED 1. A second release element 23 completely frames the second anchor element 13.

FIG. 53D finally shows another embodiment in which a plurality of µ-LEDs 1 are arranged in a row to each other. Two second anchor elements 13 each form a smaller main surface compared to a µ-LED 1 and are each partially arranged in the edge area at opposite corners of a µ-LED 1. Each anchor element 13 is arranged on two µ-LEDs 1 arranged side by side and comprises a surface area uncovered by µ-LEDs 1. A second release element 23 comprises a larger main surface area than all µ-LEDs 1 and is arranged on the µ-LEDs 1 in such a way that the second release element 23 completely frames the second anchor elements 13.

FIG. 53E shows a further embodiment in which twelve second anchor elements 13 together form a smaller main surface than the µ-LED 1 and are arranged in the interior of the µ-LEDs 1 in the form of a matrix. A second release element 23 comprises a larger main surface area than the µ-LED 1 and completely frames the second anchor elements 13. Anchor elements 13 and release element 23 are also arranged on a module area 11, which can alternatively be a wafer 3. The main surface area of the module area 11 is greater than or equal to the main surface area of the release element 23.

FIG. 53F shows a final embodiment in which a second anchor element 13 forms a larger main surface area compared to µ-LED 1 and in its core area a protrusion which is completely arranged at µ-LED 1. A second release element 23 comprises a larger main surface area than the µ-LED 1 and is arranged on the µ-LED 1 in such a way that the second release element 23 completely frames the elevation of the second anchor element 13 and is arranged on the second anchor element 13. The main surface of the module area 11 is greater than or equal to the main surface of the second anchor element 13. The main surface of the release element 23 corresponds to the main surface of the second anchor element 13.

In the following, various devices and arrangements as well as methods for manufacturing, processing and operating as items are again listed as an example. The following items present different aspects and implementations of the proposed principles and concepts, which can be combined in various ways. Such combinations are not limited to those listed below:

342. Pixel with several µ-LEDs for generating a pixel of a display, where
    the pixel is formed from at least two subpixels, in particular two subpixels of the same color emission, and in particular each subpixel is formed by a µ-LED;
    wherein a subpixel separating element is provided between two adjacent subpixels of the same pixel element; and
    wherein the subpixel separating element is configured to be separating with respect to electrical control of the respective subpixels and is configured to be optically coupling with respect to the light emitted by the respective subpixels.
343. Pixel according to item 342, wherein the subpixels have a common epitaxial layer and the subpixel separating element extends trench-like into the epitaxial layer transversely to an epitaxial layer plane in a main emission direction.

344. Pixel according to any of the preceding items, wherein the subpixels of the pixel are independently electrically contactable and/or controllable.

345. Pixel according to any of the preceding items, in which the at least two sub-pixels have a common active layer separated by the sub-pixel separator.

346. Pixel according to any of the preceding items, in which the subpixel separator extends to or at least partially through an active layer of the pixel.

347. Pixel according to any of the preceding items, in which the subpixel separation element is formed by quantum well intermixing generated by a diffused dopant, in particular in the region of the active layer.

348. Pixel according to any of the preceding items, in which a light-shaping structure is formed having first and second regions, the regions extending at least partially into a semiconductor material of the pixel.

349. Pixel according to item 348, wherein the light-shaping structure extends into a partial area of the active layer.

350. Pixel according to any of the preceding items, in which the light-shaping structure has a converter material in second areas.

351. Pixel according to any of the preceding items with a light-shaping or photonic structure having features according to any of the following or preceding items.

352. Pixel according to any of the preceding items, further comprising a microlens extending over the surface of a pixel.

353. Pixel according to any of the preceding items, in which a transparent conductive layer is formed on a surface.

354. Pixel according to any of the preceding items, wherein at least one contact surface for contacting at least one subpixel is provided on a side opposite to the light emission side.

355. Display with a large number of pixels according to any of the preceding items,
wherein a pixel element separation layer is provided between two adjacent pixels, which is adapted to separate electrically the adjacent pixels with respect to the controlling of the respective pixels and to separate optically the adjacent pixels with respect to the light emitted by the pixels.

356. Display according to item 355, wherein the pixels and the associated sub-pixels have a common epitaxial layer and the pixel element separation layer extends trench-like into the epitaxial layer transversely to the epitaxial layer plane in the main emission direction.

357. Display according to any of the preceding items, wherein a trench depth d1 of the pixel element separation layer is greater than a trench depth of the sub-pixel separation element.

358. Display according to any of the preceding items, in which adjacent pixels or sub-pixels comprise an active layer separated by a pixel element separation layer and/or a sub-pixel separation element.

359. Display according to any of the preceding items, further comprising a support layer having contact areas corresponding to contact areas of pixels, wherein in the support layer at least one of the following elements is provided:
electrically conductive lines to a power supply of the pixel,
Current driver circuits or supply circuits, in particular according to any of the items 836 to 930;
Control circuit for adjusting a brightness;
one or more fuses that are electrically connected to at least one subpixel of a pixel.

360. Method for calibrating a pixel, comprising the steps of:
driving a subpixel of a pixel according to any of the item 836 to 930;
acquiring of defect information of a subpixel;
storing of the defect information in a memory unit of the control unit.

361. Method according to item 360, wherein the driving, acquisition and storage is performed sequentially for all individual subpixels of a pixel.

362. Array with at least two µ-LEDs, wherein a respective µ-LED between an n-doped layer and a p-doped layer forms an active zone suitable for light emission, characterized in that between two adjacent formed µ-LEDs material of the layer sequence from the n-doped side and from the p-doped side up to or in cladding layers or up to or at least partially into the active zone is interrupted or removed in such a way that material transitions with a maximum thickness dC are formed, whereby electrical and/or optical conductivities in the material transition are reduced.

363. Array according to any of the preceding items, characterized in that, at the material transition, the active zone and, at least on one side of the active zone, a residual layer of small thickness.

364. Array according to item 362 or 363, characterized in that the removed material is at least partially replaced by a filling material.

365. Array according to any of the preceding item, characterized in that
the removed material is at least partially replaced by a material comprising a relatively small band gap and thus absorbing light of the active zone.

366. Array according to any of the preceding items, characterized in that
the removed material is at least partially replaced by a material with an increased refractive index, in particular greater than the refractive index of the doped material or a filler material.

367. Array according to any of the preceding items, characterized in that
the light absorbing material and/or the material with increased refractive index has been applied to a respective material transition.

368. Array according to any of the preceding items, characterised in that the material has been formed with an increased refractive index by diffusing or implanting a refractive index-increasing material into the filling material, in particular into a respective cladding layer.

369. Array according to any of the preceding items, characterised in that
a material for increasing light absorption and/or a material for increasing electrical resistance has been diffused or implanted into the active zone of a respective material transition.

370. Array according to any of the preceding items, characterised in that
along the material transitions, at or in these, at least one optical structure, in particular a photonic crystal and/or a Bragg mirror, is generated.

371. Array according to any of the preceding items, characterised in that an electrical bias voltage is applied to the two main surfaces of the material transitions by means of two opposite electrical contacts and an electrical field is generated by a respective material transition.

372. Array according to any of the preceding items, characterised in that
by means of an n-doped material and/or p-doped material applied or grown on at least one of the two main surfaces of the material transitions, an electric field is generated by a respective material transition.

373. Array according to any of the preceding items, characterised in that
the exposed main surfaces of the material transitions and/or exposed surface regions of the µ-LED are electrically insulated and passivated by means of a respective passivation layer, in particular comprising silicon dioxide.

374. Array according to any of the preceding items, characterised in that
the main surfaces of the µ-LED by contact layers are electrically contacted.

375. Array according to any of the preceding items, characterised in that
the material and/or the material transitions between one µ-LED and its adjacent µ-LEDs are formed differently from one another, in particular depending on the direction.

376. Array according to any of the preceding items, further comprising a light-shaping structure which is applied to a surface of the array facing the main emission direction, which in particular has a photonic structure with features according to any one of the following or previous items.

377. Array according to any of the preceding items, in which the light-shaping structure has areas of different refractive index.

378. Array according to item 376, in which the light-shaping structure extends into the semiconductor material of the µ-LED.

379. Array according to any of items 376 to 378, in which portions of the light-shaping structure are filled with a converter material.

380. Array according to any of the preceding items, further comprising a converter material applied to a surface facing the main radiation direction.

381. Method for producing an array of optoelectronic pixels, in particular a micropixel emitter array or a micropixel detector array, comprising the steps:
providing a whole-surface layer sequence of an n-doped layer and a p-doped layer along the array, between which an active zone suitable for light emission is formed;
at least partially removing of material between adjacent pixels to be formed from the n-doped side and from the p-doped side so that a material transition with a maximum thickness dC remains, which comprises the active zone, such that the electrical and/or optical conductivities between adjacent pixels are reduced.

382. Method according to item 381, wherein the step of removing material comprises removing the layer sequence from the n-doped side and from the p-doped side up to or into undoped cladding layers or up to or at least partially into the active zone.

383. Method according to item 381, characterized in that from the n-doped side and/or from the p-doped side the removed material is at least partially replaced by a filler material.

384. Method according to any of the preceding items, characterised in that
the removed material is at least partially replaced from the n-doped side and/or from the p-doped side by a material having a relatively small band gap and thus absorbing light of the active zone.

385. Method according to any of the preceding items, characterised in that
the removed material is replaced from the n-doped side and/or from the p-doped side by a material with an increased refractive index, in particular greater than the refractive index of the doped material or a filler material.

386. Method according to any of the preceding items, characterised in that
the light absorbing material and/or the material with increased refractive index is applied to a respective material transition.

387. Method according to any of the preceding items, characterised in that
the material with increased refractive index is formed by diffusing or implanting a material increasing the refractive index into the filling material, in particular into a respective cladding layer.

388. Method according to any of the preceding items, characterised in that
a material for increasing light absorption and/or a material for increasing electrical resistance is diffused or implanted into the active zone from the n-doped side and/or from the p-doped side.

389. Method according to any of the preceding items, characterised in that
at least one optical structure, in particular a photonic crystal and/or a Bragg mirror, is generated from the n-doped side and/or from the p-doped side along the material transitions, at or in these.

390. Method according to any of the preceding items, characterized in that
two electrical contacts opposite each other are formed from the n-doped side and from the p-doped side for applying an electrical bias voltage to the two main surfaces of the material transitions and for generating an electric field through a respective material transition.

391. Method according to any of the preceding items, characterised in that
by means of an n-doped material and/or p-doped material applied or grown on at least one of the two main surfaces of the material transitions, an electric field is established through a respective material transition.

392. Method according to any of the preceding items, characterised by
electrically insulating and passivating the exposed main surfaces of the material transitions and/or exposed surface areas of the pixels by means of a respective passivation layer, in particular comprising silicon dioxide.

393. Method according to any of the preceding items, characterised by
electrical contacting of the main surfaces of the pixels by means of contact layers.

394. Method according to any of the preceding items, characterised in that
the material and/or the material transitions between a pixel and its neighbouring pixels are formed differently from one another, in particular depending on the direction.

395. Method according to any of the preceding items, characterised in that
the steps are first performed for one major surface of the array and then, after a substrate change, for the other major surface of the array.

396. Carrier structure with flat optoelectronic components, especially µ-LEDs, comprising
a flat carrier substrate, and
at least two receiving elements that are designed to hold a first µ-LED detachably between the at least two receiving elements in such a way that the µ-LED can be moved out with a defined minimum force perpendicular to a carrier structural plane; wherein at least one receiving element of the at least two receiving elements is designed to simultaneously hold and/or support a second, adjacently arranged µ-LED.

397. Carrier structure according to item 396, wherein the receiving elements are arranged on the support substrate in such a way that the µ-LED is held by three receiving elements.

398. Carrier structure according to item 396, wherein at least two receiving elements of the three receiving elements are configured to hold and/or support a further adjacent µ-LED.

399. Carrier structure according to one of the items 396 to 398, wherein a delamination layer is provided, which is arranged between the receiving element and the µ-LED and remains on the receiving element in particular after the µ-LED has been moved out.

400. Carrier structure according to any of the preceding items, wherein the receiving elements are arranged in a mesa trench of a semiconductor wafer.

401. Carrier structure according to any of the preceding items, in which the support substrate and the receiving elements are made in one piece.

402. Carrier structure according to any of the preceding items, wherein the support elements are configured to hold a µ-LED laterally and from a bottom side of the µ-LED.

403. Carrier structure according to any of the preceding items, wherein the receptacle elements have µ-LED holding surfaces which are inclined relative to the carrier substrate plane so that a holding force on the µ-LED is reduced when the µ-LED is moved away from the receptacle elements.

404. Carrier structure according to any of the preceding items, wherein at least one of the receiving elements is adapted to receive a lateral corner portion or side surface of a µ-LED.

405. Carrier structure according to any of the preceding items, wherein a contact area between the receiving element and µ-LED is less than 1/20, in particular less than 1/50 of a total area of the µ-LED.

406. Carrier structure according to any of the preceding items, in which the first µ-LED and second µ-LED partially rest on the at least one receiving element, and between the first and second µ-LED a part of the surface of the receiving element is exposed or rises between the first and second µ-LED.

407. µ-LED with a semiconductor layer stack which comprises an active layer and which is arranged on a carrier structure according to any of the preceding items.

408. µ-LED according to item 407, said µ-LED comprising a peripheral region formed by the mesa trench, wherein the active layer in said peripheral region has a band gap increased by quantum well intermixing.

409. µ-LED according to any of the preceding items, in which an edge region comprises a protuberance, which is arranged on the support structure.

410. Carrier structure according to any of the preceding items articles containing a µ-LED, in particular a µ-LED according to any of the preceding items.

411. Method for transferring at least two µ-LEDs, in particular optoelectronic components, wherein the at least two µ-LEDs are arranged on a common receiving element of a carrier and the carrier comprises a sacrificial layer on which the µ-LEDs are arranged, comprising the steps:
removing of the sacrificial layer on which the µ-LEDs are arranged, so that the µ-LEDs are held by the common receiving element;
removing at least one of the at least two µ-LEDs from the common mounting element.

412. Method for producing a µ-LED, comprising the steps:
providing of a substrate;
applying of a sacrificial layer, in particular comprising AlGaAs or InGaAlP, to the substrate;
creating a functional layer stack with an active layer between oppositely doped semiconductor layers;
applying of a first electrically conductive contact layer on a first major surface side of the functional layer stack;
forming at least one holding structure which is attached to the substrate, supports the functional layer stack and from which a contacted functional layer stack can be broken off during lift-off;
at least partial removing of the sacrificial layer located between a second major surface side of the functional layer stack and the substrate;
applying a second electrically conductive contact layer to the second main surface side of the functional layer stack in the area of the removed sacrificial layer.

413. Method according to item 412, wherein the step of generating a functional layer stack comprises the step of
forming one or more quantum wells or quantum wells in the active layer.

414. Method according to any of the preceding items, wherein the step of creating a functional layer stack comprises the step of:
forming of a quantum well intermixing in edge regions of the active layer and/or in regions, which are at least adjacent to the retaining structure or adjacent to a possible break-off edge.

415. Method according to item 414, wherein the step of forming a quantum well intermixing comprises:
providing a structured photomask on the functional layer stack;
applying of a dopant with first process parameters;
diffusing and/or formation of quantum well intermixing with second process parameters.

416. Method according to any of the preceding items, in which the step of creating a functional layer stack comprises the step forming a quantum well intermixing with features according to any of the preceding items.

417. Method one of the previous articles, further comprising: lifting the contacted functional layer stack by breaking it off the holding structure and positioning it on a secondary substrate.

418. Method according to any of the preceding items, in which the step of forming the support structure comprises
forming of the retaining structure, in particular having a conical shape, on the functional layer stack from its first main surface side into the substrate.

419. Method according to any of the preceding items, in which the step of applying a first electrically conductive contact layer comprises:

Application of a first bearing layer to the functional layer stack on its first main surface side;
  applying of the first electrically conductive contact layer to the first support layer, wherein the first support layer and the first electrically conductive contact layer are attached to the substrate at least at one point and thus form the support structure at least partially.

420. Method according to any of the preceding items, wherein the step comprises applying a second electrically conductive contact layer:
  applying a second support layer to the second major surface side of the functional layer stack facing the substrate directly to the functional layer stack; and
  applying the second electrically conductive contact layer to the second base layer.

421. Method according to any of the preceding items, in which the structure is formed at least partially epitaxially or by means of steam or electroplating.

422. Method according to any of the preceding items, in which the structure of the functional layer stack is passivated by means of the retaining structure, whereby the retaining structure can in particular be transparent.

423. Method according to any of the preceding items, characterised by
  removing of the sacrificial layer by wet chemical etching.

424. Method according to any of the preceding items, characterised by
  removing of the sacrificial layer in two steps, before and after applying the second electrically conductive contact layer.

425. Method according to any of the preceding items, further comprising:
  covering one flank of the functional layer stack with a passivation layer.

426. Method according to any of the preceding items, characterised by
  diffusing of a metal, in particular Zn, from a flank of the functional layer stack into an outer edge region of the functional layer stack.

427. Method according to any of the preceding items, characterised by
  applying of the first and/or the second electrically conductive contact layer by sputtering, vaporizing or electroplating.

428. µ-LED or µ-LED module or array of µ-LEDs, comprising:
  a functional layer stack; wherein
  a first electrically conductive contact layer is applied to a first main surface side of the functional layer stack facing away from a substrate and a second electrically conductive contact layer is applied to a second main surface side of the functional layer stack facing the substrate; wherein
  the contacted functional layer stack is supported by at least one holding structure which is attached to the substrate and from which the contacted functional layer stack can be broken off during lift-off.

429. µ-LED or µ-LED module or array of µ-LEDs according to item 428, characterized in that
  the functional layer stack has an optically active layer between oppositely doped layers, in particular an active layer formed by one or more quantum wells.

430. µ-LED or µ-LED module or array of µ-LEDs according to any of the preceding items, in which the active layer has an increased band gap in edge regions of the µ-LED and/or in regions, which are at least adjacent to the holding structure or adjacent to a possible break-off edge.

431. µ-LED or µ-LED module or array of µ-LEDs according to any of the preceding items, comprising quantum well intermixing in edge regions of the active layer or in regions of the active layer adjacent to the support structure or adjacent to a possible break-off edge.

432. µ-LED or µ-LED module or array of µ-LEDs according to any of the preceding items, characterized in that
  the contacted functional layer stack was transferred to a secondary substrate by lifting and positioning.

433. µ-LED or µ-LED module or array of µ-LEDs according to any of the preceding items characterized in that
  the substrate comprises GaAs.

434. µ-LED or µ-LED module or array of µ-LEDs according to any of the preceding items, characterised in that
  the support structure comprises in particular InGaAlP or AlGaAs or BCB or an oxide, for example $SiO_2$, or a nitride or a combination of such materials, and/or is in particular electrically non-conductive.

435. µ-LED or µ-LED module or array of µ-LEDs according to any of the preceding items, characterised in that
  a first supporting layer comprises, in particular InGaAlP and/or AlGaAs, attached to the functional layer stack on the first main surface side.

436. µ-LED or µ-LED module or array of µ-LEDs according to any of the preceding items, characterised in that
  a second supporting layer attached to the functional layer stack on the second main surface side comprises in particular InGaAlP and/or AlGaAs.

437. µ-LED or µ-LED module or array of µ-LEDs according to any of the preceding items, characterised in that
  the first and/or the second electrically conductive contact layer comprises ITO or ZnO or a metal and/or in particular are attached to a first and a second supporting layer.

438. µ-LED or µ-LED module or array of µ-LEDs according to any of the preceding items, characterised in that
  the µ-LED is smaller than 70 µm, in particular smaller than 50 µm or smaller than 20 µm or smaller than 10 µm.

439. Method for picking up and placing optoelectronic semiconductor chips, wherein
  electron-hole pairs are generated in optoelectronic semiconductor chips and an electric dipole field is thereby generated in the vicinity of the respective optoelectronic semiconductor chip,
  a recording tool generates an electric field, and
  the optoelectronic semiconductor chips are picked up with the pick-up tool during or after the generation of the electron-hole pairs and deposited at predetermined positions.

440. Method according to item 439, where the optoelectronic semiconductor chips are µ-LEDs or LEDs.

441. Method according to item 439 or 440, wherein the optoelectronic semiconductor chips for generating the electron-hole pairs are irradiated with light having a predetermined wavelength or a predetermined wavelength range.

442. Method according to item 441, wherein the light for generating the electron-hole pairs is incident on the optoelectronic semiconductor chips through the pick-up tool.

443. Method according to item 442, wherein the optoelectronic semiconductor chips are arranged on a carrier and the light for generating the electron-hole pairs falls through the carrier onto the optoelectronic semiconductor chips.

444. Method according to any of the preceding items, wherein a plurality of optoelectronic semiconductor chips are provided and the electrical dipole fields are generated only in selected optoelectronic semiconductor chips of the plurality of optoelectronic semiconductor chips.

445. Method according to any of the preceding items, whereby the pick-up tool generates an electric field only in predetermined areas.

446. Method according to any of the preceding items, wherein the pick-up tool has a plurality of elevations on a surface facing the optoelectronic semiconductor chips, and the optoelectronic semiconductor chips are picked up by the elevations of the pick-up tool.

447. Method according to any of the preceding items, wherein at least a portion of a surface of the pick-up tool facing the optoelectronic semiconductor chips is flat, and the optoelectronic semiconductor chips are picked up with the flat portion of the pick-up tool.

448. Method according to any of the preceding items, wherein the pick-up tool has the shape of a cylinder, which is rolled over the optoelectronic semiconductor chips to pick up the optoelectronic semiconductor chips.

449. Method according to any of the preceding items, wherein for depositing the optoelectronic semiconductor chips the electric field generated by the pick-up tool is changed.

450. Method according to any of the preceding items, wherein the pick-up tool for picking up the optoelectronic semiconductor chips directly contacts the optoelectronic semiconductor chips and holds them by means of Van der Waals forces.

451. Apparatus for picking up and putting down optoelectronic semiconductor chips, µ-LED arrays or µ-LED according to any of the preceding or subsequent items, comprising:
  an excitation element for generating electron-hole pairs in optoelectronic semiconductor chips in order to generate an electric dipole field in the vicinity of the respective optoelectronic semiconductor chip, and
  a pick-up tool for picking up and depositing the optoelectronic semiconductor chips, wherein the pick-up tool is configured such that it generates an electric field, then picks up the optoelectronic semiconductor chips with the electron-hole pairs generated by the excitation element and deposits the optoelectronic semiconductor chips at predetermined locations.

452. Apparatus according to item 451, wherein the excitation element is configured to generate light with a predetermined wavelength or a predetermined wavelength range for generating the electron-hole pairs in the optoelectronic semiconductor chips.

453. Apparatus according to item 452, wherein the excitation element is arranged in such a way that the light for generating the electron-hole pairs is incident on the optoelectronic semiconductor chips through the pick-up tool or through a carrier on which the optoelectronic semiconductor chips are arranged.

454. Apparatus according to one of the items 451 to 453, wherein the pick-up tool has a plurality of projections on a surface facing the optoelectronic semiconductor chips, and the optoelectronic semiconductor chips are picked up by the projections of the pick-up tool.

455. Apparatus according to any one of the items 451 to 453, wherein at least a portion of a surface of the pick-up tool facing the optoelectronic semiconductor chips is flat and the optoelectronic semiconductor chips are picked up with the flat portion of the pick-up tool.

456. Apparatus according to any one of the items 451 to 453, wherein the pick-up tool has the shape of a cylinder, which is rolled over the optoelectronic semiconductor, chips to pick up the optoelectronic semiconductor chips.

457. Method for processing a number of arrays of optoelectronic components, in particular µ-LEDs or µ-LED arrangements, comprising the following steps:
  generating of µ-LEDs on a carrier substrate with a first density;
  executing of first transfer steps by means of a first transfer stamp, which transfers the optoelectronic microchips onto an intermediate carrier of the first density;
  carrying out second transfer steps by means of a second transfer stamp, which transfers the optoelectronic microchips from the intermediate carrier to a target substrate with a second density smaller by a factor n than the first density, which provides a common array area for a respective one of the number of arrays, in particular for all three colors, wherein the size of the intermediate carrier is equal to or larger than that of the second transfer stamp and the size of the second transfer stamp is equal to or smaller by a factor k than that of the array area.

458. Method according to item 457, characterized in that the µ-LEDs are generated connected to respective module areas, which are generated connected to the carrier substrate.

459. Method according to item 458, characterized in that when the µ-LEDs are generated, first armature elements for connecting with a first adhesive force are formed between module areas and the carrier substrate and/or second armature elements for connecting with a second adhesive force are formed between the µ-LEDs and the module areas.

460. Method according to any of the preceding items, characterised in that
  when carrying out the first transfer steps, the lifting force of the lifting first transfer stamp is set to be greater than the first adhesive force and less than the second adhesive force in such a way that the module areas are lifted off the carrier substrate and transferred to the intermediate carrier.

461. Method according to any of the preceding items, characterised in that
  when carrying out the second transfer steps, the lifting force of the lifting second transfer stamp is set to be greater than the second holding force in such a way that the µ-LEDs are lifted off the module areas and transferred to the target substrate.

462. Method according to any of the preceding items, characterised in that
  when generating the µ-LEDs, first release elements for connecting with an additional first adhesive force are additionally formed between the module areas and the carrier substrate and/or second release elements for connecting with an additional second adhesive force are additionally formed between the µ-LEDs and the module areas.

463. Method according to item 462, characterized in that when carrying out the first transfer steps, the lifting force of the lifting first transfer stamp is set to be greater than the total first adhesive force and less than the total second adhesive force in such a way that the module areas are lifted off the wafer and transferred to the intermediate carrier.

464. Method according to item 463, characterized in that the additional initial holding force has been reduced, especially to zero, by removing the first release elements beforehand.

465. Method according to any of the preceding items, characterised in that
when carrying out the second transfer steps, the lifting force of the lifting second transfer stamp is set to be greater than the total second holding force in such a way that the μ-LEDs are lifted off the module areas and transferred to the target substrate.

466. Method according to item 465, characterized in that
the additional second holding force has been reduced, in particular to zero, by means of prior removing the second release elements.

467. Method according to any of the preceding items, characterized in that
for the adhesion of the module areas on the intermediate carrier, materials with a respective adhesive force greater than the total second adhesive force must be used.

468. Method according to any of the preceding items, characterized in that
when generating the μ-LEDs for carrying out the first transfer steps, lifting elements are formed directly on the module areas for lifting and transferring the module areas to the intermediate carrier.

469. Method according to any of the preceding items, characterised in that
when generating the microchips for carrying out the first transfer steps, positioning elements are formed directly on the module areas for the precise transfer of the module areas to the intermediate carrier.

470. Method according to any of the preceding items, characterised in that
to carry out the second transfer steps, tapping elements are formed on the second transfer die for thinning the microchips to the second density.

471. Method according to any of the preceding items, characterised in that
the size of the, in particular rectangular, first transfer stamp is chosen to be smaller by a factor s than the size of the, in particular round, wafer in such a way that the size of an area of lost μ-LEDs at the edge of the carrier substrate for the first transfer for complete loading of the intermediate carrier is small, in particular per color less than or equal to 20% or less than or equal to 30% of the carrier substrate area.

472. Method according to any of the preceding items, characterised in that
the size of the, in particular rectangular, first transfer stamp is chosen to be smaller than the size of the intermediate carrier by the factor r in such a way that the number of first transfer steps r for the first transfer for complete loading of the intermediate carrier is small, in particular per color less than or equal to 10 or less than or equal to 50.

473. Method according to any of the preceding items, characterised in that
the shape of the intermediate carrier corresponds to the shape of the second transfer stamp and said shape in particular to the shape of the array surface.

474. Method according to any of the previous items, characterised in that
the intermediate carrier is equipped with tested module areas of the carrier substrate or several, in particular different, carrier substrates.

475. Method according to any of the preceding items, characterised in that
the distances between the μ-LEDs on the respective carrier substrate correspond to the distances between the μ-LEDs on the intermediate carrier substrate.

476. Method according to any of the preceding items, characterised in that
the distances between microchip on a respective intermediate carrier and on a respective target substrate in an x-direction are different from those in a y-direction.

477. Method according to any of the preceding items, characterised in that
the target substrate is loaded with several intermediate carriers.

478. Method according to any of the preceding items, characterised in that
the color of the μ-LEDs of a respective intermediate carrier is monochrome red, green or blue and the number of arrays is formed from three intermediate carriers, which have μ-LEDs of different colors to each other.

479. Method according to any of the preceding items, characterised in that
between carrier substrate and module areas first release elements and then between μ-LEDs and module areas second release elements are selectively removed.

480. Array with a multitude of μ-LEDs, μ-LED modules or μ-LED arrays, which are manufactured in particular for each of the colors red, green and blue by the following steps:
generating μ-LEDs, on a carrier substrate with a first density;
executing of first transfer steps by means of a first transfer stamp, which transfers the μ-LEDs to an intermediate carrier of the first density;
carrying out second transfer steps by means of a second transfer stamp which transfers the μ-LEDs from the intermediate carrier to a target substrate with a second density which is smaller by a factor n than the first density, wherein the intermediate carrier provides a common array area for a respective one of the arrays, in particular for all three colors, wherein the size of the intermediate carrier is equal to or larger than that of the second transfer stamp and the size of the second transfer stamp is equal to or smaller by a factor k than that of the array area.

481. Array comprising a plurality of μ-LEDs, μ-LED modules or μ-LED arrays manufactured by a process according to any of the preceding items.

482. Start structure for use in a process according to any of the preceding items, characterized in that
module areas are attached to a carrier substrate by means of first anchor elements, and
μ-LEDs are attached to the module areas by means of second armature elements.

483. Start structure for use in a process according to any of the preceding items,
characterised in that
module areas are fixed to a carrier substrate by means of first anchor elements and removable first release elements, and
μ-LEDs are attached to the module areas by means of second armature elements and removable second release elements.

484. Method for producing modules of μ-LEDs, comprising the steps of:
generating at least one layer stack providing a base module on a carrier having a first layer, an active layer applied thereto and a second layer formed thereon;

exposing a surface area of the first layer facing away from the substrate;

forming a first contact on a surface area of the second layer facing away from the carrier;

forming a second contact on the surface area of the first layer facing away from the carrier.

485. Method according to item 484, characterized in that forming a second contact comprises:

forming an electrically insulating dielectric over a portion of the active layer and the second layer forming the second contact with a conductive material, which electrically contacts the remote surface area of the first layer via the dielectric to a surface area of the second layer remote from the carrier.

486. Method according to item 484 or 485, characterised by exposing the surface region of the first layer remote from the substrate by means of a flat edge structuring of the at least one stack of layers, in particular from the side of the second layer, a flat trench in particular being produced around the respective stack of layers.

487. Method according to any of the preceding items, characterised by generating a plurality of base modules as a matrix along an X-Y plane along at least one row and along at least one column, wherein base modules of a respective row are oriented in the same way.

488. Method according to item 487, characterized in that the base modules of two adjacent lines are oriented in the same way; or that the base modules of two adjacent lines are oriented in opposite directions, whereby contacts of the same polarity, in particular first contacts, are thus arranged adjacent to one another.

489. Method according to item 488, characterised by generating of a common layer stack of two adjacent base modules oriented opposite to each other.

490. Method according to any of the preceding items, characterised by at least one of the following steps:

grouping a number of base modules to form at least one μ-LED module, in particular rectangular or square along the X-Y plane, wherein, in particular in a plurality of rows, each row has the same columns occupied by base modules; and forming the at least one μ-LED module from the plurality of base modules by means of a deep edge structuring through the first layer, in particular from the side of the second layer.

491. Method according to any of the preceding items, characterised in that the base modules are arranged on a different carrier when structuring the deep edges, as opposed to exposing the first and second contacts.

492. Method according to any of the preceding items, characterised by at least one of the following steps:

detaching the base module or μ-LED module from the carrier Laser Lift-Off; and detaching the base module or μ-LED module from the carrier, using a mechanical process.

493. Method according to any of the preceding items, characterised by a contacting the contacts of the μ-LED module to a replacement carrier or end carrier, especially by means of flip-chip technology.

494. Method according to item 493, characterized in that common contact areas can be created for contacts of adjacent oppositely oriented base modules of the μ-LED module.

495. Method according to any of the preceding items, characterized in that the first layer is n-doped and the second layer is p-doped, the active layer being configured in particular to emit blue or green light; and/or in that the first layer is p-doped and the second layer is n-doped, the active layer being configured in particular to emit red light.

496. Method according to any of the preceding items, characterized in that the at least one layer stack is created by epitaxy; and/or in that exposure and/or grouping is performed by means of etching.

497. Method according to any of the preceding items, further comprising a generating of quantum well intermixing in areas of the active layer adjacent to a deep edge structuring.

498. μ-LED module comprising at least one layer stack forming a base module, with a first layer formed on a carrier, an active layer and a second layer, wherein a first contact is formed in or on a surface region of the second layer facing away from the carrier, and a second contact is formed in or on the surface region of the first layer facing away from the carrier, and the first and second contact are spaced apart from one another.

499. μ-LED module according to item 498, in which a light-emitting surface is formed on a side of the stack of layers facing away from the first and second contact.

500. μ-LED module according to item 498, characterized in that the second contact is formed by means of a dielectric to the transition layer and to the second layer electrically insulated from and on the surface region of the second layer remote from the carrier.

501. μ-LED module according to item 499, characterized in that the μ-LED module comprises a plurality of base modules arranged in a matrix of at least one row and at least one column.

502. μ-LED module according to item 501, in which a μ-LED adjacent to the μ-LED module is separated by a deep edge structuring.

503. μ-LED module according to item 502, in which regions of the active layer which run adjacent to a deep edge structure have an elevated band structure produced in particular by quantum well intermixing.

504. μ-LED module according to any of the preceding items, characterized in that the base modules of two adjacent lines are oriented in opposite directions so that contacts of the same polarity, in particular first contacts, are arranged adjacent to each other.

505. μ-LED module according to any of the preceding items, characterised in that the module, in particular a light-emitting diode module, has been produced by means of a process according to any of the preceding items.

506. μ-display or μ-LED display module with an all-surface target matrix formed on a first carrier, which has rows and columns of μ-LEDs, occupy-able locations, one or more μ-LED modules following one of the items 498 to 505 comprising one or more base modules whose size corresponds to the vacant positions;

characterised in that the μ-LED modules are positioned and electrically connected to the first carrier in the target matrix in such a way that a number of base modules remain unoccupied in the target matrix, at least some of which each have at least one sensor element positioned and electrically connected.

507. μ-display or μ-LED display module according to item 506, characterized in that
a plurality of full-surface target matrices formed on the first carrier and of equal or different size to one another are formed along rows and columns with target matrix-occupy-able locations at respective distances from one another.

508. μ-display or μ-LED display module according to item 506 or 507, characterized in that
the base modules form rectangles in a matrix plane, and in μ-LED modules any number of base modules adjacent to each other along a common side are grouped together.

509. μ-display or μ-LED display module according to any of the preceding items, characterized in that
at least one μ-LED module comprises four base modules in two rows and two columns.

510. μ-display or μ-LED display module according to any of the preceding items, characterized in that
at least one μ-LED module comprises three base modules in two rows and two columns.

511. μ-display or μ-LED display module according to any of the preceding items, characterized in that
at least seven μ-LED modules, each with four base modules, and
at least two μ-LED modules, each with three base modules, are positioned and electrically connected to the target matrix.

512. μ-display or μ-LED display module according to item 511, characterized in that
in that at least two positions which are unoccupied by base modules are produced, at which in each case at least one sensor element is positioned and electrically connected.

513. μ-display or μ-LED display module according to item 512, characterized in that
the positions occupied by sensor elements are framed by base modules.

514. μ-display or μ-LED display module according to any of the preceding items, characterized in that
the base modules are configured to emit electromagnetic radiation from a first side of the first carrier.

515. μ-display or μ-LED display module according to any of the preceding items, characterized in that
the μ-LED modules comprise base modules, which are configured as subpixels.

516. μ-display or μ-LED display module according to any of the preceding items, characterized in that
the locations of the target matrices are configured as subpixels of a pixel.

517. μ-display or μ-LED display module according to any of the preceding items, characterized in that
a plurality of sensor elements are formed as part of sensor means formed on said first carrier to receive electromagnetic radiation incident on a first side of said first carrier.

518. μ-display or μ-LED display module according to any of the preceding items, characterized in that
at least one sensor element is configured as a vital sign monitoring sensor.

519. μ-display or μ-LED display module according to item 519, where
said vital sign monitoring sensor is disposed within a display screen or behind the rear surface of a display screen, and said vital sign monitoring sensor is adapted to measure one or more vital sign parameters of a user placing a body part to the front major surface of the display screen at said vital sign monitoring sensor.

520. μ-display or μ-LED display module according to any of the preceding items, characterized in that
a base module comprises in each case a first layer, which is formed on a second carrier and on which an active transition layer is formed and on which a second layer is formed, a first contact being connected to a surface region of the second layer which faces away from the second support, a second contact being connected to a surface region of the first layer which faces away from the second support.

521. μ-display or μ-LED display module according to item 520, in which
the second contact is formed by means of a dielectric to the transition layer and to the second layer, electrically insulated from and on the surface region of the second layer remote from the second carrier.

522. μ-display or μ-LED display module according to any of the preceding items, characterized in that
the respective sensor element is adapted in the form of a μ-photodiode, or in the form of a phototransistor, or in the form of a photoconductor, or in the form of an ambient light sensor, or in the form of an infrared sensor, or in the form of an ultraviolet sensor, or in the form of a proximity sensor, or in the form of an infrared component.

523. Method for producing a μ-display or μ-LED display module with a whole-surface target matrix formed on a first carrier and having rows and columns of target matrixes which can be occupied by base modules,
wherein a number of base modules are formed on a second carrier in a starting matrix having a spacing, equal to the target matrix, of points which can be occupied by base modules, in particular by means of a flat mesa etching, are grouped there, in particular by means of a deep mesa etching, to form a number of μ-LED modules and these μ-LED modules are separated from the second carrier, in particular by means of laser lift-off or a mechanical or chemical process,
characterised in that
the μ-LED modules are positioned and electrically connected on the first carrier in the target matrix in such a way that a number of base modules remain unoccupied in the target matrix, at least some of which at least one sensor element in each case is positioned and electrically connected.

524. Method according to item 523, characterized in that
a plurality of full-surface target matrices of identical or different sizes formed on the first carrier are formed along rows and columns with target matrix-occupyable locations at respective distances from one another.

525. Method according to any of the preceding items, characterised in that
the base modules form rectangles in a matrix plane, and in μ-LED modules any number of base modules adjacent to each other along a common side can be grouped together.

526. Method according to any of the preceding items, wherein in at least one μ-LED module four base modules can be grouped in two rows and two columns.

527. Method according to any of the preceding items, wherein in at least one μ-LED module three base modules can be grouped in two rows and two columns.

528. Method according to any of the preceding items, characterised in that
at least seven µ-LED modules, each with four base modules, and at least two µ-LED modules, each with three base modules, are positioned and electrically connected to the target matrix in such a way that at least two positions which are unoccupied by base modules are generated at which in each case at least one sensor element is positioned and electrically connected.

529. Method according to any of the preceding items, wherein the positions occupied by sensor elements are framed by base modules.

530. Method according to any of the preceding items, wherein the base modules are configured to emit electromagnetic radiation from a first side of the first carrier.

531. Method according to any of the preceding items, characterised in that
a plurality of sensor elements are formed as part of sensor means formed on said first carrier to receive electromagnetic radiation incident on a first side of said first carrier.

532. Method according to any of the preceding items, characterised in that
a sensor element is configured as a vital sign monitoring sensor.

533. Method according to item 532, characterised in that
said vital sign monitoring sensor is disposed within a display screen or behind the rear surface of a display screen, wherein said vital sign monitoring sensor is adapted to measure one or more vital sign parameters of a user who places a body part to the front major surface of the display screen at said vital sign monitoring sensor.

534. Method according to any of the preceding items, characterised in that
a base module has in each case a first layer formed on a second carrier, on which an active transition layer and on said active transition layer a second layer is formed, a first contact being connected to a surface region of the second layer facing away from the support, a second contact being connected to a surface region of the first layer facing away from the second support.

535. Method according to item 534, characterized in that the second contact is formed by means of a dielectric to the transition layer and to the second layer, electrically insulated from and on the surface region of the second layer remote from the second carrier.

536. Method according to any of the preceding items, characterised in that
a sensor element is formed in each case in the form of a micro-photodiode, or in the form of a phototransistor, or in the form of a photo-resistor, or in the form of an ambient light sensor, or in the form of an infrared sensor, or in the form of an ultraviolet sensor, or in the form of a proximity sensor, or in the form of an infrared component.

537. µ-LED module comprising:
a body with a first major surface and four lateral surfaces;
at least three contact pads arranged on the first main surface, wherein a µ-LED with an edge length of 15 µm or less is arranged on at least one of the at least three contact pads;
a plurality of contact bars, one contact bar being electrically connected to one of the at least three contact pads in each case, and the three contact bars being arranged on the first main surface and at least one of the four side surfaces.

538. µ-LED module according to item 537, further comprising:
a fourth contact bar arranged on a second of the four side faces and which
is connected on the first major surface to a fourth contact pad electrically connected to the at least one µ-LED; or
is electrically connected on the first main surface to an optically transparent contact pad which electrically connects the at least one µ-LED on a side opposite the at least one of the three contact pads.

539. µ-LED module according to item 537, in which the second side surface of the four side surfaces has only the fourth contact bar.

540. µ-LED module according to any of the preceding items, where at least two of the three contact bars are arranged on different side surfaces.

541. µ-LED module according to any of the preceding items, in which the body forms a prismatic body in which the first major surface forms an angle of 90° or more with each of the four lateral surfaces.

542. µ-LED module according to any of the preceding items, further comprising:
a second major surface substantially opposite the first major surface; wherein
the second main surface has a larger area than the area of the first main surface.

543. µ-LED module according to any of the preceding items, where the side surfaces are not perpendicular to the first main surface.

544. µ-LED module according to any of the preceding items, further comprising:
a second main surface opposite the first main surface;
at least three contact pads arranged on the second main surface and connected to one of the at least three contact bars on at least one of the four side surfaces.

545. µ-LED module according to any of the preceding items, in which the contact bars and/or the contact pads comprise a metal tab, in particular a vapour-deposited metal tab, the thickness of which is less than 5 µm, in particular less than 2 µm.

546. µ-LED module according to any of the preceding items, the body comprising
at least one through hole at least partially filled with an electrically conductive material, wherein the electrically conductive material on the first main surface is connected to one of the at least three contact pads arranged on the first main surface.

547. µ-LED module according to any of the preceding items, in which the body comprises a recess on the second main surface in which at least one contact bar runs, which connects a contact pad on the second main surface to a through-hole and at least one optoelectronic component arranged on the first main surface is connected to the through-hole.

548. µ-LED module according to any of the preceding items, in which the body comprises silicon and/or has a thickness of less than 30 µm, in particular in the range 5 to 15 µm.

549. µ-LED module according to any of the preceding items, in which the contact bars each run along one corner of two side surfaces from the first main surface to the second main surface.

550. Method for producing µ-LED module, comprising the steps:
  providing a structured membrane wafer having a plurality of substantially V-shaped trench-shaped depressions such that a first major surface of the structured membrane wafer bounded by trenches forms an angle of 90° or greater with the edges of the trenches;
  producing of contact pads on the first main surface of the membrane wafer, including optional rewiring
  applying of at least one µ-LED;
  applying of a temporary support facing the first main surface;
  Etching back the membrane wafer to around or just before the trenches;
  applying of rear contacts and optional separation to form a µ-LED module.

551. Method for producing a pixel array comprising the steps of:
  providing a substrate for the field-like arrangement of pixels on the substrate and for electrical contacting of the pixels, said substrate providing a set of primary contacts for a pixel, said set of primary contacts being for electrically contacting a group of µ-LEDs of said pixel, said substrate also providing a set of spare contacts for said pixel,
  equipping the primary contacts of the pixel with the group of µ-LEDs, whereby the set of replacement contacts of the pixel is not equipped,
  identifying a faulty µ-LED or a faulty contact in the group of µ-LEDs, and
  equipping one spare contact of the set of spare contacts of the pixel with a spare µ-LED for the faulty µ-LED or the faulty contacting.

552. Method according to item 551, characterized in that the steps of identifying a defective µ-LED in the group of µ-LEDs and providing a replacement contact with a replacement µ-LED for the identified µ-LED are repeated until a replacement µ-LED is present in the pixel for each µ-LED identified as defective.

553. Method according to any of the preceding items, characterised in that
  a µ-LED identified as faulty is not removed.

554. Method according to any of the preceding items, characterised in that
  a µ-LED identified as defective and the replacement µ-LED are intended to emit light of the same color.

555. Method according to any of the preceding items, characterised in that
  the group of µ-LEDs comprises one or more sets of RGB µ-LEDs.

556. Method according to any of the preceding items, characterised in that
  no replacement contact of the pixel is equipped with a replacement µ-LED, if no faulty µ-LED is found in the pixel.

557. Method according to any of the preceding items, characterised in that
  the primary contacts and/or the replacement contacts are configured for contacting the µ-LED or the replacement µ-LEDs on the anode side or on the cathode side or both on the anode and cathode side.

558. Method according to any of the preceding items, characterised in that
  a µ-LED or a replacement µ-LED is a µ-LED or a µ-LED module or a base module according to features according to any of the preceding items.

559. Method according to any of the preceding items, characterised in that
  an electrical contact for an identified, faulty µ-LED is disconnected.

560. Method according to any of the preceding items, characterised in that
  the replacement contact is equipped with a replacement µ-LED for a µ-LED identified as faulty, irrespective of the color of the light emitted by the replacement µ-LED.

561. Method according to any of the preceding items, characterised in that
  all primary contacts of the pixel are equipped with µ-LEDs.

562. Pixel field, with:
  a substrate for field-like arrangement of pixels on the substrate and for electrical contacting of the pixels,
  the substrate providing a set of primary contacts for at least one pixel, the set of primary contacts of the pixel being adapted for electrical contacting of a group of µ-LEDs, the substrate also providing a set of spare contacts for the at least one pixel,
  wherein the primary contacts of the pixel are equipped with the group of µ-LEDs,
  wherein the group of µ-LEDs comprises a faulty, deactivated µ-LED, and
  wherein one spare contact of said set of spare contacts of said pixel is equipped with a spare µ-LED as a replacement for said faulty, deactivated µ-LED.

563. Pixel field according to item 562,
characterised in that
  the number of occupied spare contacts is different for at least two pixels.

564. µ-display comprising a pixel array according to any of the preceding items or a pixel array produced by a process according to any of the preceding items.

The description with the help of the exemplary embodiments does not limit the various embodiments shown in the examples to these. Rather, the disclosure depicts several aspects, which can be combined with each other and also with each other. Aspects that relate to processes, for example, can thus also be combined with aspects where light extraction is the main focus. This is also made clear by the various objects shown above.

The invention thus comprises any features and also any combination of features, including in particular any combination of features in the subject-matter and claims, even if that feature or combination is not explicitly specified in the exemplary embodiments.

The invention claimed is:

1. µ-LED module comprising at least one layer stack forming a base module, with a first layer formed on a carrier, an active layer and a second layer, wherein a first contact is formed in or on a surface region of the second layer facing away from the carrier, and a second contact is formed in or on the surface region of the first layer facing away from the carrier, and the first and second contact are spaced apart from one another,
  wherein the second contact is electrically insulated from the active layer and the second layer by means of a dielectric and is formed to and on the surface region of the second layer facing away from the carrier.

2. The µ-LED module according to claim 1, in which a light-emitting surface is formed on a side of the stack of layers facing away from the first and second contact.

3. The μ-LED module according to claim 1, characterized in that the μ-LED module comprises a plurality of base modules arranged in a matrix of at least one row and at least one column.

4. The μ-LED module according to claim 3, characterized in that the base modules of two adjacent lines are oriented in opposite directions so that contacts of the same polarity, in particular first contacts, are arranged adjacent to each other.

5. The μ-LED module according to claim 3, in which a μ-LED adjacent to the μ-LED module is separated by a deep flanking structuring.

6. The μ-LED module according to claim 5, in which regions of the active layer which run adjacent to the deep flanking structure have an elevated band structure produced in particular by quantum well intermixing.

* * * * *